US012581656B2

(12) United States Patent
Zhou et al.

(10) Patent No.: US 12,581,656 B2
(45) Date of Patent: Mar. 17, 2026

(54) THREE-DIMENSIONAL MEMORY DEVICE AND METHOD OF MAKING THEREOF USING ETCH STOP STRUCTURES LOCATED BETWEEN TIERS

(71) Applicant: SANDISK TECHNOLOGIES LLC, Addison, TX (US)

(72) Inventors: Bing Zhou, San Jose, CA (US); Monica Titus, Santa Clara, CA (US); Raghuveer S. Makala, Campbell, CA (US); Rahul Sharangpani, Fremont, CA (US); Senaka Kanakamedala, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 378 days.

(21) Appl. No.: 18/350,524

(22) Filed: Jul. 11, 2023

(65) Prior Publication Data

US 2024/0138151 A1     Apr. 25, 2024
US 2024/0237355 A9     Jul. 11, 2024

Related U.S. Application Data

(60) Provisional application No. 63/380,307, filed on Oct. 20, 2022.

(51) Int. Cl.
H10B 43/35          (2023.01)
G11C 16/04          (2006.01)
          (Continued)

(52) U.S. Cl.
CPC ......... H10B 43/35 (2023.02); G11C 16/0483 (2013.01); H01L 23/5226 (2013.01);
          (Continued)

(58) Field of Classification Search
CPC ........ H10B 43/35; H10B 41/10; H10B 41/27; H10B 41/35; H10B 43/10; H10B 43/27;
          (Continued)

(56) References Cited

U.S. PATENT DOCUMENTS 8,614,126 B1     12/2013 Lee et al.
8,884,357 B2     11/2014 Wang et al.
          (Continued)

OTHER PUBLICATIONS

Invitation to Pay Additional Fees and Where Applicable Protest Fee, and Communication Relating to the Results of the Partial International Search from the International Search Authority for International Application No. PCT/US2023/034893, mailed Jan. 10, 2024, 6 pages.
          (Continued)

*Primary Examiner* — Tucker J Wright
(74) *Attorney, Agent, or Firm* — THE MARBURY LAW GROUP PLLC

(57)          ABSTRACT

A etch stop structure is formed a sacrificial memory opening fill structure formed within a first-tier memory opening vertically extending through a first-tier alternating stack of first insulating layers and first spacer material layers. The etch stop structure may include a conductive etch stop plate that is formed over a sacrificial memory opening fill material portion inside the first-tier memory opening, or may include a semiconductor plug which is selectively grown from sidewalls of an etch stop semiconductor material layer that is formed over the first-tier alternating stack. A second-tier alternating stack of second insulating layers and second spacer material layers is formed over the first-tier alternating stack and the etch stop structure.

9 Claims, 92 Drawing Sheets

(51) Int. Cl.

| | |
|---|---|
| *H01L 23/522* | (2006.01) |
| *H01L 23/528* | (2006.01) |
| *H10B 41/10* | (2023.01) |
| *H10B 41/27* | (2023.01) |
| *H10B 41/35* | (2023.01) |
| *H10B 43/10* | (2023.01) |
| *H10B 43/27* | (2023.01) |

(52) U.S. Cl.
CPC ......... *H01L 23/5283* (2013.01); *H10B 41/10* (2023.02); *H10B 41/27* (2023.02); *H10B 41/35* (2023.02); *H10B 43/10* (2023.02); *H10B 43/27* (2023.02)

(58) Field of Classification Search
CPC . H10B 43/50; G11C 16/0483; H01L 23/5226; H01L 23/5283
See application file for complete search history.

(56) References Cited

U.S. PATENT DOCUMENTS

| | | | | |
|---|---|---|---|---|
| 8,946,023 | B2 | 2/2015 | Makala et al. | |
| 8,969,153 | B2 | 3/2015 | Lee et al. | |
| 9,023,719 | B2 | 5/2015 | Pachamuthu et al. | |
| 9,230,979 | B1 | 1/2016 | Pachamuthu et al. | |
| 9,379,124 | B2 | 6/2016 | Sharangpani et al. | |
| 9,437,606 | B2 | 9/2016 | Makala et al. | |
| 9,449,982 | B2 | 9/2016 | Lu et al. | |
| 9,460,931 | B2 | 10/2016 | Pachamuthu et al. | |
| 9,520,406 | B2 | 12/2016 | Makala et al. | |
| 9,524,976 | B2 | 12/2016 | Pachamuthu et al. | |
| 9,530,788 | B2 | 12/2016 | Oginoe et al. | |
| 9,698,153 | B2 | 7/2017 | Liu et al. | |
| 9,768,192 | B1 | 9/2017 | Nakamura | |
| 9,768,270 | B2 | 9/2017 | Gunji-Yoneoka et al. | |
| 9,780,034 | B1 | 10/2017 | Tsutsumi et al. | |
| 10,242,994 | B2 | 3/2019 | Inomata et al. | |
| 10,748,925 | B1 | 8/2020 | Tsutsumi et al. | |
| 10,854,513 | B2 | 12/2020 | Kawasaki et al. | |
| 10,964,715 | B2 | 3/2021 | Kakazu et al. | |
| 11,018,152 | B2 | 5/2021 | Hinoue et al. | |
| 11,101,284 | B2 | 8/2021 | Pachamuthu et al. | |
| 11,296,101 | B2 | 4/2022 | Lee et al. | |
| 2004/0124531 | A1* | 7/2004 | Venkatraman | C23C 16/30 |
| | | | | 257/E21.27 |
| 2015/0076580 | A1 | 3/2015 | Pachamuthu et al. | |
| 2015/0294978 | A1 | 10/2015 | Lu et al. | |
| 2015/0380419 | A1 | 12/2015 | Gunji-Yoneoka et al. | |
| 2015/0380422 | A1 | 12/2015 | Sharangpani et al. | |
| 2017/0271261 | A1 | 9/2017 | Tsutsumi et al. | |
| 2017/0271352 | A1 | 9/2017 | Nakamura | |
| 2017/0352677 | A1 | 12/2017 | Zhu et al. | |
| 2018/0006049 | A1 | 1/2018 | Inomata et al. | |
| 2018/0166460 | A1 | 6/2018 | Manabe | |
| 2018/0277567 | A1* | 9/2018 | Nakamura | H01L 21/764 |
| 2019/0378849 | A1 | 12/2019 | Tao et al. | |
| 2020/0075627 | A1* | 3/2020 | Ahn | H10B 43/35 |
| 2020/0227318 | A1 | 7/2020 | Kawasaki et al. | |
| 2020/0251486 | A1 | 8/2020 | Tsutsumi et al. | |
| 2021/0005627 | A1 | 1/2021 | Hinoue et al. | |
| 2021/0167081 | A1 | 6/2021 | Hopkins et al. | |
| 2021/0305266 | A1 | 9/2021 | Lee et al. | |

OTHER PUBLICATIONS

Baklanov, M. R. et al., "Surface processes occurring on TiSi 2 and CoSi 2 in fluorine-based plasmas. Reactive ion etching in Cf 4/CHF 3 plasmas," *Journal of Vacuum Science & Technology A*. vol. 15, pp. 3005-3014 (1997), https://doi.org/10.1116/1.580897.

Endoh et al., "Novel Ultra High-Density Memory with a Stacked-Surrounding Gate Transistor (S-SGT) Structured Cell," IEDM Proc. (2001) 33-36.

Kalanyan, B. et al. "Using Hydrogen To Expand the Inherent Substrate Selectivity Window During Tungsten Atomic Layer Deposition," *Chem. Mater.* 2016, vol. 28, No. 1, pp. 117-126 https://doi.org/10.1021/acs.chemmater.5b03319.

Mackus, A.J.M. et al., "Direct-Write Atomic Layer Deposition of High-Quality Pt Nanostructures: Selective Growth Conditions and Seed Layer Requirements," *J. Phys. Chem. C.* 2013, vol. 117, No. 20, pp. 10788-10798, https://doi.org/10.1021/jp402260i.

Nadhom, M. et al., "Area Selective Deposition of Metals from the Electrical Resistivity of the Substrate," *J. Phys. Chem. Lett.* 2021, vol. 12, No. 17, pp. 4130-4133, https://doi.org/10.1021/acs.jpclett.1c00415.

Tsai, W. et a., "High selectivity plasma etching of silicon dioxide with a dual frequency 27/2 MHz capacitive radio frequency discharge," *Journal of Vacuum Science & Technology B: Microelectronics and Nanometer Structures Processing, Measurement, and Phenomena*, vol. 14, pp. 3276-3282 (1996), https://doi.org/10.1116/1.588820.

Vos, M.F.J. et al., "Area-Selective Deposition of Ruthenium by Combining Atomic Layer Deposition and Selective Etching," *Chem. Mater.* 2019, vol. 31, No. 11, pp. 3878-3882, https://doi.org/10.1021/acs.chemmater.9b00193.

Yang, C.L. et al., "New contact etch process for embedded DRAM applications," *MRS Online Proceedings Library* 564, 177-182 (1999), https://doi.org/10.1557/PROC-564-177.

Yang, M. et al., "Inherently area-selective hot-wire assisted atomic layer deposition of tungsten films," Thin Solid Films, vol. 649, Mar. 1, 2018, pp. 17-23, https://doi.org/10.1016/i.tsf.2018.01.016.

IPRP—Notification Concerning Transmittal of International Preliminary Report on Patentability and Written Opinion of the International Searching Authority for International Patent Application No. PCT/US2023/034893, mailed May 1, 2025, 9 pages.

Zhou, B. et al., "Three-Dimensional Memory Device and Method of Making Thereof Using Etch Stop Structures Located Between Tiers," U.S. Appl. No. 18/350,552, filed Jul. 11, 2023.

ISR—International Search Report and Written Opinion of the International Searching Authority for International Application No. PCT/US2023/034893, mailed Feb. 10, 2024, 16 pages.

\* cited by examiner

THREE-DIMENSIONAL MEMORY DEVICE AND METHOD OF MAKING THEREOF USING ETCH STOP STRUCTURES LOCATED BETWEEN TIERS

FIELD

The present disclosure relates generally to the field of semiconductor devices, and particularly to methods for manufacturing a three-dimensional memory device employing etch stop structures and structures formed by the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of forming a memory device is provided, which comprises: forming a first-tier alternating stack of first insulating layers and first spacer material layers over a substrate, wherein the first spacer material layers are formed as, or are subsequently replaced with, first electrically conductive layers; forming a first-tier memory opening through the first-tier alternating stack; forming a sacrificial first-tier memory opening fill structure comprising a stack of a first carbon-based fill material portion and a first conductive material portion in the first-tier memory opening; forming a second-tier alternating stack of second insulating layers and second spacer material layers over the first-tier alternating stack, wherein the second spacer material layers are formed as, or are subsequently replaced with, second electrically conductive layers; forming a second-tier memory opening through the second-tier alternating stack by performing an anisotropic etch process having an etch chemistry that etches materials of the second insulating layers and the second spacer material layers selective to a material of the first conductive material portion; removing the first conductive material portion selective to the first carbon-based fill material portion; forming an inter-tier memory opening by removing remaining portions of the sacrificial first-tier memory opening fill structure underneath the second-tier memory opening; and forming a memory opening fill structure in the inter-tier memory opening, wherein the memory opening fill structure comprises a vertical stack of memory elements and a vertical semiconductor channel.

According to an aspect of the present disclosure, a memory device is provided, which comprises: a first-tier alternating stack of first insulating layers and first electrically conductive layers; an etch stop semiconductor material layer located over the first-tier alternating stack; a second-tier alternating stack of second insulating layers and second electrically conductive layers overlying the etch stop semiconductor material layer; an inter-tier memory opening vertically extending through the second-tier alternating stack, the etch stop semiconductor material layer, and the first-tier alternating stack; and a memory opening fill structure located in the inter-tier memory opening and comprising a vertical semiconductor channel and a vertical stack of memory elements.

According to yet another aspect of the present disclosure, a method of forming a memory device is provided, which comprises: forming a first-tier alternating stack of first insulating layers and first spacer material layers over a substrate, wherein the first spacer material layers are formed as, or are subsequently replaced with, first electrically conductive layers; forming a first-tier memory opening through the first-tier alternating stack; forming a sacrificial first-tier memory opening fill structure within the first-tier memory opening; forming an etch stop semiconductor material layer over the first-tier alternating stack and the sacrificial first-tier memory opening fill structure; forming a second-tier alternating stack of second insulating layers and second spacer material layers over the etch stop semiconductor material layer, wherein the second spacer material layers are formed as, or are subsequently replaced with, second electrically conductive layers; forming a second-tier memory opening through the second-tier alternating stack and through the etch stop semiconductor material layer; forming a semiconductor plug on a cylindrical sidewall of the etch stop semiconductor material layer over the sacrificial first-tier memory opening fill structure; laterally expanding the second-tier memory opening while the semiconductor plug covers the sacrificial first-tier memory opening fill structure; forming an inter-tier memory opening by removing the semiconductor plug and the sacrificial first-tier memory opening fill structure; and forming a memory opening fill structure in the inter-tier memory opening, wherein the memory opening fill structure comprises a vertical semiconductor channel and a vertical stack of memory elements.

DETAILED DESCRIPTION

Figure 1A:
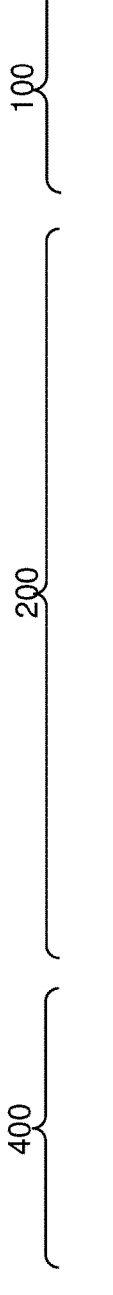
FIG. 1A is a vertical cross-sectional view of a first exemplary structure after formation of semiconductor devices, lower level dielectric layers, lower-level metal interconnect structures, and in-process source-level material layers according to a first embodiment of the present disclosure.
Figure 1A:
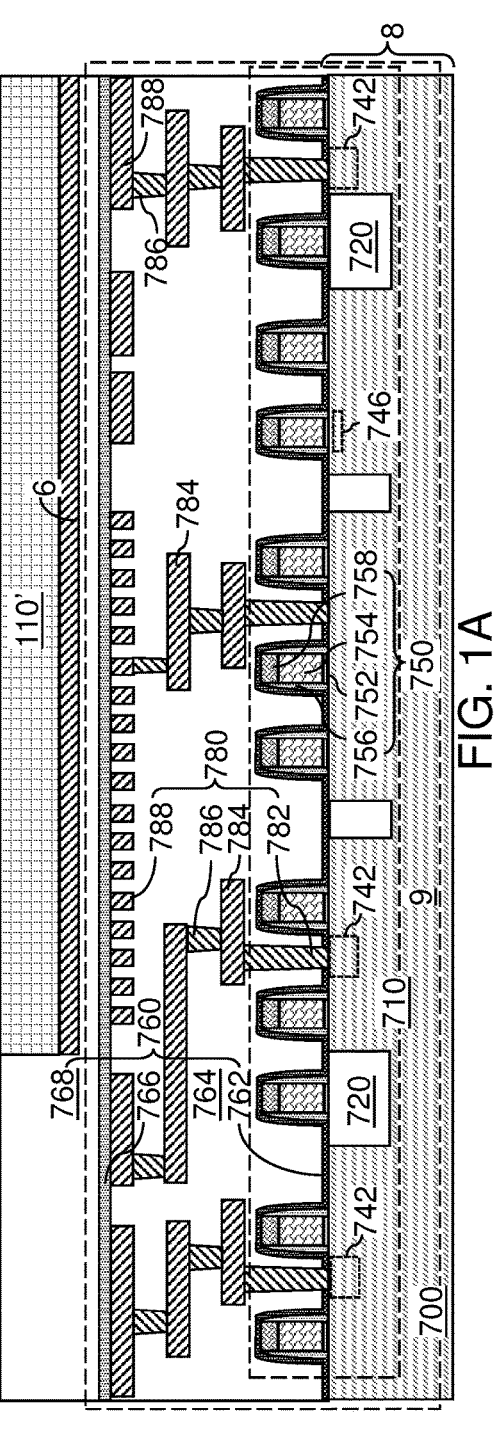

Embodiments of the present disclosure are directed to methods for manufacturing a three-dimensional memory device employing etch stop structures and structures formed by the same, the various aspects of which are described herein in detail. The embodiments of the present disclosure may be used to form various semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than 1.0× $10^5$ S/m. As used herein, an "insulator material" or a "dielectric material" refers to a material having electrical conductivity less than 1.0×10$^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than 1.0×10$^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from 1.0×10$^{-5}$ S/m to 1.0×10$^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "conductive material" refers to a conductive material including at least one conductive element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
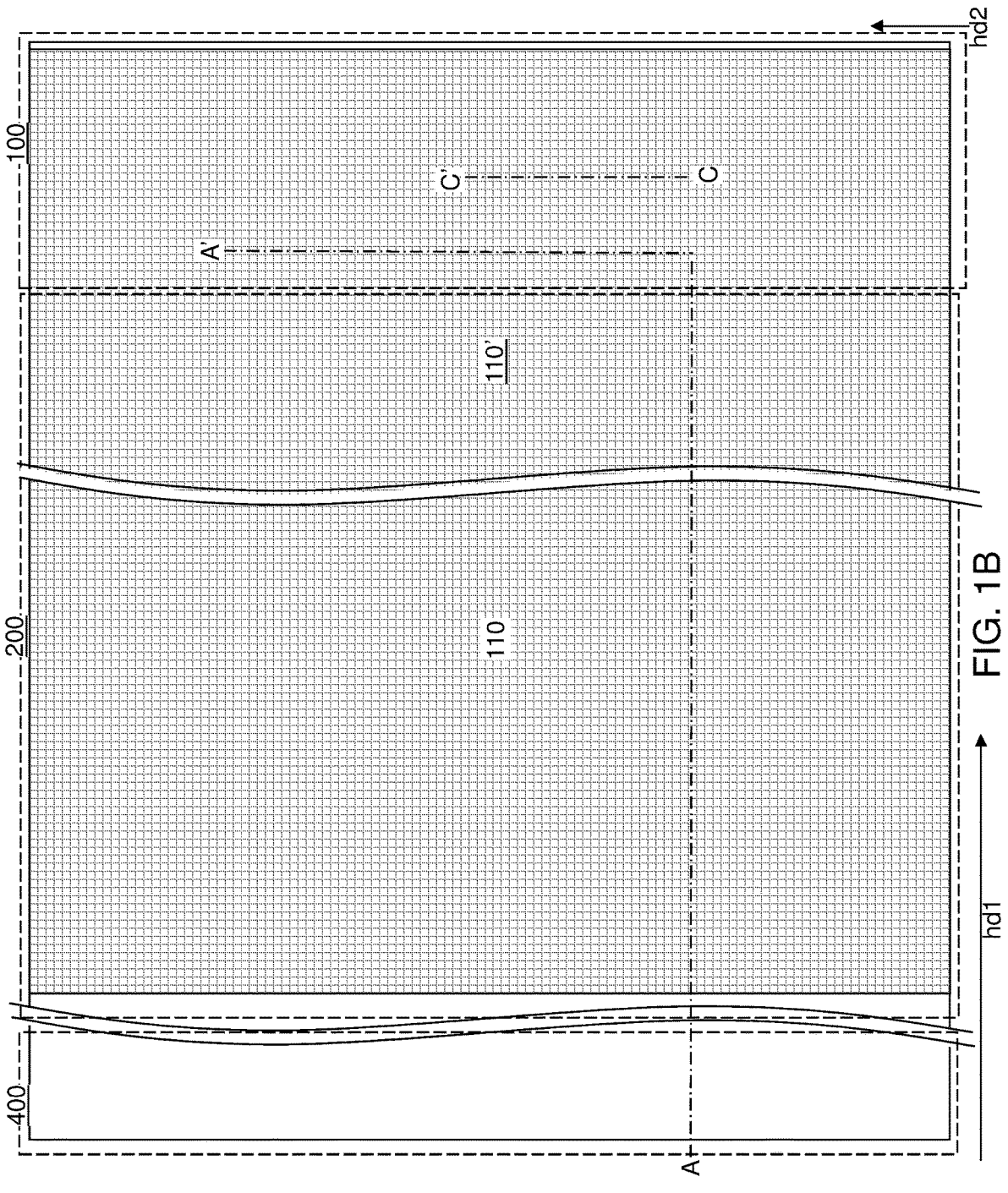
FIG. 1B is a top-down view of the first exemplary structure of FIG. 1A. The vertical plane A-A' is the plane of the vertical cross-sectional view of FIG. 1A.
Figure 1C:
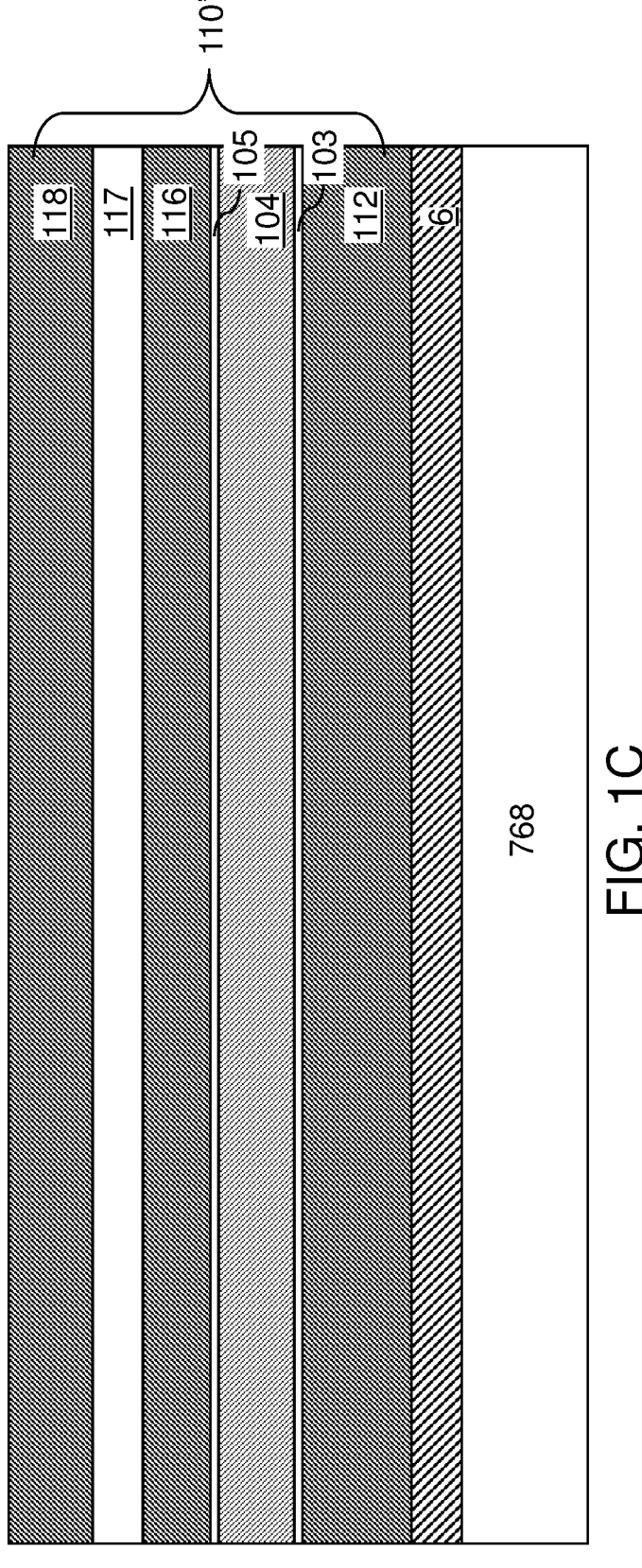
FIG. 1C is a vertical cross-sectional view of the first exemplary structure along the vertical plane C-C' of FIG. 1B.

Referring to FIGS. 1A-1C, a first exemplary structure according to a first embodiment of the present disclosure is illustrated. FIG. 1C is a magnified view of an in-process source-level material layers 110' illustrated in FIGS. 1A and 1B. The first exemplary structure includes a substrate 8 and semiconductor devices 710 formed thereupon. The substrate 8 includes a substrate semiconductor layer 9 at least at an upper portion thereof. Shallow trench isolation structures 720 may be formed in an upper portion of the substrate semiconductor layer 9 to provide electrical isolation from other semiconductor devices. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers are formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric material layers 760 functions as a matrix for lower-level metal interconnect structures 780 that provide electrical wiring to and from the various nodes of the semiconductor devices and landing pads for through-memory-level contact via structures to be subsequently formed. The lower-level metal interconnect structures 780 are formed within the dielectric layer stack of the lower-level dielectric material layers 760, and comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a conductive nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a conductive material and a layer of a semiconductor material may be deposited over, or within patterned recesses of, the at least one second dielectric material layer 768, and is lithographically patterned to provide an optional conductive plate layer 6 and in-process source-level material layers 110'. The optional conductive plate layer 6, if present, provides a high conductivity conduction path for electrical current that flows into, or out of, the in-process source-level material layers 110'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a conductive compound material such as a conductive nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 110' may be formed directly above a subset of the semiconductor devices on the substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the substrate 8.

The optional conductive plate layer 6 and the in-process source-level material layers 110' may be patterned to provide openings in areas in which through-memory-level contact via structures and through-dielectric contact via structures are to be subsequently formed. Patterned portions of the stack of the conductive plate layer 6 and the in-process source-level material layers 110' are present in each memory array region 100 in which three-dimensional memory stack structures are to be subsequently formed.

The optional conductive plate layer 6 and the in-process source-level material layers 110' may be patterned such that an opening extends over a staircase region 200 in which contact via structures contacting word line electrically conductive layers are to be subsequently formed. In one embodiment, the staircase region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 110' may be formed within the area of a memory array region 100, in which a three-dimensional memory array including memory stack structures is to be subsequently formed. A peripheral device region 400 that is subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 are formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and are located at the level of the lower-level dielectric material layers 760. Through-memory-level contact via structures may be subsequently formed directly on the lower-level metal interconnect structures 780 to provide electrical connection to memory devices to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level contact via structures to be subsequently formed.

Figure 2:
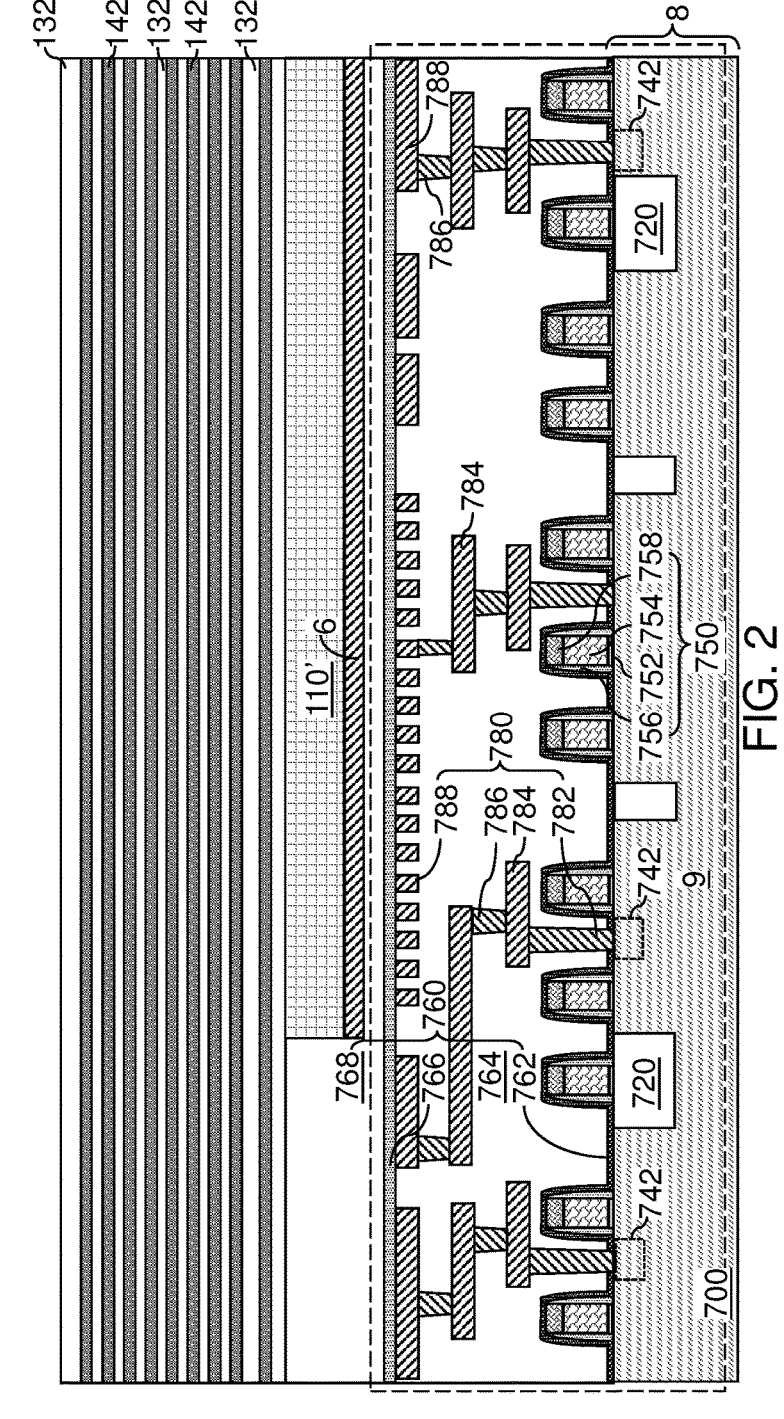
FIG. 2 is a vertical cross-sectional view of the first exemplary structure after formation of a first vertically alternating sequence of first insulating layers and first spacer material layers according to the first embodiment of the present disclosure.

Referring to FIG. 2, a first-tier structure which includes a first vertically alternating sequence of insulating layers and spacer material layers, is formed. The second vertically alternating sequence is also referred to as a first alternating stack of first material layers and second material layers. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 110'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first-tier alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 3:
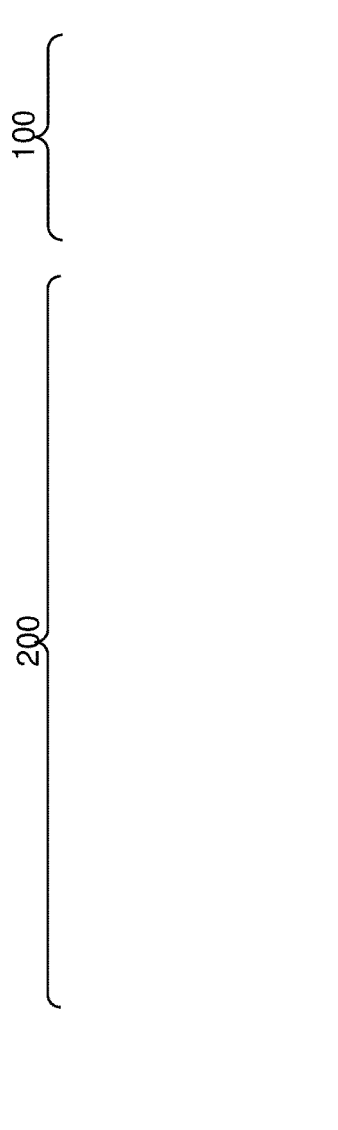
FIG. 3 is a vertical cross-sectional view of the first exemplary structure after patterning first stepped surfaces and a first retro-stepped dielectric material portion according to the first embodiment of the present disclosure.
Figure 3:
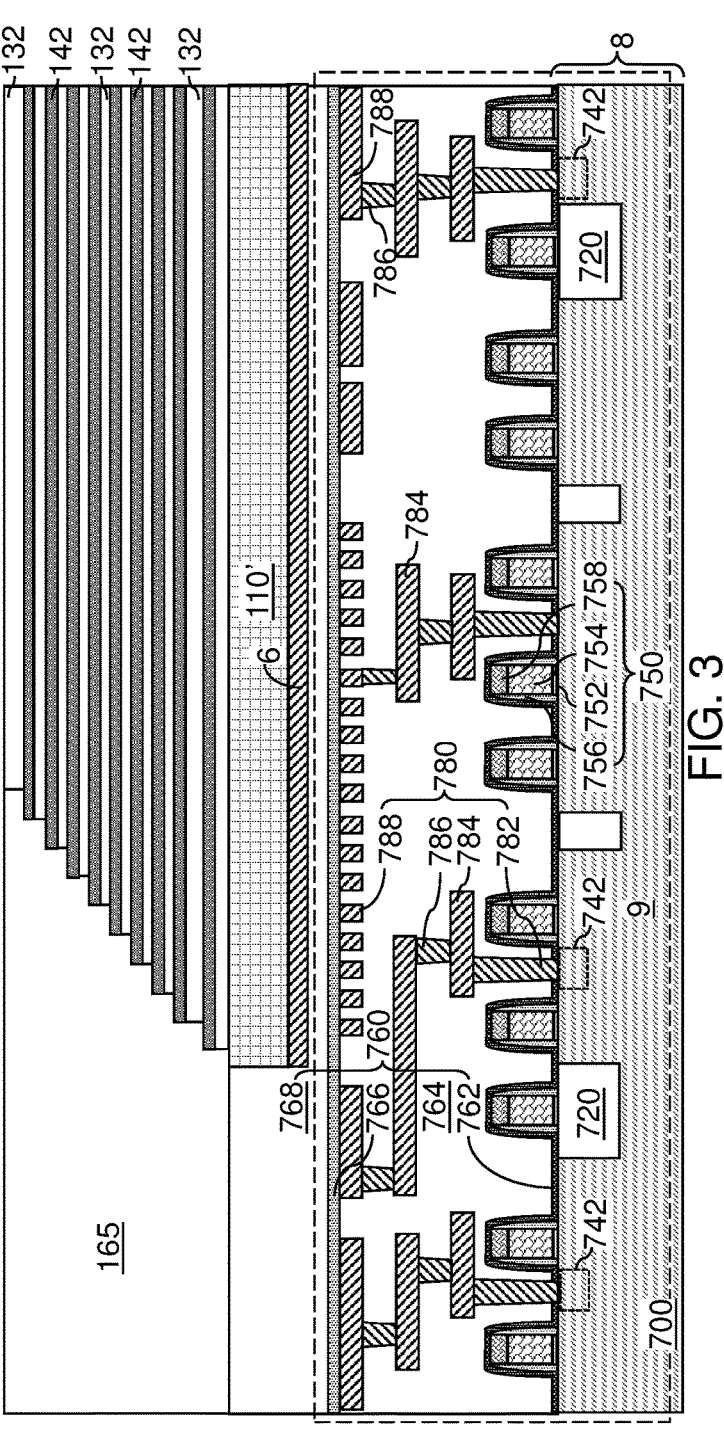

Referring to FIG. 3, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
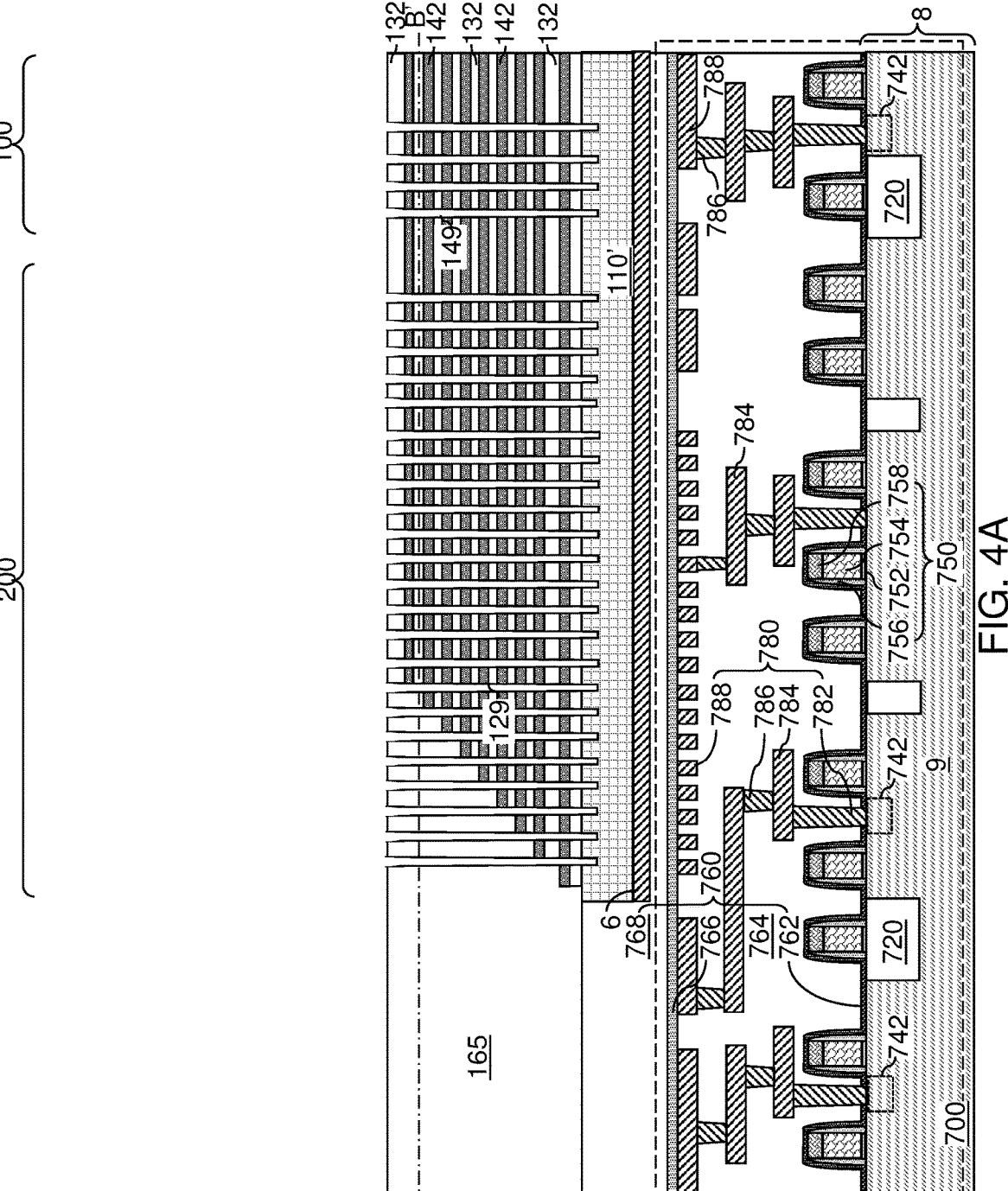
FIG. 4A is a vertical cross-sectional view of the first exemplary structure after formation of first-tier memory openings and first-tier support openings according to the first embodiment of the present disclosure.
Figure 4B:
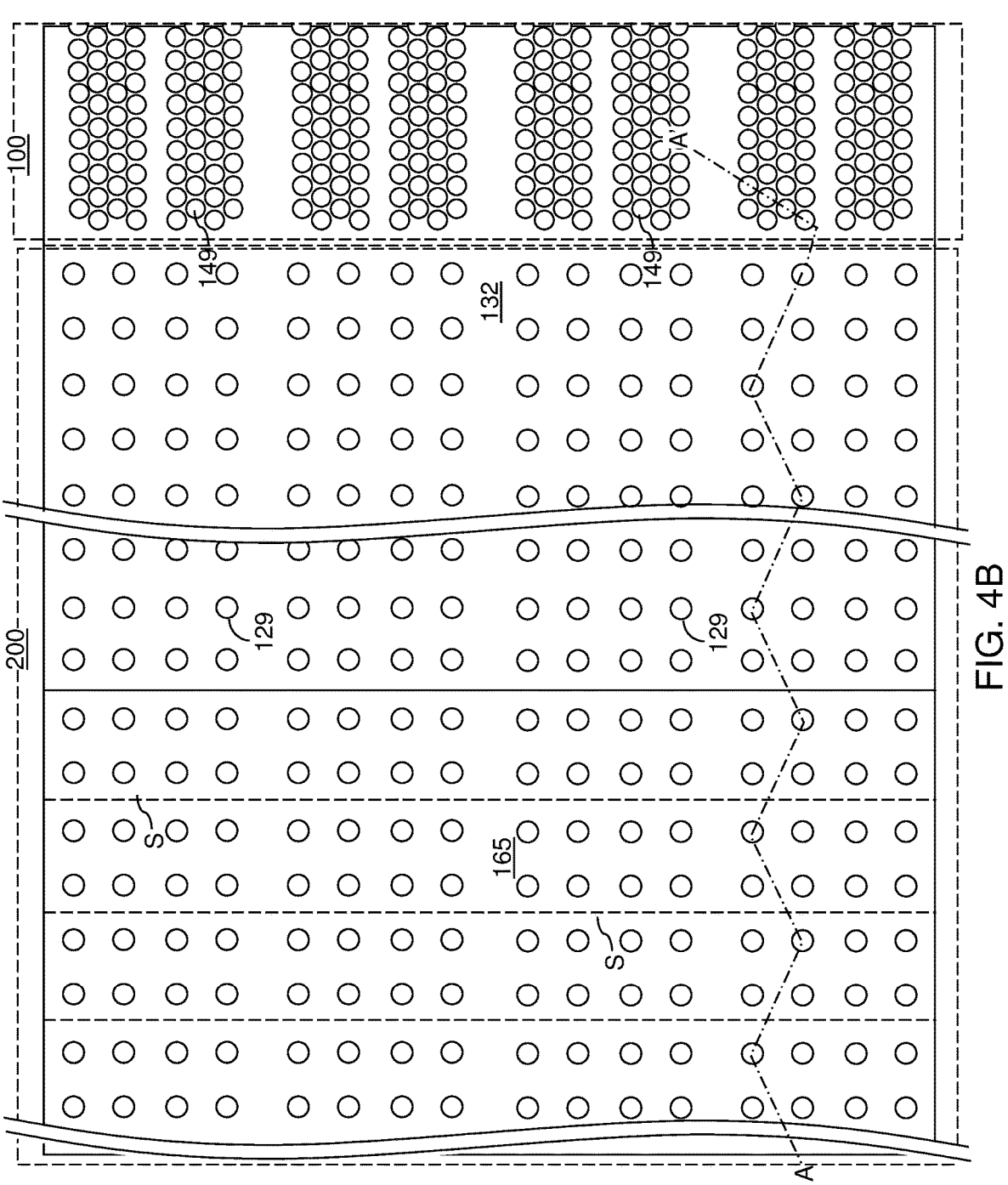
FIG. 4B is a top-down view of the first exemplary structure of FIG. 4A. The zig-zag vertical plane A-A' corresponds to the plane of the vertical cross-sectional view of FIG. 4A.

Referring to FIGS. 4A and 4B, various first-tier openings (149, 129) may be formed through the inter-tier dielectric layer 180 and the first-tier structure (132, 142, 170, 165) and into the in-process source-level material layers 110'. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the in-process source-level material layers 110' by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first-tier alternating stack (132, 142) are illustrated as dotted lines in FIG. 4B.

The first-tier memory openings 149 are openings that are formed in the memory array region 100 through each layer within the first-tier alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200, and are subsequently employed to form support pillar structures. A subset of the first-tier support openings 129 that is formed through the first retro-stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered.

After etching through the alternating stack (132, 142) and the first retro-stepped dielectric material portion 165, the chemistry of a terminal portion of the first anisotropic etch process may be selected to etch through the dielectric material(s) of the at least one second dielectric layer 768 with a higher etch rate than an average etch rate for the in-process source-level material layers 110'. For example, the terminal portion of the anisotropic etch process may include a step that etches the dielectric material(s) of the at least one second dielectric layer 768 selective to a semiconductor material within a component layer in the in-process source-level material layers 110'. In one embodiment, the terminal portion of the first anisotropic etch process may etch through the source-select-level conductive layer 118, the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 110'. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

FIGS. 5A-5D are vertical cross-sectional views of first-tier memory openings 149 during formation of sacrificial first-tier memory opening fill structures 148 in a first configuration of the first exemplary structure according to the first embodiment of the present disclosure.

Figure 5A:
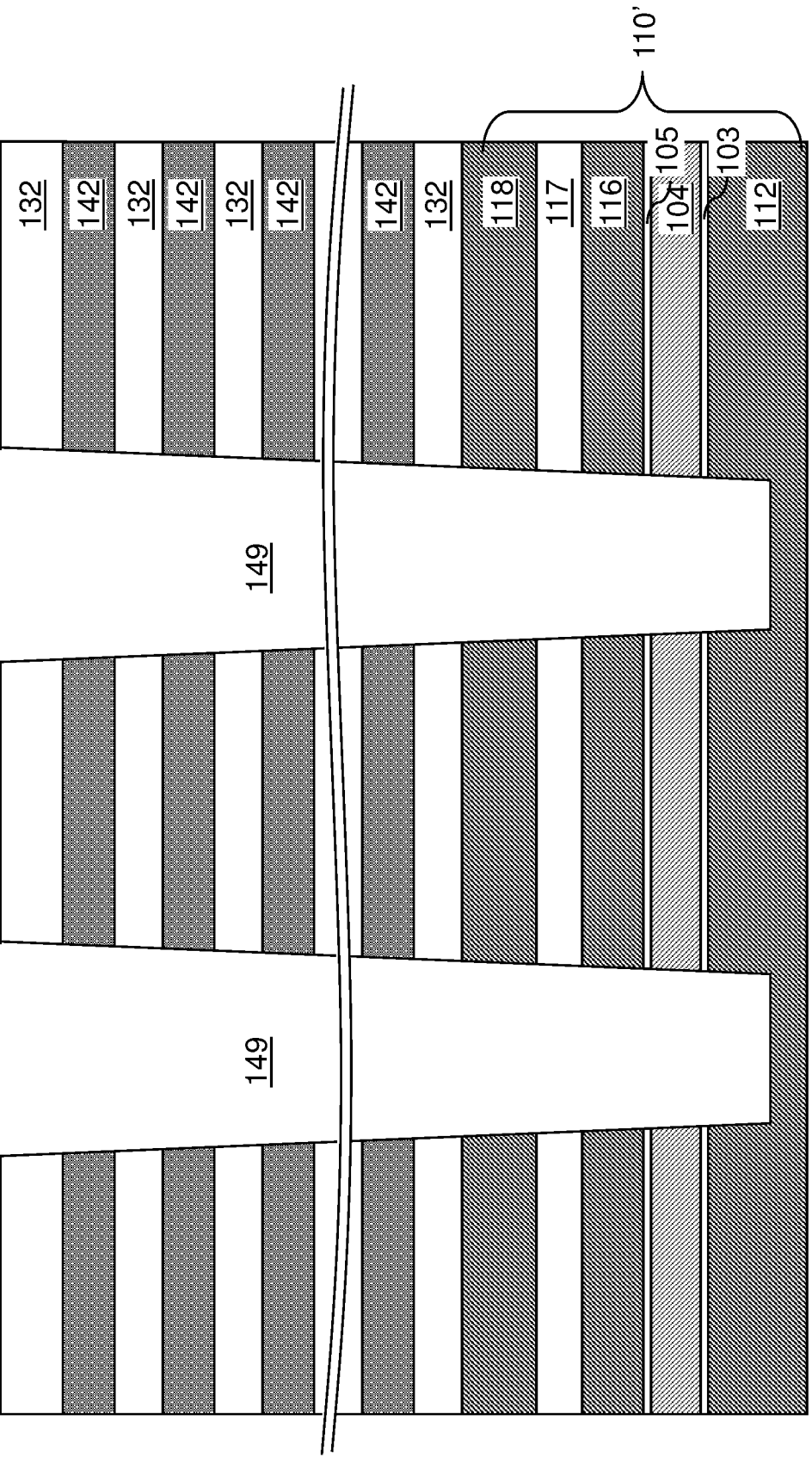
FIGS. 5A-5D are vertical cross-sectional views of first-tier memory openings during formation of sacrificial first-tier memory opening fill structures in a first configuration of the first exemplary structure according to the first embodiment of the present disclosure.

Referring to FIG. 5A, first-tier memory openings 149 in the memory array region 100 as formed at the processing steps of FIGS. 4A and 4B are illustrated.

Figure 5B:
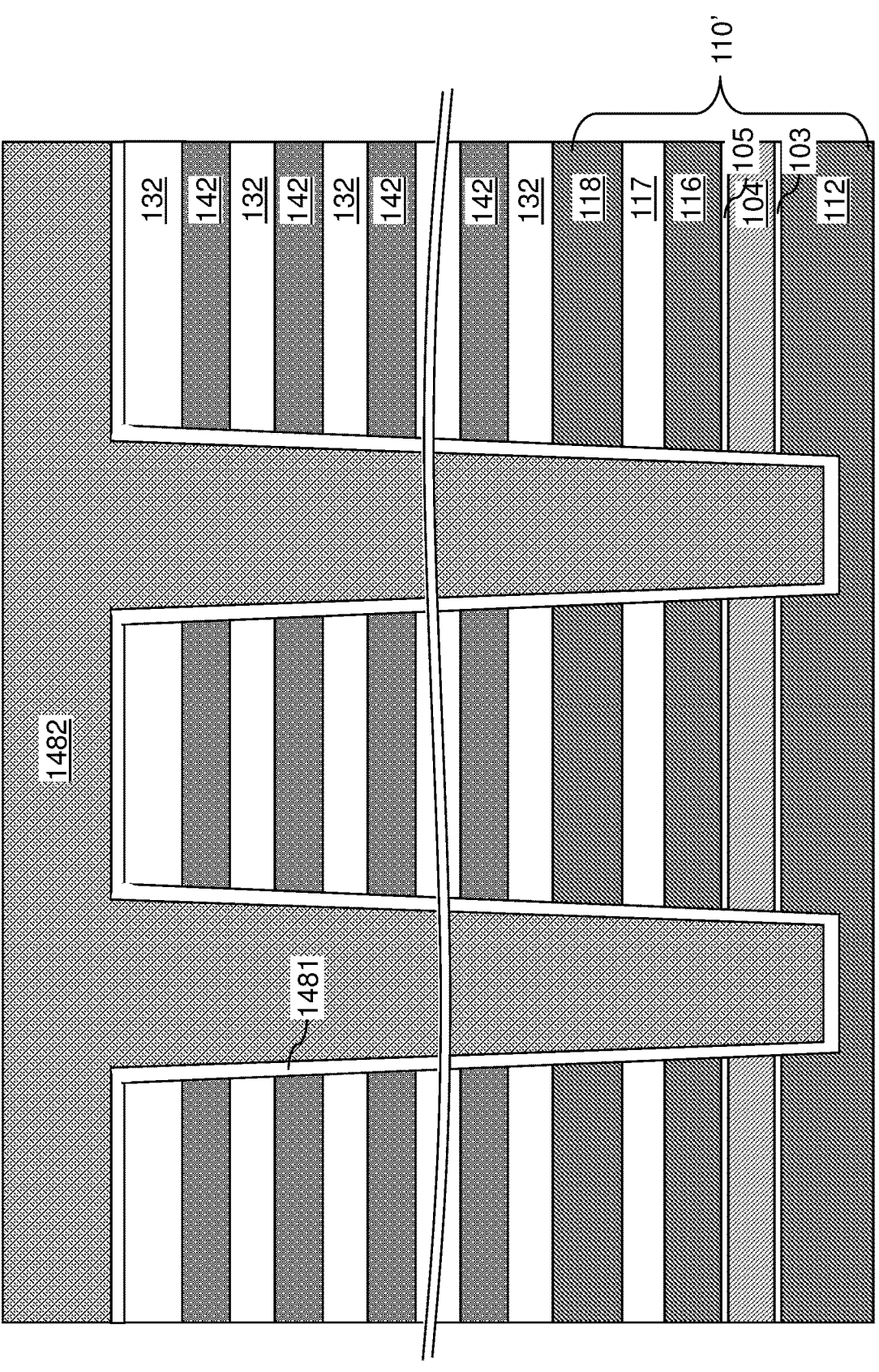

Referring to FIG. 5B, a first dielectric liner layer 1481 can be formed employing a conformal deposition process. The first dielectric liner layer 1481 includes a dielectric material, such as silicon oxide, and can have a thickness in a range from 2 nm to 12 nm, such as from 3 nm to 8 nm, although lesser and greater thicknesses may also be employed.

Figure 5C:
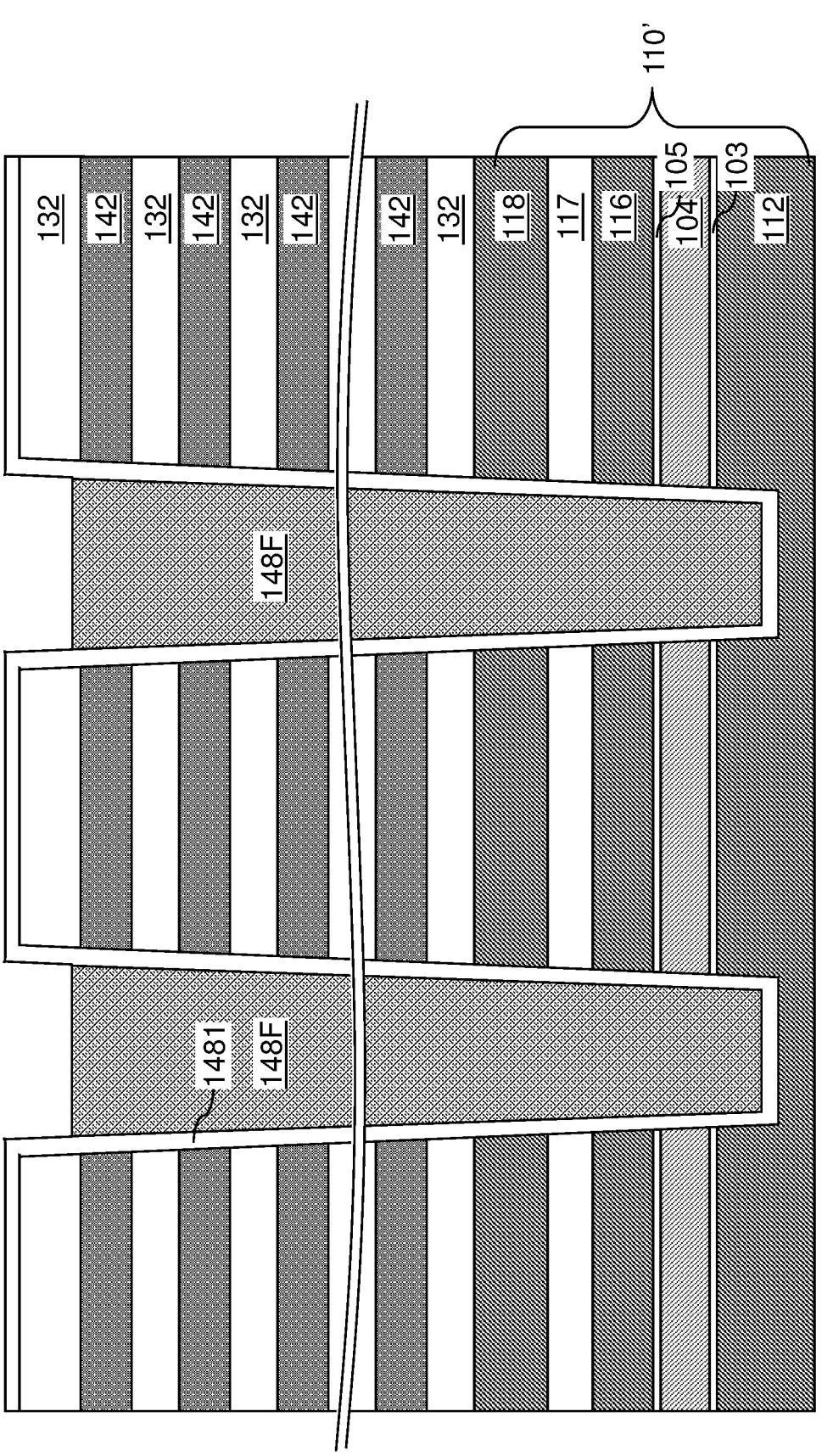

Referring to FIG. 5C, a first carbon-based fill material can be deposited in the first-tier memory openings 149 and the first-tier support openings 129. The first carbon-based fill material comprises carbon at an atomic percentage greater than 50%. For example, the first carbon-based fill material may comprise and/or may consist essentially of amorphous carbon, diamond-like carbon, or doped derivatives therefrom. Excess portions of the first carbon-based fill material can be removed from above the top surface of the horizontally-extending portion of the first dielectric liner layer 1481 by performing a recess etch process. The duration of the recess etch process can be selected such that top surfaces of remaining portions of the first carbon-based fill material are formed underneath the horizontal plane including the topmost surface of the first-tier alternating stack (132, 142).

Each remaining portion of the first carbon-based fill material in the first-tier memory openings 149 and the first-tier support openings 129 constitutes a first carbon-based fill material portion 148F. The vertical distance between the horizontal plane including the topmost surface of the first-tier alternating stack (132, 142) and the top surfaces of the first carbon-based fill material portions 148F may be in a range from 10 nm to 200 nm, such as from 20 nm to 100 nm, although lesser and greater vertical distances may also be employed. Generally, the first carbon-based fill material portions 148F are formed by depositing a first carbon-based fill material in the first-tier memory opening 149 and over the first-tier alternating stack (132, 142), and by removing portions of the first carbon-based fill material at least from above the first-tier alternating stack (132, 142) and by recessing the first carbon-based fill material in upper portions of the first-tier memory openings 149 and the first-tier support openings 129.

Figure 5D:
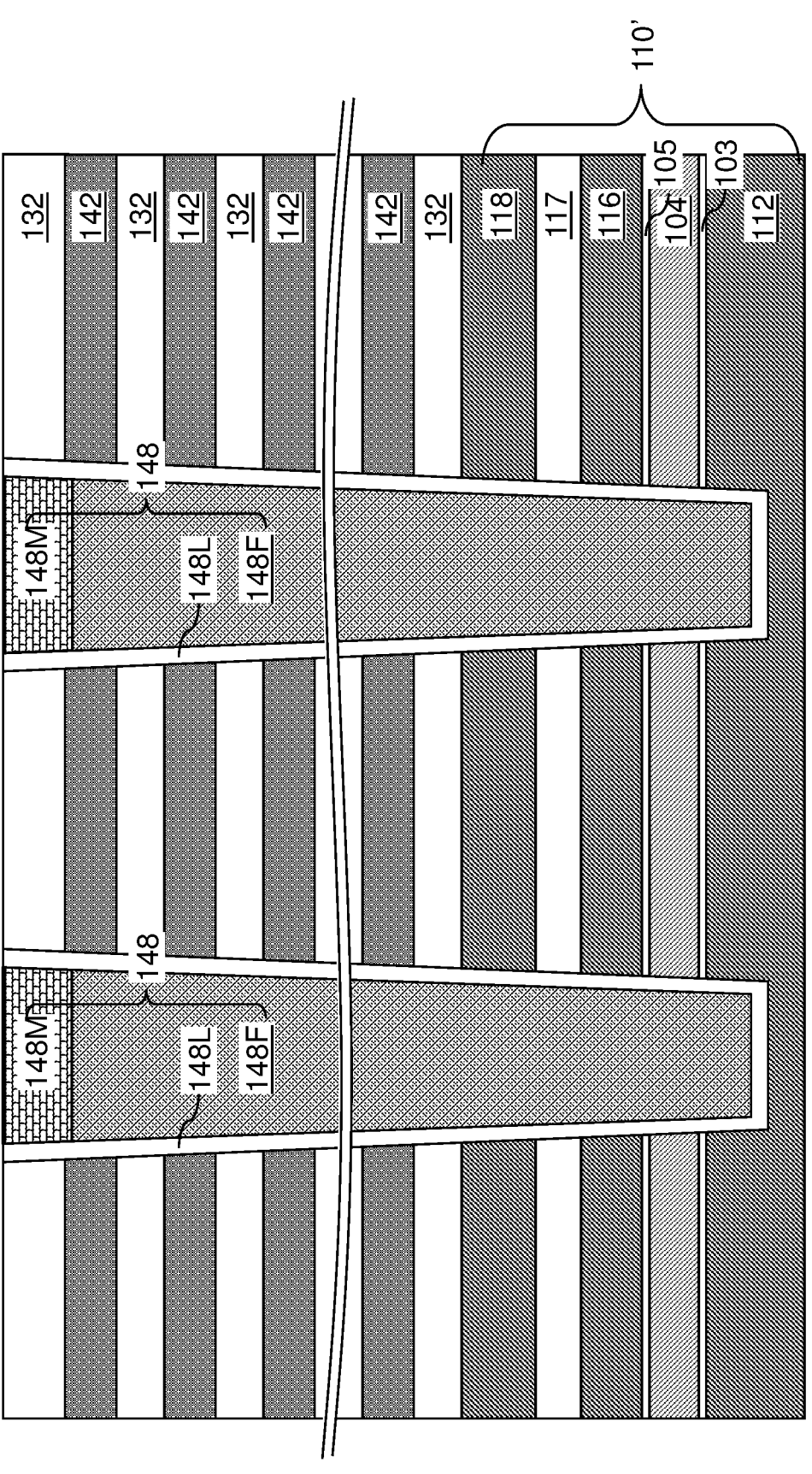

Referring to FIG. 5D, a first electrically conductive material can be deposited in the voids overlying the first-tier memory openings 149 and the first-tier support openings 129. The first conductive material comprises a transition metal or a conductive metal compound. In one embodiment, the first conductive material may comprise and/or may consist essentially of a metal, such as tungsten, molybdenum, ruthenium, cobalt, another transition metal, or alloys thereof, or a conductive compound, such as a metal silicide or metal nitride, such as titanium silicide, tungsten silicide, cobalt silicide, nickel silicide, titanium nitride, tantalum nitride, molybdenum nitride, tungsten nitride etc. The first conductive material may also comprise plural conductive layers, such as titanium nitride and tungsten layers.

Portions of the first conductive material and the first dielectric liner layer 1481 that overlie the horizontal plane including the top surface of the topmost layer of the first-tier alternating stack (132, 142) can be removed by performing a planarization process such as a chemical mechanical polishing (CMP) process and/or a recess etch process. Each remaining portion of the first conductive material constitutes a first conductive material portion 148M. Generally, the first conductive material portions 148M can be formed by depositing a layer of the first conductive material over the first carbon-based fill material portions 148F, and by removing a portion of the layer of the first conductive material from above the horizontal plane including a top surface of the first-tier alternating stack (132, 142) by performing a planarization process, which may comprise a chemical mechanical polishing process and/or a recess etch process. Each remaining portion of the first dielectric liner layer 1481 constitutes a first dielectric liner 148L that is formed on a sidewall of a respective one of the first-tier memory openings 149 and the first-tier support openings 129.

Generally, a sacrificial first-tier memory opening fill structure 148 is formed in each first-tier memory opening 149, and a sacrificial first-tier support opening fill structure is formed in each first-tier support openings 129. Each of the sacrificial first-tier memory opening fill structures 148 and the sacrificial first-tier support opening fill structures comprises an optional first dielectric liner 148L and a stack of a first carbon-based fill material portion 148F and a first conductive material portion 148M.

Figure 6A:
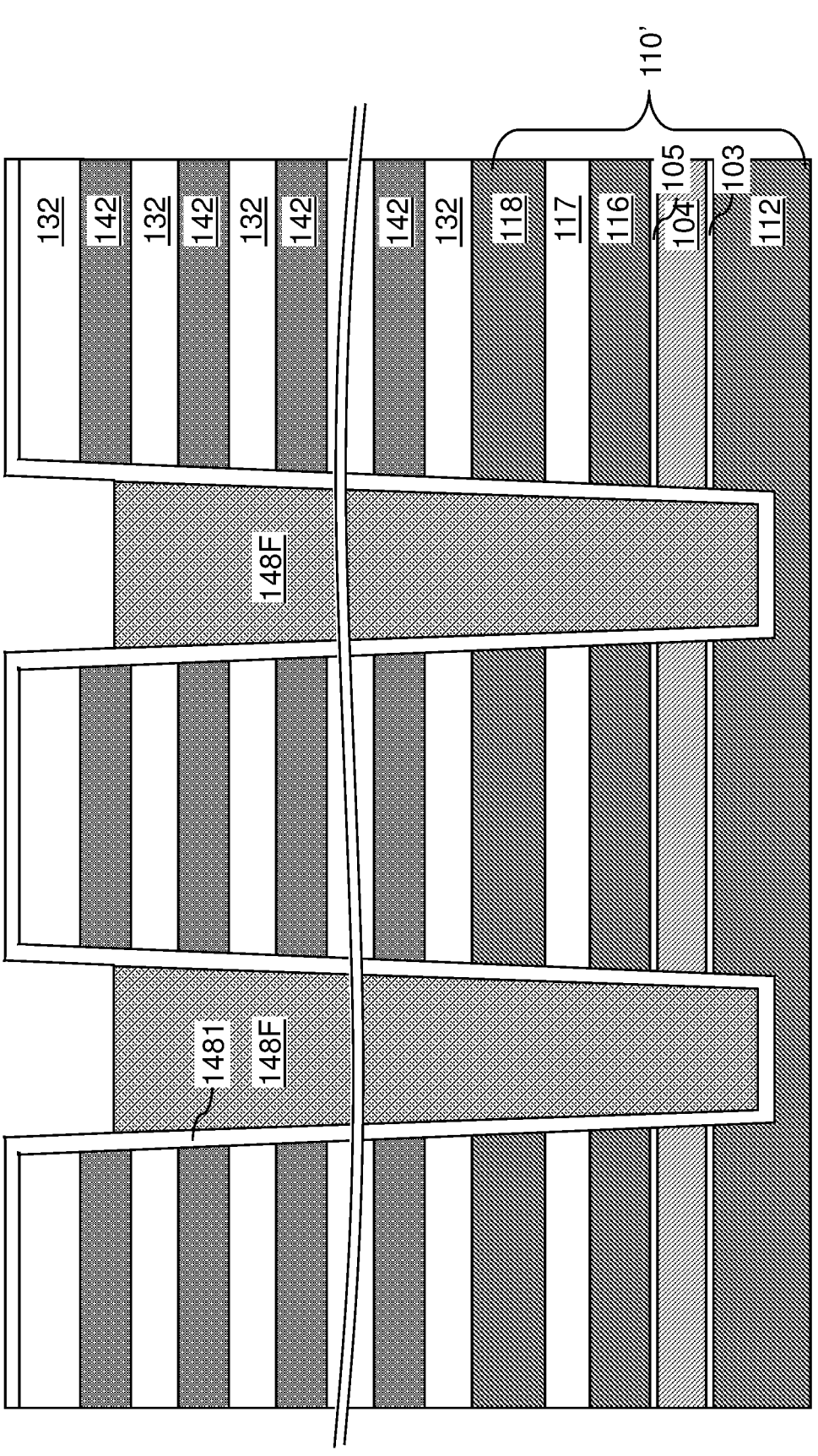
FIGS. 6A-6C are vertical cross-sectional views of first-tier memory openings during formation of sacrificial first-tier memory opening fill structures in a second configuration of the first exemplary structure according to the first embodiment of the present disclosure.
Figure 6B:
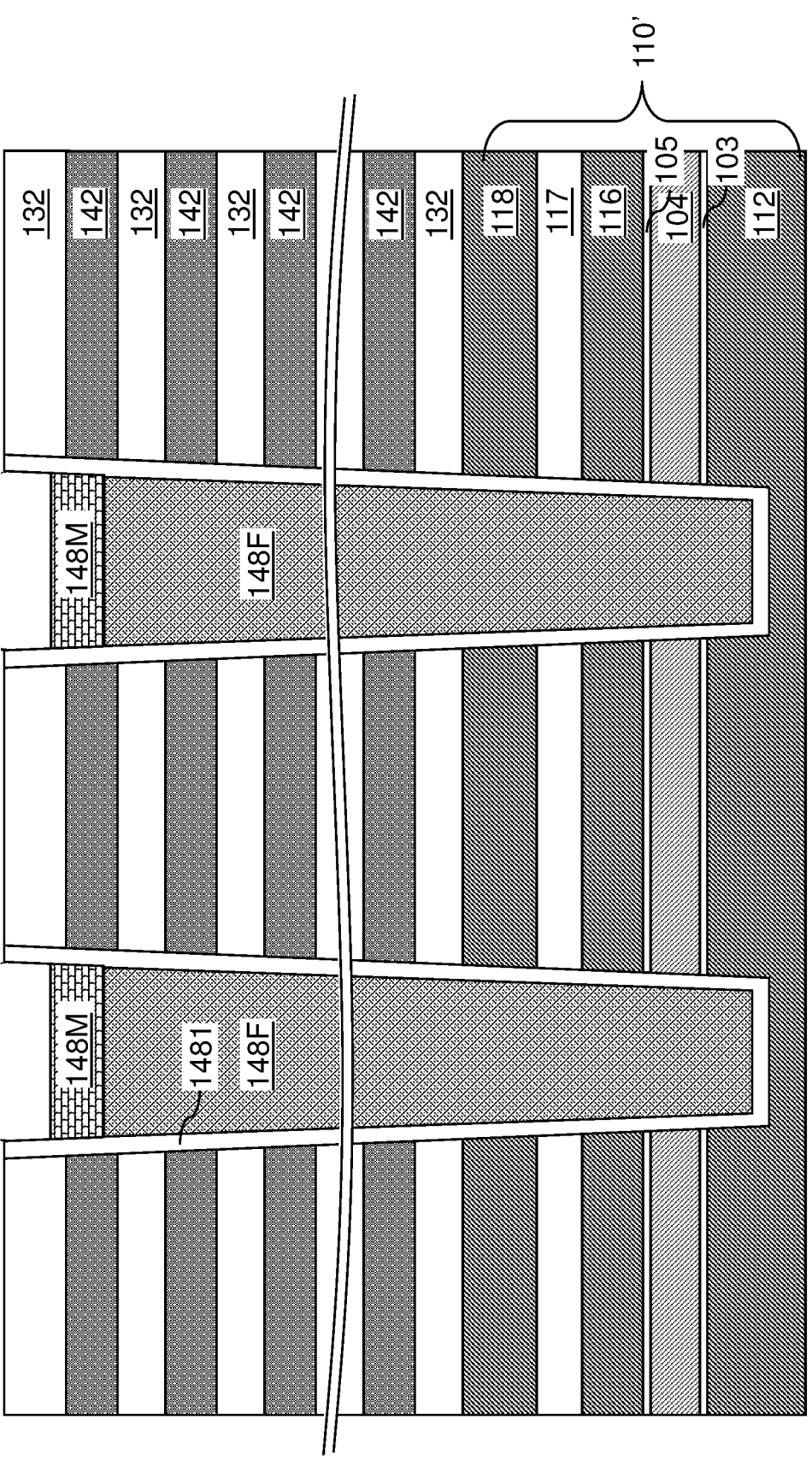
Figure 6C:
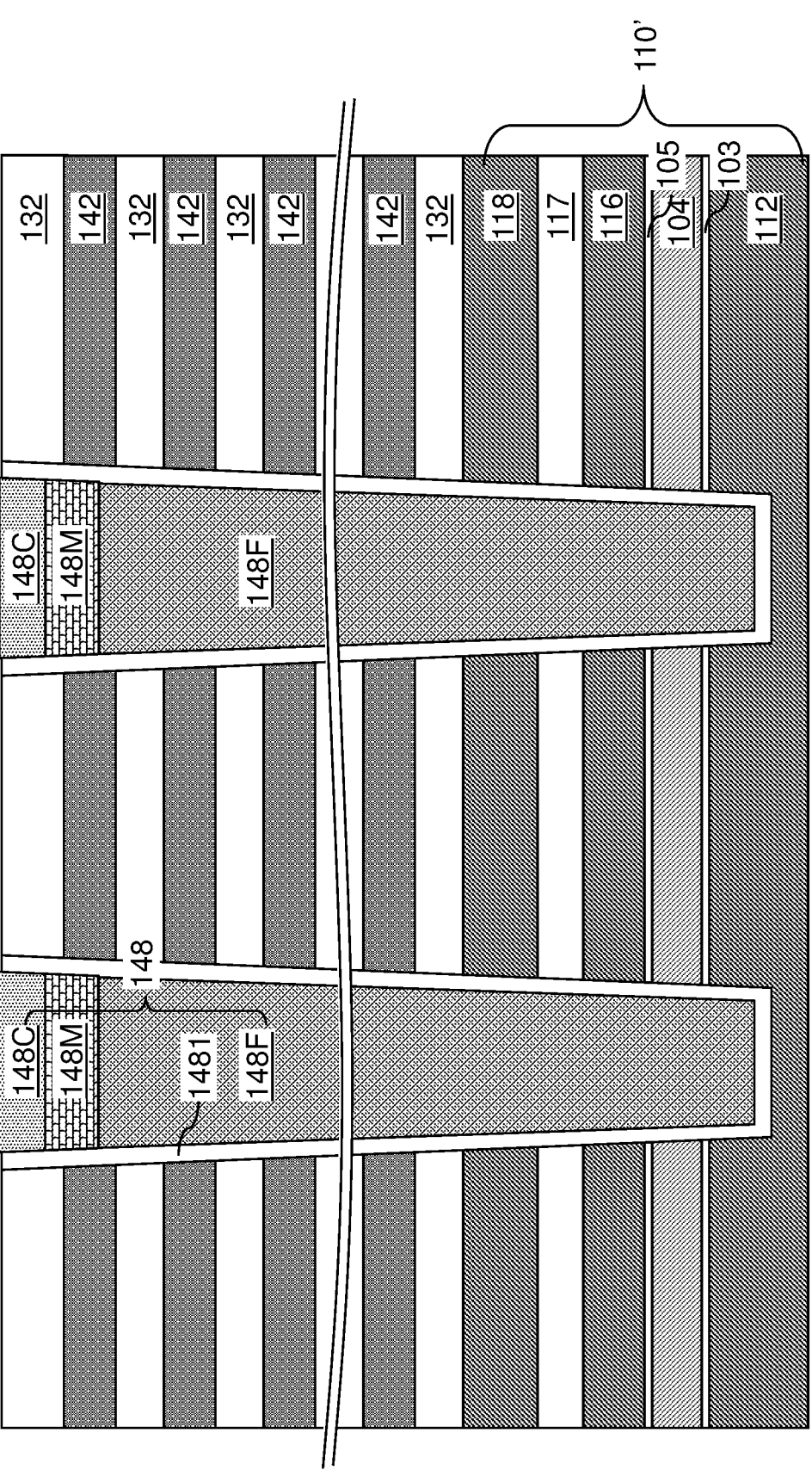

FIGS. 6A-6C are vertical cross-sectional views of first-tier memory openings 149 during formation of sacrificial first-tier memory opening fill structures 148 in a second configuration of the first exemplary structure according to the first embodiment of the present disclosure.

Referring to FIG. 6A, the second configuration of the first exemplary structure may be the same as the first configuration of the first exemplary structure illustrated in FIG. 5C. The recess depth of the top surfaces of the first carbon-based fill material portions 148F relative to the horizontal plane including the topmost surface of the first-tier alternating stack (132, 142) may be in a range from 20 nm to 300 nm, such as from 40 nm to 150 nm, although lesser and greater vertical distances may also be employed.

Referring to FIG. 6B, the processing steps described with reference to FIG. 5D can be performed to deposit a first conductive material. Portions of the first conductive material and the first dielectric liner layer 148I that overlie the horizontal plane including the top surface of the topmost layer of the first-tier alternating stack (132, 142) can be removed by performing a planarization process such as a chemical mechanical polishing (CMP) process and/or a recess etch process. Each remaining portion of the first conductive material constitutes a first conductive material portion 148M.

Subsequently, the first conductive material portions 148M can be thinned by performing a recess etch process that etches the first conductive material selective to the material of the first-tier insulating layers 132. The first conductive material can be vertically recessed below the horizontal plane including the topmost surface of the first-tier alternating stack (132, 142). The recess depth of the top surfaces of the first conductive material portion 148M relative to the horizontal plane including the topmost surface of the first-tier alternating stack (132, 142) may be in a range from 10 nm to 200 nm, such as from 20 nm to 100 nm, although lesser and greater vertical distances may also be employed. Generally, the first conductive material portions 148M can be formed by depositing a layer of the first conductive material over the first carbon-based fill material portions 148F, and by removing a portion of the layer of the first conductive material from above the horizontal plane including a top surface of the first-tier alternating stack (132, 142) and from upper portions of the first-tier memory openings 149 and the first-tier support openings 129. Each remaining portion of the first dielectric liner layer 148I constitutes a first dielectric liner 148L that is formed on a sidewall of a respective one of the first-tier memory openings 149 and the first-tier support openings 129.

Referring to FIG. 6C, a first carbon-based capping material that comprises carbon at an atomic percentage greater than 50% can be deposited in the recess cavities overlying the thinned first conductive material portions 148M, and can be subsequently recessed to form a first carbon-based capping material portion 148C. The carbon-based capping material portion may be selected from any material that may be employed for the material of the first carbon-based fill material of the first carbon-based fill material portions 148F. Each first carbon-based capping material portion 148C can be formed on a top surface of a respective one of the thinned first conductive material portions 148M. In one embodiment, the top surfaces of the first carbon-based capping material portions 148C can be formed at or about the horizontal plane including the topmost surface of the first-tier alternating stack (132, 142). A stack of a first carbon-based fill material portion 148F, a first conductive material portion 148M, and a first carbon-based capping material portion 148C can be formed inside and on an inner sidewall of each first dielectric liner 148L.

Generally, a sacrificial first-tier memory opening fill structure 148 is formed in each first-tier memory opening 149, and a sacrificial first-tier support opening fill structure is formed in each first-tier support openings 129. Each of the sacrificial first-tier memory opening fill structures 148 and the sacrificial first-tier support opening fill structures comprises an optional first dielectric liner 148L and a stack of a first carbon-based fill material portion 148F, a first conductive material portion 148M, and a first carbon-based capping material portion 148C.

Figure 7:
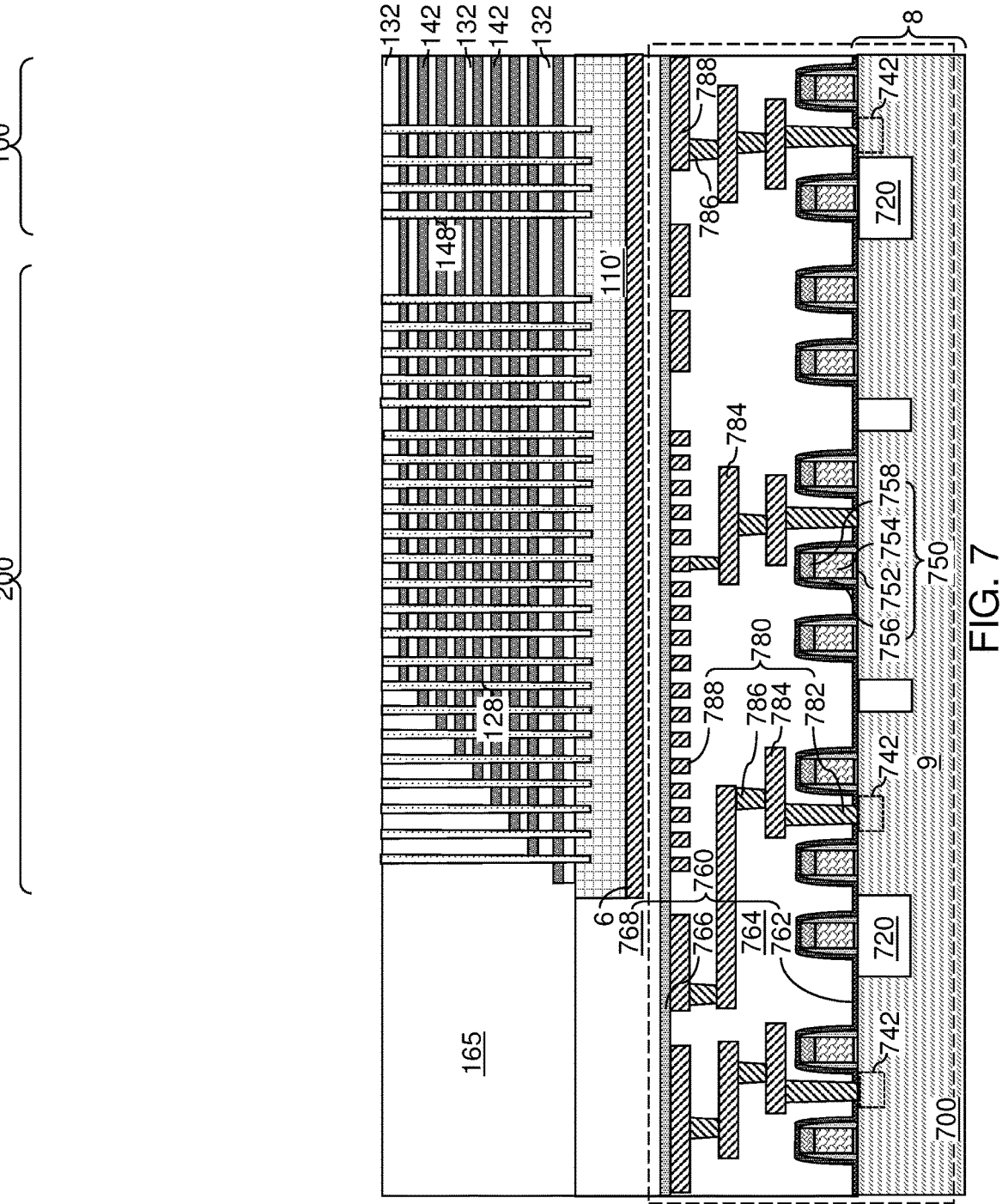
FIG. 7 is a vertical cross-sectional view of the first exemplary structure after formation of sacrificial first-tier memory opening fill structures and sacrificial first-tier support opening fill structures according to the first embodiment of the present disclosure.

Referring to FIG. 7, the first exemplary structure is illustrated after formation of sacrificial first-tier opening fill structures (148, 128) in the first-tier openings (149, 129). Each first-tier memory opening 149 is filled with a sacrificial first-tier memory opening fill structure 148, and each first-tier support opening 129 is filled with a sacrificial first-tier support opening fill structure 128.

Figure 8:
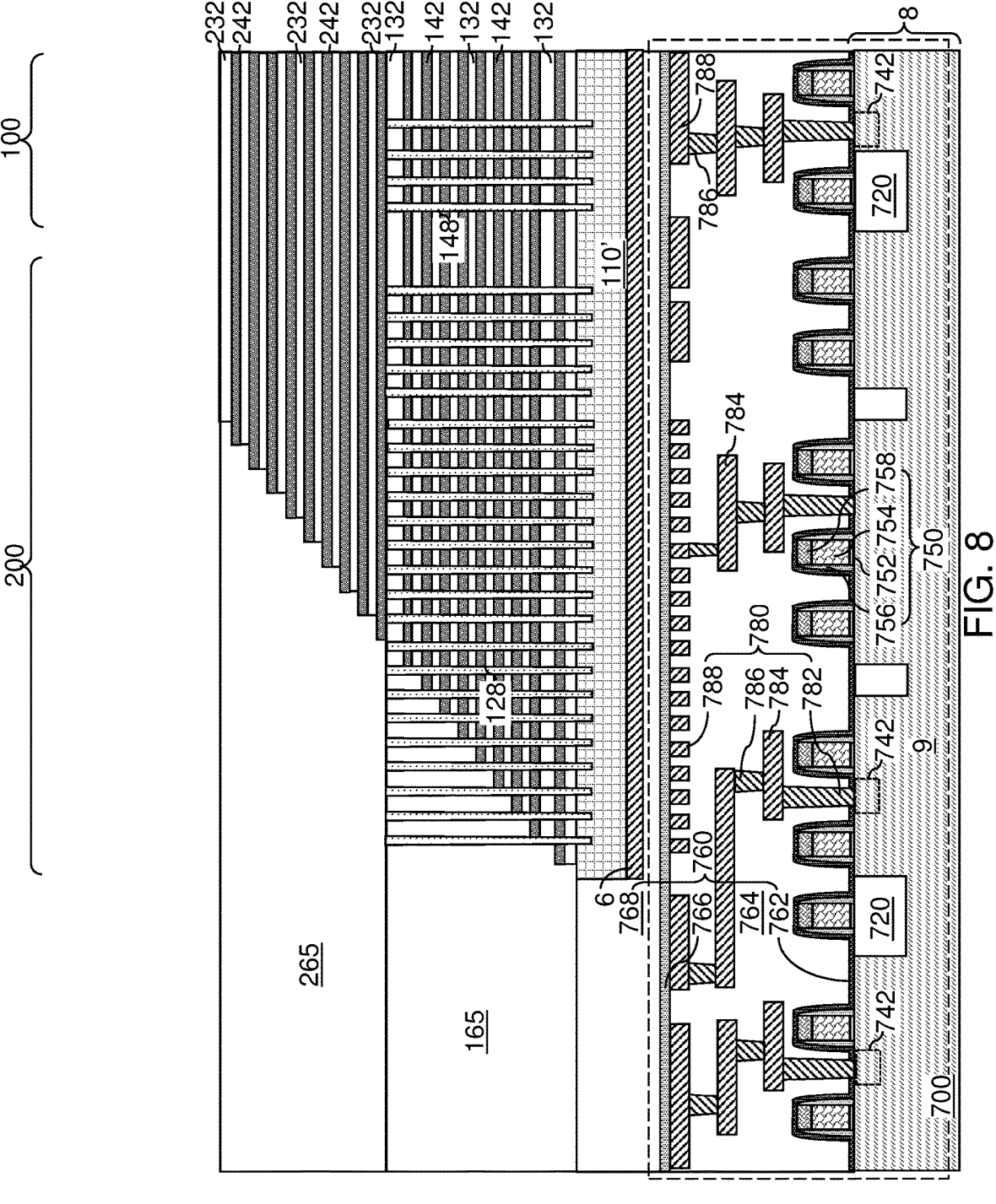
FIG. 8 is a vertical cross-sectional view of the first exemplary structure after formation of a second vertically alternating sequence of second insulating layers and second spacer material layers, second stepped surfaces, and a second retro-stepped dielectric material portion according to the first embodiment of the present disclosure.

Referring to FIG. 8, a second-tier structure can be formed over the first-tier structure (132, 142, 165, 148, 128). The second-tier structure can include an additional vertically alternating sequence of additional insulating layers and additional spacer material layers, which can be additional sacrificial material layers. The second vertically alternating sequence is also referred to as a second alternating stack. For example, a second alternating stack (232, 242) of material layers can be subsequently formed on the top surface of the first alternating stack (132, 142). The second alternating stack (232, 242) includes an alternating plurality of third material layers and fourth material layers. Each third material layer can include a third material, and each fourth material layer can include a fourth material that is different from the third material. In one embodiment, the third material can be the same as the first material of the first insulating layers 132, and the fourth material can be the same as the second material of the first sacrificial material layers 142.

In one embodiment, the third material layers can be second insulating layers 232 and the fourth material layers can be second spacer material layers that provide vertical spacing between each vertically neighboring pair of the second insulating layers 232. In one embodiment, the third material layers and the fourth material layers can be second insulating layers 232 and second sacrificial material layers 242, respectively. The third material of the second insulating layers 232 may be at least one insulating material. The fourth material of the second sacrificial material layers 242 may be a sacrificial material that can be removed selective to the third material of the second insulating layers 232. The second sacrificial material layers 242 may comprise an insulating material, a semiconductor material, or a conductive material. The fourth material of the second sacrificial material layers 242 can be subsequently replaced with electrically conductive electrodes which can function, for example, as control gate electrodes of a vertical NAND device.

In one embodiment, each second insulating layer 232 can include a second insulating material, and each second sacrificial material layer 242 can include a second sacrificial material. In this case, the second alternating stack (232, 242) can include an alternating plurality of second insulating layers 232 and second sacrificial material layers 242. The third material of the second insulating layers 232 can be deposited, for example, by chemical vapor deposition (CVD). The fourth material of the second sacrificial material layers 242 can be formed, for example, CVD or atomic layer deposition (ALD).

The third material of the second insulating layers 232 can be at least one insulating material. Insulating materials that can be employed for the second insulating layers 232 can be any material that can be employed for the first insulating layers 132. The fourth material of the second sacrificial material layers 242 is a sacrificial material that can be removed selective to the third material of the second insulating layers 232. Sacrificial materials that can be employed for the second sacrificial material layers 242 can be any material that can be employed for the first sacrificial material layers 142. In one embodiment, the second insulating material can be the same as the first insulating material, and the second sacrificial material can be the same as the first sacrificial material.

The thicknesses of the second insulating layers 232 and the second sacrificial material layers 242 can be in a range from 20 nm to 50 nm, although lesser and greater thicknesses can be employed for each second insulating layer 232 and for each second sacrificial material layer 242. The number of repetitions of the pairs of a second insulating layer 232 and a second sacrificial material layer 242 can be in a range from 2 to 1,024, and typically from 8 to 256, although a greater number of repetitions can also be employed. In one embodiment, each second sacrificial material layer 242 in the second alternating stack (232, 242) can have a uniform thickness that is substantially invariant within each respective second sacrificial material layer 242.

Second stepped surfaces can be formed in the second stepped area of the staircase region 200 employing a same set of processing steps as the processing steps employed to form the first stepped surfaces in the first stepped area with suitable adjustment to the pattern of at least one masking layer. A second retro-stepped dielectric material portion 265 can be formed over the second stepped surfaces in the staircase region 200.

Figure 9A:
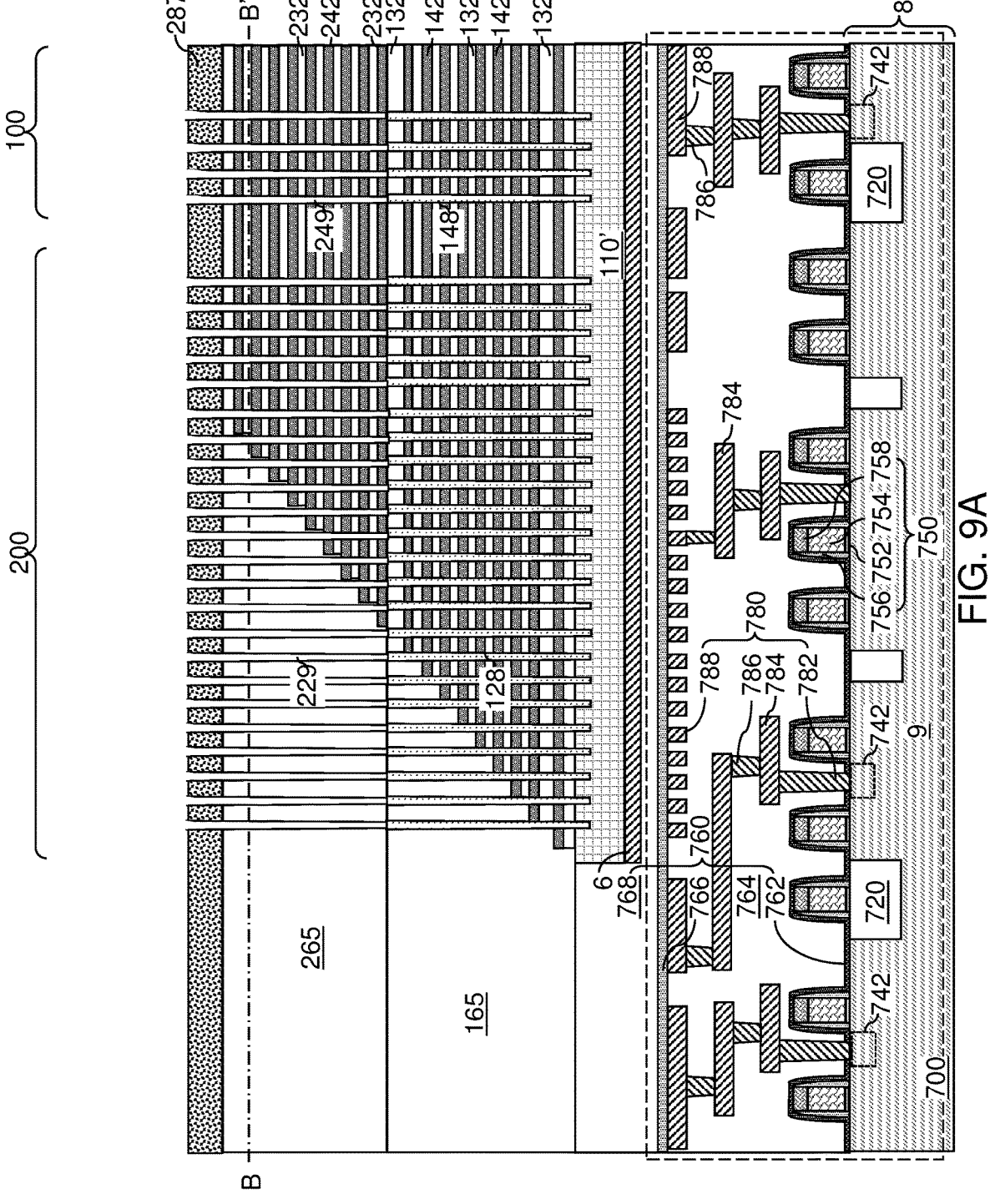
FIG. 9A is a vertical cross-sectional view of the first exemplary structure after formation of second-tier memory openings and second-tier support openings according to the first embodiment of the present disclosure.
Figure 9B:
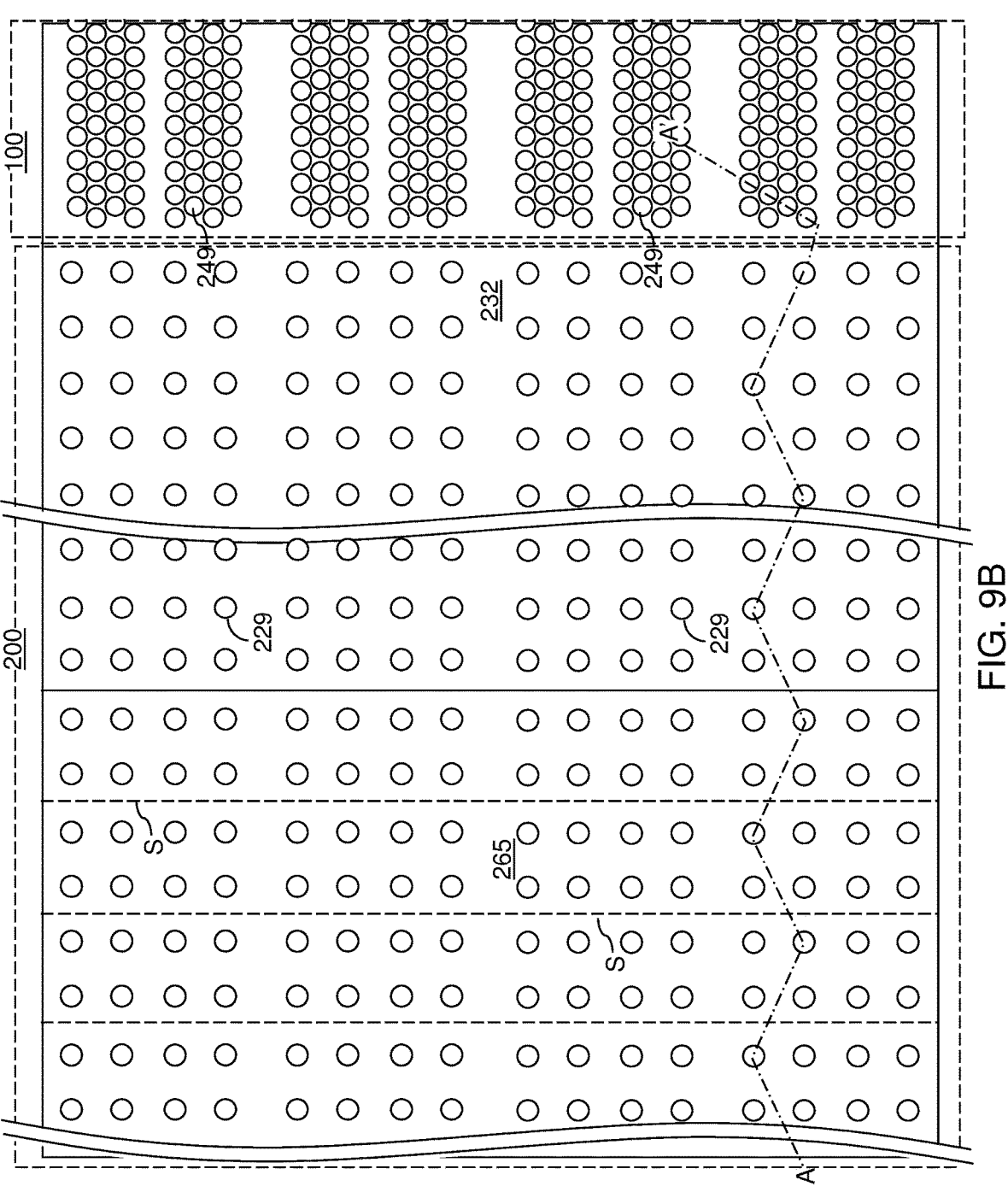
FIG. 9B is a horizontal cross-sectional of the first exemplary structure along the horizontal plane B-B' of FIG. 9A. The zig-zag vertical plane A-A' corresponds to the plane of the vertical cross-sectional view of FIG. 9A.

Referring to FIGS. 9A and 9B, a patterned etch mask layer 287 can be formed over the second-tier alternating stack (232, 242) and the second retro-stepped dielectric material portion 265. For example, a blanket etch mask material layer comprising a carbon-based material (such as a patterning film material) can be applied over the second-tier alternating stack (232, 242) and the second retro-stepped dielectric material portion 265. In one embodiment, the carbon-based material of the blanket etch mask material layer may comprise amorphous carbon, diamond-like carbon, or doped derivatives therefrom. A photoresist layer (not shown) can be applied over the blanket etch mask material layer, and can be lithographically patterned to form openings that have the same pattern as the pattern of the first-tier openings (149, 129) that are formed at the processing steps of 4A and 4B, which is the same as the sacrificial first-tier opening fill structures (148, 128). Thus, the lithographic mask employed to pattern the first-tier openings (149, 129) can be employed to pattern the photoresist layer. The pattern of openings in the photoresist layer can be transferred into the blanket etch mask material layer to form the patterned etch mask layer 287. The photoresist layer may be consumed during the pattern transfer into the blanket etch mask material layer, or may be collaterally consumed during a subsequent aniso-tropic etch process.

The pattern in the patterned etch mask layer 287 can be transferred through the second-tier structure (232, 242, 265, 270) by a second anisotropic etch process to form second-tier openings (249, 229). The second-tier openings (249, 229) can include second-tier memory openings 249 and second-tier support openings 229. The second-tier memory openings 249 are formed directly on a top surface of a respective one of the sacrificial first-tier memory opening fill structures 148. The second-tier support openings 229 are formed directly on a top surface of a respective one of the sacrificial first-tier support opening fill structures 128. Locations of steps S in the first vertically alternating sequence (132, 142) and the second vertically alternating sequence (232, 242) are illustrated as dotted lines in FIG. 9B.

Generally, a patterned etch mask layer 287 can be formed over the second-tier alternating stack (232, 242), and sec-ond-tier memory openings 249 and second-tier support openings 229 can be formed underneath the openings in the patterned etch mask layer 287 by performing an anisotropic etch process having an etch chemistry that etches materials of the second insulating layers 232 and the second spacer material layers selective to a material of the first conductive material portion 148M.

FIGS. 10A-10G are vertical cross-sectional views of first-tier memory openings 149 and second-tier memory openings 249 during formation of sacrificial second-tier memory opening fill structures 248 in the first configuration of the first exemplary structure according to the first embodi-ment of the present disclosure.

Figure 10A:
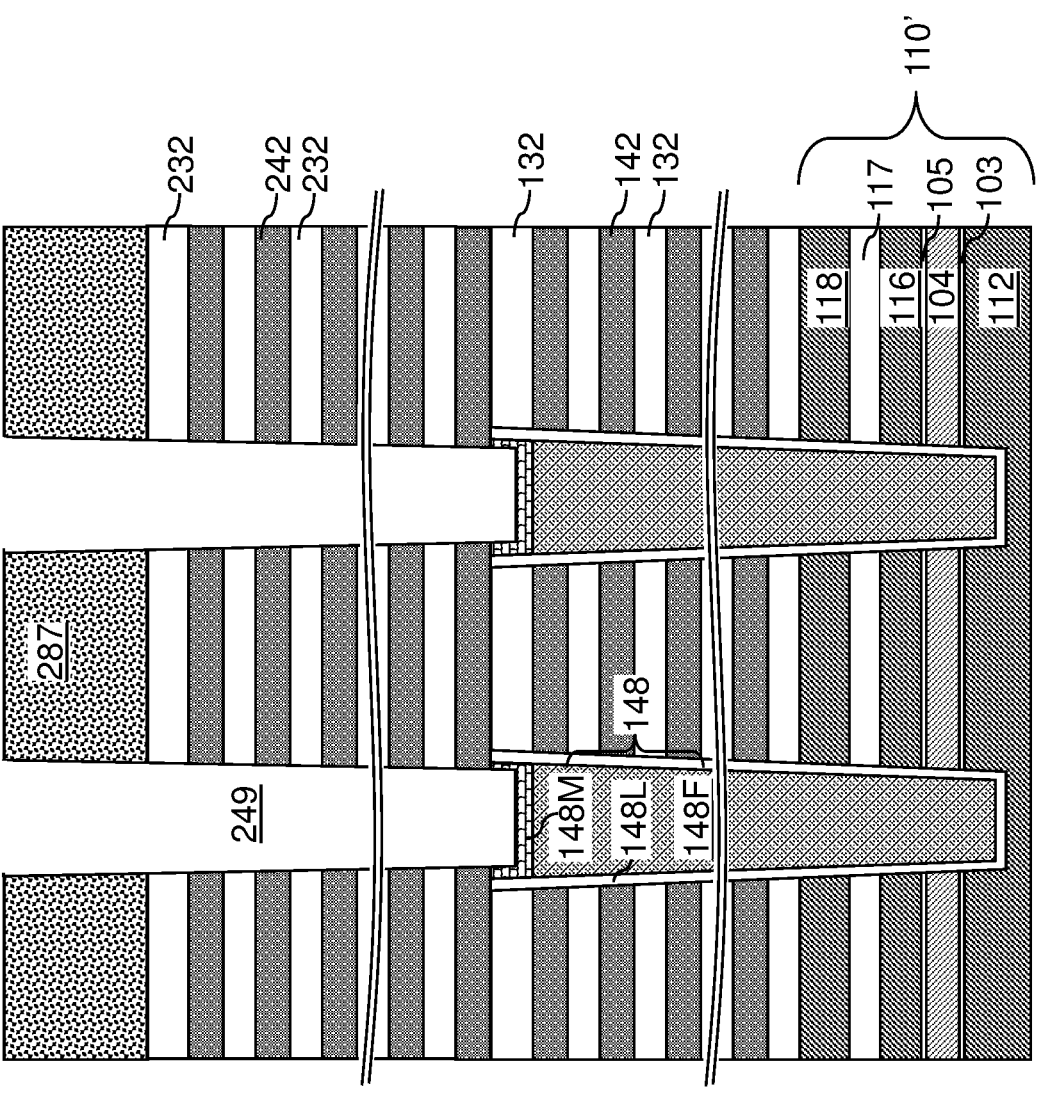
FIGS. 10A-10G are vertical cross-sectional views of first-tier memory openings and second-tier memory openings during formation of sacrificial second-tier memory opening fill structures in the first configuration of the first exemplary structure according to the first embodiment of the present disclosure.

Referring to FIG. 10A, a region of the first configuration of the first exemplary structure is illustrated after formation of the second-tier memory openings 249. The first conduc-tive material portions 148M can be employed as etch stop structures for the anisotropic etch process that forms the second-tier memory openings 249.

Figure 10B:
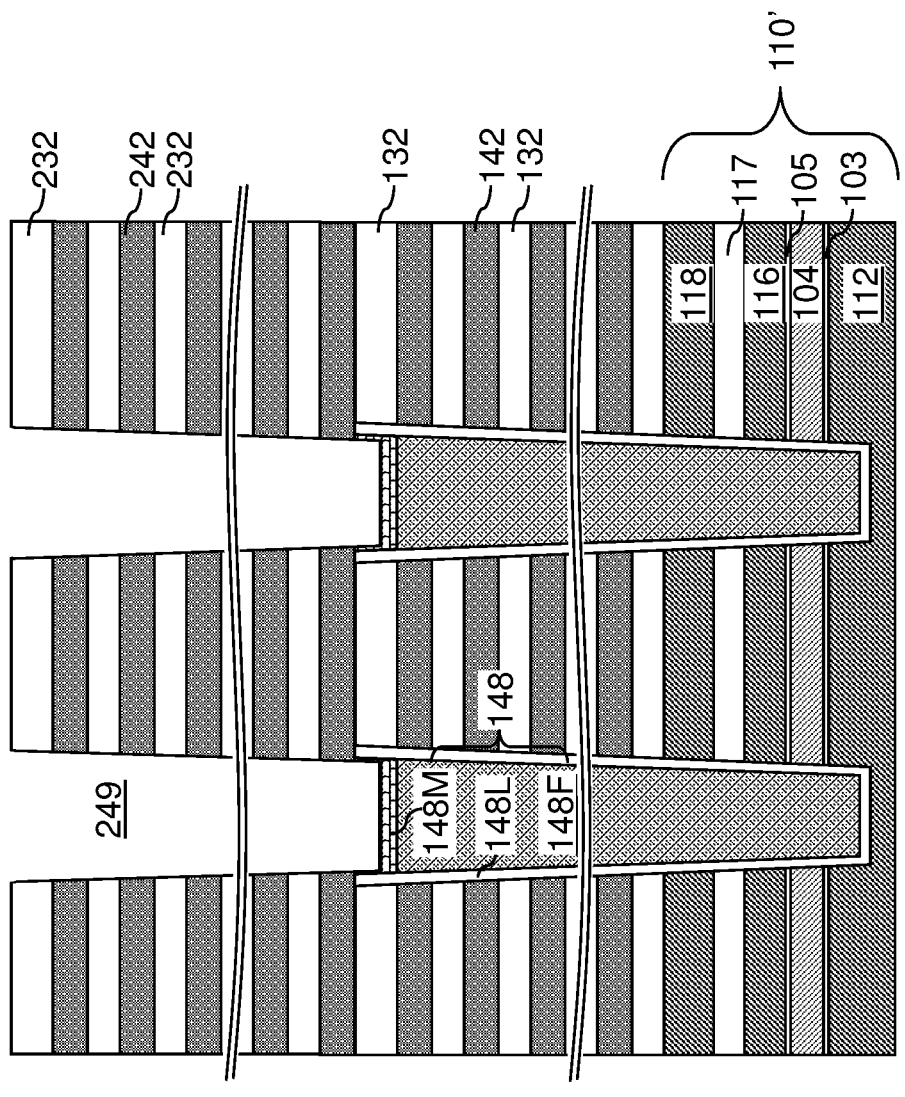

Referring to FIG. 10B and according to an aspect of the present disclosure, at least one isotropic etch process can be performed to laterally recess the second spacer material layers (such as the second sacrificial material layers 242) and/or the second insulating layers 232. In one embodiment, the at least one isotropic etch process may comprise a first isotropic etch process that laterally recesses the second spacer material layers (such as the second sacrificial material layers 242) around the second-tier memory openings 249, and a second isotropic etch process that laterally recesses the second insulating layers 232 around the second-tier memory openings 249. For example, if the second insulating layers 232 comprise silicon oxide and the second sacrificial mate-rial layers 242 comprise silicon nitride, the first isotropic etch process may comprise a wet etch process employing hot phosphoric acid, and the second isotropic etch process may comprise a wet etch process employing dilute hydrofluoric acid. The first conductive material portions 148M blocks the etchants of the isotropic etch processes from diffusion toward the first carbon-based fill material portions 148F. Thus, the second-tier memory openings 249 can be laterally expanded without expanding any portion of the first-tier memory openings 149 and without removing the first car-bon-based fill material portions 148F. The patterned etch mask layer 287 can be removed prior to, or after, the at least one isotropic etch process, for example, by performing an ashing process that volatilizes the carbon-based material of the patterned etch mask layer 287.

Figure 10C:
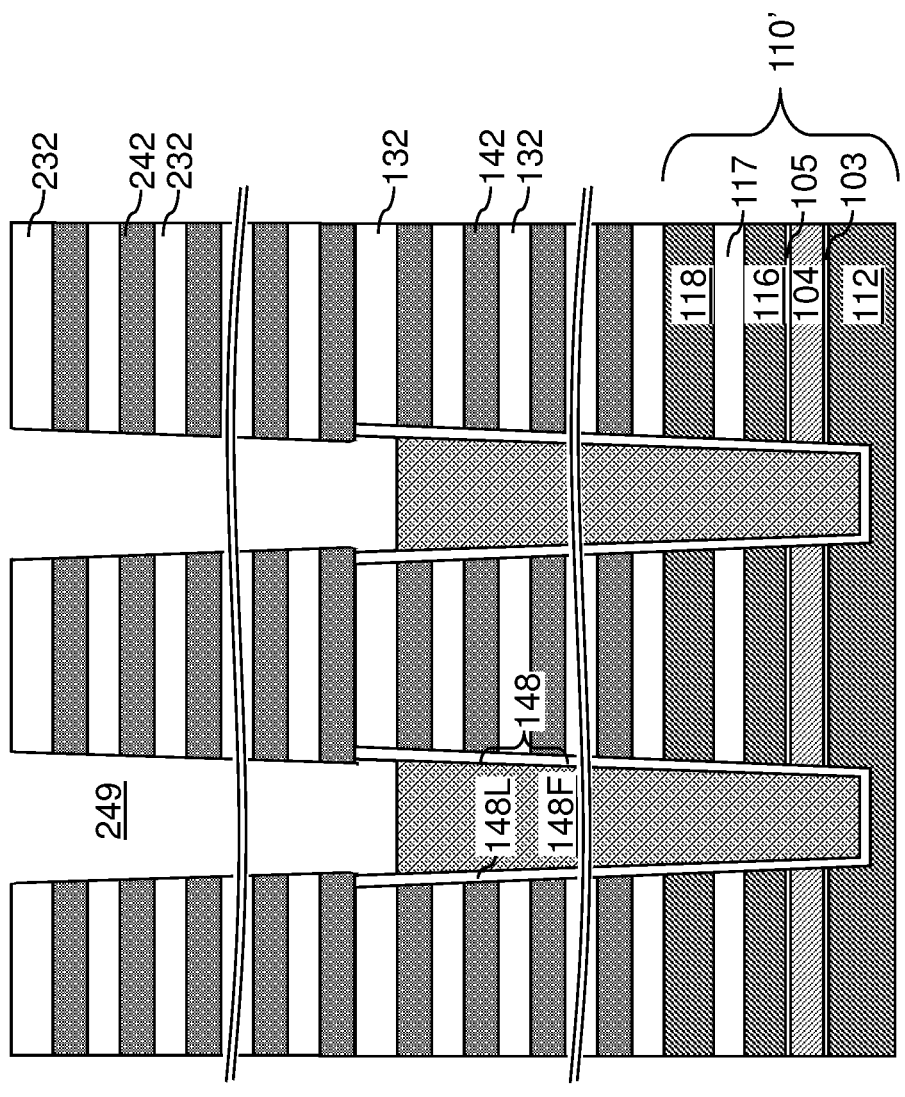

Referring to FIG. 10C, a selective etch process can be performed to remove the first conductive material portions 148M. For example, if the first conductive material portions 148M comprise tungsten, then a sulfuric acid and/or hydro-gen peroxide based wet etch process can be performed, which etches the conductive material of the first conductive material portions 148M selective to the materials of the second insulating layers 232 and the second sacrificial material layers 242 and the first carbon-based fill material portions 148F. In another example, if the first conductive material portions 148M comprise ruthenium or titanium silicide, then a reactive ion etch process using respective oxygen and chlorine chemistry or fluorocarbon chemistry can be performed, which etches the conductive material of the first conductive material portions 148M selective to the materials of the second insulating layers 232 and the second sacrificial material layers 242 and the first carbon-based fill material portions 148F.

Figure 10D:
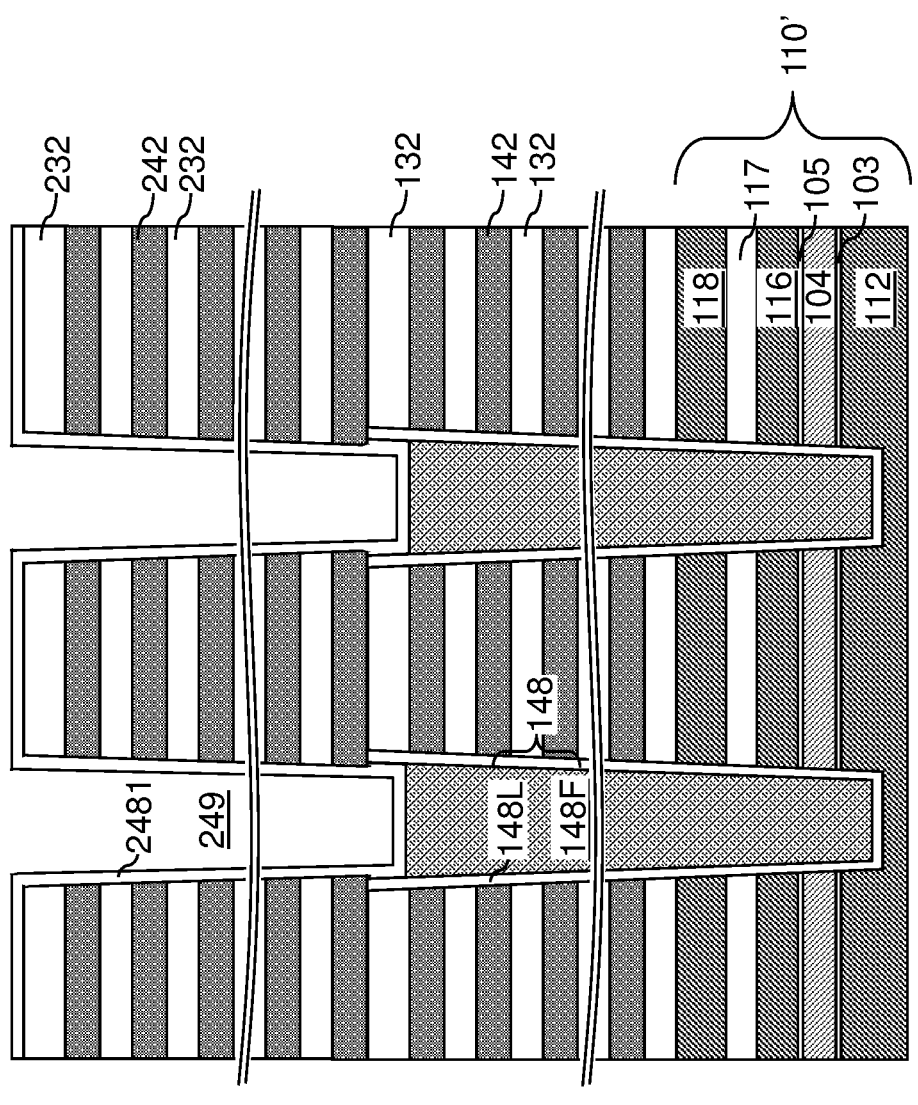

Referring to FIG. 10D, a second dielectric liner layer 2481 can be formed employing a conformal deposition process. The second dielectric liner layer 2481 includes a dielectric material such as silicon oxide, and can have a thickness in a range from 2 nm to 12 nm, such as from 3 nm to 8 nm, although lesser and greater thicknesses may also be employed.

Figure 10E:
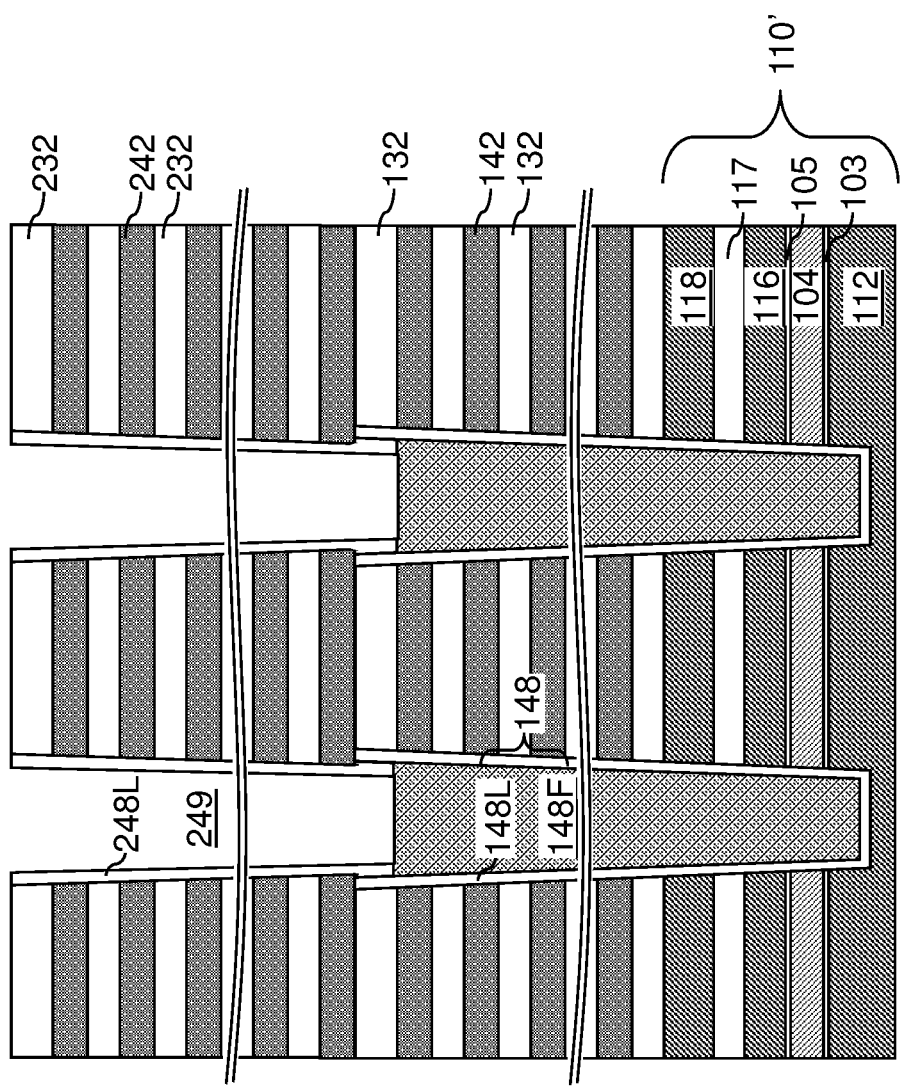

Referring to FIG. 10E, an anisotropic etch process can be performed to remove horizontally-extending portions of the second dielectric liner layer 2481. Each remaining portion of the of the second dielectric liner layer 2481 that remains in a second-tier memory opening 249 or in a second-tier support opening 229 constitutes a second dielectric liner 248L. Each second dielectric liner 248L may have a tubular configuration. A top surface of a first carbon-based fill material portion 148F can be physically exposed at the bottom of each cavity in the second-tier memory openings 249 and the second-tier support openings 229.

Figure 10F:
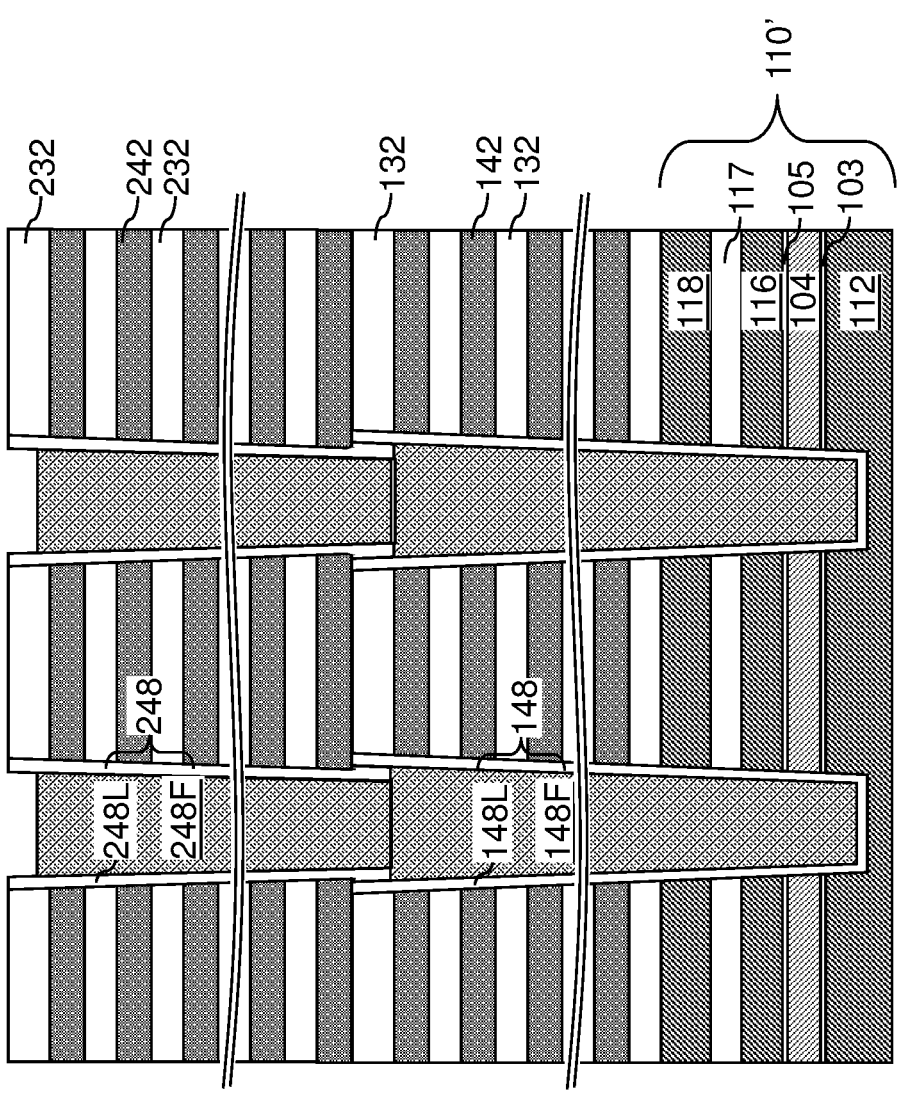

Referring to FIG. 10F, a second carbon-based fill material can be deposited in unfilled volumes of the second-tier memory openings 249 and the second-tier support openings 229. The second carbon-based fill material comprises carbon at an atomic percentage greater than 50%. For example, the second carbon-based fill material may comprise, and/or may consist essentially of, amorphous carbon, diamond-like carbon, or doped derivatives therefrom. Excess portions of the second carbon-based fill material can be removed from above the top surface of the horizontally-extending portion of the second dielectric liner layer 2481 by performing a recess etch process. The duration of the recess etch process can be selected such that top surfaces of remaining portions of the second carbon-based fill material are formed underneath the horizontal plane including the topmost surface of the second-tier alternating stack (232, 242). Each remaining portion of the second carbon-based fill material in the second-tier memory openings 249 and the second-tier support openings 229 constitutes a second carbon-based fill material portion 248F. The vertical distance between the horizontal plane including the topmost surface of the second-tier alternating stack (232, 242) and the top surfaces of the second carbon-based fill material portions 248F may be in a range from 10 nm to 200 nm, such as from 20 nm to 100 nm, although lesser and greater vertical distances may also be employed. Generally, the second carbon-based fill material portions 248F are formed by depositing a second carbon-based fill material in the second-tier memory opening 249 and over the second-tier alternating stack (232, 242), and by removing portions of the second carbon-based fill material at least from above the second-tier alternating stack (232, 242) and by recessing the second carbon-based fill material in upper portions of the second-tier memory openings 249 and the second-tier support openings 229.

Figure 10G:
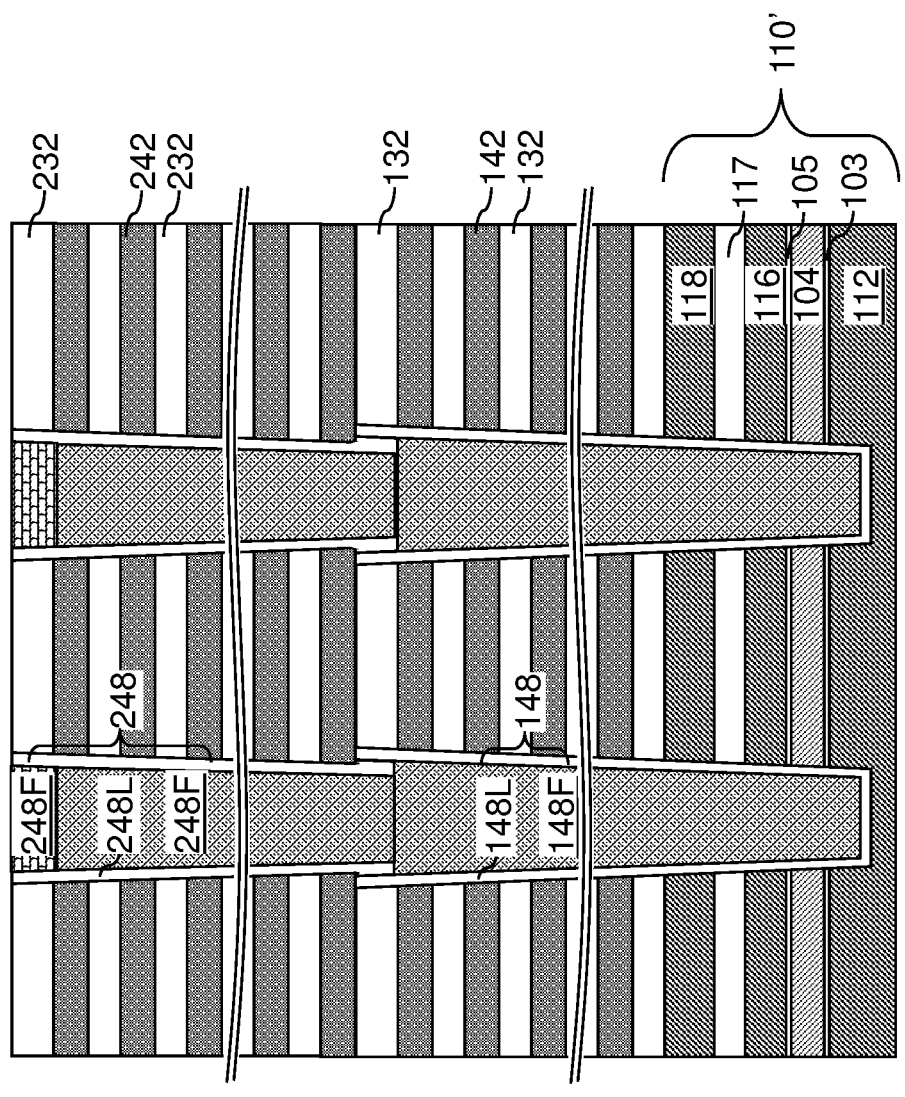

Referring to FIG. 10G, a second conductive material can be deposited in the voids overlying the second-tier memory openings 249 and the second-tier support openings 229. The second conductive material comprises a transition metal or a conductive metal compound. In one embodiment, the second conductive material may comprise and/or may consist essentially of a metal, such as tungsten, molybdenum, ruthenium, cobalt, another transition metal, or alloys thereof, or a conductive compound, such as a metal silicide or metal nitride, such as titanium silicide, tungsten silicide, cobalt silicide, nickel silicide, titanium nitride, tantalum nitride, molybdenum nitride, tungsten nitride etc. The second conductive material may also comprise plural conductive layers, such as titanium nitride and tungsten layers.

Portions of the second conductive material that overlie the horizontal plane including the top surface of the topmost layer of the second-tier alternating stack (232, 242) can be removed by performing a planarization process such as a chemical mechanical polishing (CMP) process and/or a recess etch process. Each remaining portion of the second conductive material constitutes a second conductive material portion 248M. Generally, the second conductive material portions 248M can be formed by depositing a layer of the second conductive material over the second carbon-based fill material portions 248F, and by removing a portion of the layer of the second conductive material from above the horizontal plane including a top surface of the second-tier alternating stack (232, 242) by performing a planarization process, which may comprise a chemical mechanical polishing process and/or a recess etch process. A second dielectric liner 248L is located on a sidewall of a respective one of the second-tier memory openings 249 and the second-tier support openings 229.

Generally, a sacrificial second-tier memory opening fill structure 248 is formed in each second-tier memory opening 249, and a sacrificial second-tier support opening fill structure is formed in each second-tier support openings 229. Each of the sacrificial second-tier memory opening fill structures 248 and the sacrificial second-tier support opening fill structures comprises an optional second dielectric liner 248L and a stack of a second carbon-based fill material portion 248F and a second conductive material portion 248M. In one embodiment, a sacrificial second-tier memory opening fill structure 248 comprising a stack of a second carbon-based fill material portion 248F and a second conductive material portion 248M can be formed in an upper portion of each second-tier memory opening 249 after removing the first conductive material portion 148M selective to the first carbon-based fill material portion 148F.

FIGS. 11A-11G are vertical cross-sectional views of first-tier memory openings 149 and second-tier memory openings 249 during formation of sacrificial second-tier memory opening fill structures 248 in the second configuration of the first exemplary structure according to the first embodiment of the present disclosure.

Figure 11A:
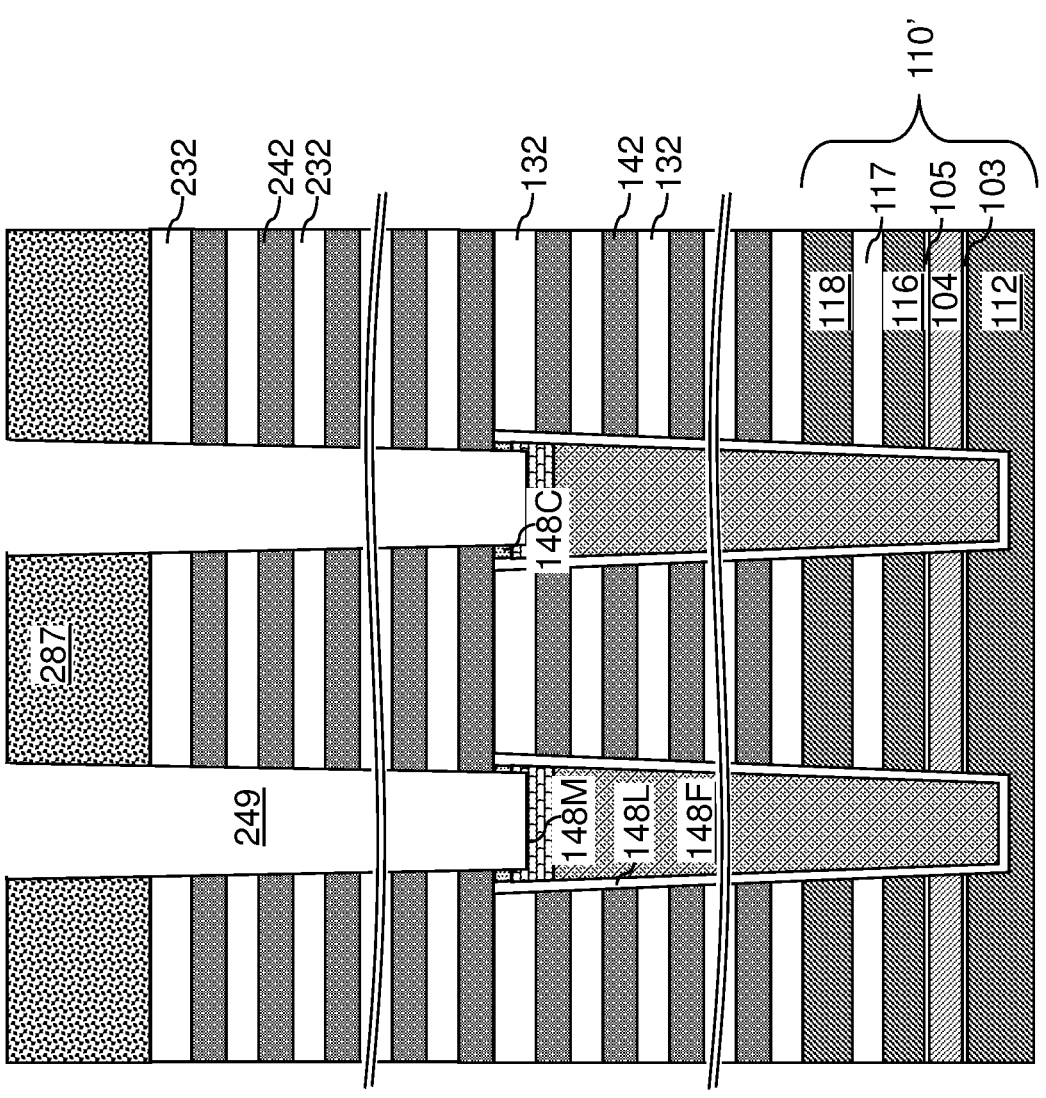
FIGS. 11A-11G are vertical cross-sectional views of first-tier memory openings and second-tier memory openings during formation of sacrificial second-tier memory opening fill structures in the second configuration of the first exemplary structure according to the first embodiment of the present disclosure.

Referring to FIG. 11A, the second configuration of the first exemplary structure is illustrated after the anisotropic etch process described with reference to FIGS. 9A and 9B. In this case, the first carbon-based capping material portions 148C may be etched through by the anisotropic etch process that forms the second-tier memory openings 249 and the second-tier support openings 229. The first conductive material portions 148M can be employed as etch stop structures for the anisotropic etch process that forms the second-tier memory openings 249.

Figure 11B:
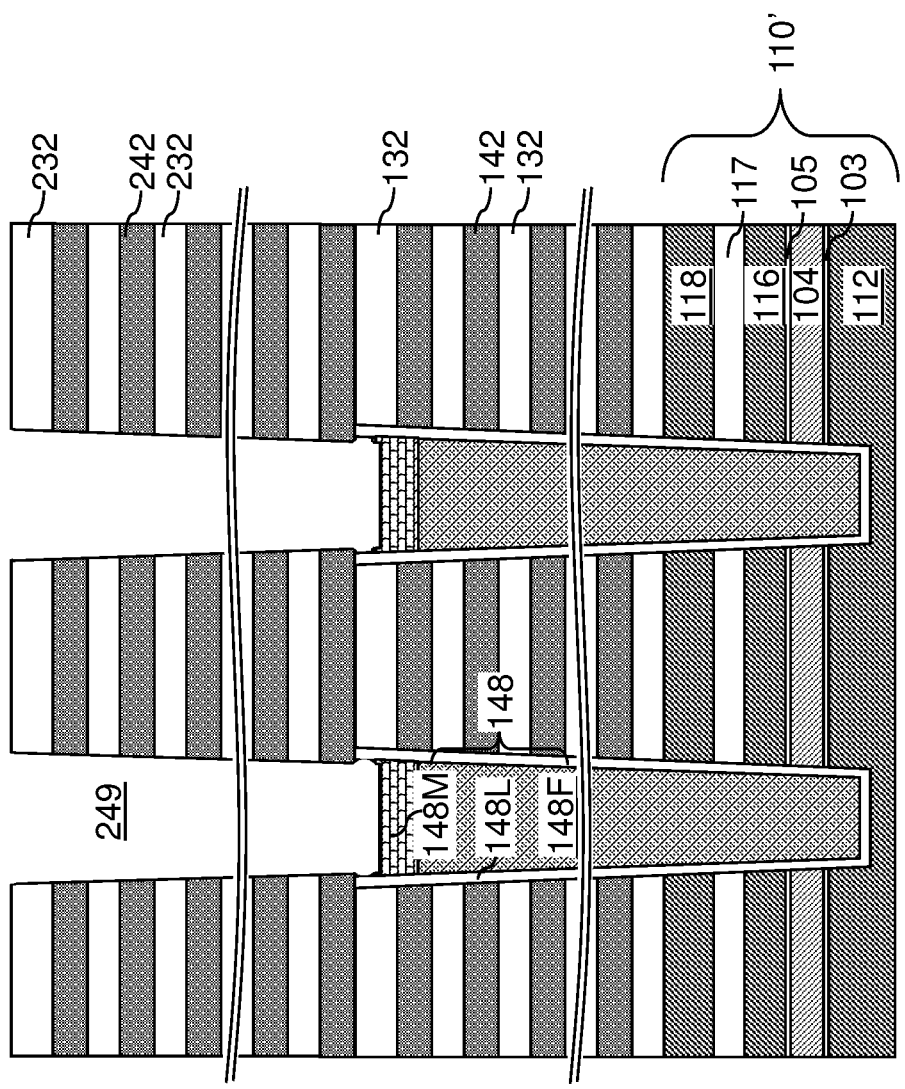

Referring to FIG. 11B, the processing steps described with reference to FIG. 10B can be performed to laterally expand the second-tier memory openings 249 and the second-tier support openings 229. The patterned etch mask layer 287 and remaining portions of the first carbon-based capping material portions 148C can be subsequently removed, for example, by ashing.

Figure 11C:
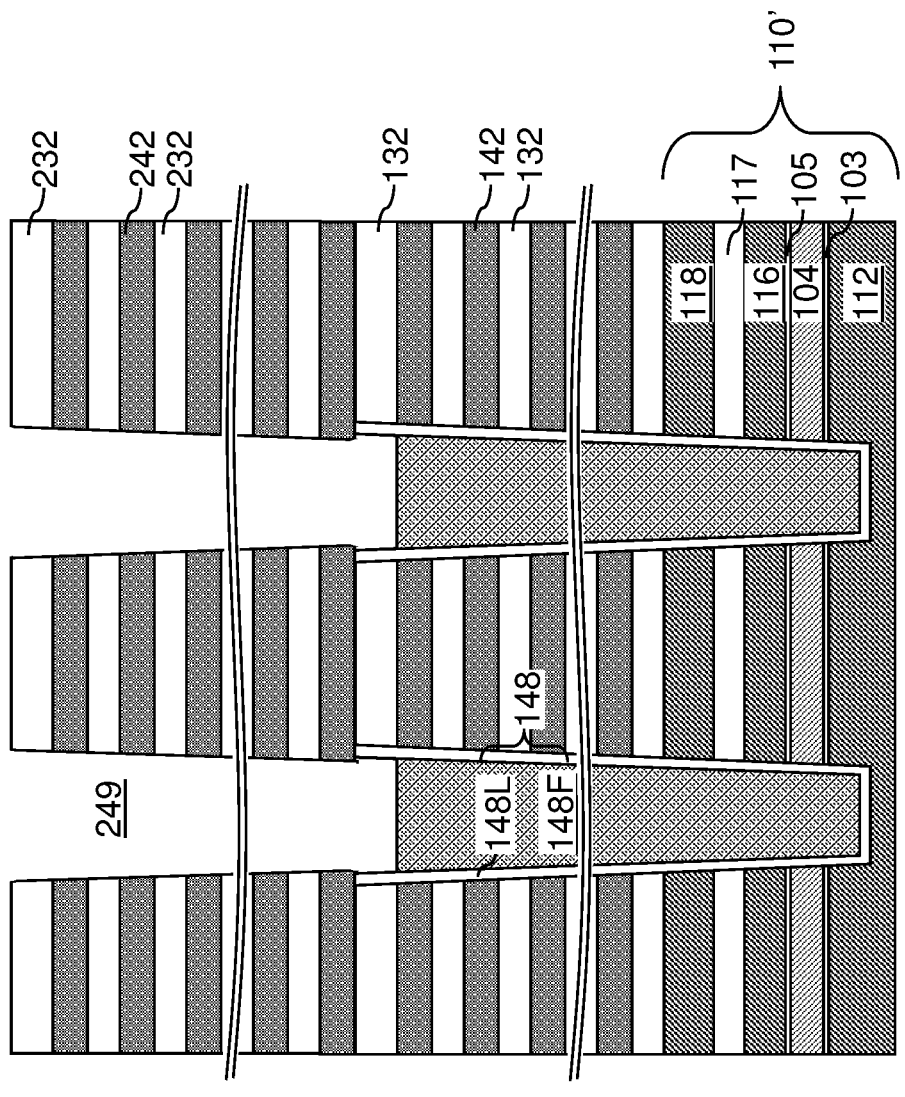

Referring to FIG. 11C, the processing steps described with reference to FIG. 10C can be performed to remove the first conductive material portions 148M.

Figure 11D:
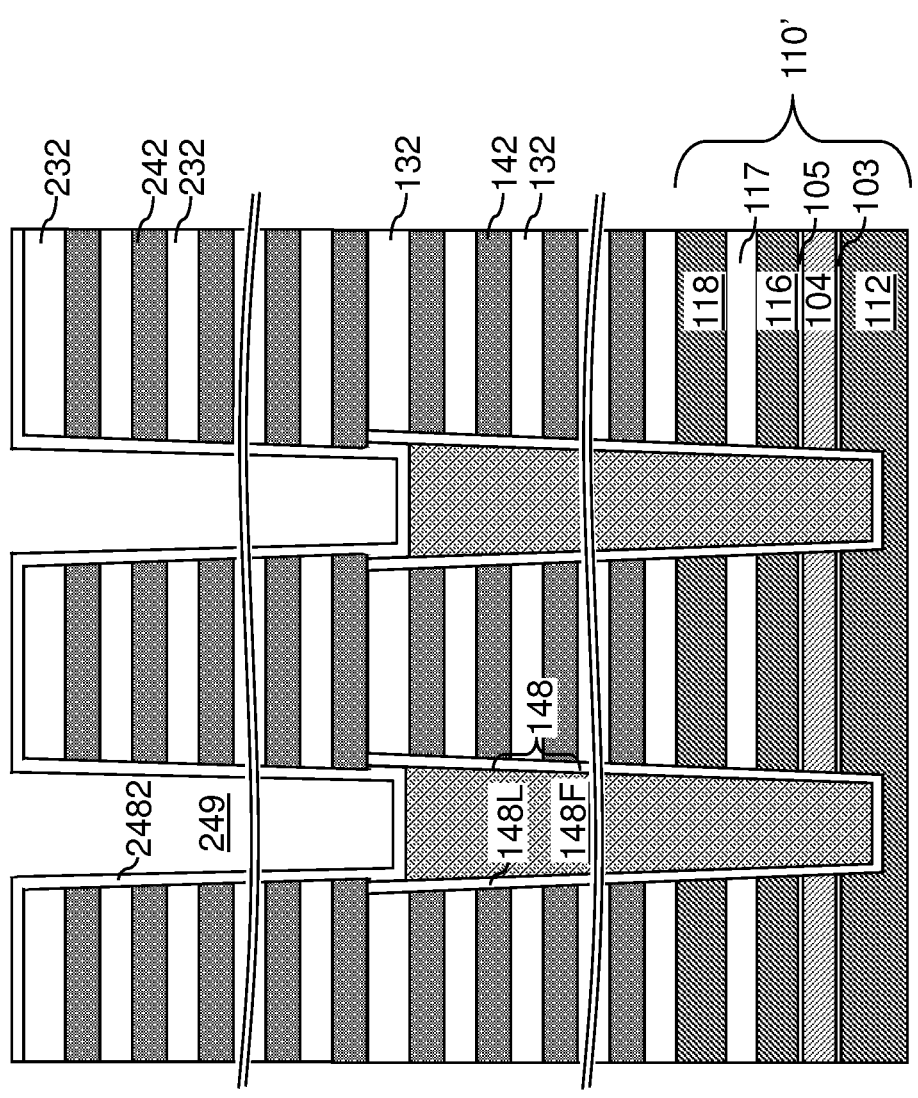

Referring to FIG. 11D, the processing steps described with reference to FIG. 10D can be performed to form a second dielectric liner layer 2481.

Figure 11E:
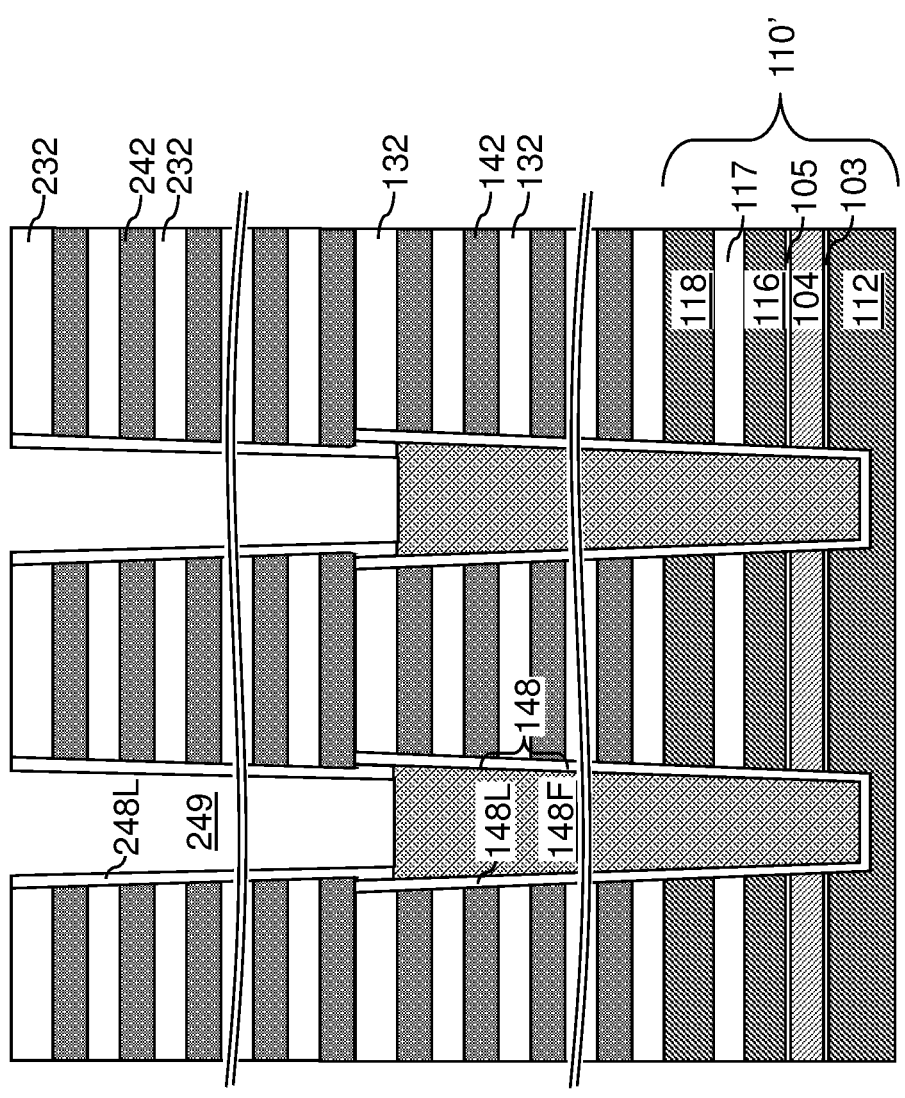

Referring to FIG. 11E, the processing steps described with reference to FIG. 10E can be performed to remove horizontally-extending portions of the second dielectric liner layer 248I. Each remaining portion of the of the second dielectric liner layer 248I that remains in a second-tier memory opening 249 or in a second-tier support opening 229 constitutes a second dielectric liner 248L.

Figure 11F:
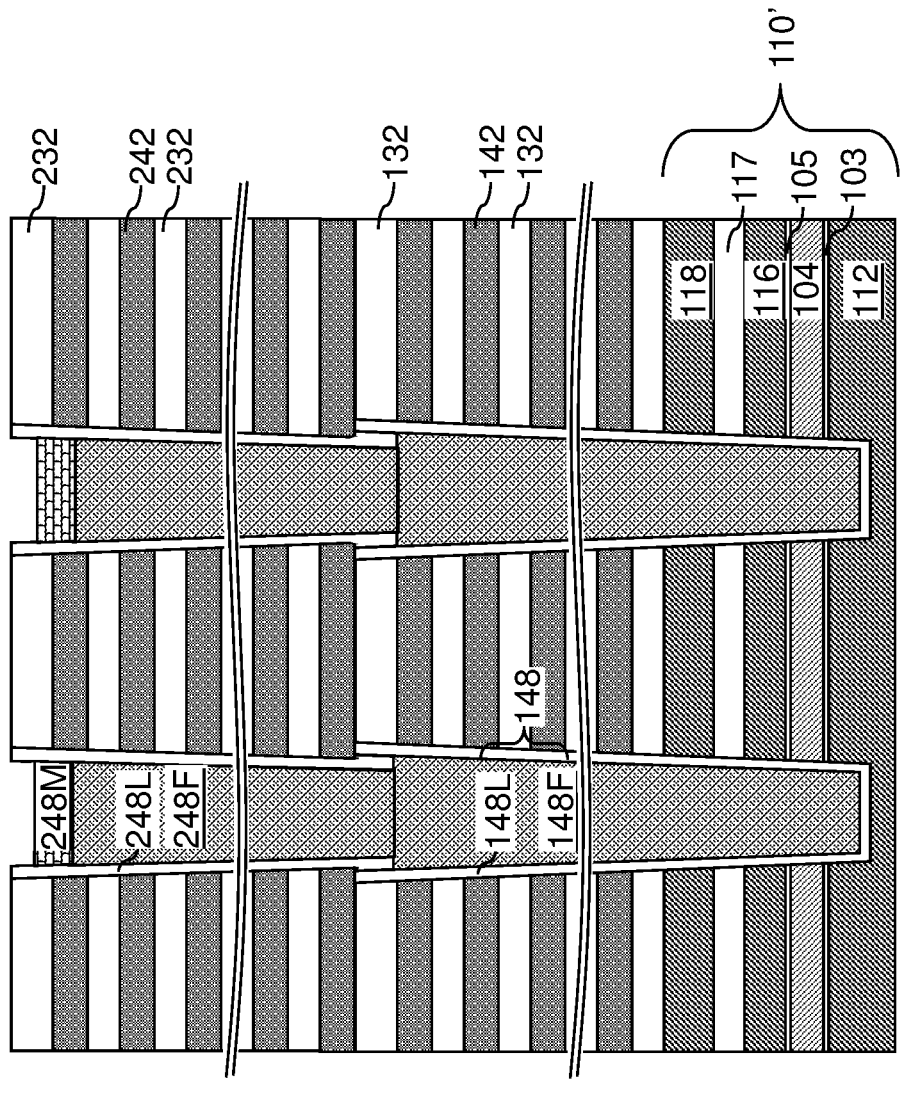

Referring to FIG. 11F, the processing steps described with reference to FIG. 10F can be performed to form second carbon-based fill material portions 248F.

Subsequently, the processing steps described with reference to FIG. 10G can be performed to deposit a second conductive material. Portions of the second conductive material that overlie the horizontal plane including the top surface of the topmost layer of the second-tier alternating stack (232, 242) can be removed by performing a planarization process such as a chemical mechanical polishing (CMP) process and/or a recess etch process. Each remaining portion of the second conductive material constitutes a second conductive material portion 248M.

The second conductive material portions 248M can be thinned (i.e., recessed) by performing a recess etch process that etches the second conductive material selective to the material of the second-tier insulating layers 232. The second conductive material can be vertically recessed below the horizontal plane including the topmost surface of the second-tier alternating stack (232, 242). The recess depth of the top surfaces of the second conductive material portion 248M relative to the horizontal plane including the topmost surface of the second-tier alternating stack (232, 242) may be in a range from 10 nm to 200 nm, such as from 20 nm to 100 nm, although lesser and greater vertical distances may also be employed. Generally, the second conductive material portions 248M can be formed by depositing a layer of the second conductive material over the second carbon-based fill material portions 248F, and by removing a portion of the layer of the second conductive material from above the horizontal plane including a top surface of the second-tier alternating stack (232, 242) and from upper portions of the second-tier memory openings 249 and the second-tier support openings 229.

Figure 11G:
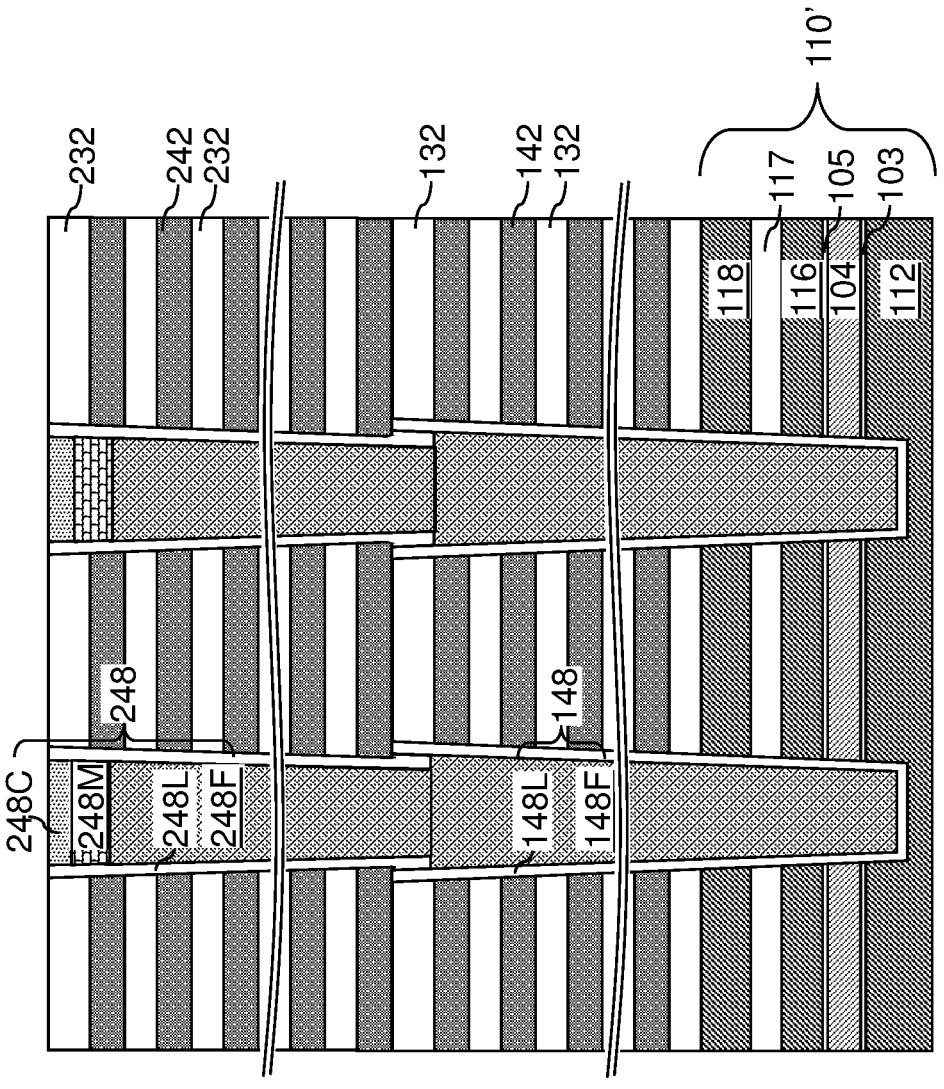

Referring to FIG. 11G, a second carbon-based capping material that comprises carbon at an atomic percentage greater than 50% can be deposited in the recess cavities overlying the thinned second conductive material portions 248M, and can be subsequently recessed to form a second carbon-based capping material portion 248C. The carbon-based capping material portion may be selected from any material that may be employed for the material of the second carbon-based fill material of the second carbon-based fill material portions 248F. Each second carbon-based capping material portion 248C can be formed on a top surface of a respective one of the thinned second conductive material portions 248M. In one embodiment, the top surfaces of the second carbon-based capping material portions 248C can be formed at, or about, the horizontal plane including the topmost surface of the second-tier alternating stack (232, 242). A stack of a second carbon-based fill material portion 248F, a second conductive material portion 248M, and a second carbon-based capping material portion 248C can be formed inside, and on an inner sidewall of, each second dielectric liner 248L.

Generally, a sacrificial second-tier memory opening fill structure 248 is formed in each second-tier memory opening 249, and a sacrificial second-tier support opening fill structure is formed in each second-tier support openings 229. Each of the sacrificial second-tier memory opening fill structures 248 and the sacrificial second-tier support opening fill structures comprises an optional second dielectric liner 248L and a stack of a second carbon-based fill material portion 248F, a second conductive material portion 248M, and a second carbon-based capping material portion 248C.

Figure 12:
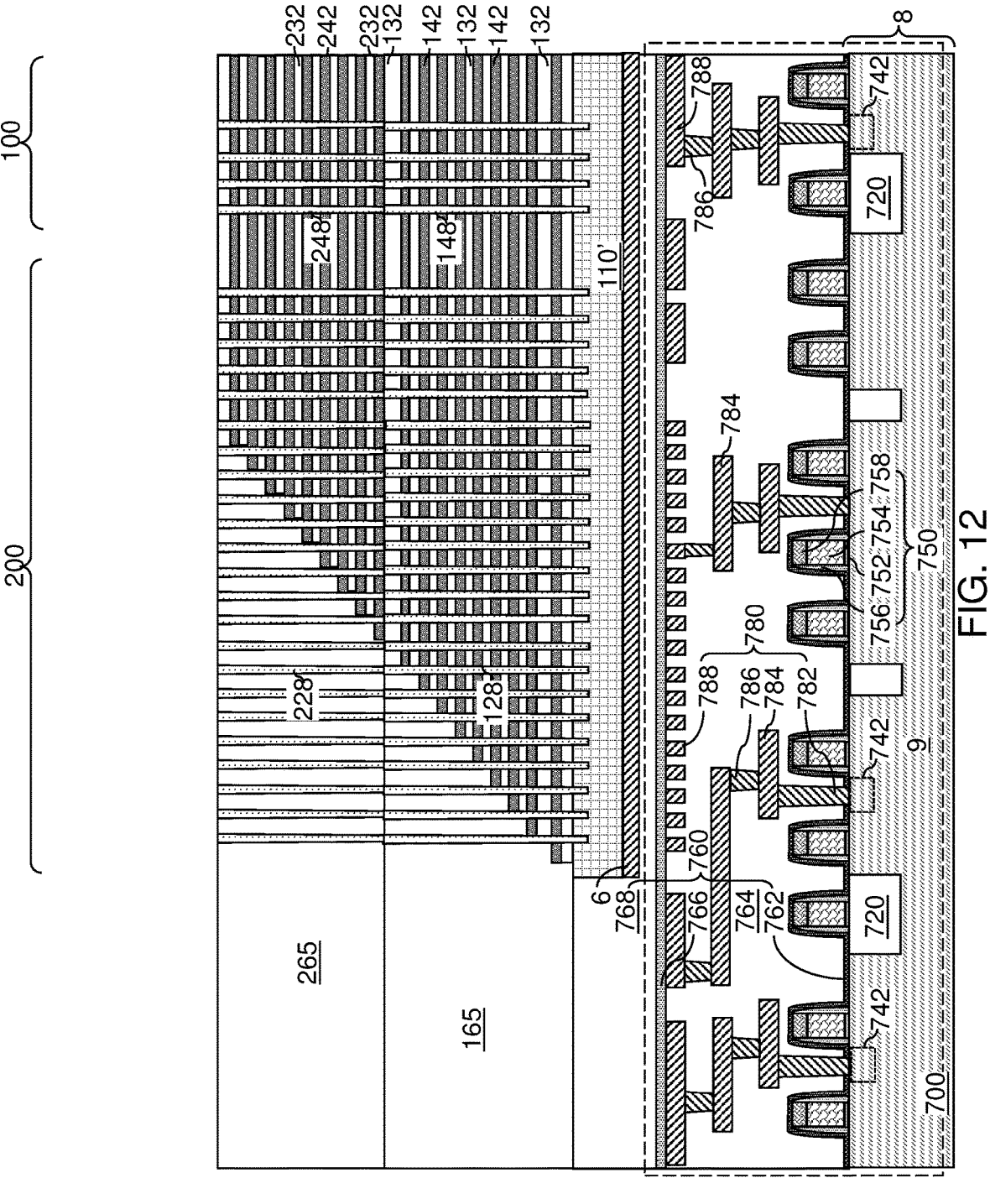
FIG. 12 is a vertical cross-sectional view of the first exemplary structure after formation of sacrificial second-tier memory opening fill structures and sacrificial second-tier support opening fill structures according to the first embodiment of the present disclosure.

Referring to FIG. 12, the first exemplary structure is illustrated after formation of sacrificial second-tier opening fill structures (248, 228) in the second-tier openings (249, 229). Each second-tier memory opening 249 is filled with a sacrificial second-tier memory opening fill structure 248, and each second-tier support opening 229 is filled with a sacrificial second-tier support opening fill structure 128.

Figure 13:
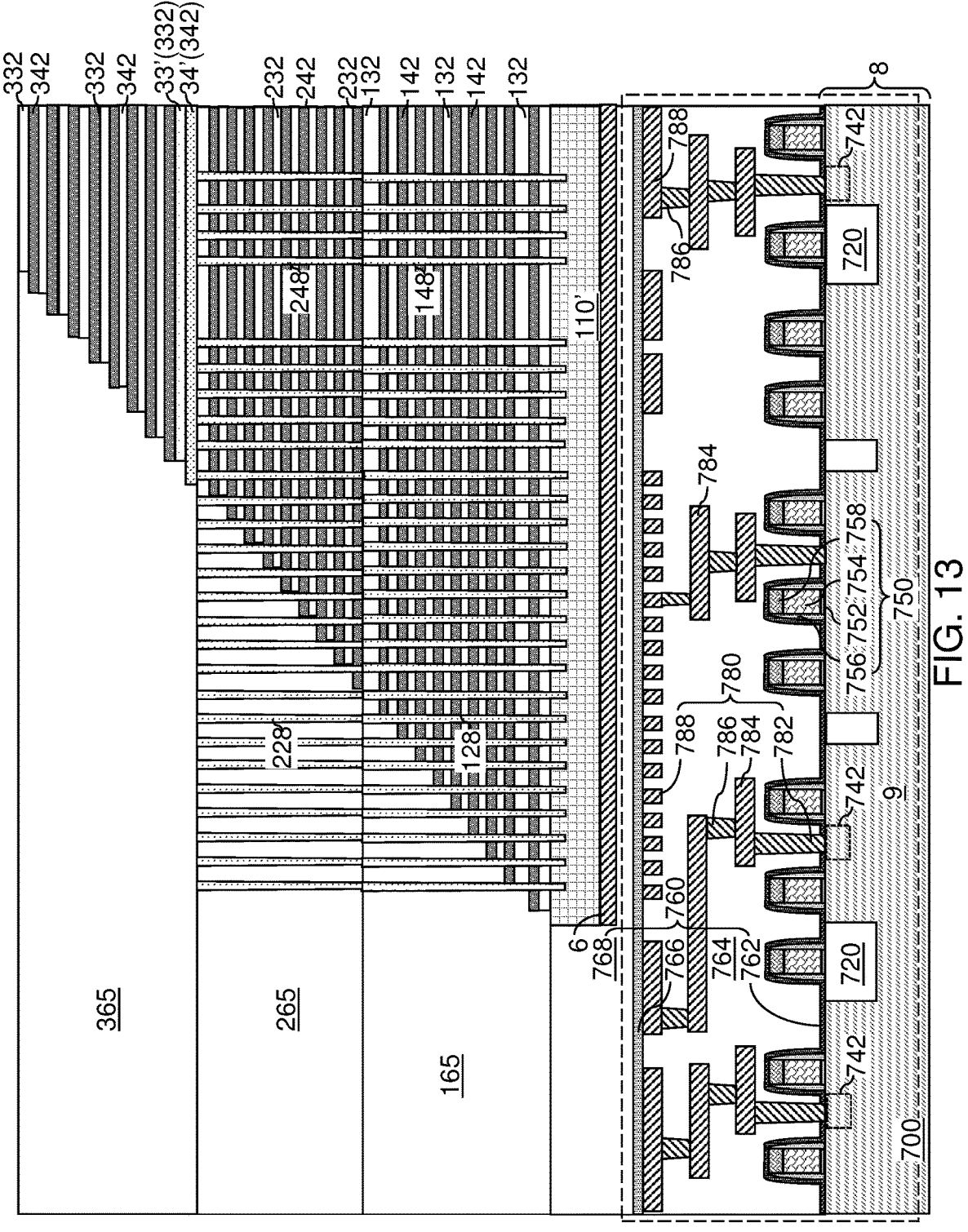
FIG. 13 is a vertical cross-sectional view of the first exemplary structure after formation of a third vertically alternating sequence of third insulating layers and third spacer material layers, third stepped surfaces, a third retro-stepped dielectric material portion, and drain-select-level isolation structures according to the first embodiment of the present disclosure.

Referring to FIG. 13, a third-tier structure can be formed over the second-tier structure (232, 242, 265, 248, 228). The third-tier structure can include an additional vertically alternating sequence of additional insulating layers and additional spacer material layers, which can be additional sacrificial material layers. The third vertically alternating sequence is also referred to as a third alternating stack. For example, a third alternating stack (332, 342) of material layers can be subsequently formed on the top surface of the second alternating stack (232, 242). The third alternating stack (332, 342) includes an alternating plurality of fifth material layers and sixth material layers. Each fifth material layer can include a fifth material, and each sixth material layer can include a sixth material that is different from the fifth material. In one embodiment, the fifth material can be the same as the first material of the first insulating layers 132, and the sixth material can be the same as the second material of the first sacrificial material layers 142.

In one embodiment, the third material layers can be third insulating layers 332 and the fourth material layers can be third spacer material layers that provide vertical spacing between each vertically neighboring pair of the third insulating layers 332. In one embodiment, the third material layers and the fourth material layers can be third insulating layers 332 and third sacrificial material layers 342, respectively. The third material of the third insulating layers 332 may be at least one insulating material. The fourth material of the third sacrificial material layers 342 may be a sacrificial material that can be removed selective to the third material of the third insulating layers 332. The third sacrificial material layers 342 may comprise an insulating material, a semiconductor material, or a conductive material. The fourth material of the third sacrificial material layers 342 can be subsequently replaced with electrically conductive electrodes which can function, for example, as control gate electrodes of a vertical NAND device.

In one embodiment, each third insulating layer 332 can include a third insulating material, and each third sacrificial material layer 342 can include a third sacrificial material. In this case, the third alternating stack (332, 342) can include an alternating plurality of third insulating layers 332 and third sacrificial material layers 342. The third material of the third insulating layers 332 can be deposited, for example, by chemical vapor deposition (CVD). The fourth material of the third sacrificial material layers 342 can be formed, for example, CVD or atomic layer deposition (ALD).

The fifth material of the third insulating layers 332 can be at least one insulating material. Insulating materials that can be employed for the third insulating layers 332 can be any material that can be employed for the second insulating layers 232. The sixth material of the third sacrificial material layers 342 is a sacrificial material that can be removed selective to the fifth material of the third insulating layers 332. Sacrificial materials that can be employed for the third sacrificial material layers 342 can be any material that can be employed for the second sacrificial material layers 242. In one embodiment, the third insulating material can be the same as the second insulating material, and the third sacrificial material can be the same as the second sacrificial material.

The thicknesses of the third insulating layers 332 and the third sacrificial material layers 342 can be in a range from 30 nm to 50 nm, although lesser and greater thicknesses can be employed for each third insulating layer 332 and for each third sacrificial material layer 342. The number of repetitions of the pairs of a third insulating layer 332 and a third sacrificial material layer 342 can be in a range from 3 to 1,024, and typically from 8 to 356, although a greater number of repetitions can also be employed. In one embodiment, each third sacrificial material layer 342 in the third alternating stack (332, 342) can have a uniform thickness that is substantially invariant within each respective third sacrificial material layer 342.

Third stepped surfaces can be formed in the third stepped area of the staircase region 200 employing a same set of processing steps as the processing steps employed to form the second stepped surfaces in the second stepped area with suitable adjustment to the pattern of at least one masking layer. A third retro-stepped dielectric material portion 365 can be formed over the third stepped surfaces in the staircase region 300.

Optionally, drain-select-level isolation structures (not illustrated) can be formed through a subset of layers in an upper portion of the third vertically alternating sequence (332, 342). The third sacrificial material layers 342 that are cut by the select-drain-level shallow trench isolation structures correspond to the levels in which drain-select-level electrically conductive layers are subsequently formed. The drain-select-level isolation structures include a dielectric material such as silicon oxide. The drain-select-level isolation structures can laterally extend along a first horizontal direction hd1, and can be laterally spaced apart along a second horizontal direction hd2 that is perpendicular to the first horizontal direction hd1.

In some embodiments, a bottommost third insulating layer 33' may comprise an insulating material having a higher etch rate than the rest of the third insulating layers 332, and a bottommost third sacrificial material layer 34' may comprise a sacrificial material having a higher etch rate than the rest of the third sacrificial material layers 342. In one embodiment, all of the third insulating layers 332 other than a bottommost third insulating layer 33' comprise a first silicon oxide material, and the bottommost third insulating layer 33' comprises a second silicon oxide material having a higher etch rate in dilute hydrofluoric acid than the first silicon oxide material. For example, the second silicon oxide material may comprise dopants such as boron and/or phosphorus, and/or may be formed employing a different process parameter during a deposition process (such as temperature, pressure, RF power, etc.). In one embodiment, all of the third spacer material layers (such as the third sacrificial material layers 342) other than a bottommost third spacer material layer (such as a bottommost third sacrificial material layer 34') comprises a first silicon nitride material, and the bottommost third spacer material layer 34' comprises a second silicon nitride material having a higher etch rate in hot phosphoric acid than the first silicon nitride material. For example, the second silicon nitride material may be formed employing a different process parameter during a deposition process (such as temperature, pressure, RF power, etc.). Compositional changes in the bottommost third insulating layer 33' and/or the bottommost third sacrificial material layer 34' may be advantageously employed to induce formation of lateral protrusions in memory opening fill structures to enhance electrical properties of vertical semiconductor channels to be subsequently formed.

Figure 14:
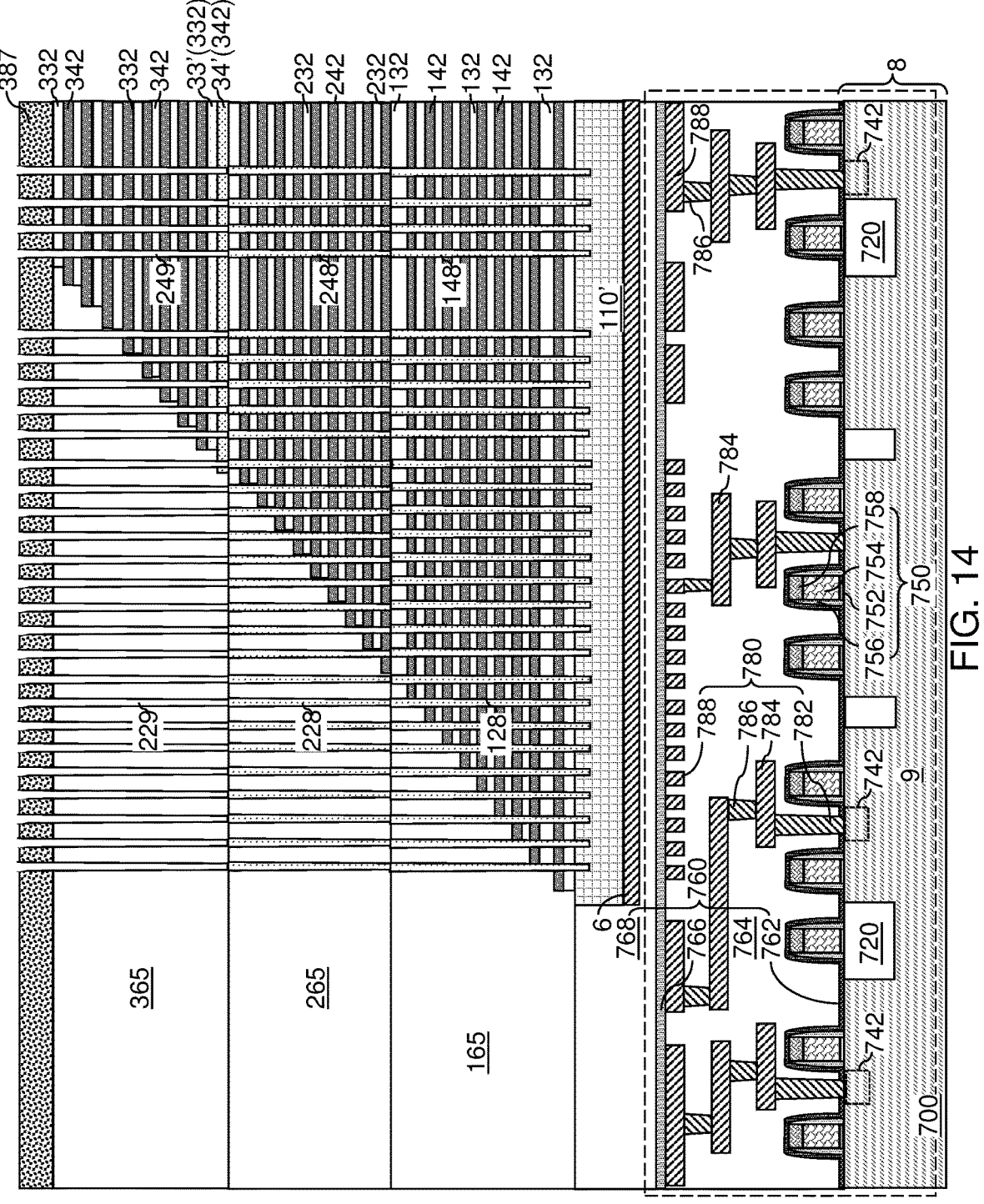
FIG. 14 is a vertical cross-sectional view of the first exemplary structure after formation of third-tier memory openings and third-tier support openings according to the first embodiment of the present disclosure.

Referring to FIG. 14, a patterned etch mask layer 387 can be formed over the third-tier alternating stack (332, 342) and the third retro-stepped dielectric material portion 365. For example, a blanket etch mask material layer comprising a carbon-based material (such as a patterning film material) can be applied over the third-tier alternating stack (332, 342) and the third retro-stepped dielectric material portion 365. In one embodiment, the carbon-based material of the blanket etch mask material layer may comprise amorphous carbon, diamond-like carbon, or doped derivatives therefrom. A photoresist layer (not shown) can be applied over the blanket etch mask material layer, and can be lithographically patterned to form openings that have the same pattern as the pattern of the first-tier openings (149, 129) that are formed at the processing steps of 4A and 4B, which is the same as the sacrificial first-tier opening fill structures (148, 128). Thus, the lithographic mask employed to pattern the first-tier openings (149, 129) can be employed to pattern the photoresist layer. The pattern of openings in the photoresist layer can be transferred into the blanket etch mask material layer to form the patterned etch mask layer 387. The photoresist layer may be consumed during the pattern transfer into the blanket etch mask material layer, or may be collaterally consumed during a subsequent anisotropic etch process.

The pattern in the patterned etch mask layer 387 can be transferred through the third-tier structure (332, 342, 365) by a third anisotropic etch process to form third-tier openings (349, 329). The third-tier openings (349, 329) can include third-tier memory openings 349 and third-tier support openings 329. The third-tier memory openings 349 are formed directly on a top surface of a respective one of the sacrificial second-tier memory opening fill structures 248. The third-tier support openings 329 are formed directly on a top surface of a respective one of the sacrificial second-tier support opening fill structures 228.

Generally, a patterned etch mask layer 387 can be formed over the third-tier alternating stack (332, 342), and the third-tier memory opening 349 and the third-tier support openings 329 can be formed underneath openings in the patterned etch mask layer 387 by performing an anisotropic etch process having an etch chemistry that etches materials of the third insulating layers 332 and the third spacer material layers selective to a material of the second conductive material portion 248M.

FIGS. 15A-15G are vertical cross-sectional views of first-tier memory openings 149, second-tier memory openings 249, and third-tier memory openings 349 in the first configuration of the first exemplary structure during formation of inter-tier memory openings 49 and memory opening fill structures 58 according to the first embodiment of the present disclosure.

Figure 15A:
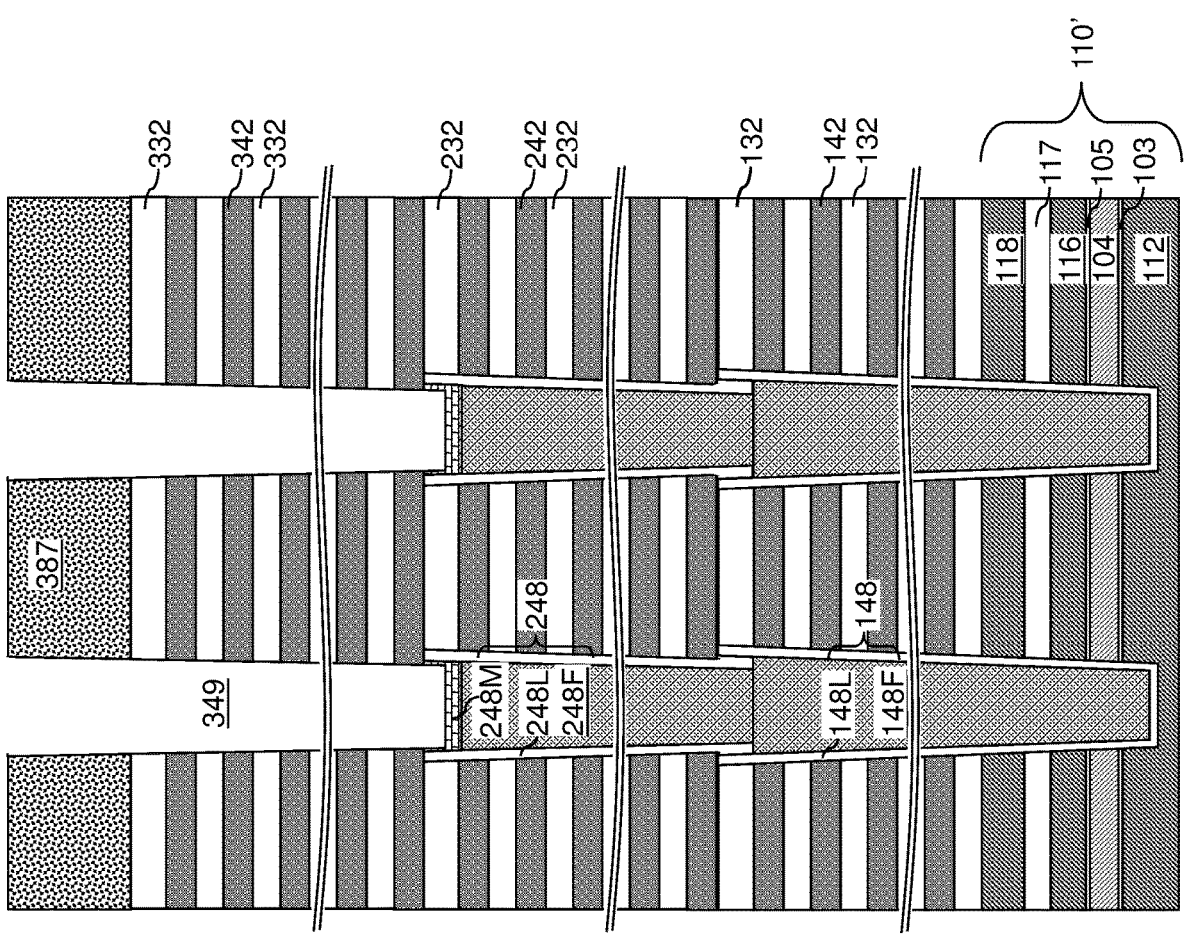
FIGS. 15A-15G are vertical cross-sectional views of first-tier memory openings, second-tier memory openings, and third-tier memory openings in the first configuration of the first exemplary structure during formation of inter-tier memory openings and memory opening fill structures according to the first embodiment of the present disclosure.

Referring to FIG. 15A, a region of the first configuration of the first exemplary structure is illustrated after formation of the third-tier memory openings 349. The second conductive material portions 248M can be employed as etch stop structures for the anisotropic etch process that forms the third-tier memory openings 349.

Figure 15B:
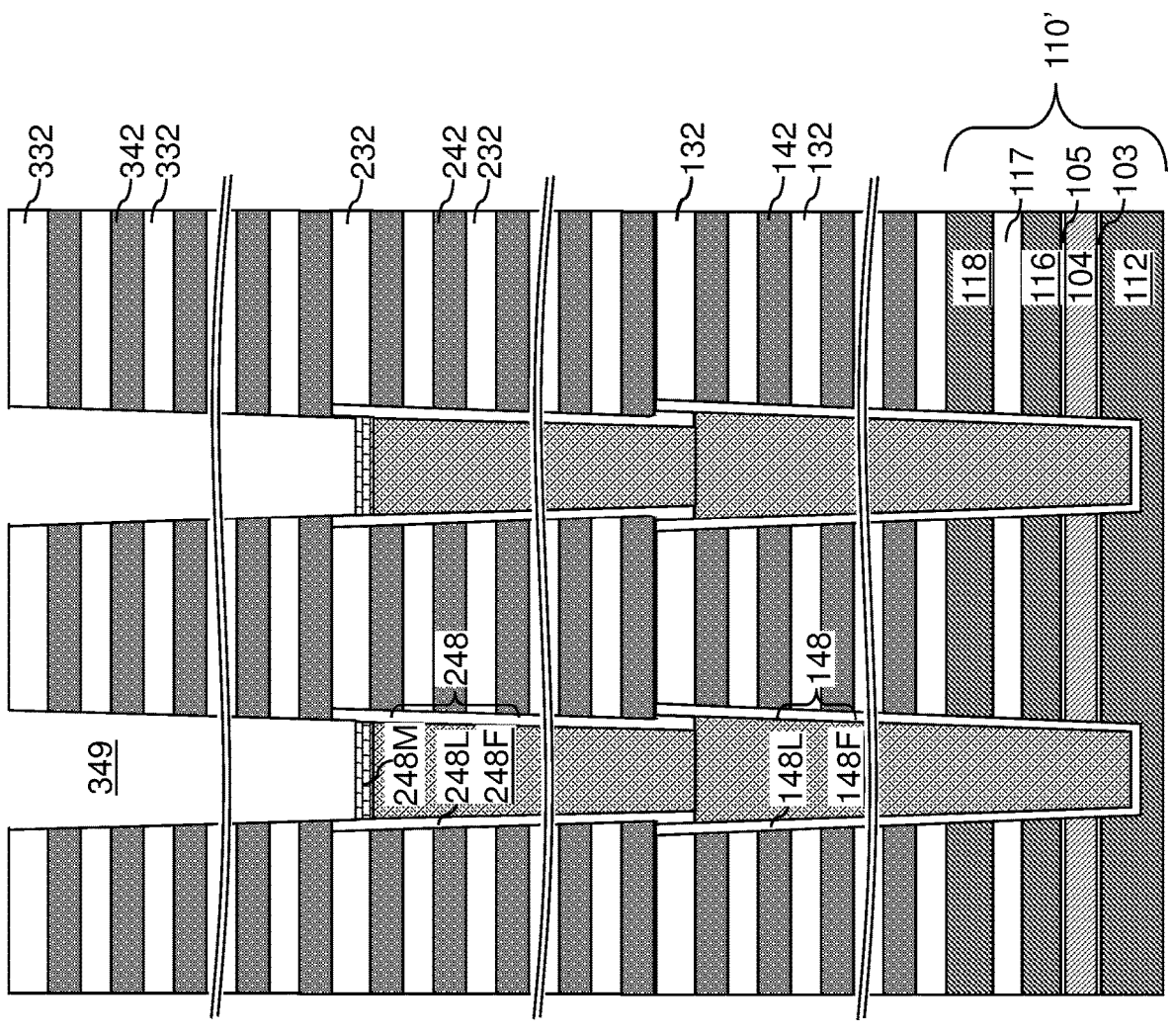

Referring to FIG. 15B, at least one isotropic etch process can be optionally performed to laterally recess the third spacer material layers (such as the third sacrificial material layers 342) and/or the third insulating layers 332. In one embodiment, the at least one isotropic etch process may comprise a first isotropic etch process that laterally recesses the third spacer material layers (such as the third sacrificial material layers 342) around the third-tier memory openings 349, and a second isotropic etch process that laterally recesses the third insulating layers 332 around the third-tier memory openings 349. For example, if the third insulating layers 332 comprise silicon oxide and the third sacrificial material layers 342 comprise silicon nitride, the first isotropic etch process may comprise a wet etch process employing hot phosphoric acid, and the second isotropic etch process may comprise a wet etch process employing dilute hydrofluoric acid. The second conductive material portions 248M blocks the etchants of the isotropic etch processes from diffusion toward the second carbon-based fill material portions 248F. Thus, the third-tier memory openings 349 can be laterally expanded without expanding any portion of the second-tier memory openings 249. The patterned etch mask layer 387 can be removed prior to, or after, the at least one isotropic etch process, for example, by performing an ashing process that volatilizes the carbon-based material of the patterned etch mask layer 387.

Figure 15C:
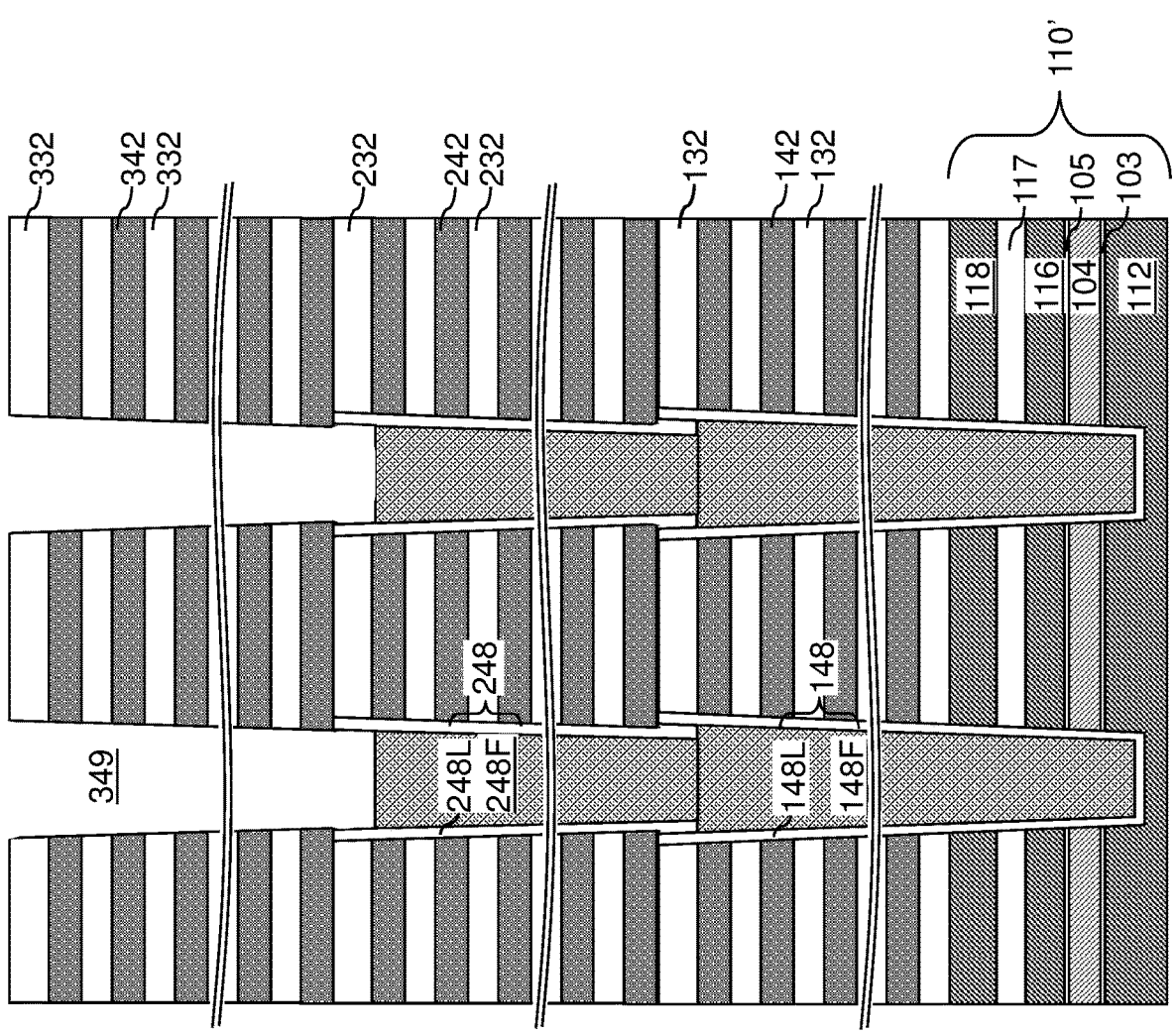

Referring to FIG. 15C, a selective etch process can be performed to remove the second conductive material portions 248M. For example, the selective etch process described above can be performed, which etches the conductive material of the second conductive material portions 248M selective to the materials of the third insulating layers 332 and the third sacrificial material layers 342 and the second carbon-based fill material portions 248F. Generally, the second conductive material portions 248M can be removed selective to the second carbon-based fill material portions 248F.

Figure 15D:
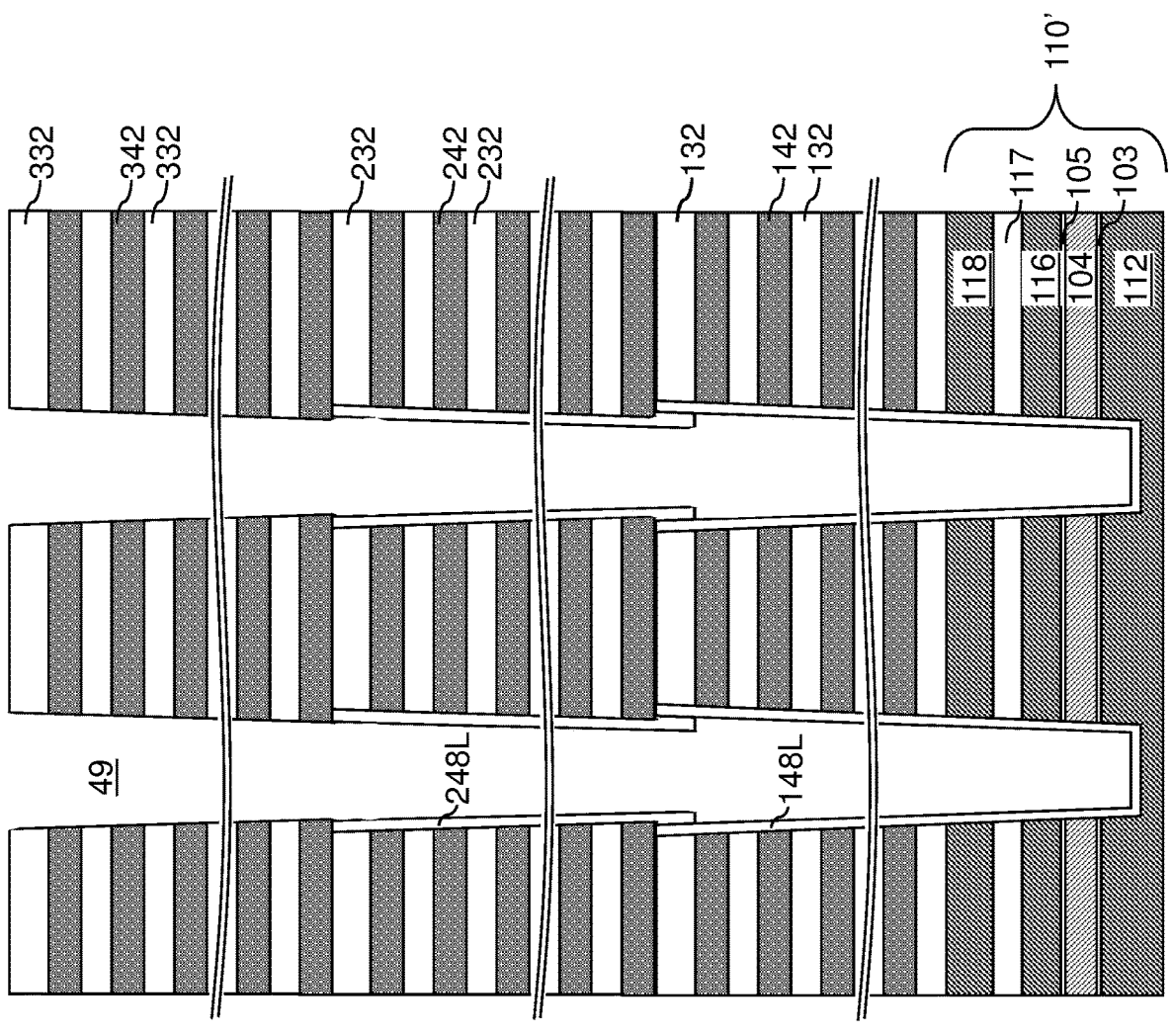

Referring to FIG. 15D, the second carbon-based fill material portions 248F and the first carbon-based fill material portions 148F can be removed, for example, by performing an ashing or selective etching process. Generally, remaining portions of the sacrificial first-tier memory opening fill structures 148 that remain after the processing steps of FIG. 15C can be removed after removing the second carbon-based fill material portion 248F.

Figure 15E:
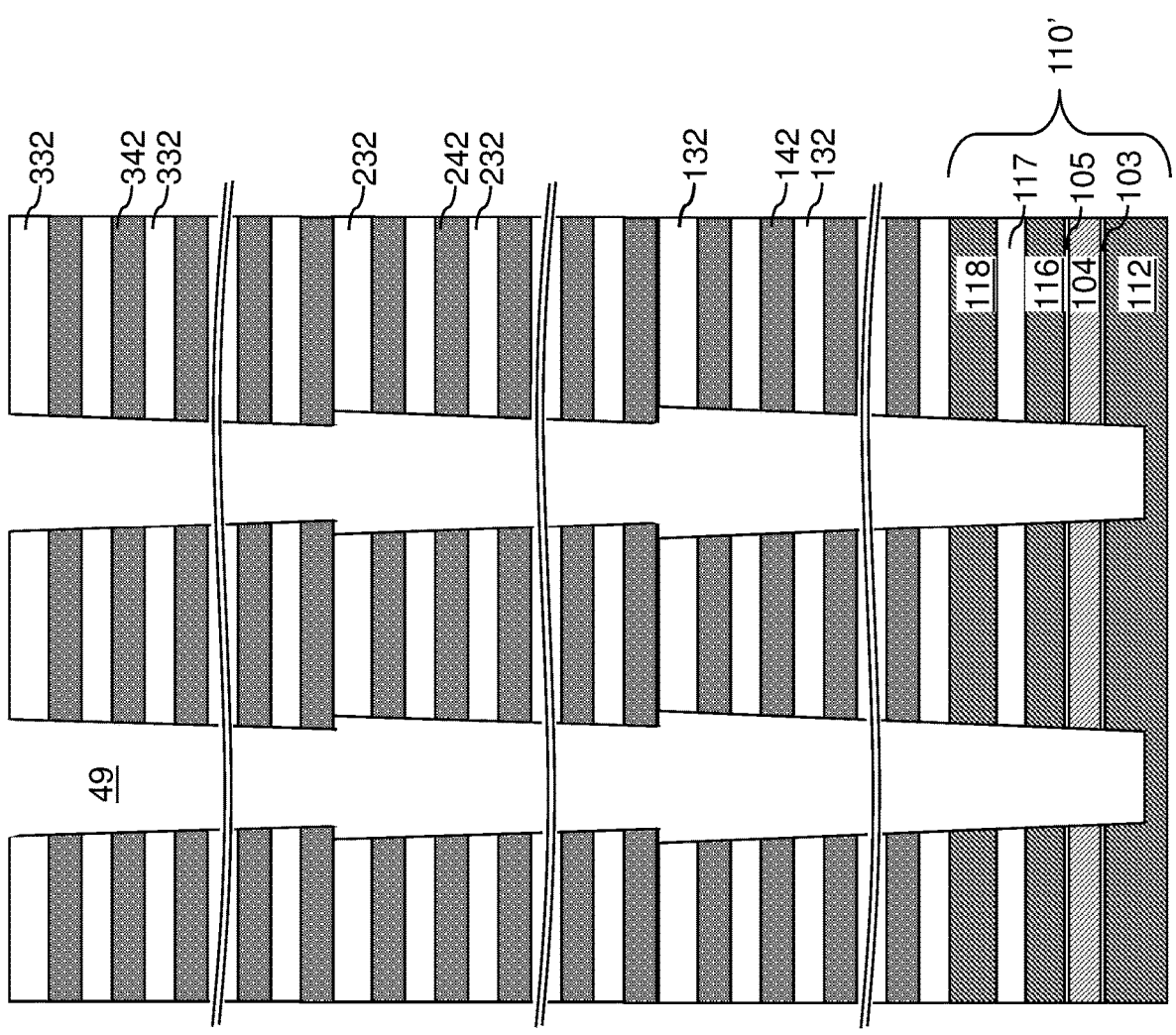

Referring to FIG. 15E, an isotropic etch process can be performed to remove the first dielectric liners 148L and the second dielectric liners 248L. In one embodiment, the first dielectric liners 148L and the second dielectric liners 248L comprise silicon oxide materials, and the isotropic etch process may comprise a wet etch process employing dilute hydrofluoric acid.

Inter-tier memory opening 49, which are also referred to as memory openings 49, can be formed by removing remaining portions of the sacrificial first-tier memory opening fill structures 148 underneath the second-tier memory opening 249. Inter-tier support openings, which are also referred to as support openings, can be formed by removing portions of the sacrificial first-tier support opening fill structures underneath the second-tier support openings.

Figure 15F:
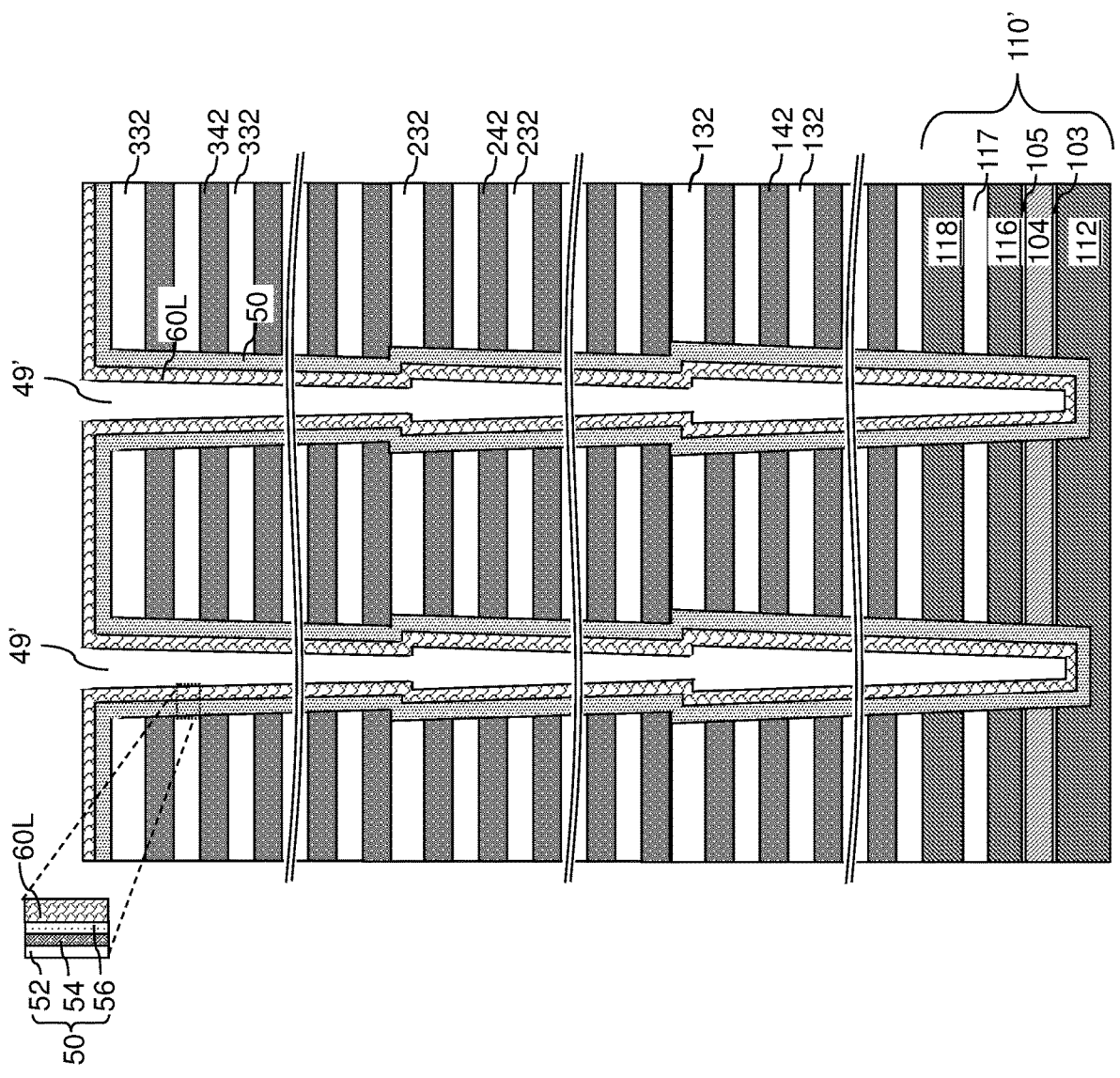

Referring to FIG. 15F, a stack of layers including an optional blocking dielectric layer 52, a charge storage layer 54, a tunneling dielectric layer 56, and a semiconductor channel material layer 60L can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one conductive element and at least oxygen. The dielectric metal oxide may consist essentially of the at least one conductive element and oxygen, or may consist essentially of the at least one conductive element, oxygen, and at least one non-conductive element such as nitrogen. In one embodiment, the blocking dielectric layer 52 can include a dielectric metal oxide having a dielectric constant greater than 7.9, i.e., having a dielectric constant greater than the dielectric constant of silicon nitride. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 can include a dielectric semiconductor compound such as silicon oxide, silicon oxynitride, silicon nitride, or a combination thereof.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a conductive material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer. As used herein, a first surface and a second surface are "vertically coincident" if there exists the second surface that overlies or underlies the first surface and if there exists a vertical plane that intersects both the first surface and the second surface. Alternatively, the sacrificial material layers (142, 242) can be laterally recessed with respect to the sidewalls of the insulating layers (132, 232), and a combination of a deposition process and an anisotropic etch process can be employed to form the charge storage layer 54 as a plurality of memory material portions that are vertically spaced apart. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed. The stack of the blocking dielectric layer 52, the charge storage layer 54, and the tunneling dielectric layer 56 constitutes a memory film 50 that stores memory bits.

The semiconductor channel material layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L includes amorphous silicon or polysilicon. The semiconductor channel material layer 60L can be formed by a conformal deposition method such as low pressure chemical vapor deposition (LPCVD). The thickness of the semiconductor channel material layer 60L can be in a range from 2 nm to 10 nm, although lesser and greater thicknesses can also be employed. A cavity 49' is formed in the volume of each memory opening 49 that is not filled with the deposited material layers (52, 54, 56, 60L).

Figure 15G:
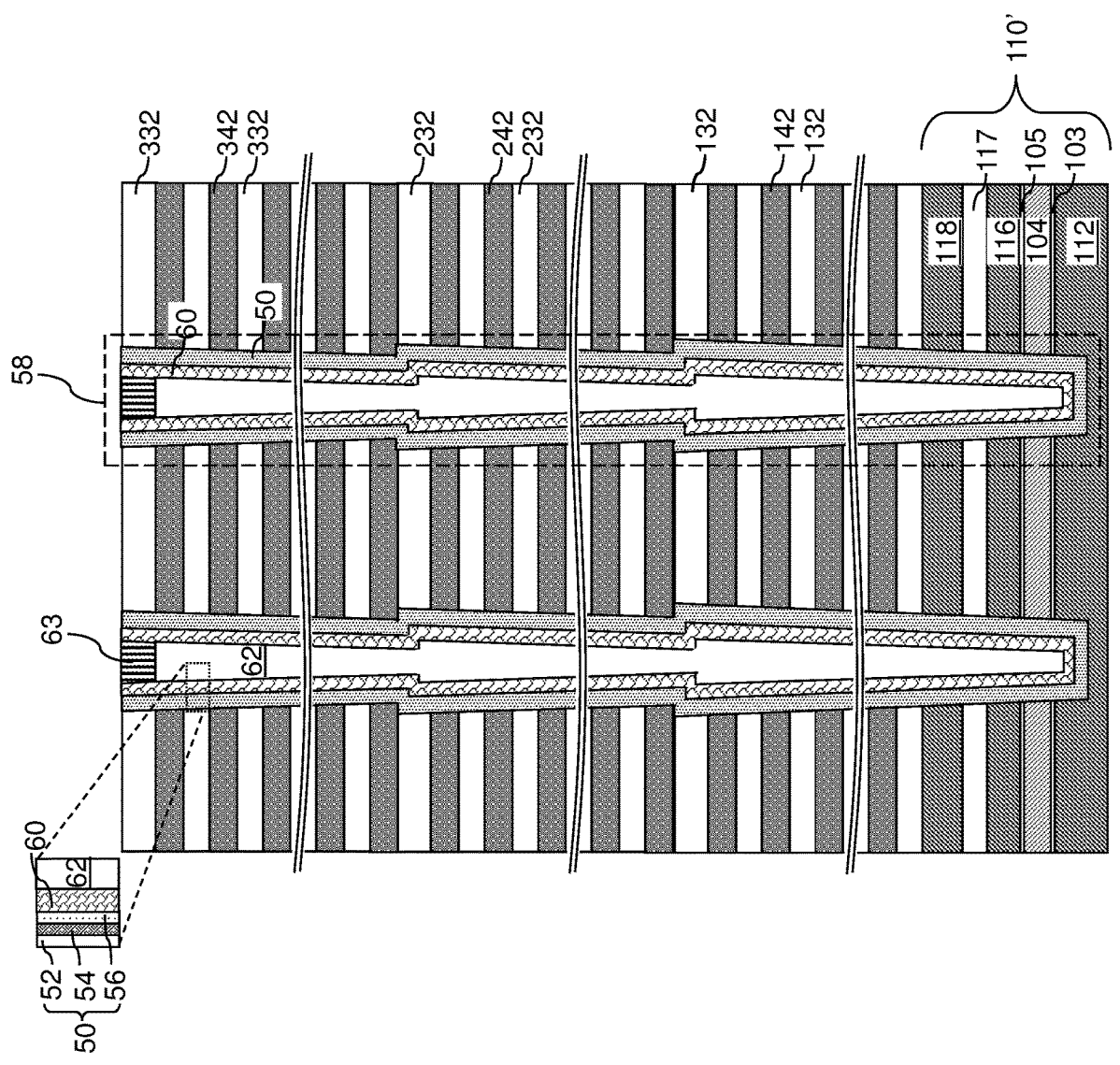

Referring to FIG. 15G, in case the cavity 49' in each memory opening is not completely filled by the semiconductor channel material layer 60L, a dielectric core layer can be deposited in the cavity 49' to fill any remaining portion of the cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. The horizontal portion of the dielectric core layer overlying the third-tier alternating stack (332, 342) can be removed, for example, by a recess etch. The recess etch continues until top surfaces of the remaining portions of the dielectric core layer are recessed to a height between the top surface of the topmost third insulating layer 332 and the bottom surface of the topmost third insulating layer 332. Each remaining portion of the dielectric core layer constitutes a dielectric core 62.

A doped semiconductor material can be deposited in cavities overlying the dielectric cores 62. The doped semiconductor material has a doping of the opposite conductivity type of the doping of the semiconductor channel material layer 60L. Thus, the doped semiconductor material has a doping of the second conductivity type. Portions of the deposited doped semiconductor material, the semiconductor channel material layer 60L, the tunneling dielectric layer 56, the charge storage layer 54, and the blocking dielectric layer 52 that overlie the horizontal plane including the top surface of the third-tier alternating stack (332, 342) can be removed by a planarization process such as a chemical mechanical planarization (CMP) process.

Each remaining portion of the doped semiconductor material having a doping of the second conductivity type constitutes a drain region 63. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Each remaining portion of the semiconductor channel material layer 60L constitutes a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Generally, a memory film 50 is formed in each inter-tier memory opening 49. The memory film 50 include a vertical stack of memory elements. For example, the vertical stack of memory elements comprises portions of the memory film 50 that are located at levels of the various spacer material layers (such as the various sacrificial material layers (142, 242, 342)). A vertical semiconductor channel 60 is formed inside the memory film 50. A drain region 63 can be formed at a top end of the vertical semiconductor channel 60.

Each combination of a memory film 50 and a vertical semiconductor channel 60 within a memory opening 49 constitutes a memory stack structure. The memory stack structure is a combination of a vertical semiconductor channel 60, a tunneling dielectric layer 56, a plurality of memory elements comprises portions of the charge storage layer 54, and an optional blocking dielectric layer 52. Each combination of a memory stack structure, a dielectric core 62, and a drain region 63 within a memory opening 49 constitutes a memory opening fill structure 58. Each combination of a memory stack structure, a dielectric core 62, and a drain region 63 within a support opening constitutes a support pillar structure. The in-process source-level material layers 10', the first-tier structure (132, 142, 165), the second-tier structure (232, 242, 265), the third-tier structure (332, 342, 365), and the memory opening fill structures 58 collectively constitute a memory-level assembly.

FIGS. 16A-16D are vertical cross-sectional views of first-tier memory openings 149, second-tier memory openings 249, and third-tier memory openings 349 in the second configuration of the first exemplary structure during formation of inter-tier memory openings 49 and memory opening fill structures 58 according to the first embodiment of the present disclosure.

Figure 16A:
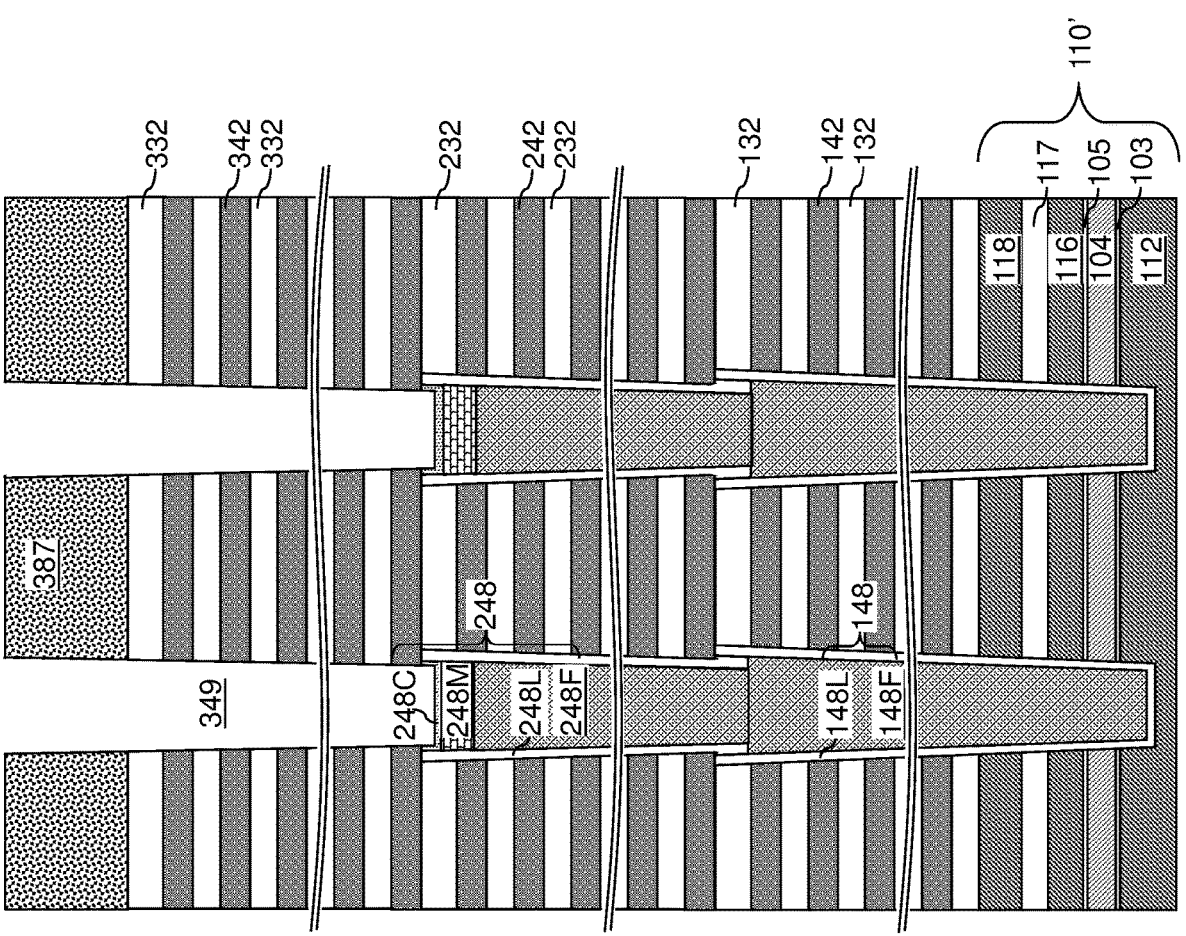
FIGS. 16A-16D are vertical cross-sectional views of first-tier memory openings, second-tier memory openings, and third-tier memory openings in the second configuration of the first exemplary structure during formation of inter-tier memory openings and memory opening fill structures according to the first embodiment of the present disclosure.

Referring to FIG. 16A, the second configuration of the first exemplary structure is illustrated after the anisotropic etch process described with reference to FIG. 15A. In this case, the second carbon-based capping material portions 248C may be etched through by the anisotropic etch process that forms the third-tier memory openings 349 and the third-tier support openings 329. The second conductive material portions 248M can be employed as etch stop structures for the anisotropic etch process that forms the third-tier memory openings 349.

Figure 16B:
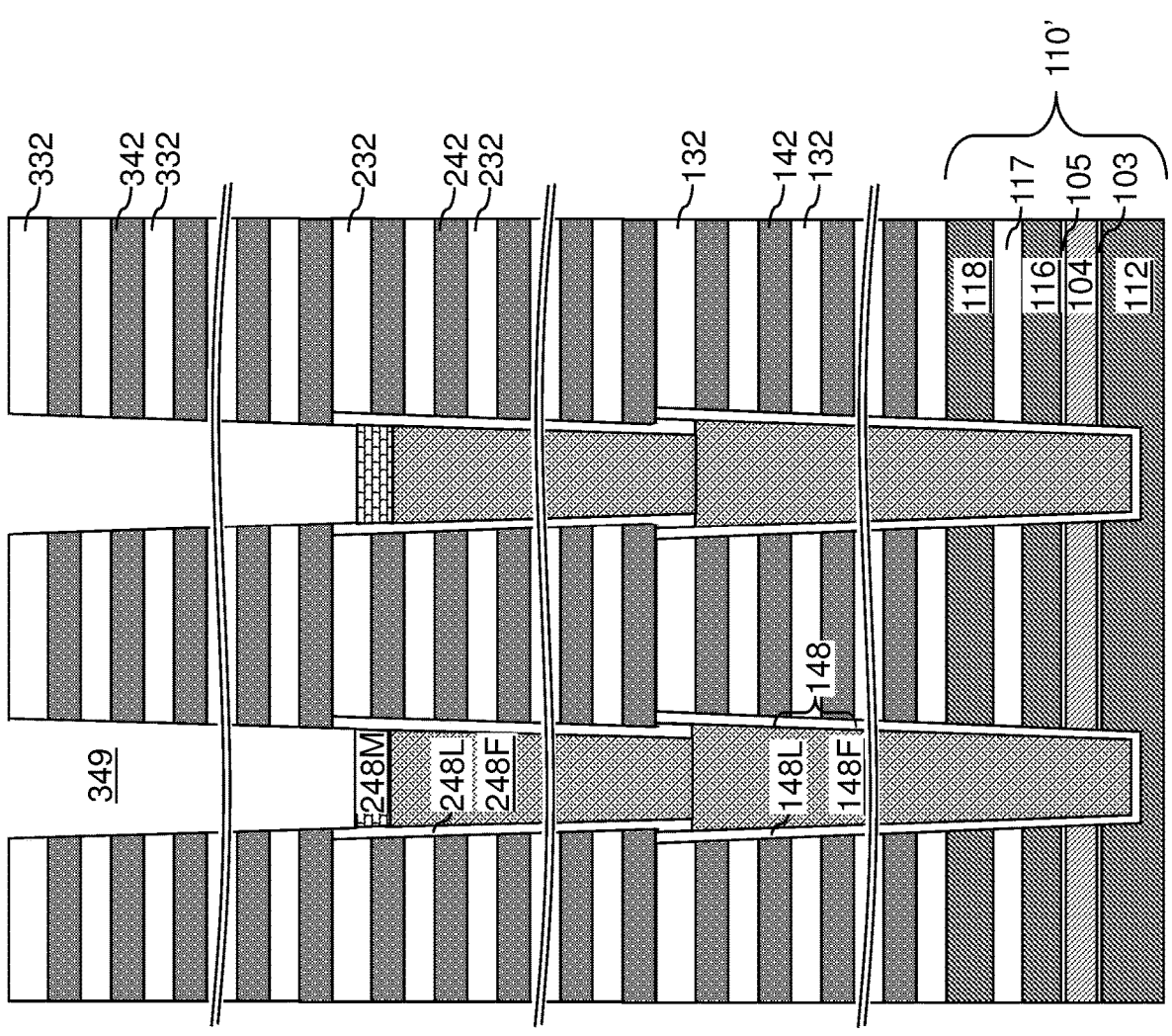

Referring to FIG. 16B, the processing steps described with reference to FIG. 15B can be optionally performed to laterally expand the third-tier memory openings 349 and the third-tier support openings 329. The patterned etch mask layer 387 and remaining portions of the second carbon-based capping material portions 248C can be subsequently removed, for example, by ashing or selective etching.

Figure 16C:
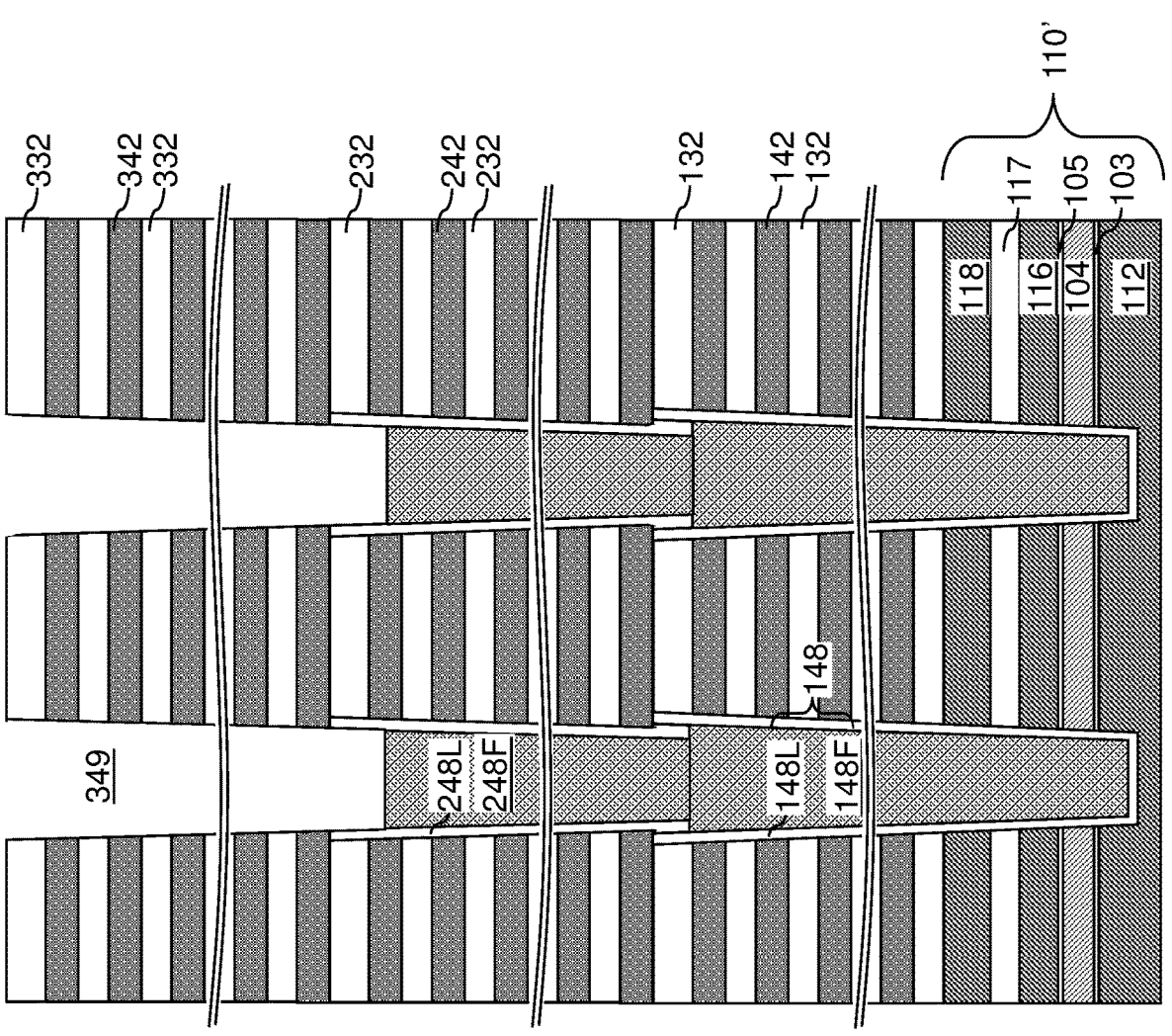
Figure 16D:
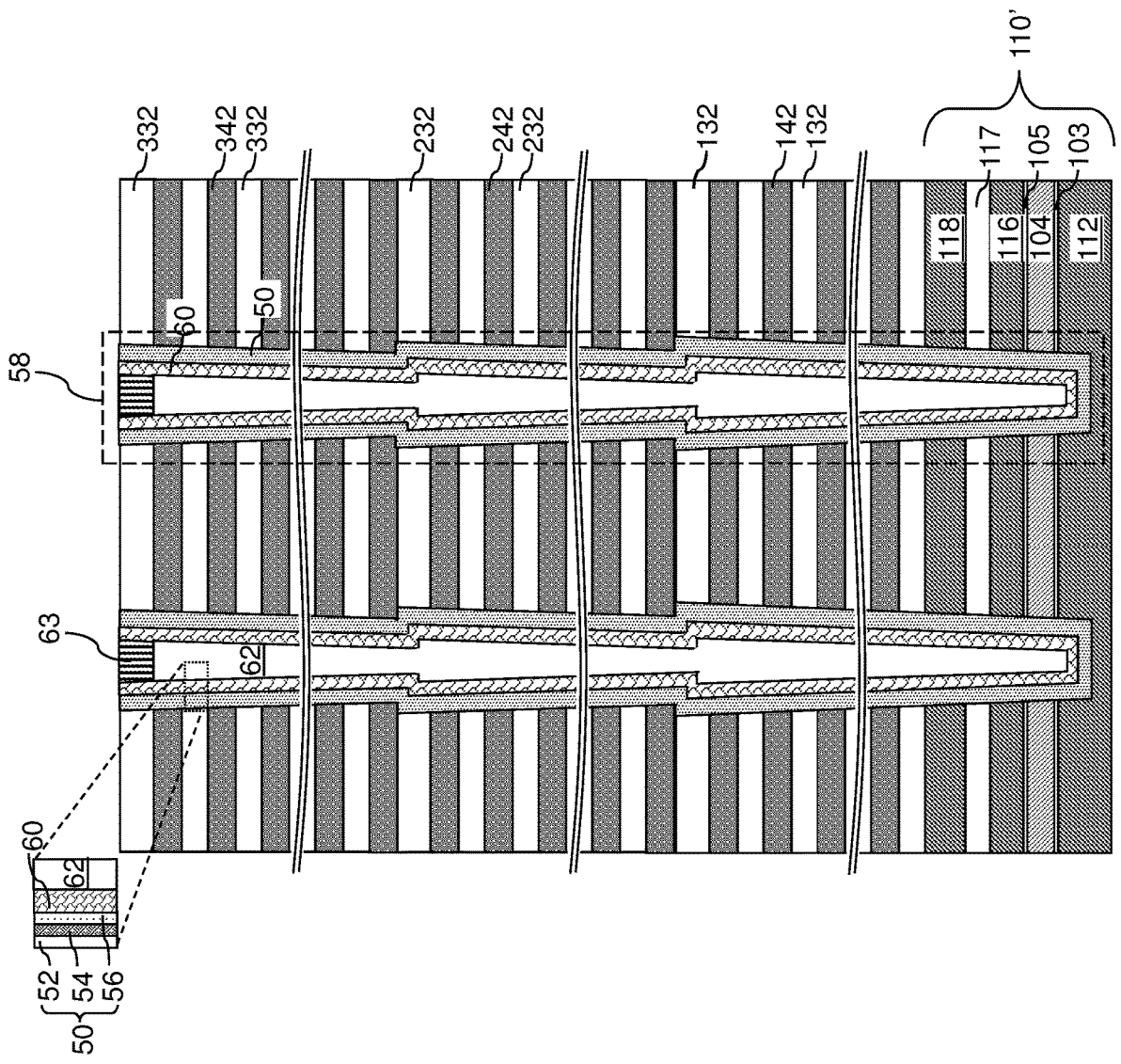

Referring to FIG. 16C, the processing steps described with reference to FIG. 15C can be performed to remove the second conductive material portions 248M.

Referring to FIG. 15D, the processing steps described with reference to FIGS. 15D-15G can be performed to form a memory opening fill structure 58 within each memory opening 49, and to form a support pillar structure within each support opening.

Figure 17A:
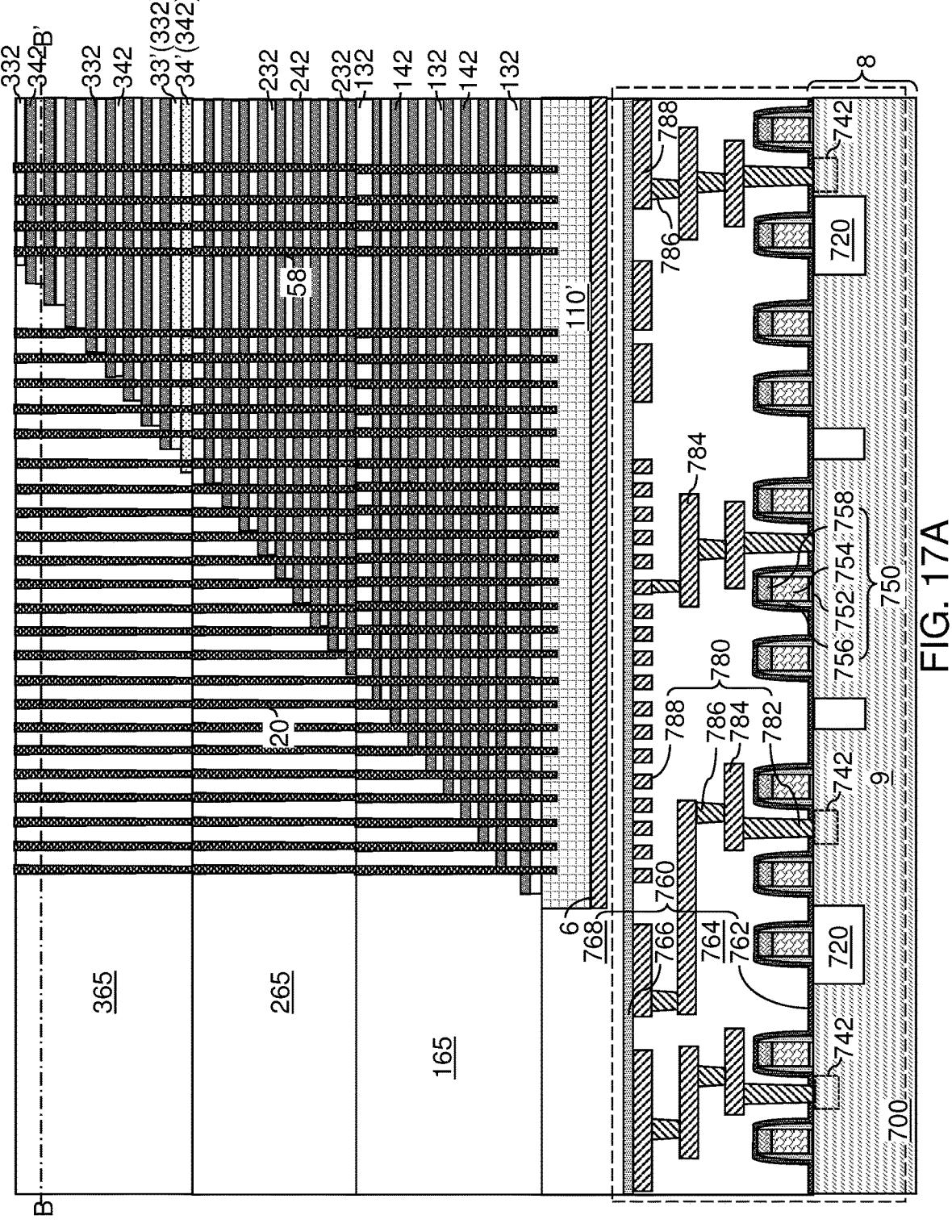
FIG. 17A is a vertical cross-sectional view of the first exemplary structure after formation of memory opening fill structures and support pillar structures according to the first embodiment of the present disclosure.
Figure 17B:
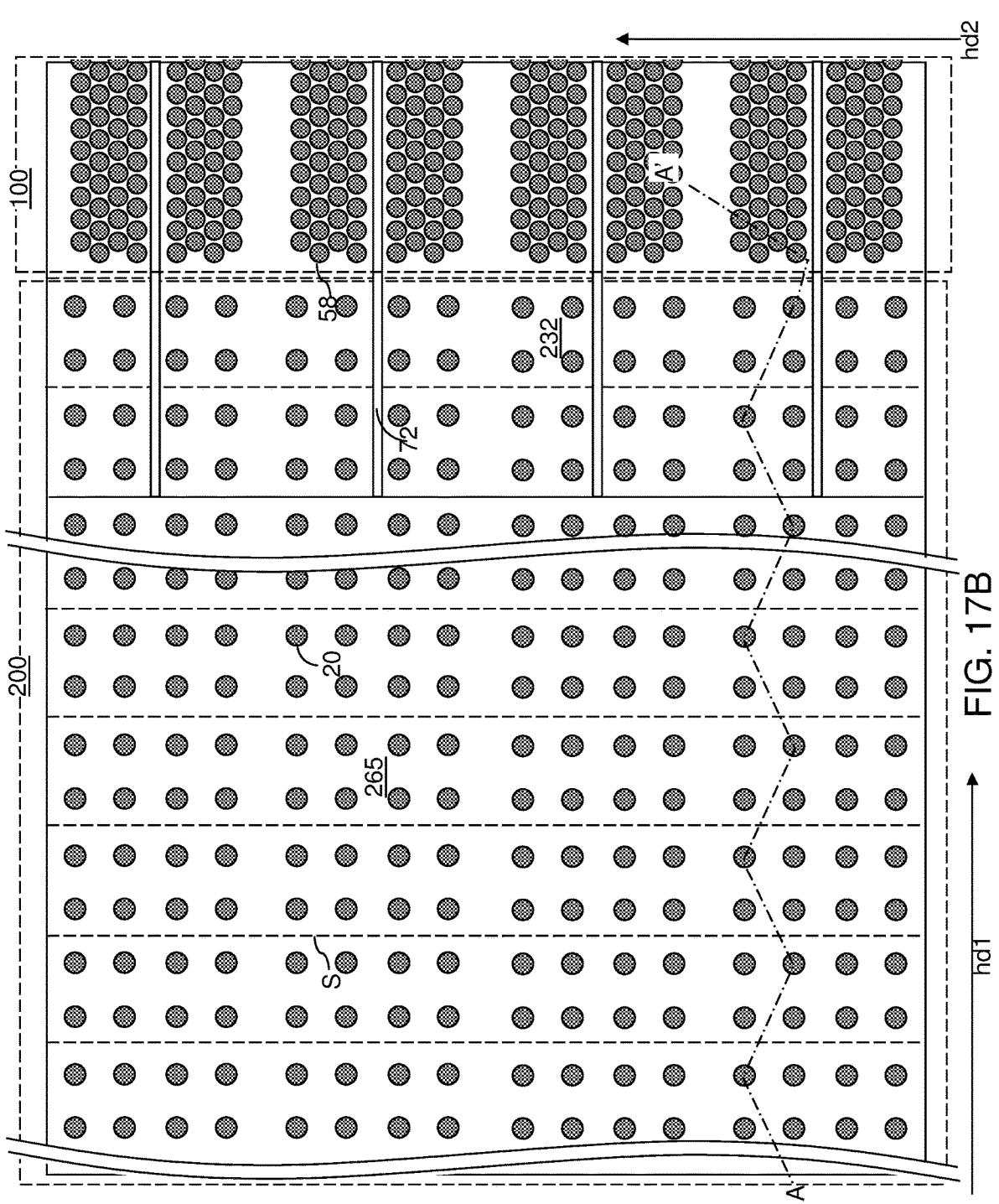
FIG. 17B is a horizontal cross-sectional of the first exemplary structure along the horizontal plane B-B' of FIG. 17A. The zig-zag vertical plane A-A' corresponds to the plane of the vertical cross-sectional view of FIG. 17A.

Referring to FIGS. 17A and 17B, the first exemplary structure is shown after formation of memory opening fill structures 58 in the memory openings 49 and support pillar structures 20 in the support openings 19. Each of the support openings 19 is filled with a respective support pillar structure 20 concurrently with formation of the memory opening fill structures 58. Each support pillar structure 20 can have the same structural elements as a memory opening fill structure 58. Each support pillar structure 20 is a dummy structure, i.e., an electrically inactive structure, and as such, is not subsequently contacted by any contact via structure. Drain-select-level isolation structures 72 can laterally extend through a topmost portion of the third-tier alternating stack (332, 342) along the first horizontal direction hd1.

Figure 18A:
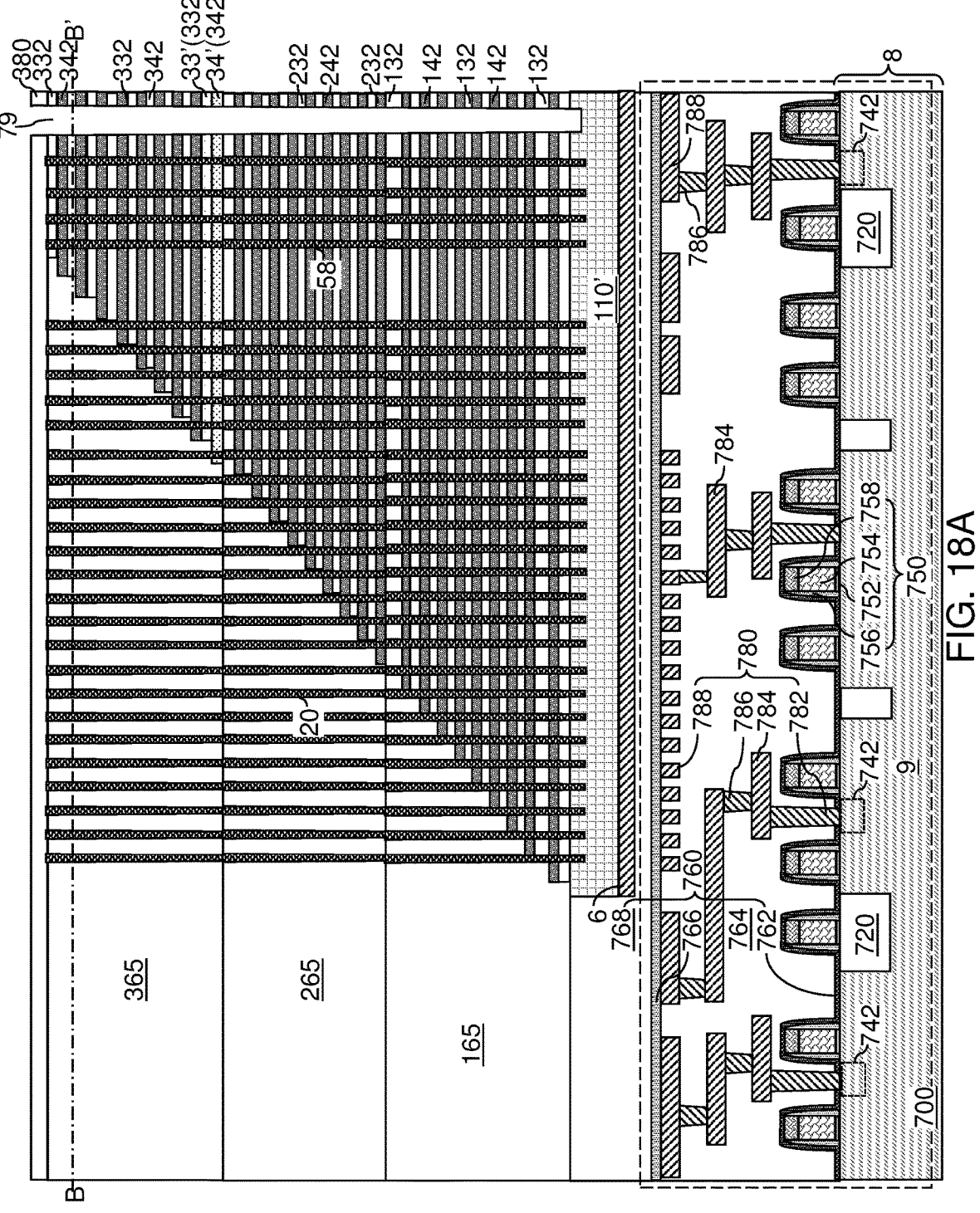
FIG. 18A is a vertical cross-sectional view of the first exemplary structure after formation of a contact-level dielectric layer and backside trenches according to the first embodiment of the present disclosure.
Figure 18B:
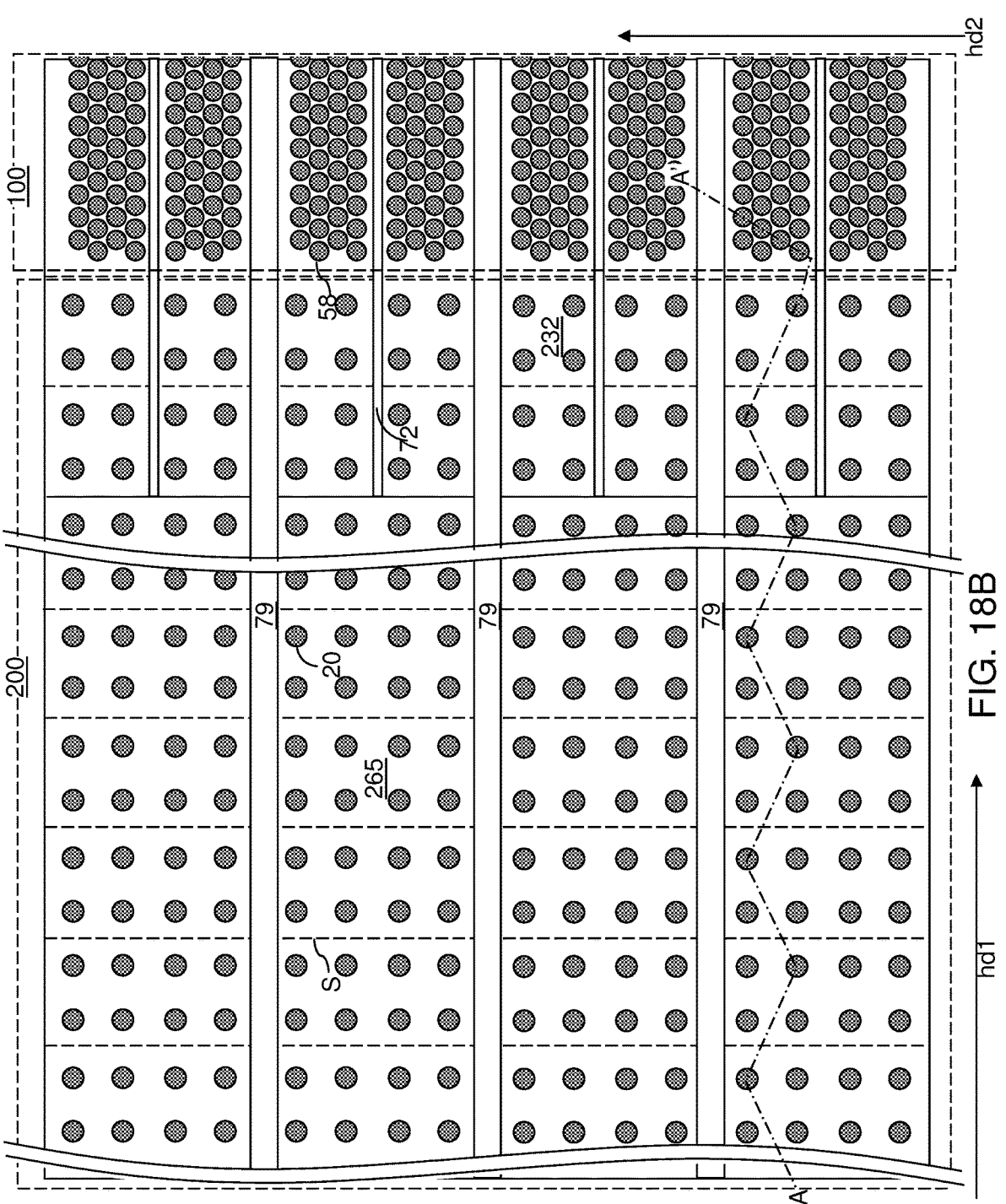
FIG. 18B is a horizontal cross-sectional of the first exemplary structure along the horizontal plane B-B' of FIG. 18A. The zig-zag vertical plane A-A' corresponds to the plane of the vertical cross-sectional view of FIG. 18A.

Referring to FIGS. 18A and 18B, a contact-level dielectric layer 380 can be formed over the third-tier structure (232, 242, 265). The contact-level dielectric layer 380 includes a dielectric material such as silicon oxide, and can be formed by a conformal or non-conformal deposition process. For example, the contact-level dielectric layer 380 can include undoped silicate glass and can have a thickness in a range from 100 nm to 600 nm, although lesser and greater thicknesses can also be employed.

A photoresist layer (not shown) can be applied over the contact-level dielectric layer 380 and can be lithographically patterned to form openings within areas extending across the memory array region 100 and the staircase region 200. The openings in the photoresist layer can laterally extend along the first horizontal direction hd1 between each neighboring cluster of memory opening fill structures 58. Backside trenches 79 can be formed by transferring the pattern in the photoresist layer through the contact-level dielectric layer 380, the second alternating stack (232, 242, 265), the first alternating stack (132, 142, 165), and the in-process source-level material layers 110'. Portions of the contact-level dielectric layer 380, the second alternating stack (232, 242, 265), the first alternating stack (132, 142, 165), and the in-process source-level material layers 110' that underlie the openings in the photoresist layer can be removed to form backside trenches 79. In one embodiment, the backside trenches 79 can be formed between clusters of memory opening fill structures 58. The clusters of the memory opening fill structures 58 can be laterally spaced apart along the second horizontal direction hd2 by the backside trenches 79.

Generally, at least one vertically alternating sequence of continuous insulating layers (132, 232, 332) and continuous spacer material layers (such as the continuous sacrificial material layers (142, 242, 342)) can be divided into alternating stacks {(132, 142), (232, 242), (332, 342)} of insulating layers (132, 232, 332) and spacer material layers (such as sacrificial material layers (142, 242, 342)) by forming backside trenches 79 that laterally extend along a first horizontal direction hd1 and laterally spaced apart along a second horizontal direction hd2. The contact-level dielectric layer 380 is divided into a plurality of contact-level dielectric layers 380 by the backside trenches 380. Each of the contact-level dielectric layers 380 overlies a respective alternating stack of insulating layers (132, 232, 332) and spacer material layers (such as sacrificial material layers (142, 242, 342)), and overlies a respective array of memory opening fill structures 58.

Figure 19A:
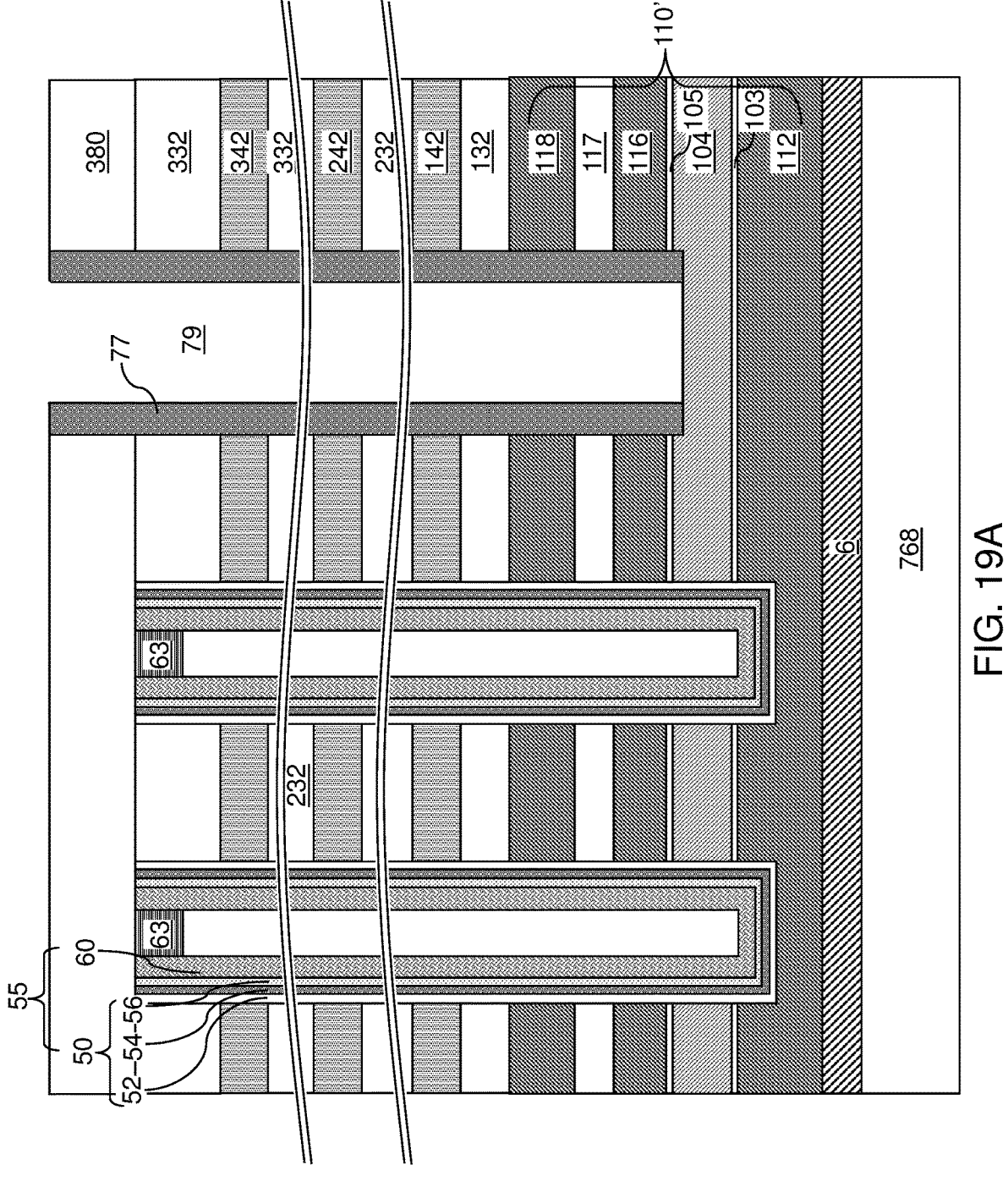
FIGS. 19A-19H illustrate sequential vertical cross-sectional views of a region of the first exemplary structure during formation of a source-level material layers and replacement of the sacrificial material layers with electrically conductive layers according to the first embodiment of the present disclosure.

Referring to FIG. 19A, a backside trench spacer 74 can be formed on sidewalls of each backside trench 79. For example, a conformal spacer material layer can be deposited in the backside trenches 79 and over the contact-level dielectric layer 380, and can be anisotropically etched to form the backside trench spacers 74. The backside trench spacers 74 include a material that is different from the material of the source-level sacrificial layer 104. For example, the backside trench spacers 74 can include silicon oxide, a dielectric metal oxide, or silicon nitride.

Figure 19B:
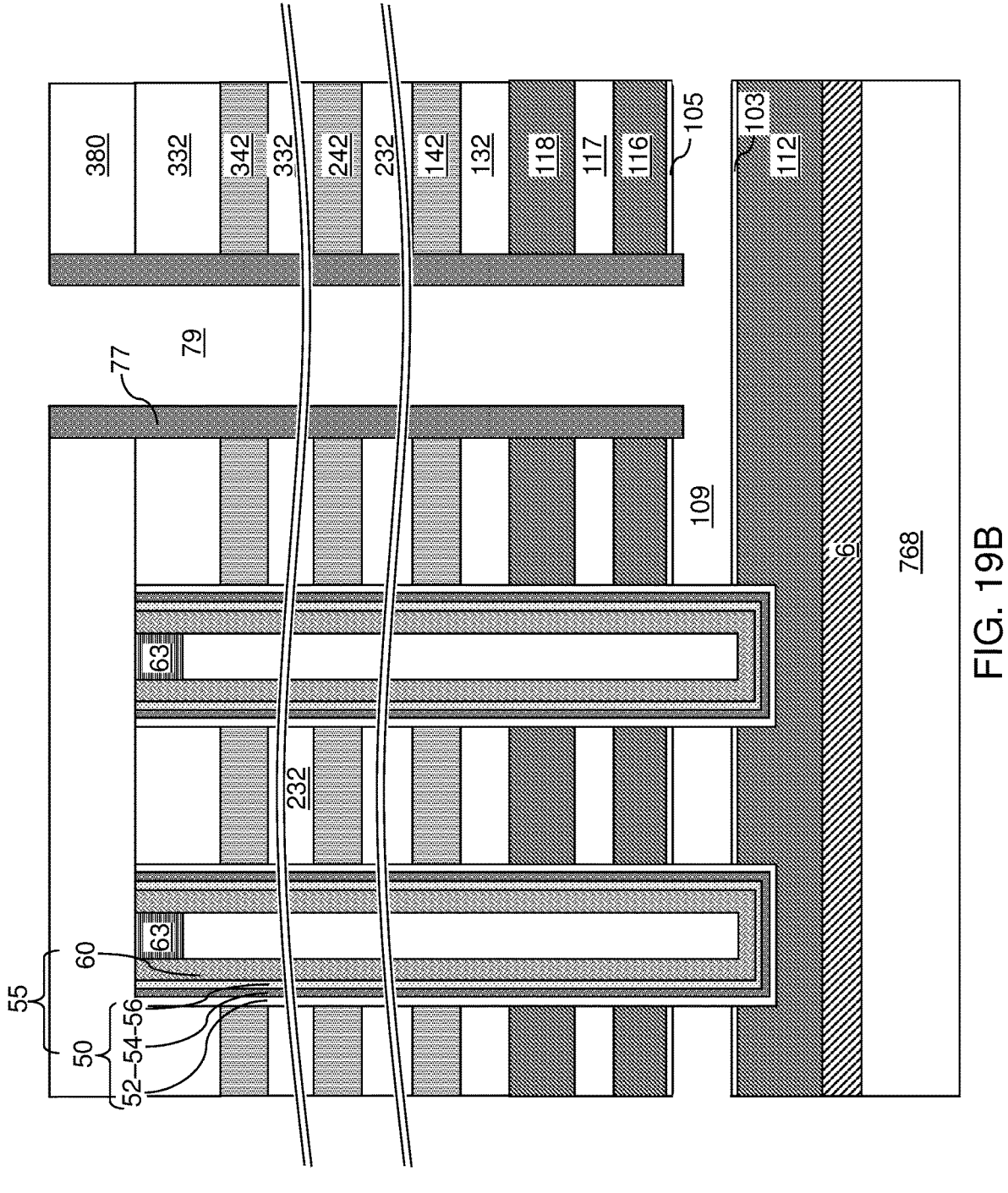

Referring to FIG. 19B, an etchant that etches the material of the source-level sacrificial layer 104 selective to the materials of the first alternating stack (132, 142), the second alternating stack (232, 242), the third alternating stack (332, 342), the upper dielectric liner layer 105, and the lower dielectric liner layer 103 can be introduced into the backside trenches 79 in an isotropic etch process. For example, if the source-level sacrificial layer 104 includes undoped amorphous silicon or an undoped amorphous silicon-germanium alloy, the backside trench spacers 74 include silicon nitride, and the upper and lower dielectric liner layers (105, 103) include silicon oxide, a wet etch process employing hot trimethyl-2 hydroxyethyl ammonium hydroxide ("hot TMY") or tetramethyl ammonium hydroxide (TMAH) can be employed to remove the source-level sacrificial layer 104 selective to the backside trench spacers 74 and the upper and lower dielectric liner layers (105, 103). Alternatively, if the source-level sacrificial material layer 104 includes silicon nitride, the backside trench spacers 74 include silicon oxide or a dielectric metal oxide, and the upper and lower dielectric liner layers (105, 103) include silicon oxide, a wet etch process employing hot phosphoric acid can be employed to remove the source-level sacrificial layer 104 selective to the backside trench spacers 74 and the upper and lower dielectric liner layers (105, 103). A source cavity 109 is formed in the volume from which the source-level sacrificial layer 104 is removed.

Figure 19C:
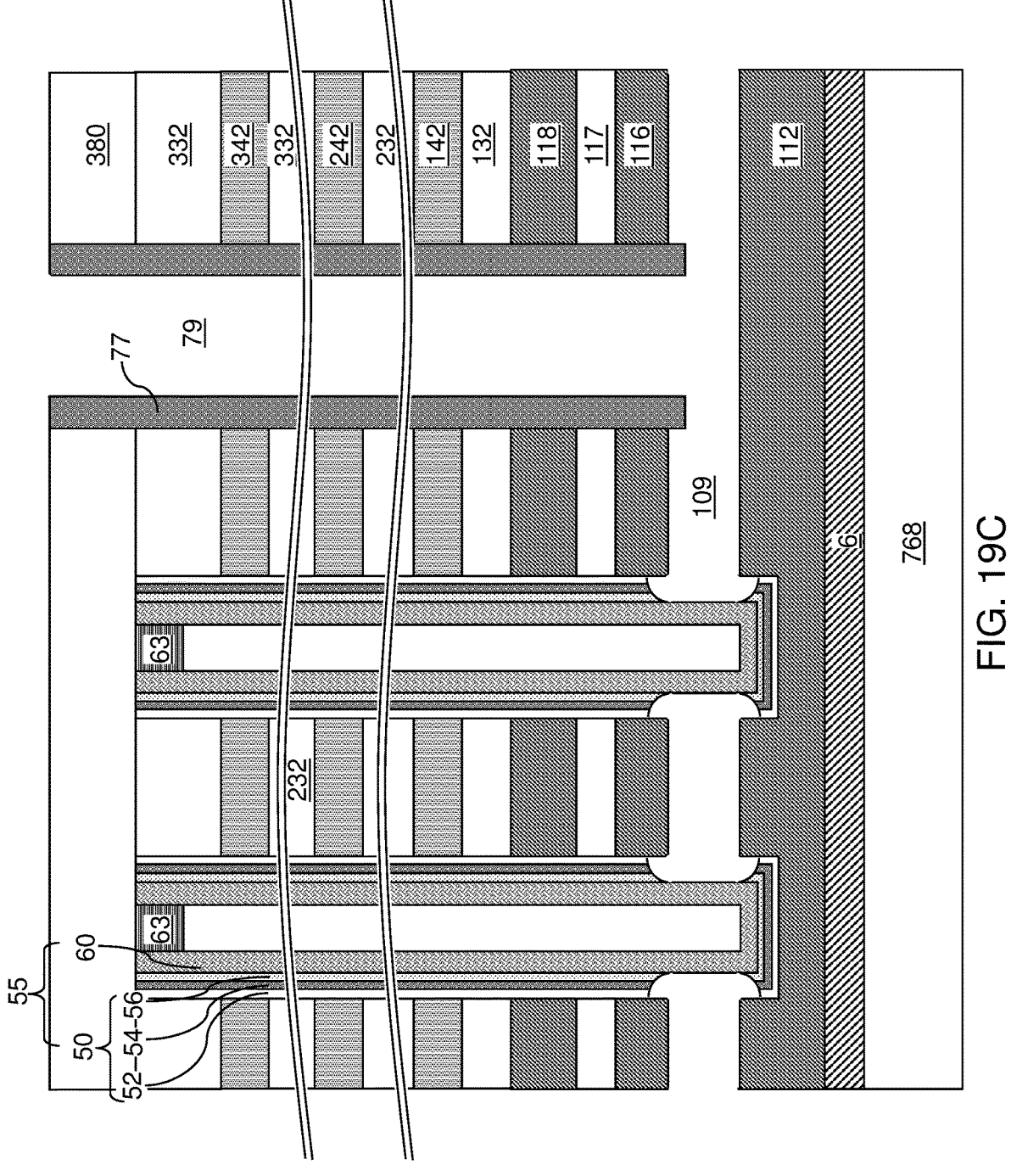

Referring to FIG. 19C, a sequence of isotropic etchants, such as wet etchants, can be applied through the backside trenches 79 and the source cavity 109 to the physically exposed portions of the memory films 50 to sequentially etch the various component layers of the memory films 50 from outside to inside, and to physically expose bottom surfaces and cylindrical side surfaces of the vertical semiconductor channels 60 at the level of the source cavity 109. The upper and lower dielectric liner layers (105, 103) can be collaterally etched during removal of the portions of the memory films 50 located at the level of the source cavity 109. The source cavity 109 can be expanded in volume by removal of the portions of the memory films 50 at the level of the source cavity 109 and the upper and lower dielectric liner layers (105, 103). A top surface of the lower source-level material layer 112 and a bottom surface of the upper source-level material layer 116 can be physically exposed to the source cavity 109. An outer sidewall of each vertical semiconductor channel 60 is physically exposed to the source cavity 109 after removing the physically exposed portions of the memory films 50. A dielectric material stack 150 is formed underneath each physically exposed cylindrical surface of the vertical semiconductor channels 60. Each dielectric material stack 150 is a remaining portion of the memory films 50, and includes the same dielectric material stack as the memory films 50.

Thus, the upper source-level material layer 116 can act as an etch stop during the selective etching of the memory film 50 through the source cavity 109 and can prevent lateral expansion of the source cavity 109. This prevents a short circuit between the source-select-level conductive layer 118 and a source contact layer that is subsequently formed in the source cavity 109 during a subsequent step.

Figure 19D:
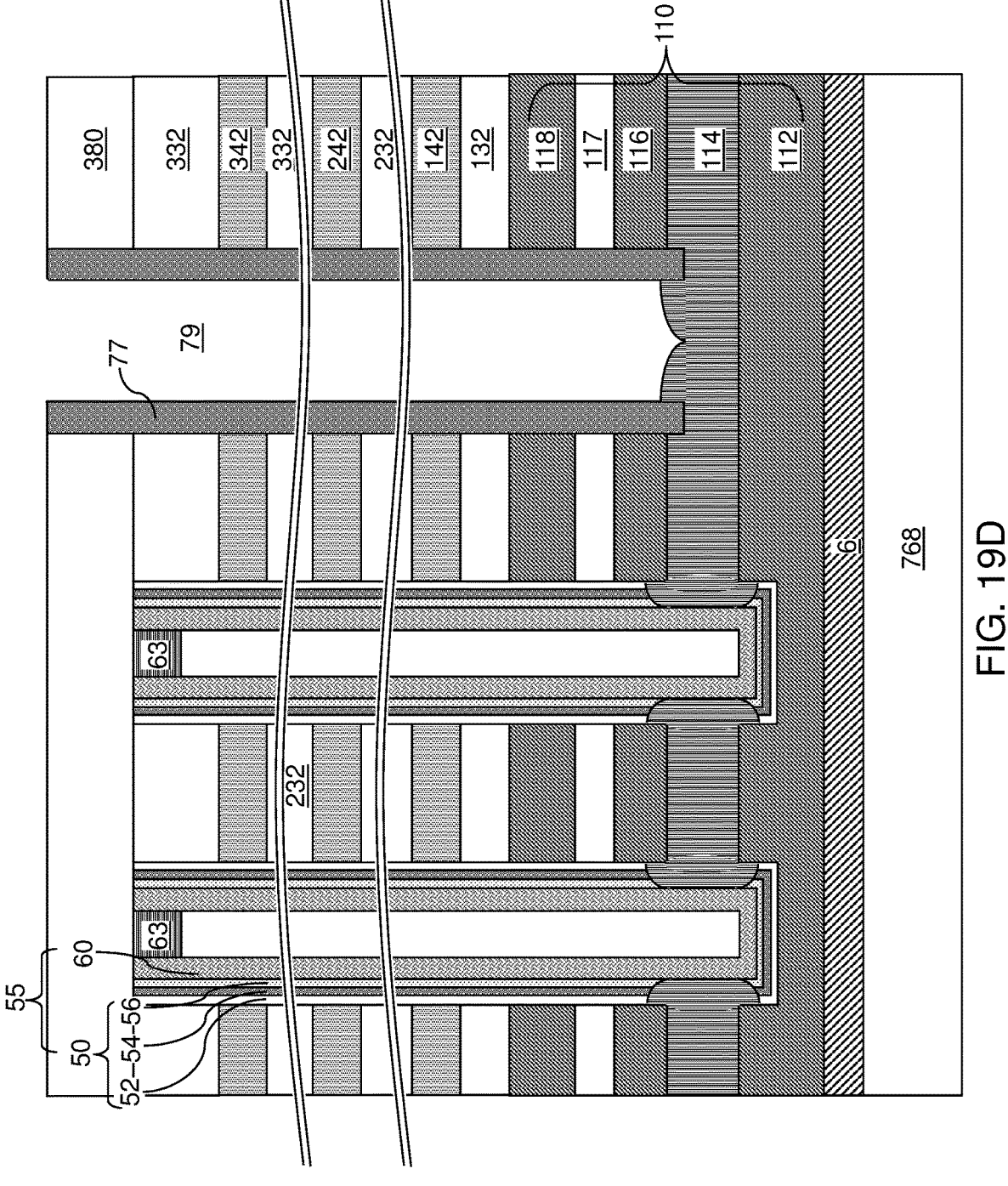

Referring to FIG. 19D, a source contact layer 114 can be formed by a selective deposition process that deposits a doped semiconductor material having a doping of the second conductivity type, which is herein referred to as a third doped semiconductor material. The doped semiconductor material can include amorphous silicon, polysilicon, or a silicon-germanium alloy. The third doped semiconductor material of the source contact layer 114 can grow from physically exposed semiconductor surfaces around the source cavity 109. The average atomic concentration of dopants of the second conductivity type in the source contact layer 114 can be in a range from $5.0 \times 10^{19}/cm^3$ to $2.0 \times 10^{21}/cm^3$, although lesser and greater dopant concentrations can also be employed.

The in-process source-level material layers 110' are replaced with source-level material layers 10. The source-level material layers 110 include a layer stack including, from bottom to top, the lower source-level material layer 112, the source contact layer 114, the upper source-level material layer 116, the source-level insulating layer 117, and the optional source-select-level conductive layer 118. The combination of the lower source-level material layer 112, the source contact layer 114, the upper source-level material layer 116 constitutes a source layer (112, 114, 116). Upon replacement of the source-level sacrificial layer 104 with a source contact layer 114, the in-process source-level material layers 110' are converted into source-level material layers 110 including a source layer (112, 114, 116).

Figure 19E:
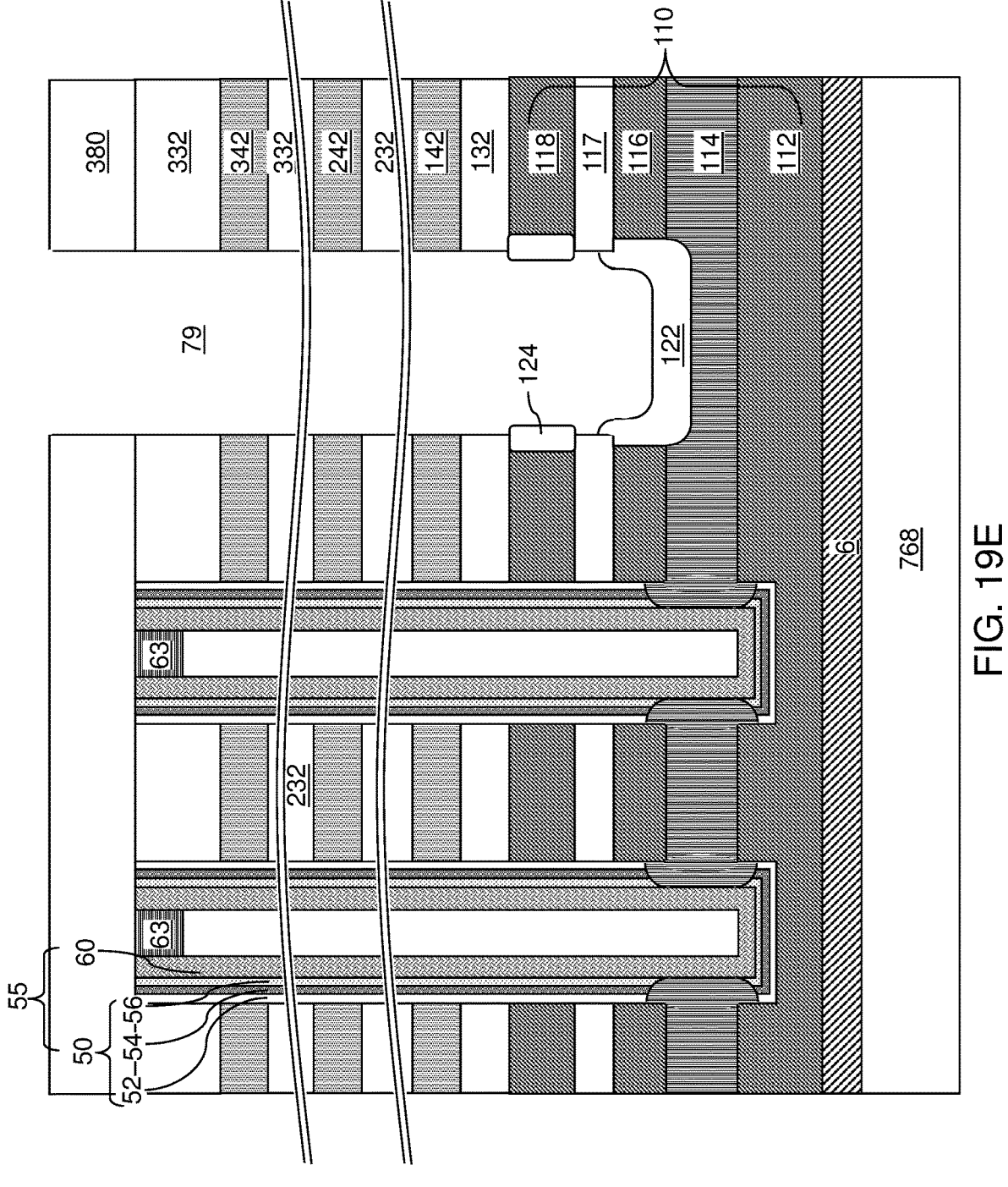

Referring to FIG. 19E, the backside trench spacers 74 can be removed selective to the semiconductor materials of the source contact layer 114. For example, if the backside trench spacers 74 include silicon nitride, a wet etch process employing hot phosphoric acid can be employed to remove the backside trench spacers 74. If the backside trench spacers 74 include silicon oxide, a wet etch process employing dilute hydrofluoric acid can be employed to remove the backside trench spacers 74. Sidewalls of the alternating stacks (132, 142, 232, 242), the upper source-level material layer 116, the source-level insulating layer 117, and the optional source-select-level conductive layer 118 can be physically exposed after removal of the backside trench spacers 74.

A thermal oxidation process can be performed to convert physically exposed surface portions of various semiconductor materials into semiconductor oxide portions. Specifically, physically exposed surface portions of the source contact layer 114, the upper source-level material layer 116, and the source-select-level conductive layer 118 (if present) are converted into thermal semiconductor oxide material portions. As used herein, a "thermal semiconductor oxide" refers to a material that is formed by thermal oxidation of a semiconductor material. Unlike a semiconductor oxide material formed by chemical vapor deposition, thermal semiconductor oxide materials do not include carbon or hydrogen above a trace level unless the semiconductor material from which the semiconductor oxide material is derived includes carbon prior to a thermal oxidation process.

The thermal oxidation process forms a semiconductor oxide plate 122 at the bottom of each backside trench 79 and semiconductor oxide rails 124 on sidewalls of the source-select-level conductive layer 118. The semiconductor oxide plate 122 includes various thermal semiconductor oxide material portions formed by thermal conversion of surface portions of the source contact layer 114 and the upper source-level material layer 116.

The layer stack including the lower source-level material layer 112, the source contact layer 114, and the upper source-level material layer 116 constitutes a source layer (112, 114, 116), which is a buried source layer that functions as a common source region that is connected each of the vertical semiconductor channels 60 and has a doping of the second conductivity type. The average dopant concentration in the buried source layer (112, 114, 116) can be in a range from $5.0 \times 10^{19}/cm^3$ to $2.0 \times 10^{21}/cm^3$, although lesser and greater dopant concentrations can also be employed.

Figure 19F:
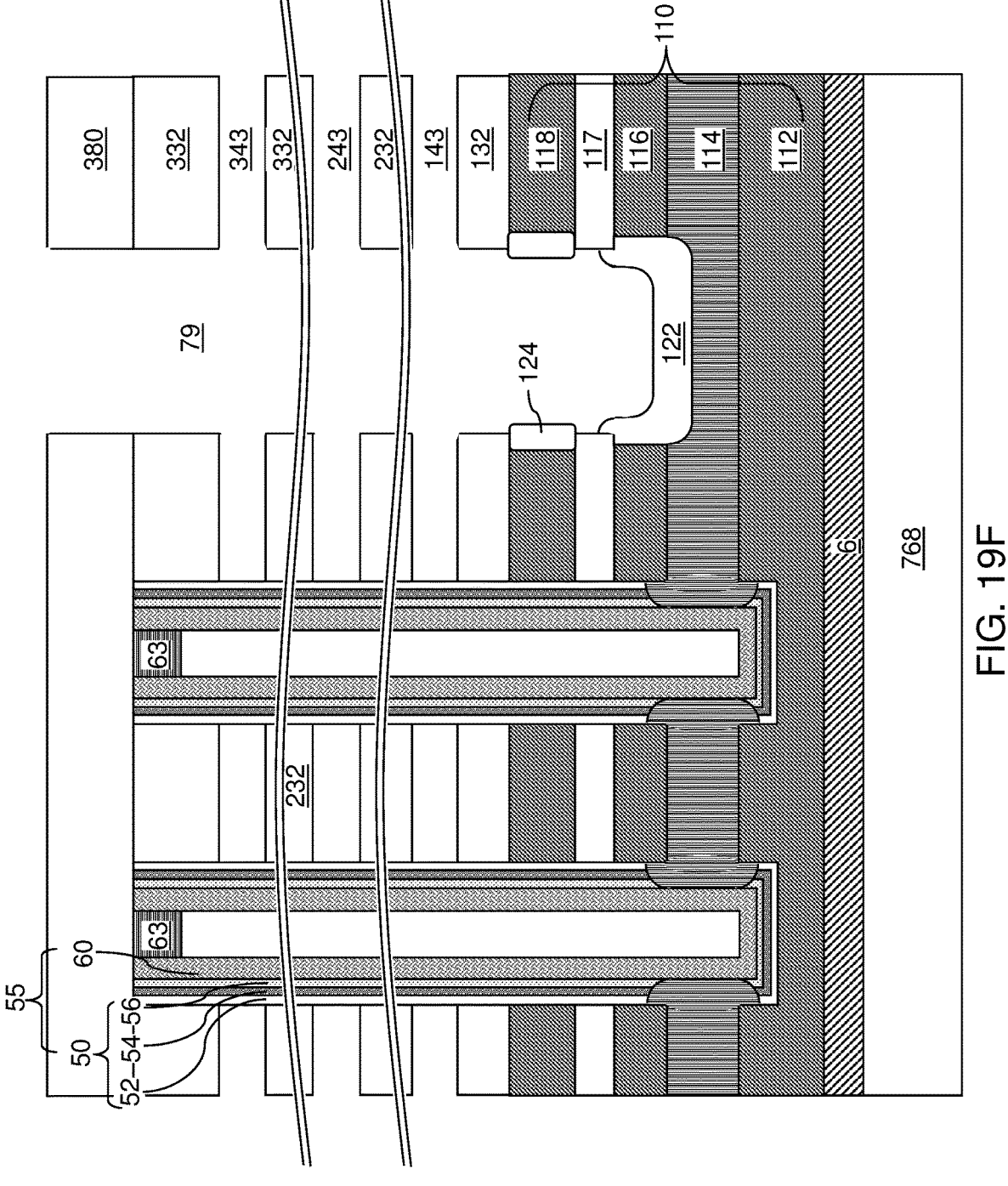

Referring to FIG. 19F, an etchant that selectively etches the materials of the sacrificial material layers (142, 242, 342) with respect to the materials of the insulating layers (132, 232, 332), the retro-stepped dielectric material portions (165, 265, 365), and the material of the outermost layer of the memory films 50 can be introduced into the backside trenches 79, for example, employing an isotropic etch process. For example, the sacrificial material layers (142, 242, 342) can include silicon nitride, the materials of the insulating layers (132, 232, 332), the retro-stepped dielectric material portions (165, 265, 365), and the material of the outermost layer of the memory films 50 can include silicon oxide materials. First backside recesses 143 are formed in volumes from which the first sacrificial material layers 142 are removed. Second backside recesses 243 are formed in volumes from which the second sacrificial material layers 242 are removed. Third backside recesses 343 are formed in volumes from which the third sacrificial material layers 342 are removed.

The isotropic etch process can be a wet etch process employing a wet etch solution, or can be a gas phase (dry) etch process in which the etchant is introduced in a vapor phase into the backside trenches 79. For example, if the sacrificial material layers (142, 242, 342) include silicon nitride, the etch process can be a wet etch process in which the first exemplary structure is immersed within a wet etch tank including phosphoric acid, which etches silicon nitride selective to silicon oxide, silicon, and various other materials employed in the art.

Each of the backside recesses (143, 243, 343) can be a laterally extending cavity having a lateral dimension that is greater than the vertical extent of the cavity. In other words, the lateral dimension of each of the backside recesses (143, 243, 343) can be greater than the height of the respective backside recess (143, 243, 343). A plurality of first backside recesses 143 can be formed in the volumes from which the material of the first sacrificial material layers 142 is removed. A plurality of second backside recesses 243 can be formed in the volumes from which the material of the second sacrificial material layers 242 is removed. A plurality of third backside recesses 343 can be formed in the volumes from which the material of the third sacrificial material layers 342 is removed. Each of the backside recesses (143, 243, 343) can extend substantially parallel to the top surface of the substrate 8. A backside recess (143, 243, 343) can be vertically bounded by a top surface of an underlying insulating layer (132, 232, or 332) and a bottom surface of an overlying insulating layer 132, 232, or 332). In one embodiment, each of the backside recesses (143, 243, 343) can have a uniform height throughout.

Figure 19G:
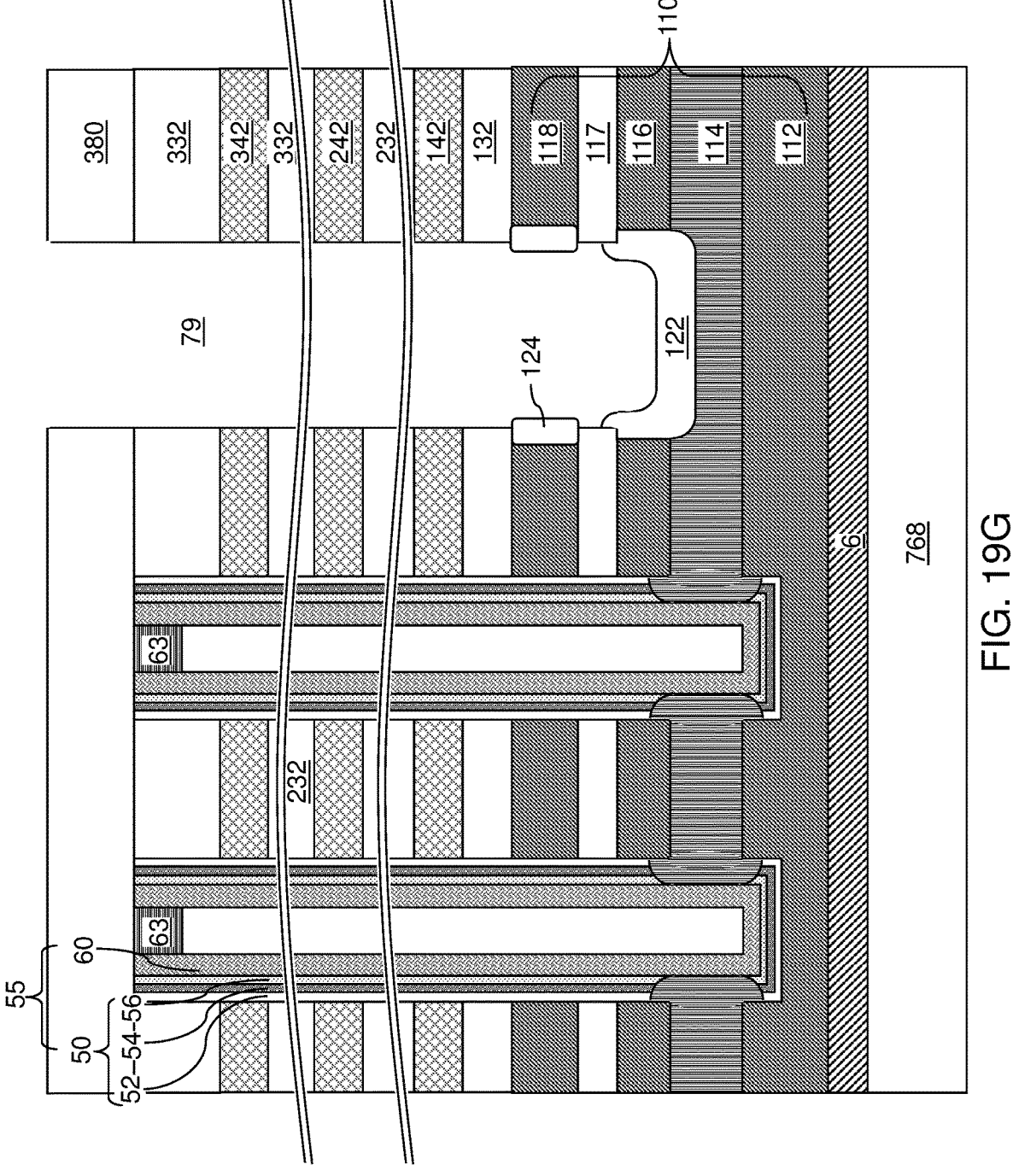

Referring to FIG. 19G, a backside blocking dielectric layer (not shown) can be optionally deposited in the backside recesses and the backside trenches 79 and over the contact-level dielectric layer 380. At least one conductive material can be deposited in the plurality of backside recesses (143, 243, 343), on the sidewalls of the backside trench 79, and over the contact-level dielectric layer 380. The at least one conductive material can include at least one conductive material, i.e., an electrically conductive material that includes at least one conductive element.

Figure 19H:
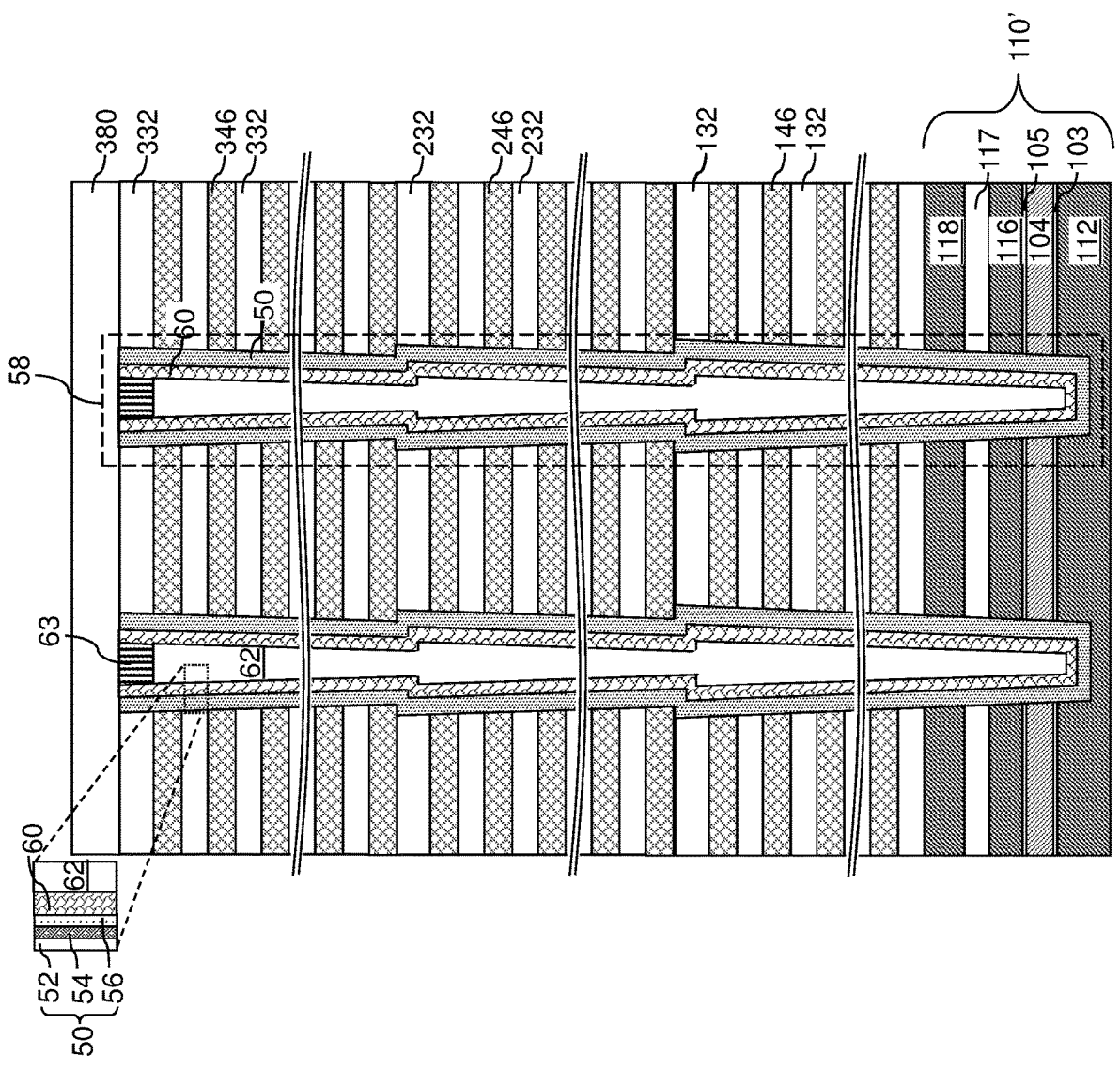

Referring to FIG. 19H, another view of the first exemplary structure at the processing steps of FIG. 19G is illustrated. A plurality of first electrically conductive layers 146 can be formed in the plurality of first backside recesses 143, a plurality of second electrically conductive layers 246 can be formed in the plurality of second backside recesses 243, a plurality of third electrically conductive layers 346 can be formed in the plurality of third backside recesses 343, and a continuous conductive material layer (not shown) can be formed on the sidewalls of each backside trench 79 and over the contact-level dielectric layer 380. Thus, the sacrificial material layers (142, 242, 342) can be replaced with the conductive material layers (146, 246, 346), respectively. Specifically, each first sacrificial material layer 142 can be replaced with an optional portion of the backside blocking dielectric layer and a first electrically conductive layer 146, each second sacrificial material layer 242 can be replaced with an optional portion of the backside blocking dielectric layer and a second electrically conductive layer 246, and each third sacrificial material layer 342 can be replaced with an optional portion of the backside blocking dielectric layer and a third electrically conductive layer 346. A backside cavity is present in the portion of each backside trench 79 that is not filled with the continuous conductive material layer.

The conductive material can be deposited by a conformal deposition method, which can be, for example, chemical vapor deposition (CVD), atomic layer deposition (ALD), electroless plating, electroplating, or a combination thereof. The conductive material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the backside recesses include tungsten, tungsten nitride, titanium, titanium nitride, tantalum, tantalum nitride, cobalt, and ruthenium. In one embodiment, the conductive material can comprise a metal such as tungsten and/or metal nitride. In one embodiment, the conductive material for filling the backside recesses can be a combination of titanium nitride layer and a tungsten fill material. In one embodiment, the conductive material can be deposited by chemical vapor deposition or atomic layer deposition.

The deposited conductive material of the continuous conductive material layer can be etched back from the sidewalls of each backside trench 79 and from above the contact-level dielectric layers 380, for example, by an anisotropic or isotropic etch. Each remaining portion of the deposited conductive material in the first backside recesses constitutes a first electrically conductive layer 146. Each remaining portion of the deposited conductive material in the second backside recesses constitutes a second electrically conductive layer 246. Each electrically conductive layer (146, 246, 346) can be a conductive line structure.

In one embodiment, a subset of the third electrically conductive layers 346 located at the levels of the drain-select-level isolation structures 72 constitutes drain select gate electrodes. A subset of the electrically conductive layer (146, 246, 346) located underneath the drain select gate electrodes can function as combinations of a control gate and a word line located at the same level. The control gate electrodes within each electrically conductive layer (146, 246, 346) are the control gate electrodes for a vertical memory device including the memory stack structure. The source-select-level conductive layer 118 functions as a source select gate electrode.

Each of the memory opening fill structures 58 (which contains a respective memory stack structures) comprises a vertical stack of memory elements located at each level of the electrically conductive layers (146, 246, 346). A subset of the electrically conductive layers (146, 246, 346) can comprise word lines for the memory elements. The semiconductor devices in the underlying peripheral device region 700 can comprise word line switch devices configured to control a bias voltage to respective word lines. The memory-level assembly includes all structures located above the topmost surface of the lower-level metal interconnect structures 780, and is located over, and is vertically spaced from, the substrate semiconductor layer 9. The memory-level assembly includes at least one alternating stack {(132, 146), (232, 246), (332, 346)} and memory stack structures vertically extending through the at least one alternating stack {(132, 146), (232, 246), (332, 346)}. Each of the at least one an alternating stack {(132, 146), (232, 246), (332, 346)} includes alternating layers of respective insulating layers (132, 232, or 332) and respective electrically conductive layers (146, 246, or 346). The at least one alternating stack {(132, 146), (232, 246), (332, 346)} comprises staircase regions that include terraces in which each underlying electrically conductive layer (146, 246, 346) extends farther along the first horizontal direction hd1 than any overlying electrically conductive layer (146, 246, 346) in the memory-level assembly.

Alternating stacks {(132, 146), (232, 246), (332, 346)} of insulating layers (132, 232, 332) and electrically conductive layers (146, 246, 346) are formed, which are laterally spaced apart from each other by the backside trenches 79 along the second horizontal direction hd1. The source layer (112, 114, 116) comprises: a lower source-level material layer 112 comprising a first doped semiconductor material; an upper source-level material layer 116 comprising a second doped semiconductor material; and a source contact layer 114 comprising a third doped semiconductor material and located between the upper source-level material layer 116 and the lower source-level material layer 112. In one embodiment, each of the vertical semiconductor channels 60 is in contact with the source contact layer 114. In one embodiment, each of the memory opening fill structures 58 comprises a respective memory film 50 that laterally surrounds the respective vertical semiconductor channel 60, has a respective annular concave bottom surface contacting the source contact layer 114, and has a respective cylindrical outer surface contacting the upper source-level material layer 116 and each insulating layer within a respective one of the alternating stacks {(132, 146), (232, 246), (332, 346)}.

Figure 20A:
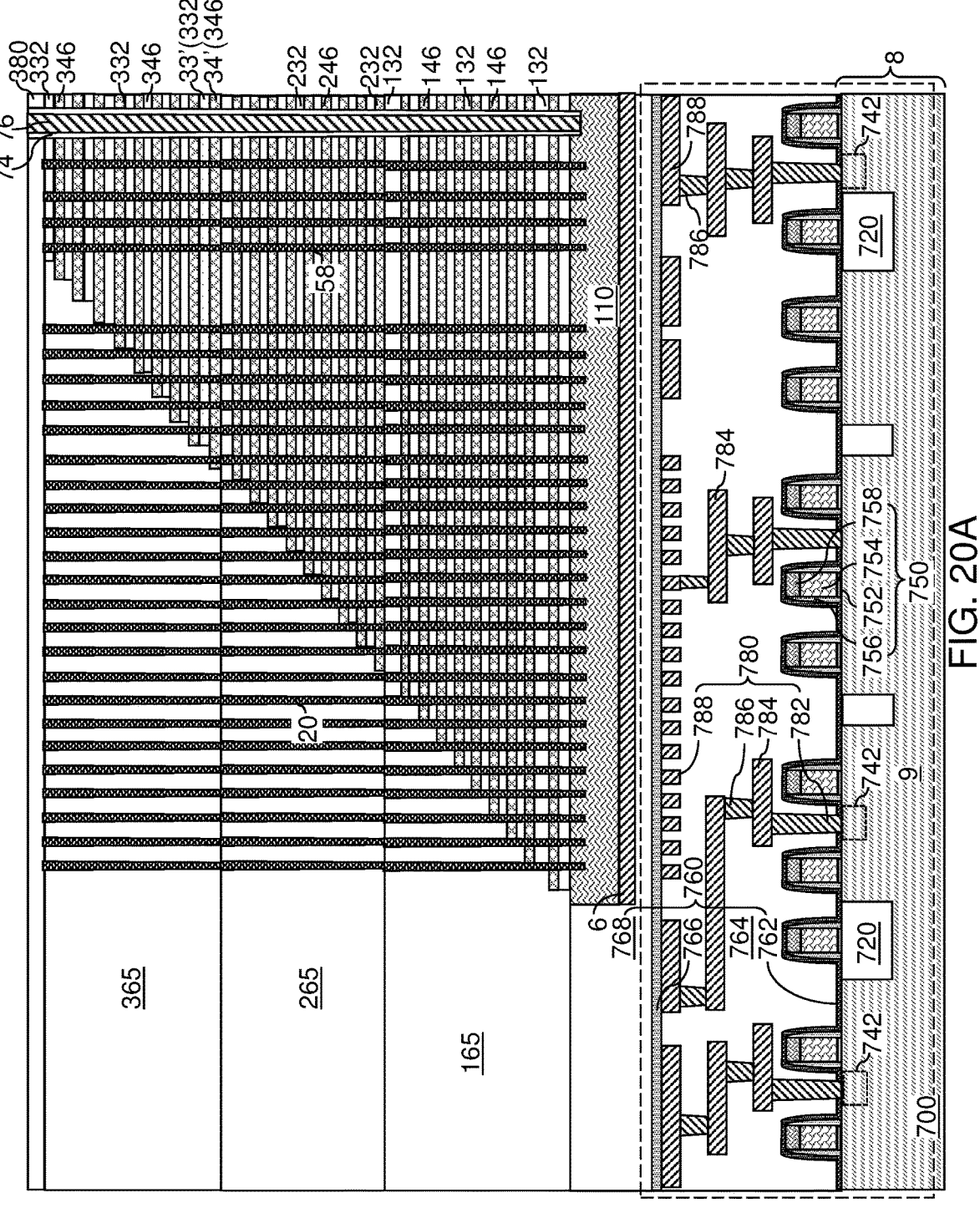
FIG. 20A is a vertical cross-sectional view of the first exemplary structure after formation of backside trench fill structures in the backside trenches according to the first embodiment of the present disclosure.
Figure 20B:
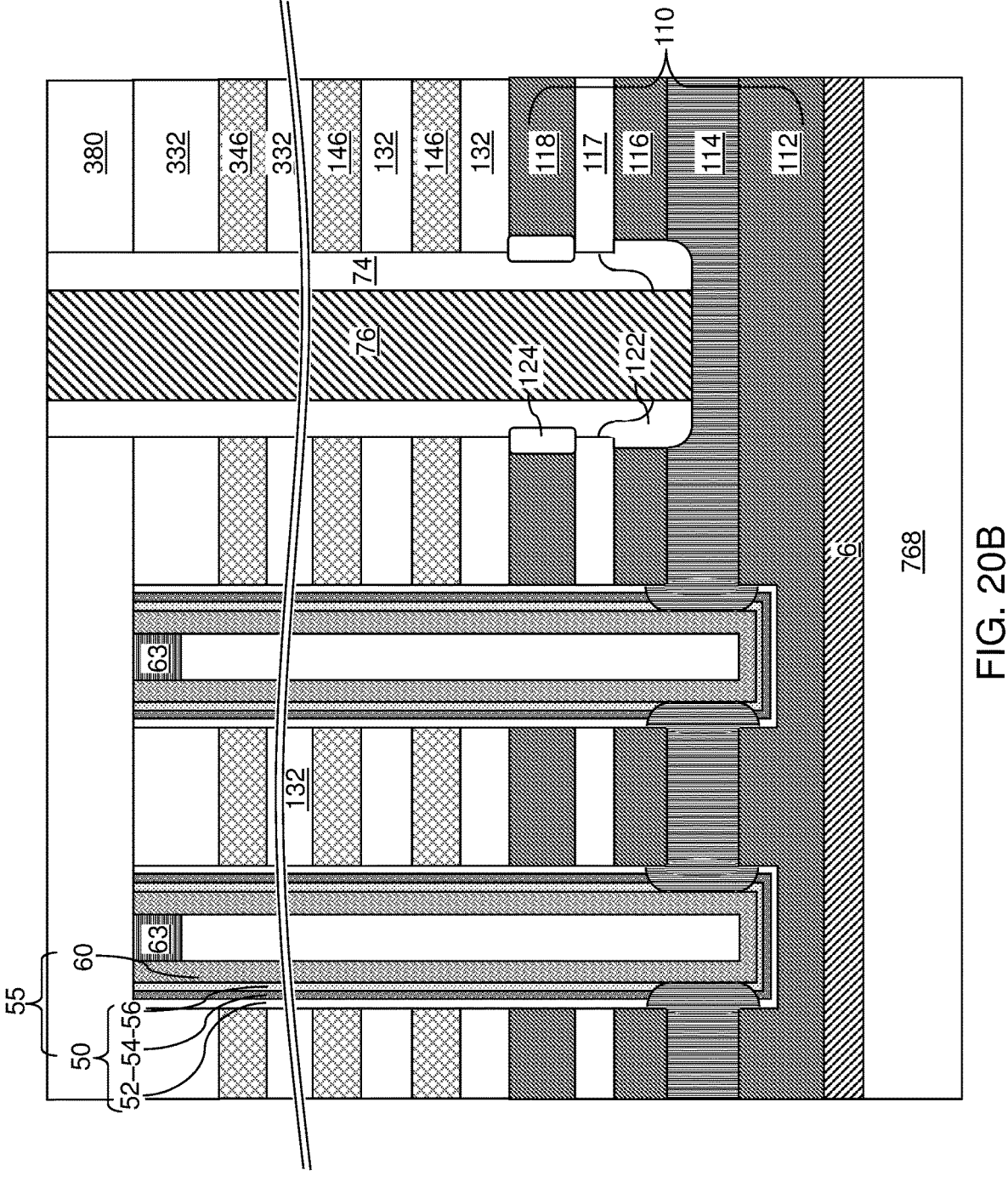
FIG. 20B is a magnified vertical cross-sectional view of a region of the first exemplary structure of FIG. 20A.

Referring to FIGS. 20A and 20B, an insulating spacer material layer such as a silicon oxide layer can be formally deposited in the first subset of the backside trenches 79 and over the contact-level dielectric layers 380. An anisotropic etch process can be performed to remove horizontally-extending portions of the insulating spacer material layer from above the contact-level dielectric layers 380 and at the bottom of the first subset of the backside trenches 79. In one embodiment, center portions of the semiconductor oxide plates 122 may be collaterally etched to physically expose top surface segments of underlying portions of the source contact layer 114. Each remaining vertically-extending tubular portion of the insulating spacer material layer constitutes a backside insulating spacer 74.

At least one conductive material, such as at least conductive material, can be subsequently deposited in the cavities in the first subset of the backside trenches 79. The at least one conductive material may comprise at least one conductive barrier material (e.g., a conductive nitride material such as TiN, TaN, and/or WN) and at least one conductive fill material (e.g., W, Cu, Co, Ru, Mo, etc.). Excess portions of the at least one conductive material can be removed from above the horizontal plane including the top surfaces of the contact-level dielectric layer 380 by a planarization process, which may employ a recess etch process and/or a chemical mechanical polishing process. Each remaining portion of the at least one conductive material constitutes a backside contact via structure 76. Each contiguous combination of a backside insulating spacer 74 and a backside contact via structure 76 constitutes a backside trench fill structure (74, 76). Each backside trench 79 within the first subset of the backside trenches 79 can be filled with a respective backside trench fill structure (74, 76).

Generally, backside trench fill structures (74, 76) can be formed in the second subset of the backside trenches 79. Each of the backside trench fill structures (74, 76) comprises a respective backside insulating spacer 74 and a respective backside contact via structure 76. In one embodiment, each of the backside contact via structures 76 is formed directly on a respective surface of the source contact layer 114. In one embodiment, each recessed surface segment of the source layer (112, 114, 116) that is contacted by a respective backside contact via structures 76 is a surface of the source contact layer 114. In one embodiment, each backside contact via structure 76 is laterally surrounded by, and is laterally spaced from a respective neighboring pair of alternating stacks {(132, 146), (232, 246), (332, 346)} by, a respective backside insulating spacer 74. Each backside insulating spacer 74 laterally surrounds a respective backside contact via structure 76 therein.

Figure 21A:
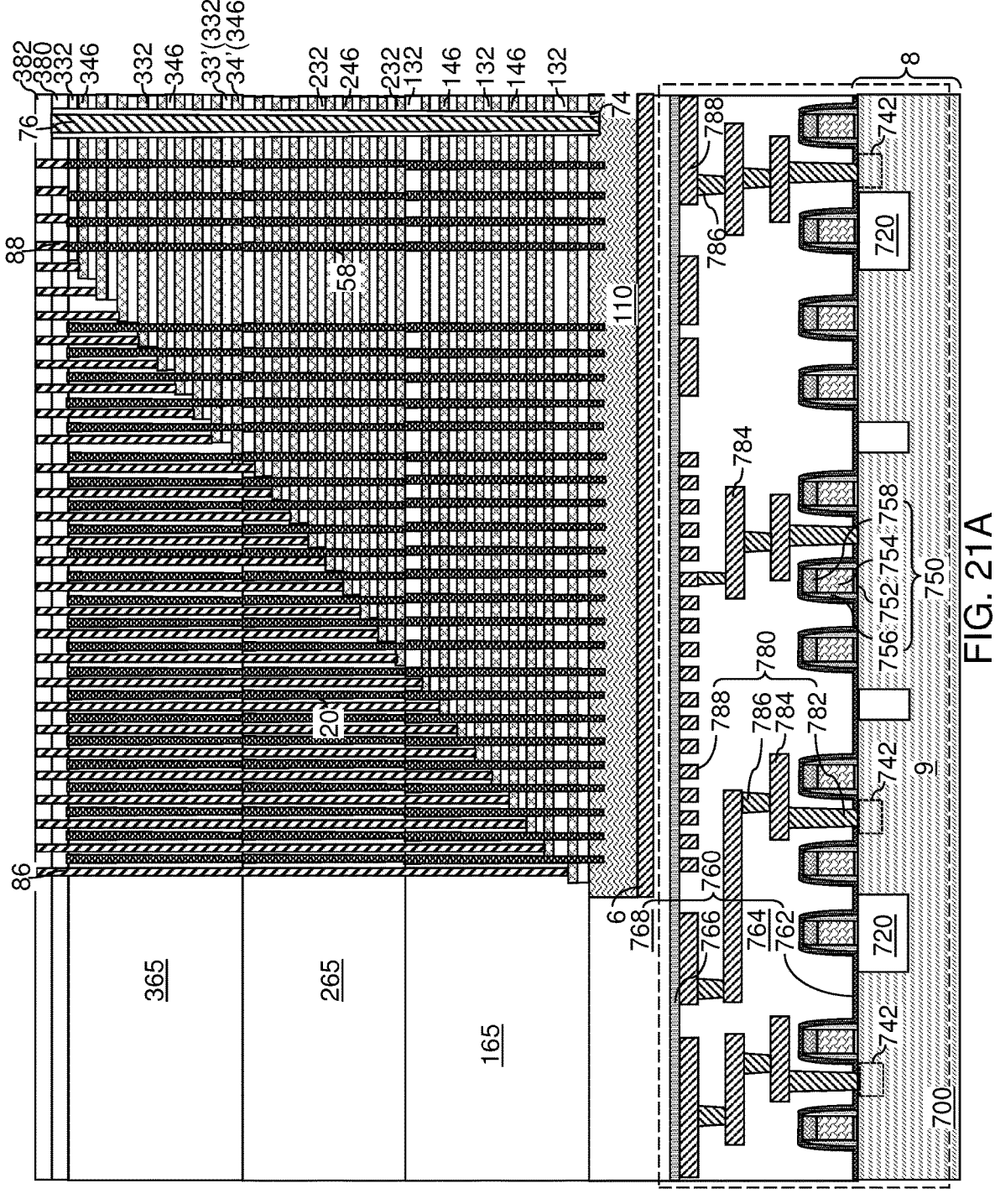
FIG. 21A is a vertical cross-sectional view of the first exemplary structure after formation of drain contact via structures and layer contact via structures according to the first embodiment of the present disclosure.
Figure 21B:
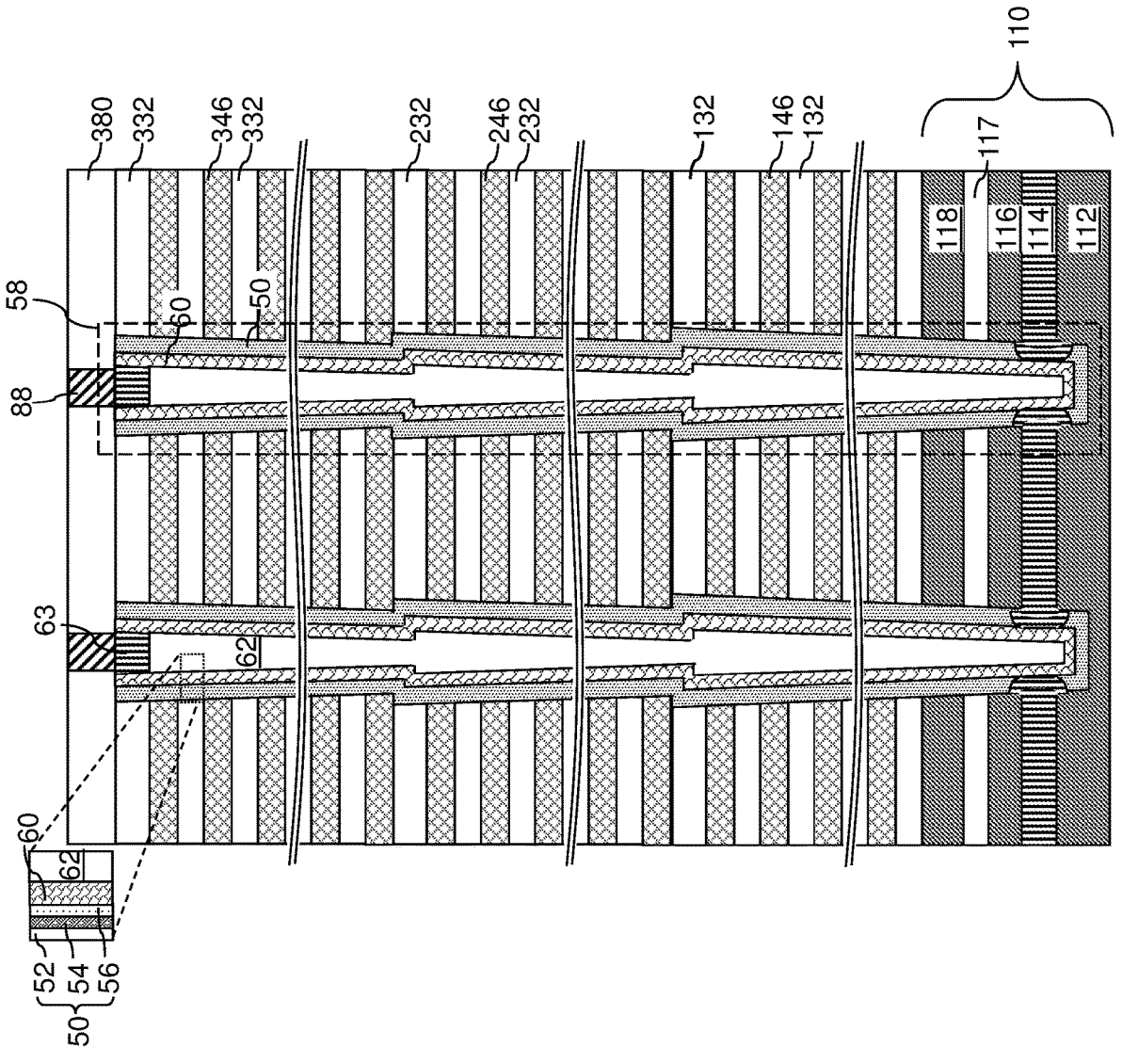
FIG. 21B is a vertical cross-sectional view of a region including memory opening fill structures in the first exemplary structure of FIG. 21A.

Referring to FIGS. 21A and 21B, a via-level dielectric layer 382 can be formed over the contact-level dielectric layers 380. A photoresist layer (not shown) can be applied over the via-level dielectric layers 382, and can be lithographically patterned to form various contact via openings. For example, openings for forming drain contact via structures can be formed through the via-level dielectric layer 382 and the contact-level dielectric layer in the memory array region 100, and openings for forming layer contact via structures can be formed through the via-level dielectric layer 382, the contact-level dielectric layer 380, and the retro-stepped dielectric material portions (165, 265, 365) in the staircase region 200. An anisotropic etch process is performed to transfer the pattern in the photoresist layer through the via-level dielectric layer 382, the contact-level dielectric layers 380, and underlying dielectric material portions. The drain regions 63 and the electrically conductive layers (146, 246, 346) can be employed as etch stop structures. Drain contact via cavities can be formed over each drain region 63, and layer contact via cavities can be formed over each electrically conductive layer (146, 246, 346) at the stepped surfaces underlying the retro-stepped dielectric material portions (165, 265, 365). The photoresist layer can be subsequently removed, for example, by ashing.

At least one conductive material can be deposited in the layer contact via cavities and the drain contact via cavities. The at least one conductive material can include at least one conductive material. Excess portions of the at least one conductive material can be removed from above the horizontal plane including the top surface of the via-level dielectric layer 382 by a planarization process. The planarization process can employ a recess etch process and/or a chemical mechanical planarization process. Remaining portions of the at least one conductive material in the drain contact via cavities constitute drain contact via structures 88. Remaining portions of the at least one conductive material in the layer contact via cavities constitute layer contact via structures 86. The layer contact via structures 86 may comprise first contact via structures that vertically extend through the third retro-stepped dielectric material portion 365, the second retro-stepped dielectric material portion 265, and the first retro-stepped dielectric material portion 165 and contact a respective one of the first electrically conductive layers 146, second contact via structures that vertically extend through the third retro-stepped dielectric material portion 365 and the second retro-stepped dielectric material portion 265 and contact a respective one of the second electrically conductive layers 246, and third contact via structures that vertically extend through the third retro-stepped dielectric material portion 365 and contact a respective one of the third electrically conductive layers 346.

Upper-level metal interconnect structures (not shown) and upper-level dielectric material layers (not shown) can be formed over the via-level dielectric layer 382. For example, the upper-level dielectric material layers may comprise a bit-line-level dielectric layer (not shown) and additional dielectric material layers (not shown). The upper-level metal interconnect structures may comprise bit lines and additional metal lines and via structures (not shown).

According to a second embodiment of the present disclosure, an etch stop semiconductor material layer and an optional etch stop conductive material layer may be employed as at least one etch stop structure during formation of various openings through alternating stacks of material layers.

FIGS. 22A-22D are vertical cross-sectional views of first-tier memory openings 149 during formation of sacrificial first-tier memory opening fill structures 148, a first etch stop semiconductor material layer 180, and a first etch stop conductive material layer 182 in a first configuration of the second exemplary structure according to a second embodiment of the present disclosure.

Figure 22A:
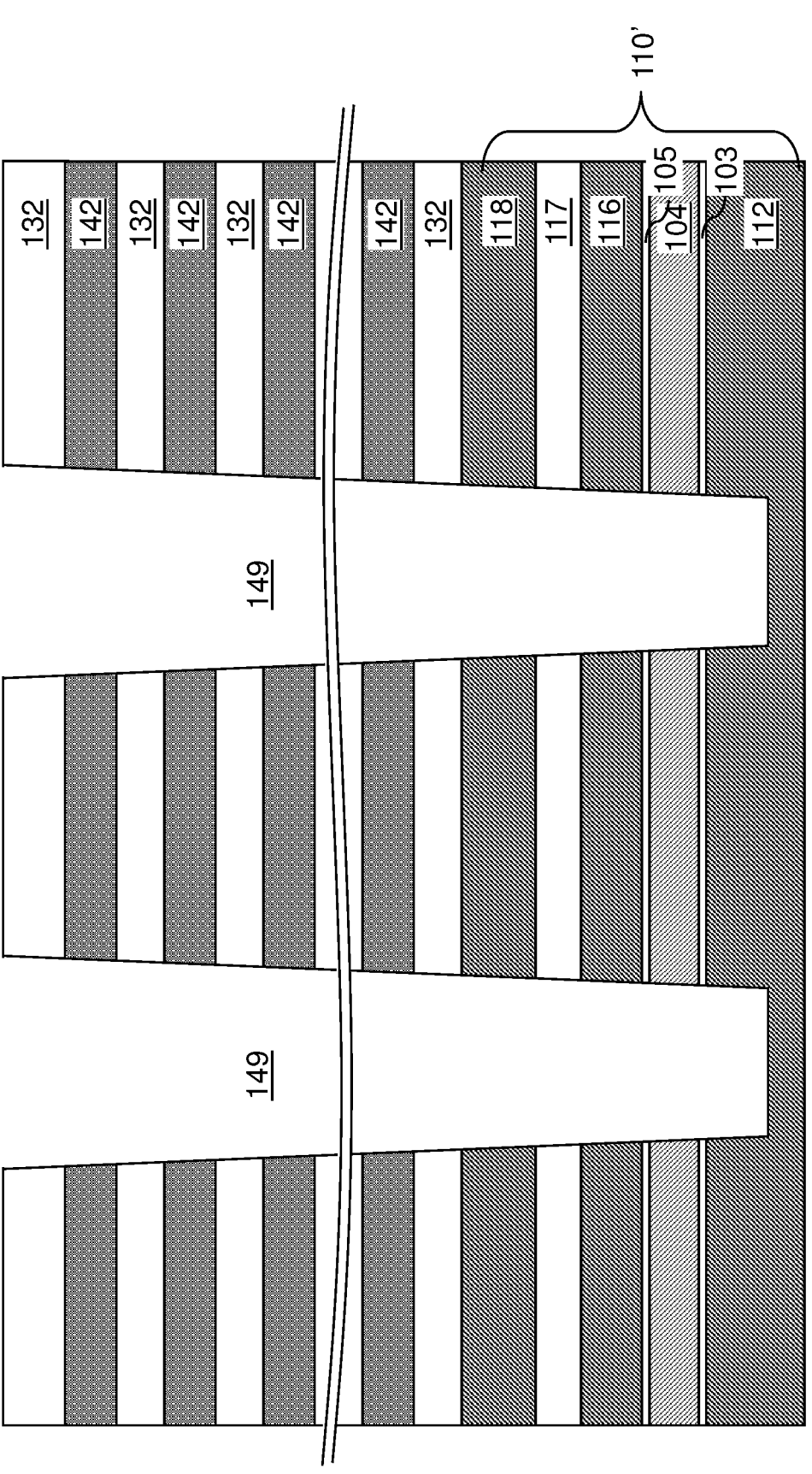
FIGS. 22A-22D are vertical cross-sectional views of first-tier memory openings during formation of sacrificial first-tier memory opening fill structures, a first etch stop semiconductor material layer, and a first etch stop conductive material layer in a first configuration of the second exemplary structure according to a second embodiment of the present disclosure.

Referring to FIG. 22A, the first configuration of the second exemplary structure is illustrated after formation of first-tier memory openings 149 and first-tier support openings. The first configuration of the second exemplary structure at this processing step can be the same as the first configuration of the first exemplary structure illustrated in FIG. 5A.

Figure 22B:
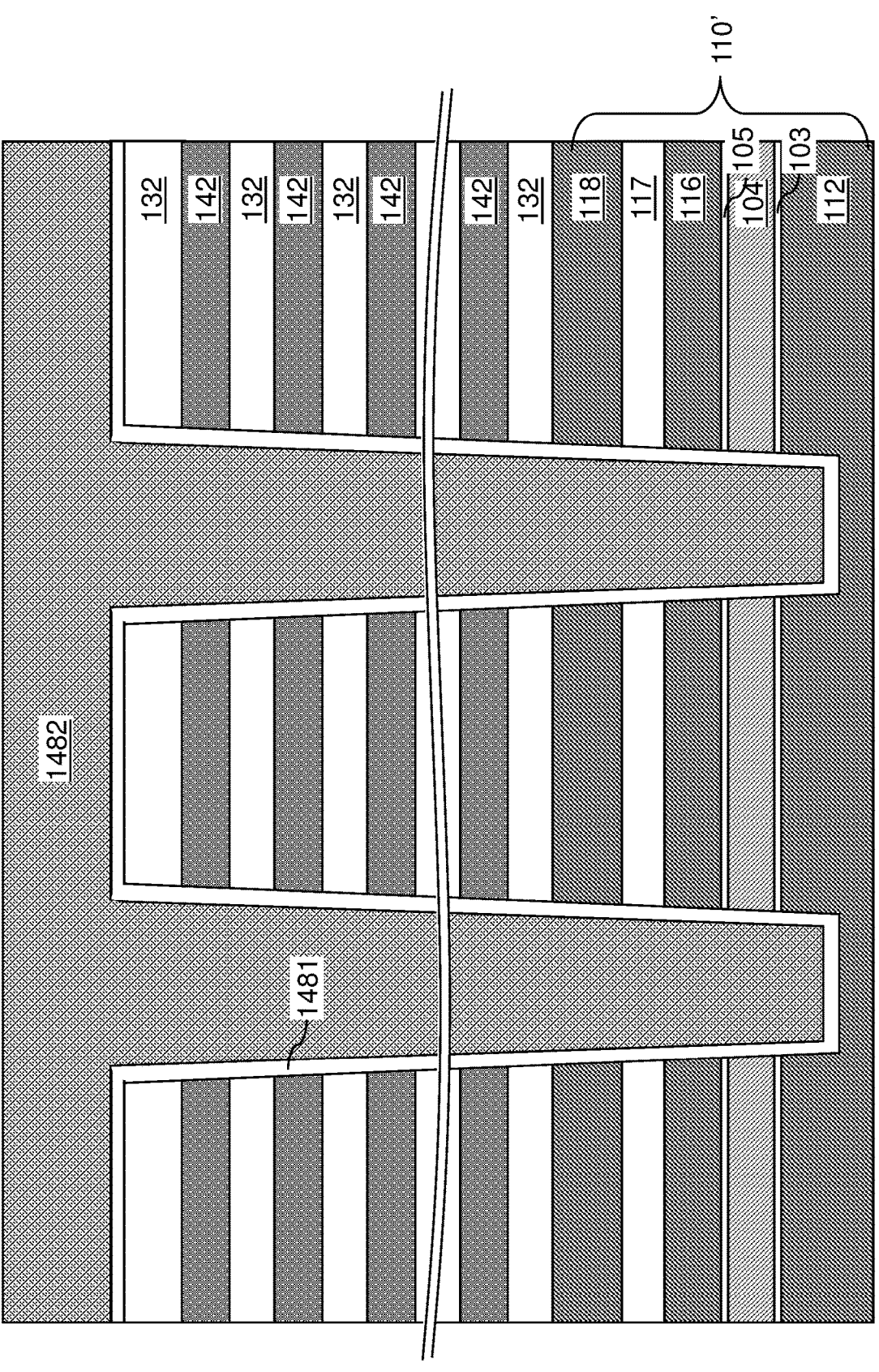

Referring to FIG. 22B, a first dielectric liner layer 1481 can be formed by performing a conformal deposition process. The first dielectric liner layer 1481 includes a dielectric material such as silicon oxide, and can have a thickness in a range from 2 nm to 12 nm, such as from 3 nm to 8 nm, although lesser and greater thicknesses may also be employed.

A first carbon-based fill material layer 1482 can be formed by depositing a first carbon-based fill material in the first-tier memory openings 149 and the first-tier support openings 129. The first carbon-based fill material comprises carbon at an atomic percentage greater than 50%. For example, the first carbon-based fill material may comprise, and/or may consist essentially of, amorphous carbon, diamond-like carbon, or doped derivatives therefrom.

Figure 22C:
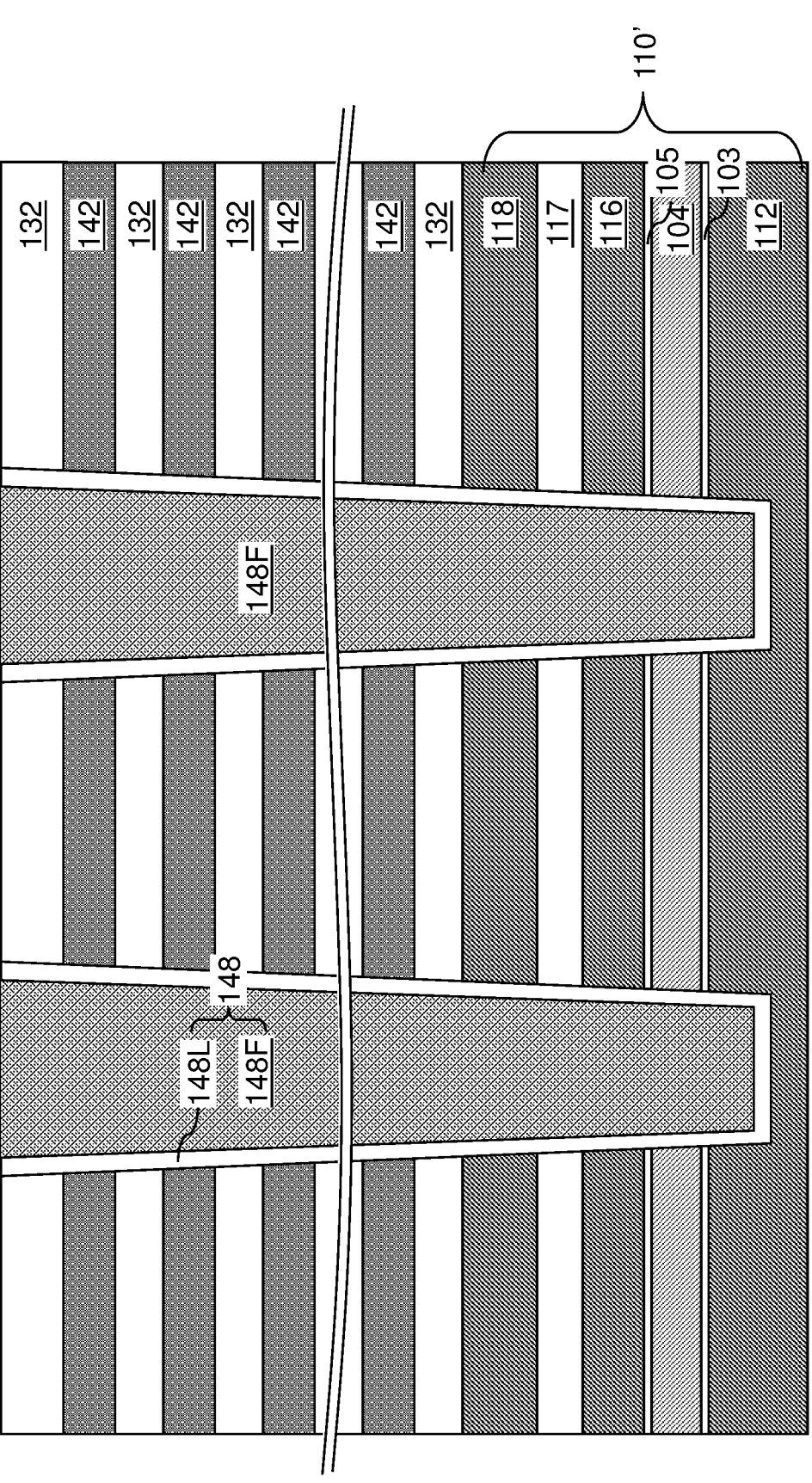

Referring to FIG. 22C, portions of the first carbon-based fill material layer 1482 and the first dielectric liner layer 1481 that overlie the topmost surface of the first-tier alternating stack (132, 142) can be removed by performing a planarization process. The planarization process may employ at least one recess etch process and/or a chemical mechanical polishing process. Each remaining portion of the first carbon-based fill material in the first-tier memory openings 149 and the first-tier support openings 129 constitutes a first carbon-based fill material portion 148F. Generally, the first carbon-based fill material portions 148F are formed by depositing a first carbon-based fill material in the first-tier memory opening 149 and over the first-tier alternating stack (132, 142), and by removing portions of the first carbon-based fill material from above the first-tier alternating stack (132, 142). Each remaining portion of the first dielectric liner layer 1481 constitutes a first dielectric liner 148L. Each contiguous combination of a first dielectric liner 148L and a first carbon-based fill material portion 148F filling a first-tier memory opening 149 constitutes a sacrificial first-tier memory opening fill structure 148. Each contiguous combination of a first dielectric liner 148L and a first carbon-based fill material portion 148F filling a first-tier support opening 129 constitutes a sacrificial first-tier memory opening fill structure.

Figure 22D:
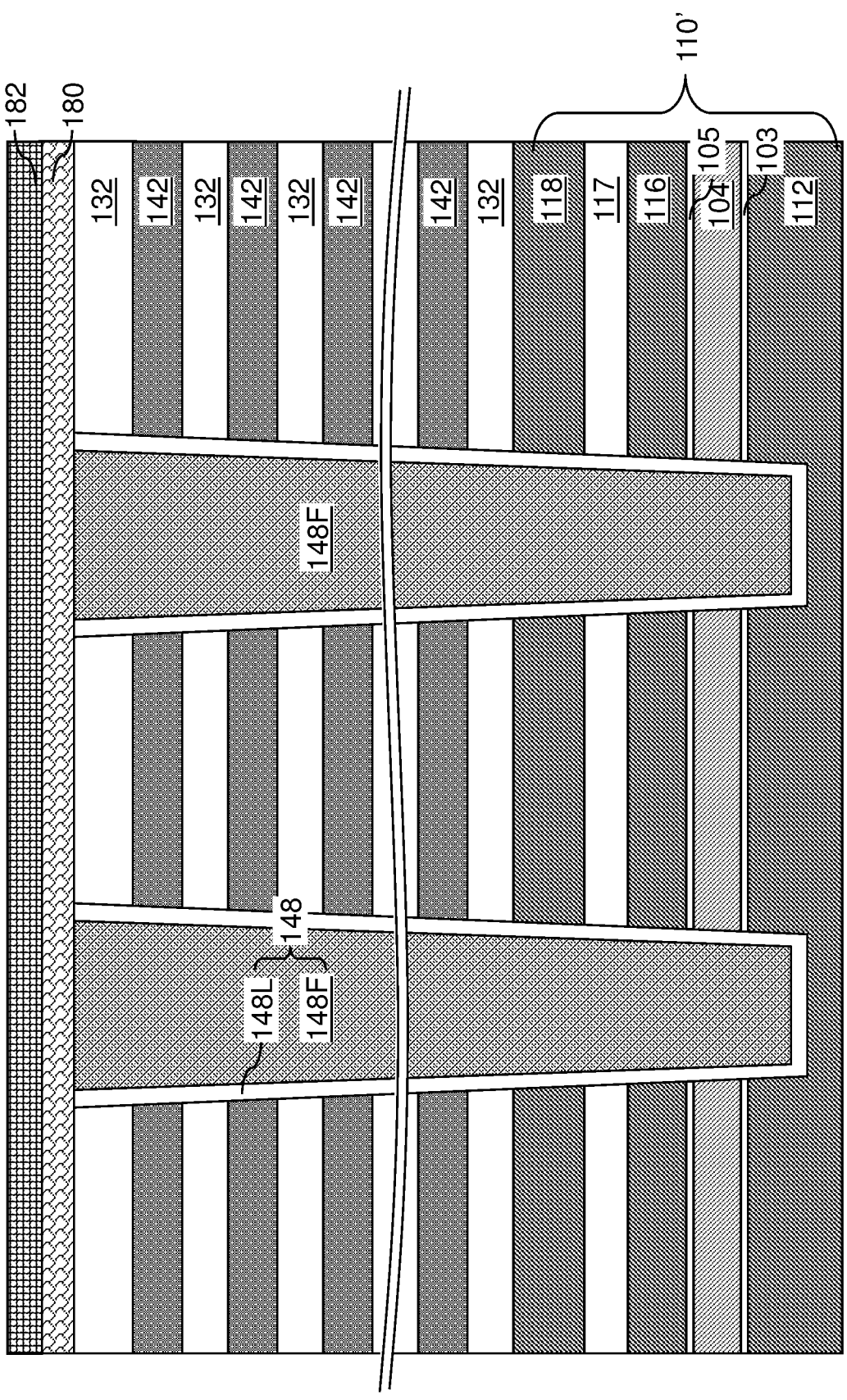

Referring to FIG. 22D, a first etch stop semiconductor material layer 180 can be formed over the first-tier alternating stack (132, 146) and the sacrificial first-tier memory opening fill structures 148. The first etch stop semiconductor material layer 180 includes a semiconductor material such as amorphous silicon, polysilicon, a silicon-germanium alloy, or doped derivatives thereof. The first etch stop semiconductor material layer 180 may be deposited by a conformal or non-conformal deposition process, and may have a thickness in a range from 5 nm to 50 nm, such as from 10 nm to 30 nm, although lesser and greater thicknesses may also be employed.

Subsequently, a first etch stop conductive material layer 182 can be optionally formed over the first etch stop semiconductor material layer 180. The first etch stop conductive material layer 182 comprises and/or consists essentially of a transition metal or a conductive metal compound. In one embodiment, the first etch stop conductive material layer 182 may comprise and/or may consist essentially of a metal, such as tungsten, molybdenum, ruthenium, cobalt, another transition metal, or alloys thereof, or a conductive compound, such as a metal silicide or metal nitride, such as titanium silicide, tungsten silicide, cobalt silicide, nickel silicide, titanium nitride, tantalum nitride, molybdenum nitride, tungsten nitride, etc. The thickness of the first etch stop conductive material layer 182 may be in a range from 5 nm to 50 nm, such as from 10 nm to 30 nm, although lesser and greater thicknesses may also be employed.

Figure 22E:
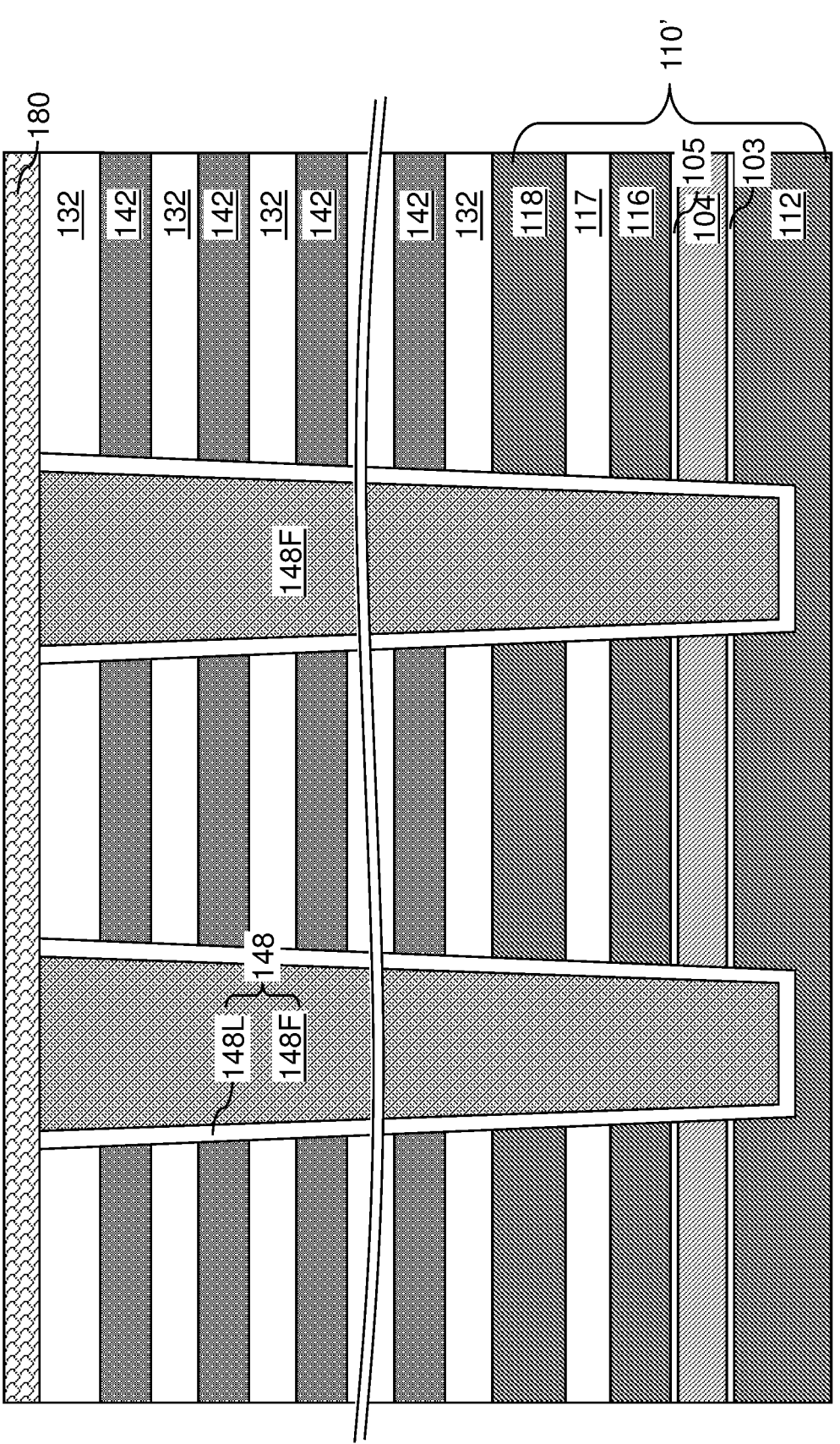
FIG. 22E is a vertical cross-sectional view of first-tier memory openings after formation of sacrificial first-tier memory opening fill structures and a first etch stop semiconductor material layer in a second configuration of the second exemplary structure according to the second embodiment of the present disclosure.

Referring to FIG. 22E, a second configuration of the second exemplary structure according to the second embodiment of the present disclosure can be derived from the first configuration of the second exemplary structure illustrated in FIG. 22D by omitting formation of the first etch stop conductive material layer 182.

Figure 23:
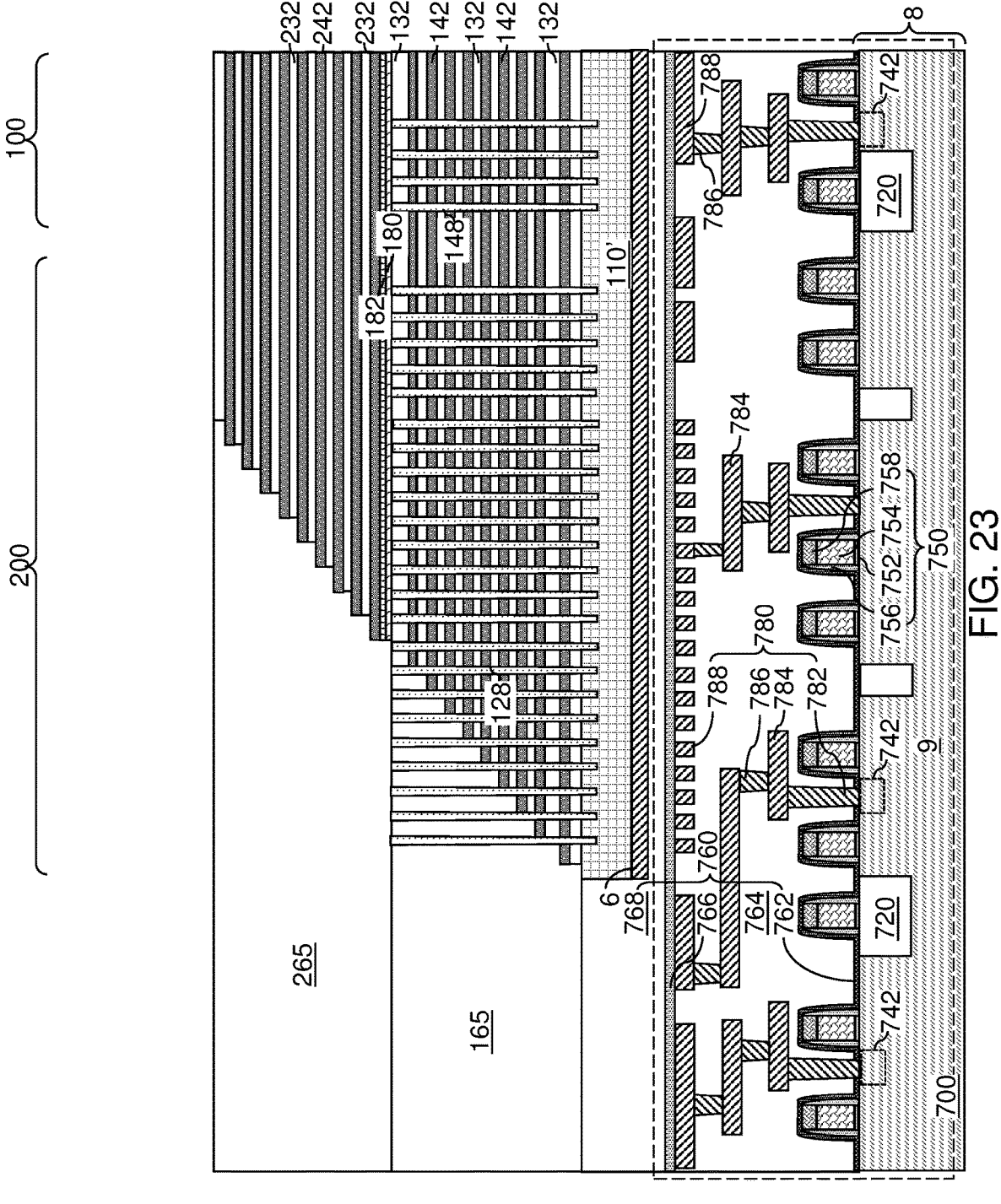
FIG. 23 is a vertical cross-sectional view of the second exemplary structure after formation of a second vertically alternating sequence of second insulating layers and second spacer material layers, second stepped surfaces, and a second retro-stepped dielectric material portion according to the second embodiment of the present disclosure.

Referring to FIG. 23, the processing steps described with reference to FIG. 8 can be performed to form a second-tier structure including a second alternating stack of second insulating layers 232 and second sacrificial material layers 242, second stepped surfaces, and a second retro-stepped dielectric material portion 265. The second-tier alternating stack (232, 242) is formed over the first etch stop semiconductor material layer 180. In case the first etch stop conductive material layer 182 is present over the first etch stop semiconductor material layer 180 as in the case of the first configuration illustrated in FIG. 22D, the second-tier alternating stack (232, 242) is formed over the first etch stop conductive material layer 182. In case a first etch stop conductive material layer 182 is not present as in the case of the first configuration illustrated in FIG. 22E, the second-tier alternating stack (232, 242) is formed directly on a top surface of the first etch stop semiconductor material layer 180.

Figure 24:
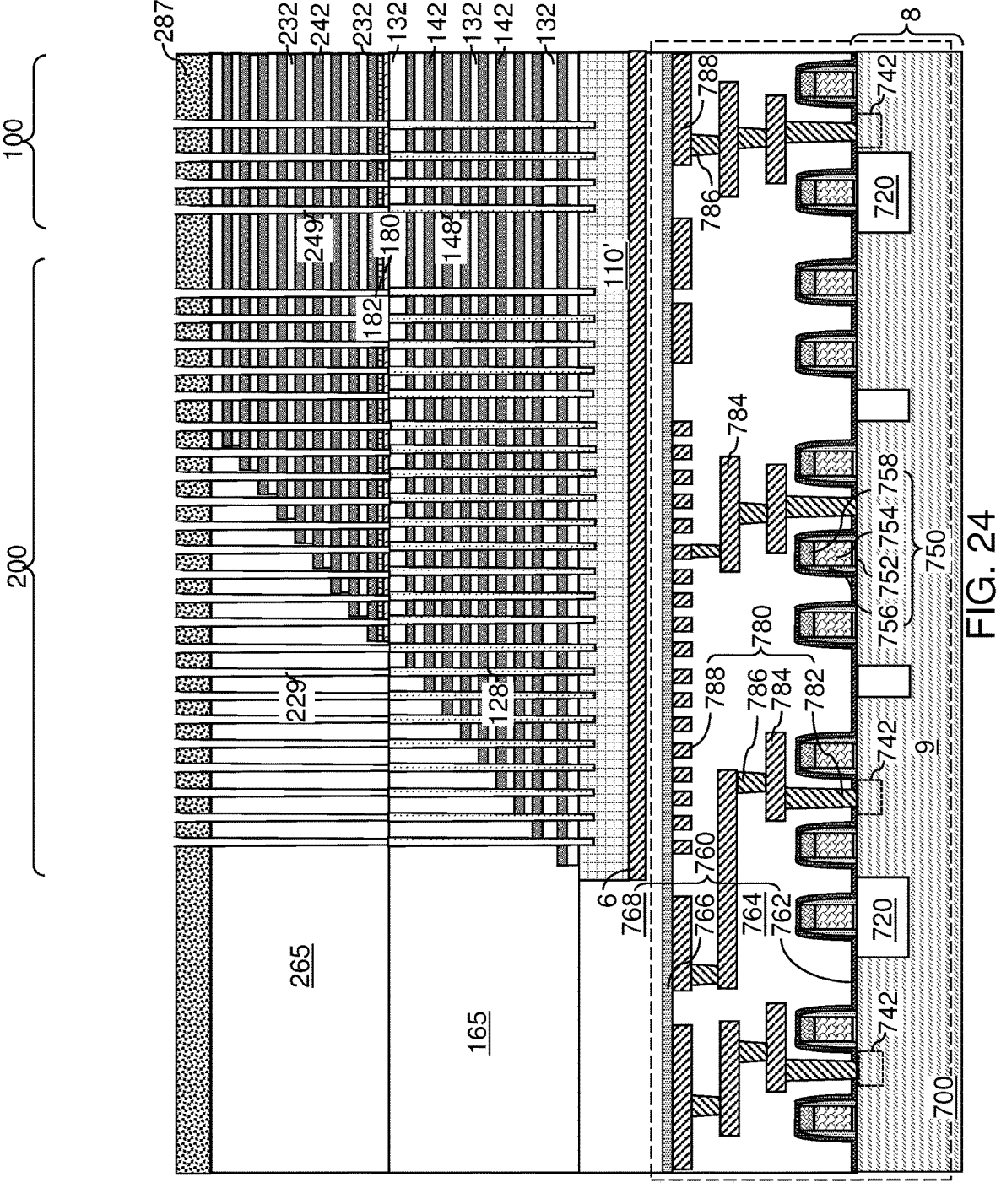
FIG. 24 is a vertical cross-sectional view of the first configuration of the second exemplary structure after formation of second-tier memory openings and second-tier support openings according to the second embodiment of the present disclosure.

Referring to FIG. 24, the processing steps described with reference to FIGS. 9A and 9B can be performed to form a patterned etch mask layer 287 over the second-tier alternating stack (232, 242), and to form second-tier memory opening 249 and second-tier support openings 229 underneath the openings in the patterned etch mask layer 287. A main etch step of the anisotropic etch process employed to form the second-tier memory opening 249 and the second-tier support openings 229 may have an etch chemistry that etches materials of the second insulating layers 232 and the second spacer material layers selective to at least one material of the first etch stop material layers (180, 182). As discussed above, the patterned etch mask layer 287 may comprise a carbon-based material comprising carbon at an atomic percentage greater than 50%.

FIGS. 26A-26G are vertical cross-sectional views of first-tier memory openings 149 and second-tier memory openings 249 during formation of sacrificial second-tier memory opening fill structures 248, a second etch stop semiconductor material layer 280, and a second etch stop conductive material layer 282 in the first configuration of the second exemplary structure according to the second embodiment of the present disclosure.

Figure 25:
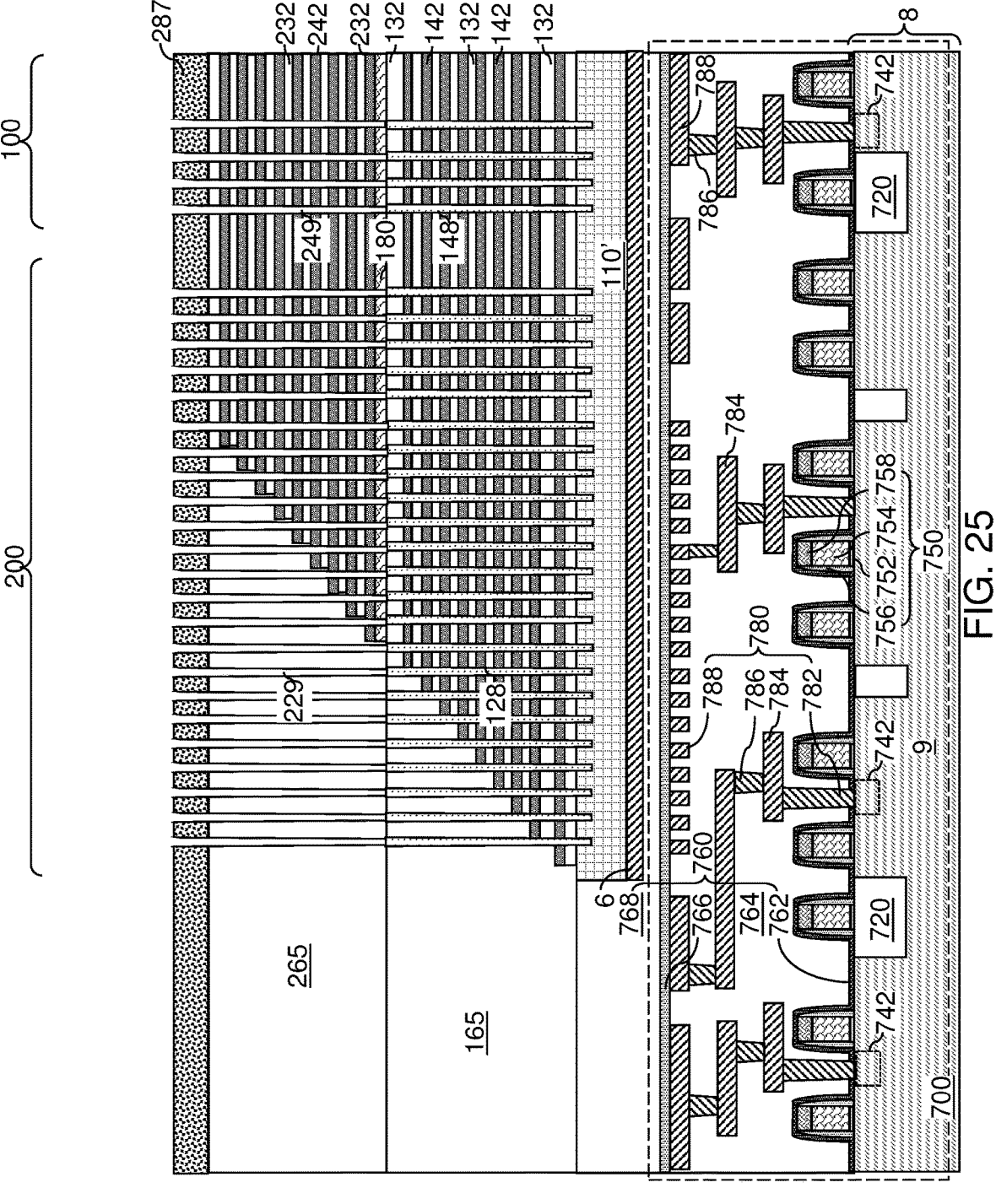
FIG. 25 is a vertical cross-sectional view of the second configuration of the second exemplary structure after formation of second-tier memory openings and second-tier support openings according to the second embodiment of the present disclosure.
Figure 26A:
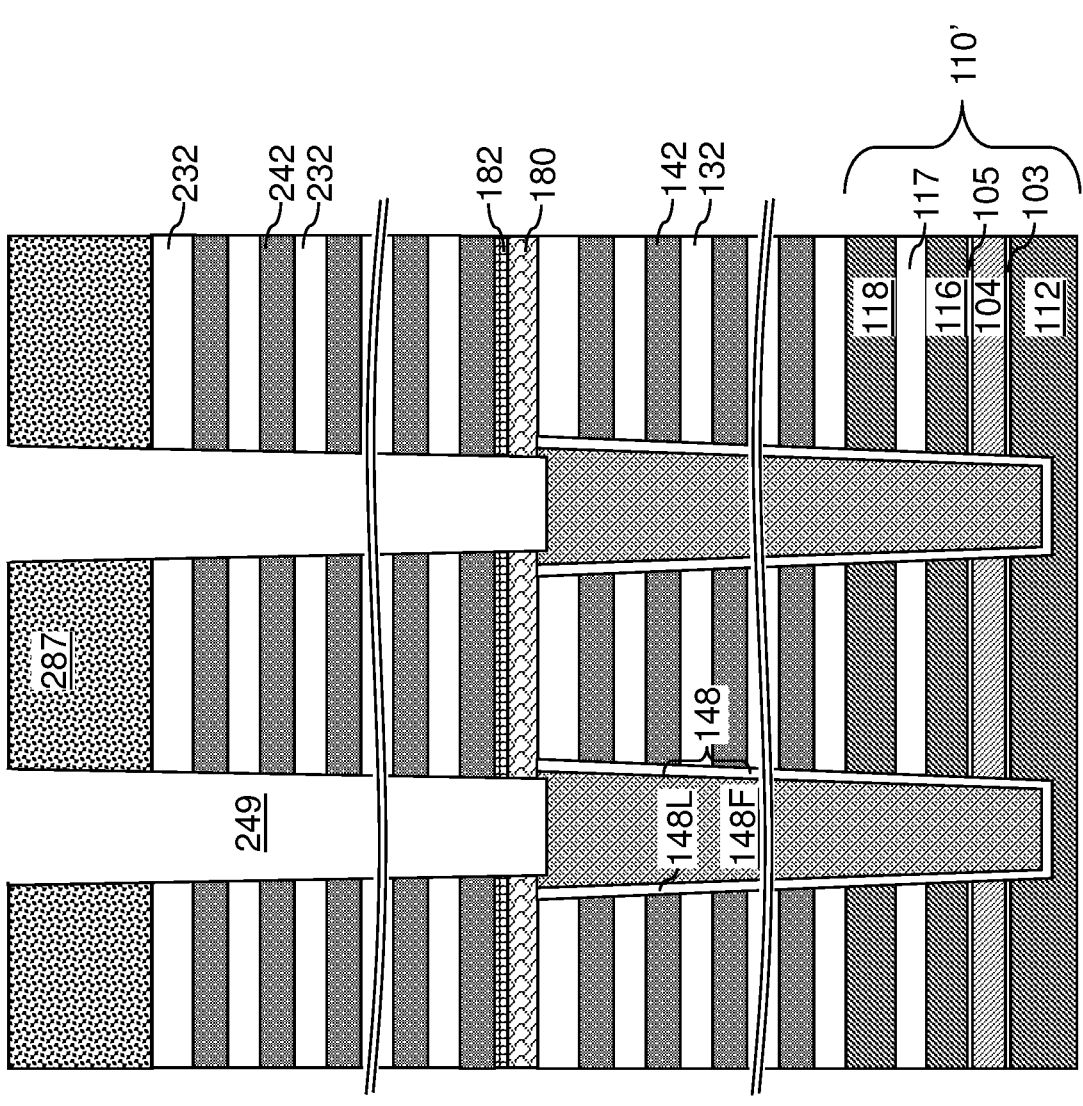
FIGS. 26A-26G are vertical cross-sectional views of first-tier memory openings and second-tier memory openings during formation of sacrificial second-tier memory opening fill structures, a second etch stop semiconductor material layer, and a second etch stop conductive material layer in the first configuration of the second exemplary structure according to the second embodiment of the present disclosure.

Referring to FIG. 26A, second-tier memory openings 249 are illustrated after the processing steps described with reference to FIG. 25. The anisotropic etch process employed to form the second-tier memory openings 249 and the second-tier support openings 229 may comprise a main etch step having an etch chemistry that etches materials of the second insulating layers 232 and the second spacer material layers 242 selective to at least one material of the first etch stop material layers (180, 182). In case the at least one material of the first etch stop material layers (180, 182) comprises a stack of the first etch stop conductive material layer 182 and the first etch stop semiconductor material layer 180, the etch chemistry of the main etch step may be selective to the material of the first etch stop conductive material layer 182 and/or the material of the first etch stop semiconductor material layer 180. In one embodiment, the main etch step of the anisotropic etch process may etch through the first etch stop conductive material layer 182 and may terminate before etching through the first etch stop semiconductor material layer 180. In another embodiment, the main etch step of the anisotropic etch process may terminate while etching the first etch stop conductive material layer 182.

A terminal etch step of the anisotropic etch process may etch through any unmasked remaining portion of the first etch stop conductive material layer 182 (if present), and etch through the first etch stop semiconductor material layer 180. The etch chemistry of the terminal etch step of the anisotropic etch process may be selective to the material of the first carbon-based fill material portions 148F.

Figure 26B:
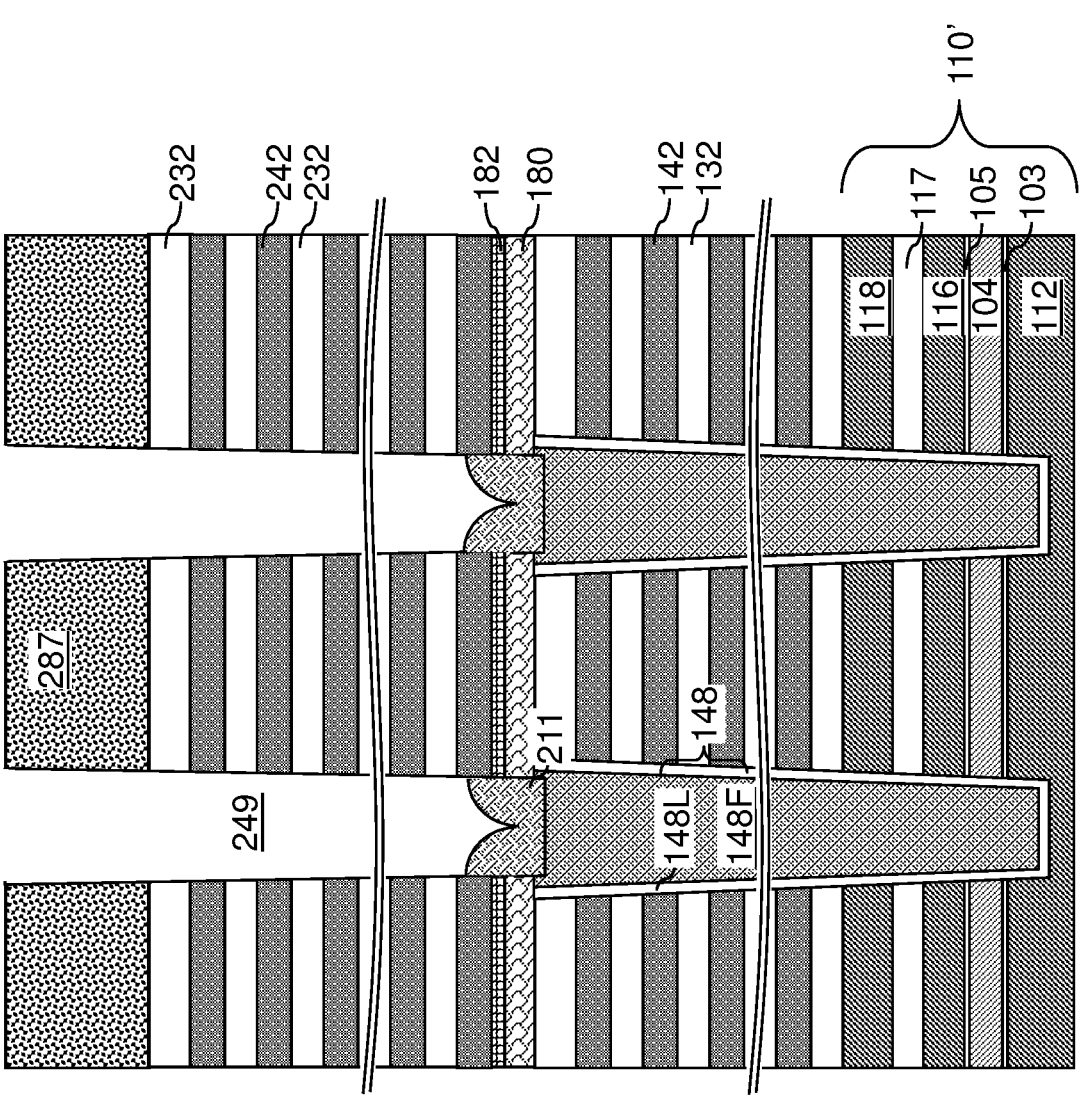

Referring to FIG. 26B, a first selective semiconductor deposition process can be performed to grow a semiconductor material from the physically exposed cylindrical sidewalls of the first etch stop semiconductor material layer 180 around bottom portions of the second-tier memory openings 249 and the second-tier support openings 229. The first selective semiconductor deposition process grows a semiconductor material from physically exposed semiconductor surfaces while suppressing growth of the semiconductor material from physically exposed dielectric surfaces such as the surfaces of the second insulating layers 232, the second sacrificial material layers 242, and the patterned etch mask layer 287. The semiconductor material deposited by the first selective semiconductor deposition process may comprise amorphous silicon, polysilicon, a silicon-germanium alloy, or other semiconductor materials. During the first selective semiconductor deposition process, a reactant including a precursor gas for the semiconductor material to be deposited and an etchant gas can be simultaneously or alternately flowed into a process change in which the second exemplary structure is placed. Generally, semiconductor surfaces provide higher nucleation rates and higher growth rates for the semiconductor material than dielectric surfaces. In contrast, the etch rate is generally independent of the underlying surfaces. The flow rates of the reactant gas and the etchant gas can be selected such that the deposition rate on semiconductor surfaces is greater than the etch rate on semiconductor surfaces, while the deposition rate on dielectric surfaces is less than the etch rate. Thus, the semiconductor material can grow only from the physically exposed semiconductor surfaces of the first etch stop semiconductor layer 180 while growth of the semiconductor material from the surfaces of the surfaces of the second insulating layers 232, the second sacrificial material layers 242, and the patterned etch mask layer 287 is suppressed during the selective semiconductor deposition.

The duration of the first selective semiconductor deposition process is selected such that the top surfaces of the first carbon-based fill material portions 148F are entirely covered with the semiconductor material portions grown by the first selective semiconductor deposition process, which are herein referred to as first semiconductor plugs 211. In one embodiment, each of the first semiconductor plugs 211 can be formed on a respective cylindrical sidewall of the first etch stop semiconductor material layer 180 over a respective one of the sacrificial first-tier memory opening fill structures 148. Generally, the first semiconductor plugs 211 can be formed by performing a selective semiconductor material deposition process that grows a semiconductor material from the cylindrical sidewalls of the first etch stop semiconductor material layer 180 while suppressing growth of the semiconductor material from physically exposed surfaces of the second-tier alternating stack (232, 242). The semiconductor material of the first semiconductor plugs 211 may be the same as or may be different from the semiconductor material of the first etch stop semiconductor material layer 180. In one embodiment, each first semiconductor plug 211 may have a convex top surface having a general taper direction that provides a center divot.

Figure 26C:
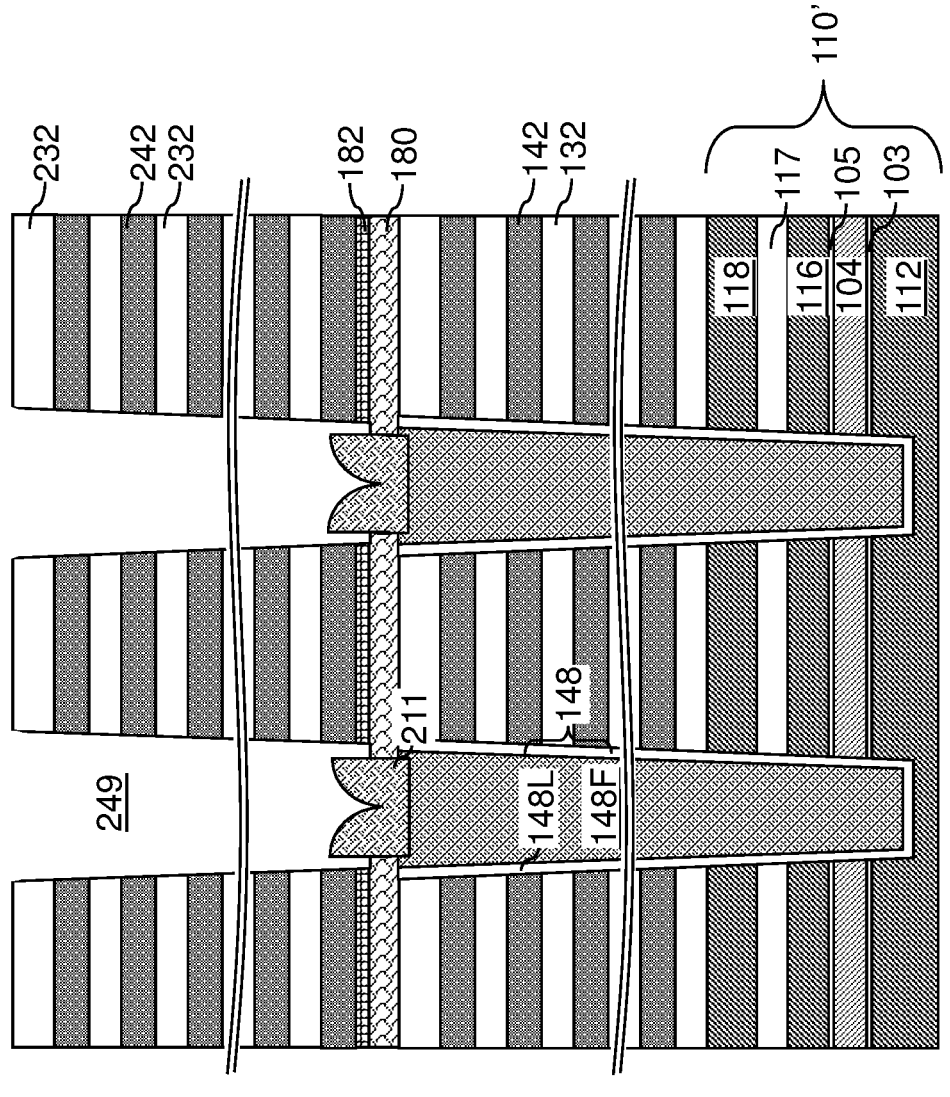

Referring to FIG. 26C, at least one isotropic etch process can be performed to laterally recess the second spacer material layers (such as the second sacrificial material layers 242) and/or the second insulating layers 232. In one embodiment, the at least one isotropic etch process may comprise a first isotropic etch process that laterally recesses the second spacer material layers (such as the second sacrificial material layers 242) around the second-tier memory openings 249, and a second isotropic etch process that laterally recesses the second insulating layers 232 around the second-tier memory openings 249. For example, if the second insulating layers 232 comprise silicon oxide and the second sacrificial material layers 242 comprise silicon nitride, the first isotropic etch process may comprise a wet etch process employing a mixture of hot phosphoric acid, and the second isotropic etch process may comprise a wet etch process employing dilute hydrofluoric acid. The first semiconductor plugs 211 act as etch stop regions and block the etchants of the isotropic etch processes from diffusion toward the first carbon-based fill material portions 148F and etching the sacrificial first-tier memory opening fill structures 148.

Generally, the second-tier memory opening 249 can be laterally expanded while the first semiconductor plug 211 covers the sacrificial first-tier memory opening fill structures 148. Thus, the second-tier memory openings 249 can be laterally expanded without expanding any portion of the first-tier memory openings 149. The patterned etch mask layer 287 can be removed prior to, or after, the at least one isotropic etch process, for example, by performing an ashing process that volatilizes the carbon-based material of the patterned etch mask layer 287. In one embodiment, the patterned etch mask layer 287 is removed while the first semiconductor plugs 211 cover the sacrificial first-tier memory opening fill structures 148.

Figure 26D:
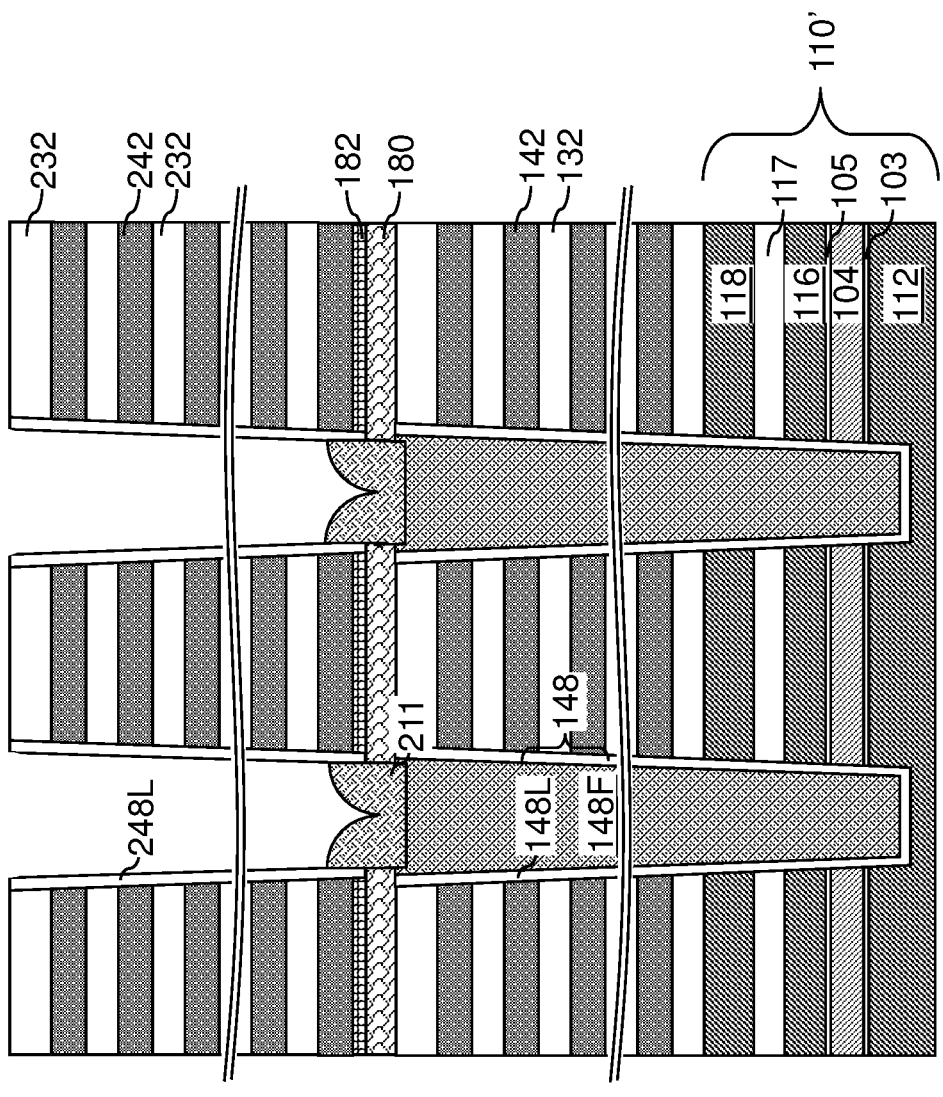

Referring to FIG. 26D, a second dielectric liner layer can be formed employing a conformal deposition process. The second dielectric liner layer includes a dielectric material such as silicon oxide, and can have a thickness in a range from 2 nm to 12 nm, such as from 3 nm to 8 nm, although lesser and greater thicknesses may also be employed. An anisotropic etch process can be performed to remove horizontally-extending portions of the second dielectric liner layer. Each remaining portion of the of the second dielectric liner layer that remains in a second-tier memory opening 249 or in a second-tier support opening 229 constitutes a second dielectric liner 248L. Each second dielectric liner 248L may have a tubular configuration. Top surfaces of the first semiconductor plugs 211 can be physically exposed after formation of the second dielectric liners 248L.

Figure 26E:
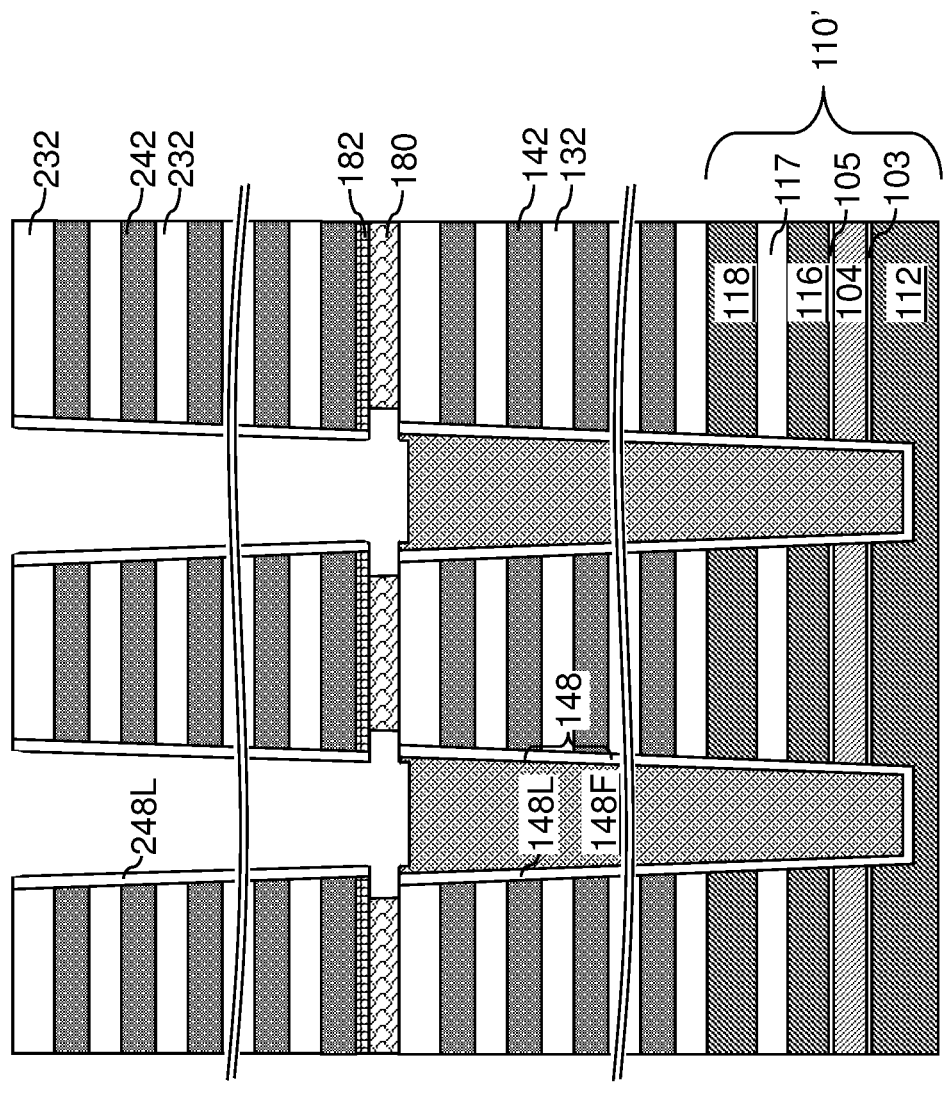

Referring to FIG. 26E, an etch process can be performed to remove the first semiconductor plugs 211 selective to the materials of second dielectric liners 248L and the first carbon-based fill material portions 148F. The etch process may comprise a wet etch process or a dry etch process. For example, a wet etch process employing hot trimethyl-2 hydroxyethyl ammonium hydroxide ("hot TMY") or tetramethyl ammonium hydroxide (TMAH) can be performed to remove amorphous silicon first semiconductor plugs 211. Alternatively or additionally, a dry etch process employing gas phase hydrochloric acid may be performed to remove the first semiconductor plugs 211.

In one embodiment, the etch process that removes the first semiconductor plugs 211 may collaterally recess each proximal portion of the first etch stop semiconductor material layer 180 around bottom portions of the second-tier memory openings 249 and the second-tier support openings 219 after removal of the first semiconductor plugs 211. The lateral recess distance of the recessed cylindrical surfaces of the first etch stop semiconductor material layer 180, as measured from a bottom periphery of an outer sidewall of a respective overlying second dielectric liner 248L, may be in a range from 5 nm to 100 nm, and/or from 10 nm to 50 nm, although lesser and greater lateral recess distances may also be employed.

Figure 26F:
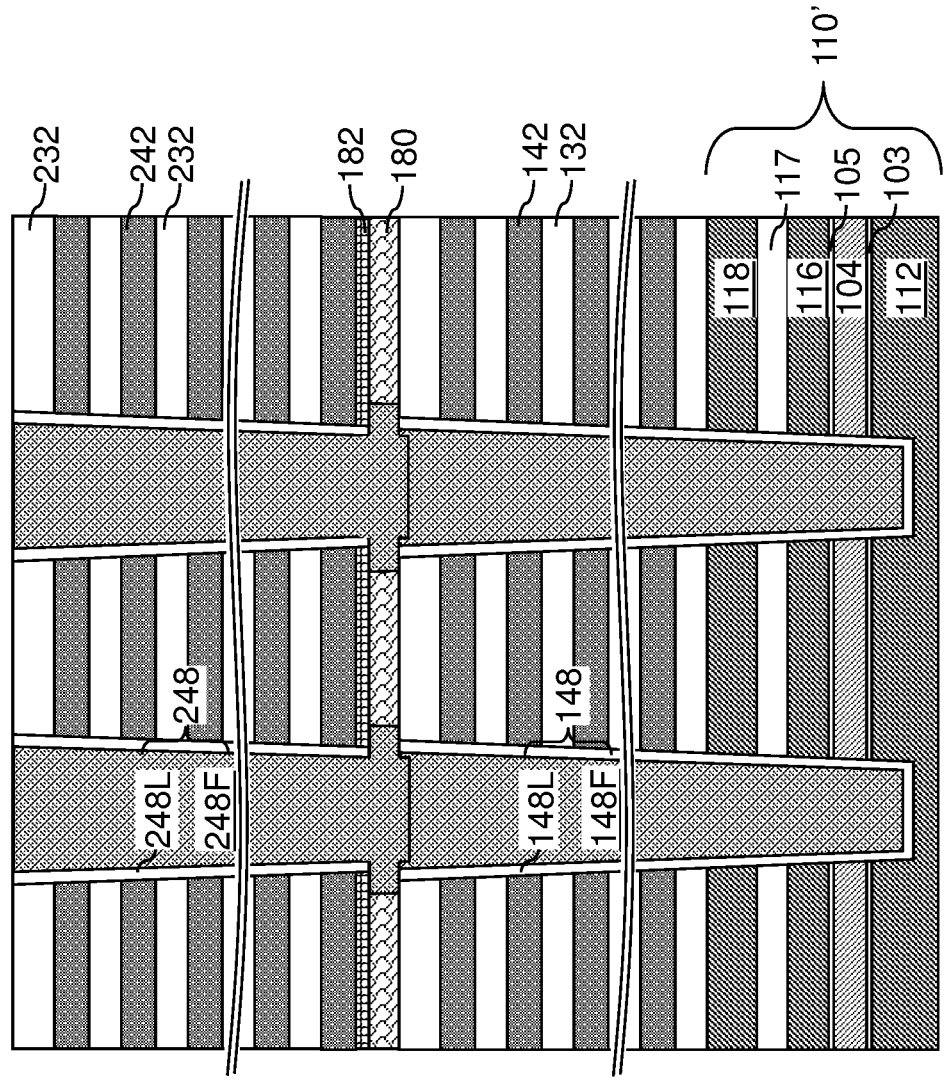

Referring to FIG. 26F, a second carbon-based fill material can be deposited in unfilled volumes of the second-tier memory openings 249 and the second-tier support openings 229. The second carbon-based fill material comprises carbon at an atomic percentage greater than 50%. For example, the second carbon-based fill material may comprise, and/or may consist essentially of, amorphous carbon, diamond-like carbon, or doped derivatives therefrom. Excess portions of the second carbon-based fill material can be removed from above the topmost surface of the second alternating stack (232, 242) by performing a planarization process, which may comprise a recess etch process and/or a chemical mechanical polishing (CMP) process. Each remaining portion of the second carbon-based fill material in the second-tier memory openings 249 and the second-tier support openings 229 constitutes a second carbon-based fill material portion 248F. Generally, the second carbon-based fill material portions 248F are formed by depositing a second carbon-based fill material in the second-tier memory opening 249 and over the second-tier alternating stack (232, 242), and by removing portions of the second carbon-based fill material at least from above the second-tier alternating stack (232, 242). Top surfaces of the second carbon-based fill material portions 248F may be coplanar with the topmost surface of the second alternating stack (232, 242).

Figure 26G:
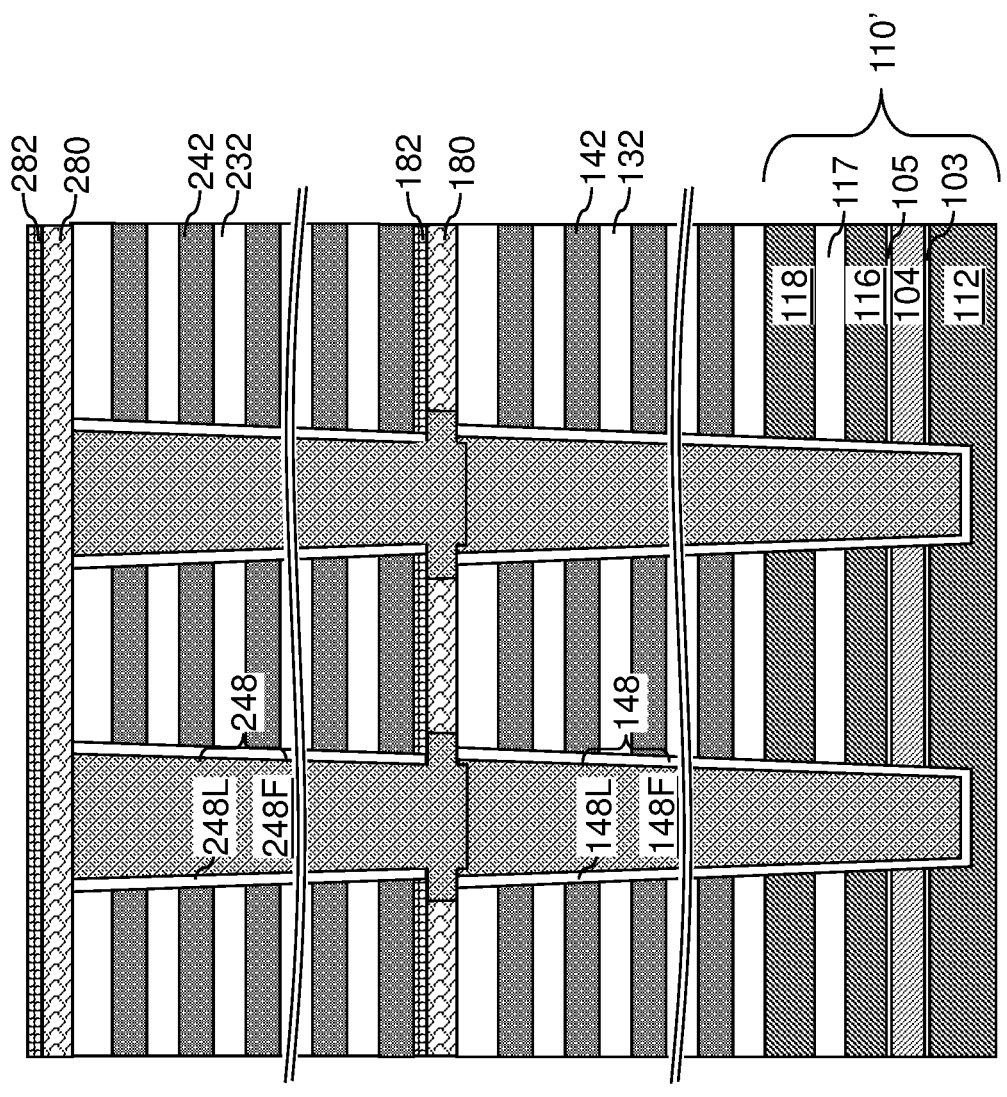

Referring to FIG. 26G, a second etch stop semiconductor material layer 280 can be formed over the second-tier alternating stack (232, 246), the sacrificial second-tier memory opening fill structures 248, the sacrificial second-tier support opening fill structures. The second etch stop semiconductor material layer 280 includes a semiconductor material, such as amorphous silicon, polysilicon, a silicon-germanium alloy, or doped derivatives thereof. The second etch stop semiconductor material layer 280 may be deposited by a conformal or non-conformal deposition process, and may have a thickness in a range from 5 nm to 50 nm, such as from 20 nm to 30 nm, although lesser and greater thicknesses may also be employed.

Subsequently, a second etch stop conductive material layer 282 can be optionally formed over the second etch stop semiconductor material layer 280. The second etch stop conductive material layer 282 comprises and/or consists essentially of a transition metal or a conductive metal compound. In one embodiment, the first etch stop conductive material layer 182 may comprise and/or may consist essentially of a metal, such as tungsten, molybdenum, ruthenium, cobalt, another transition metal, or alloys thereof, or a conductive compound, such as a metal silicide or metal nitride, such as titanium silicide, tungsten silicide, cobalt silicide, nickel silicide, titanium nitride, tantalum nitride, molybdenum nitride, tungsten nitride, etc. The thickness of the second etch stop conductive material layer 282 may be in a range from 5 nm to 50 nm, such as from 10 nm to 30 nm, although lesser and greater thicknesses may also be employed.

Figure 26H:
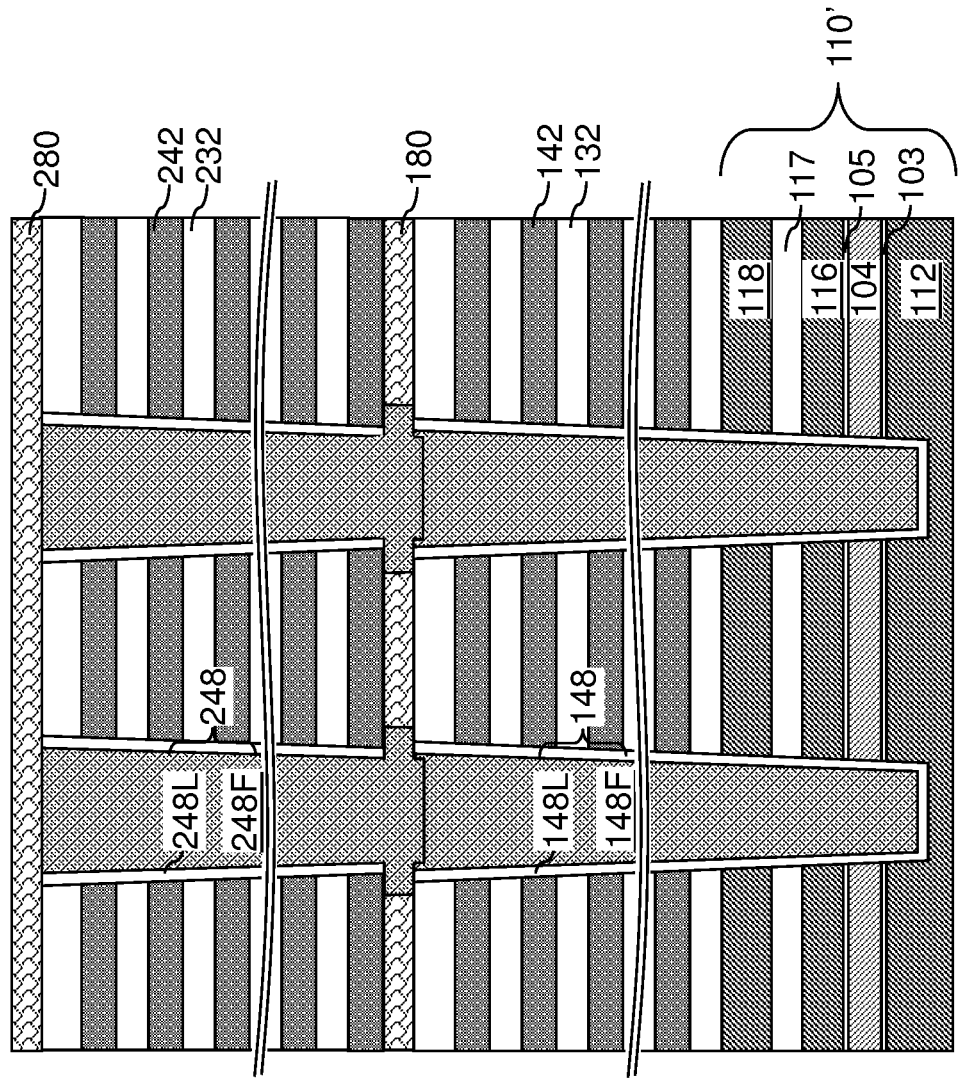
FIG. 26H is a vertical cross-sectional view of first-tier memory openings after formation of sacrificial second-tier memory opening fill structures and a second etch stop semiconductor material layer in the second configuration of the second exemplary structure according to the second embodiment of the present disclosure.

Referring to FIG. 26H, a second configuration of the second exemplary structure according to the second embodiment of the present disclosure can be derived from the second configuration of the second exemplary structure illustrated in FIG. 26G by omitting formation of the second etch stop conductive material layer 282.

Figure 27:
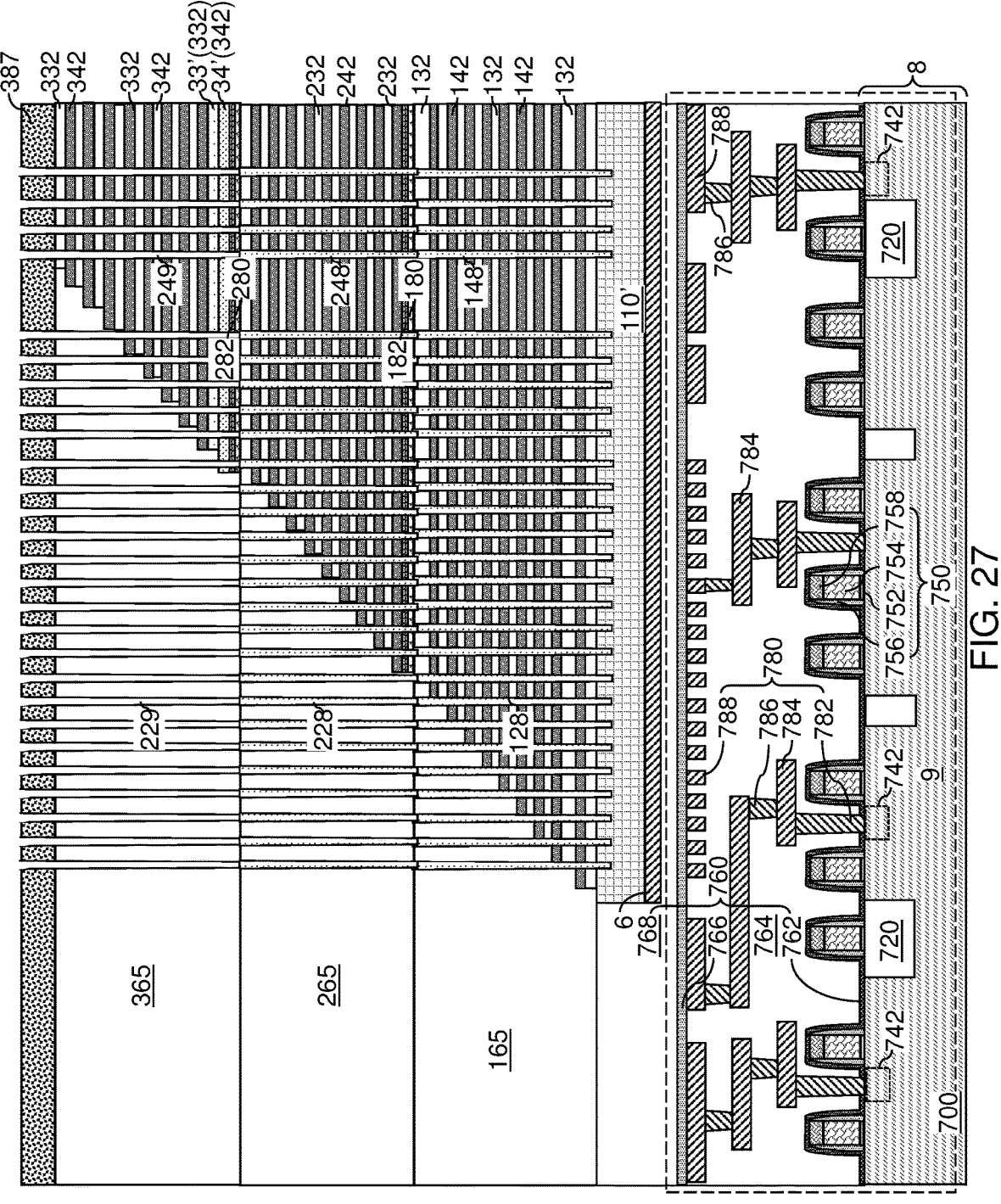
FIG. 27 is a vertical cross-sectional view of the first configuration of the second exemplary structure after formation of a third vertically alternating sequence of third insulating layers and third spacer material layers, third stepped surfaces, a third retro-stepped dielectric material portion, drain-select-level isolation structures, third-tier memory openings, and third-tier support openings according to the second embodiment of the present disclosure.

Referring to FIG. 27, the processing steps described with reference to FIGS. 13 and 14 can be performed to form a third alternating stack of third insulating layers 332 and third spacer material layers (such as third sacrificial material layers 342), third stepped surfaces, a third retro-stepped dielectric material portion 365, a patterned etch mask layer 387, third-tier memory openings 349, and third-tier support openings 329.

Figure 28A:
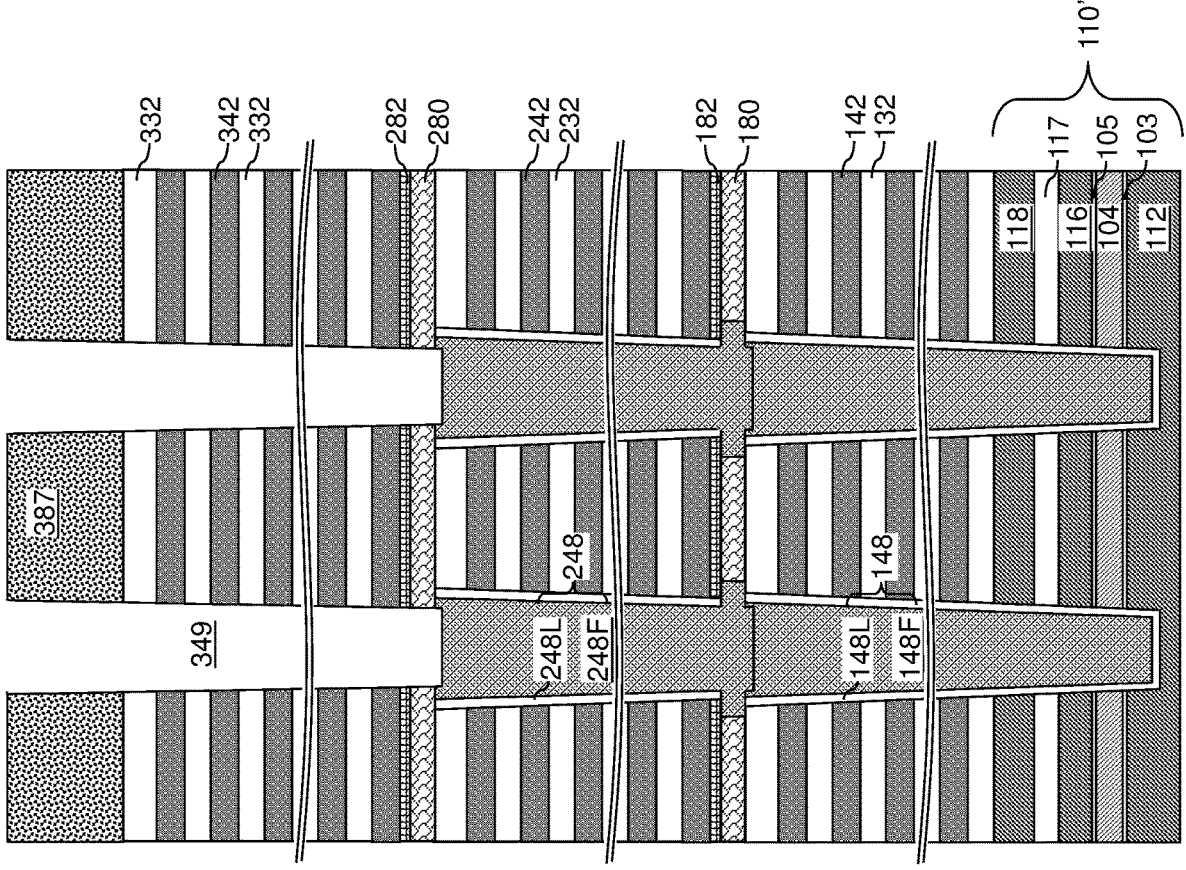
FIGS. 28A-28H are vertical cross-sectional views of first-tier memory openings, second-tier memory openings, and third-tier memory openings in the first configuration of the second exemplary structure during formation of inter-tier memory openings and memory opening fill structures according to the second embodiment of the present disclosure.

Referring to FIG. 28A, third-tier memory openings 349 are illustrated after the processing steps described with reference to FIG. 27. The anisotropic etch process employed to form the third-tier memory openings 349 and the third-tier support openings 329 may comprise a main etch step having an etch chemistry that etches materials of the third insulating layers 332 and the third spacer material layers selective to at least one material of the second etch stop material layers (280, 282). In case the at least one material of the second etch stop material layers (280, 282) comprises a stack of the second etch stop conductive material layer 282 and the second etch stop semiconductor material layer 280, the etch chemistry of the main etch step may be selective to the material of the second etch stop conductive material layer 282 and/or the material of the second etch stop semiconductor material layer 280. In one embodiment, the main etch step of the anisotropic etch process may etch through the second etch stop conductive material layer 282 and may terminate before etching through the second etch stop semiconductor material layer 280. In another embodiment, the main etch step of the anisotropic etch process may terminate while etching the second etch stop conductive material layer 282.

A terminal etch step of the anisotropic etch process may etch through any unmasked remaining portion of the second etch stop conductive material layer 282 (if present), and etch through the second etch stop semiconductor material layer 280. The etch chemistry of the terminal etch step of the anisotropic etch process may be selective to the material of the second carbon-based fill material portions 248F.

Figure 28B:
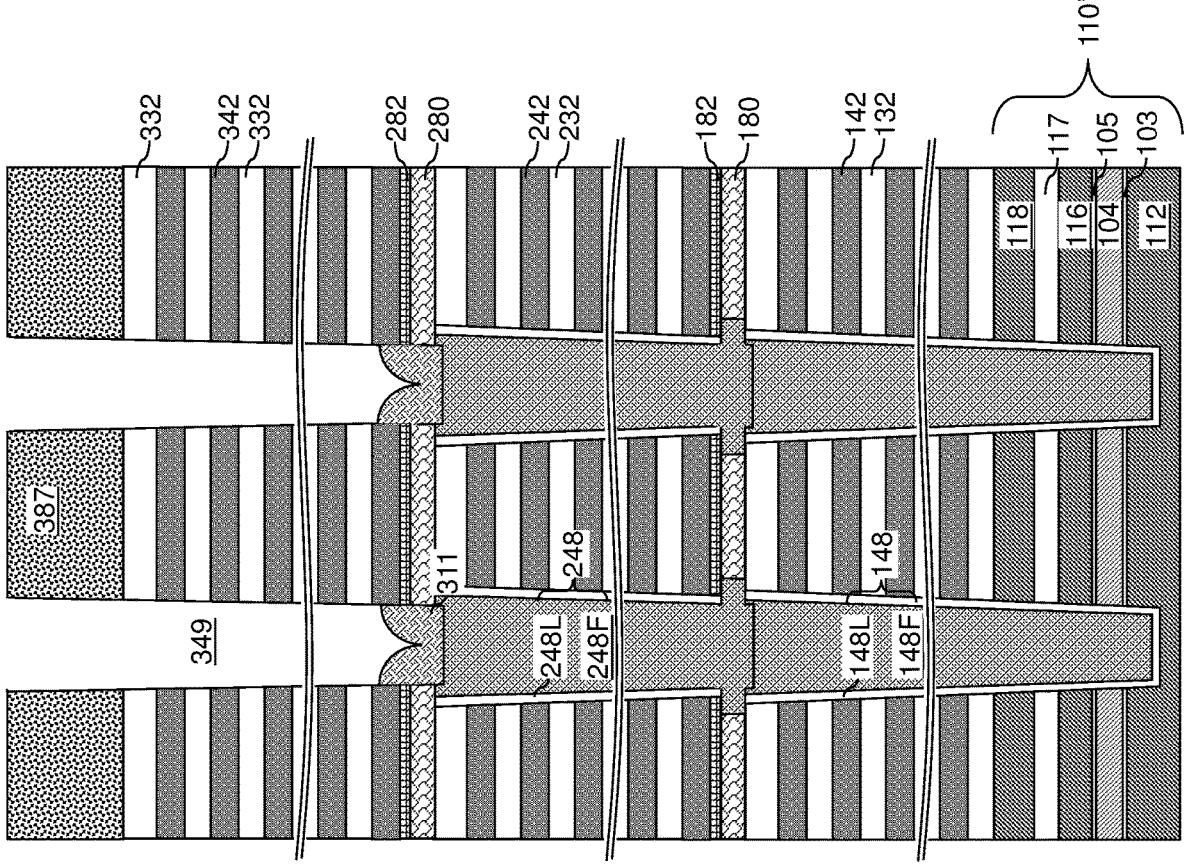

Referring to FIG. 28B, a second selective semiconductor deposition process can be performed to grow a semiconductor material from the physically exposed cylindrical sidewalls of the second etch stop semiconductor material layer 280 around bottom portions of the third-tier memory openings 349 and the third-tier support openings 329. The second selective semiconductor deposition process grows a semiconductor material from physically exposed semiconductor surfaces while suppressing growth of the semiconductor material from physically exposed dielectric surfaces such as the surfaces of the third insulating layers 332, the third sacrificial material layers 342, and the patterned etch mask layer 387. The semiconductor material deposited by the second selective semiconductor deposition process may comprise amorphous silicon, polysilicon, a silicon-germanium alloy, or other semiconductor materials. The second selective semiconductor deposition process may employ the same type of process as the first selective semiconductor deposition process. The semiconductor material can grow only from the physically exposed semiconductor surfaces of the second etch stop semiconductor layer 280 while growth of the semiconductor material from the surfaces of the surfaces of the third insulating layers 332, the third sacrificial material layers 342, and the patterned etch mask layer 387 is suppressed during the selective semiconductor deposition.

The duration of the second selective semiconductor deposition process is selected such that the top surfaces of the second carbon-based fill material portions 248F are entirely covered with the semiconductor material portions grown by the second selective semiconductor deposition process, which are herein referred to as second semiconductor plugs 311. In one embodiment, each of the second semiconductor plugs 311 can be formed on a respective cylindrical sidewall of the second etch stop semiconductor material layer 280 over a respective one of the sacrificial second-tier memory opening fill structures 248. Generally, the second semiconductor plugs 311 can be formed by performing a selective semiconductor material deposition process that grows a semiconductor material from the cylindrical sidewalls of the second etch stop semiconductor material layer 280 while suppressing growth of the semiconductor material from physically exposed surfaces of the third-tier alternating stack (332, 342). The semiconductor material of the second semiconductor plugs 311 may be the same as or may be different from the semiconductor material of the second etch stop semiconductor material layer 282. Each second semiconductor plug 311 may have a convex top surface having a general taper direction that provides a center divot.

Figure 28C:
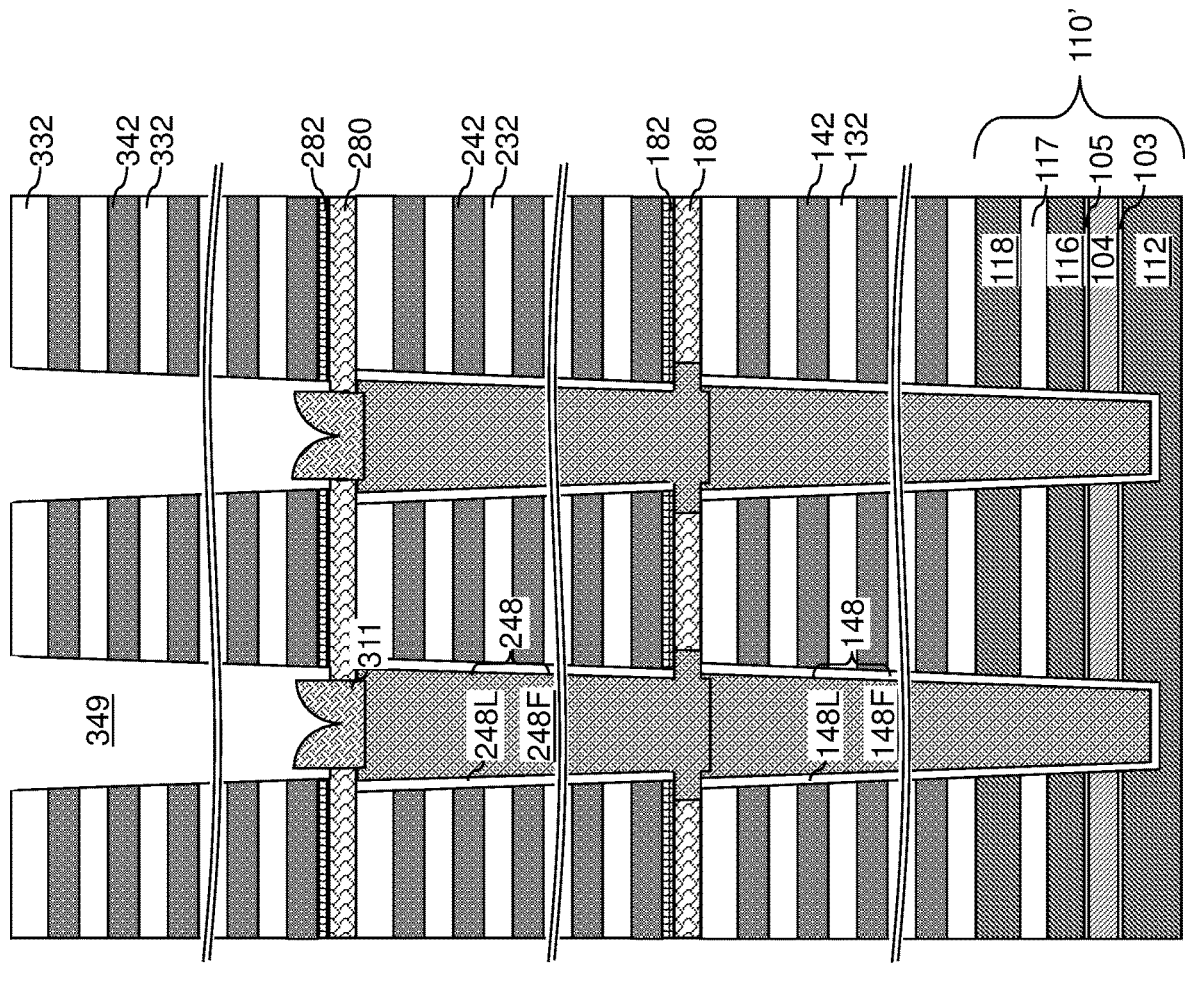

Referring to FIG. 28C, at least one isotropic etch process can be performed to laterally recess the third spacer material layers (such as the third sacrificial material layers 342) and/or the third insulating layers 332. In one embodiment, the at least one isotropic etch process may comprise a second isotropic etch process that laterally recesses the third spacer material layers (such as the third sacrificial material layers 342) around the third-tier memory openings 349, and a third isotropic etch process that laterally recesses the third insulating layers 332 around the third-tier memory openings 349. For example, if the third insulating layers 332 comprise silicon oxide and the third sacrificial material layers 342 comprise silicon nitride, the second isotropic etch process may comprise a wet etch process employing hot phosphoric acid, and the third isotropic etch process may comprise a wet etch process employing dilute hydrofluoric acid. The second semiconductor plugs 311 blocks the etchants of the isotropic etch processes from diffusion toward the second carbon-based fill material portions 248F and from etching the sacrificial second-tier memory opening fill structures 248.

Generally, the third-tier memory opening 349 can be laterally expanded while the second semiconductor plug 311 covers the sacrificial second-tier memory opening fill structures 248. Thus, the third-tier memory openings 349 can be laterally expanded without expanding any portion of the second-tier memory openings 249. The patterned etch mask layer 387 can be removed prior to, or after, the at least one isotropic etch process, for example, by performing an ashing process that volatilizes the carbon-based material of the patterned etch mask layer 387. In one embodiment, the patterned etch mask layer 387 is removed while the second semiconductor plugs 311 cover the sacrificial second-tier memory opening fill structures 248.

Figure 28D:
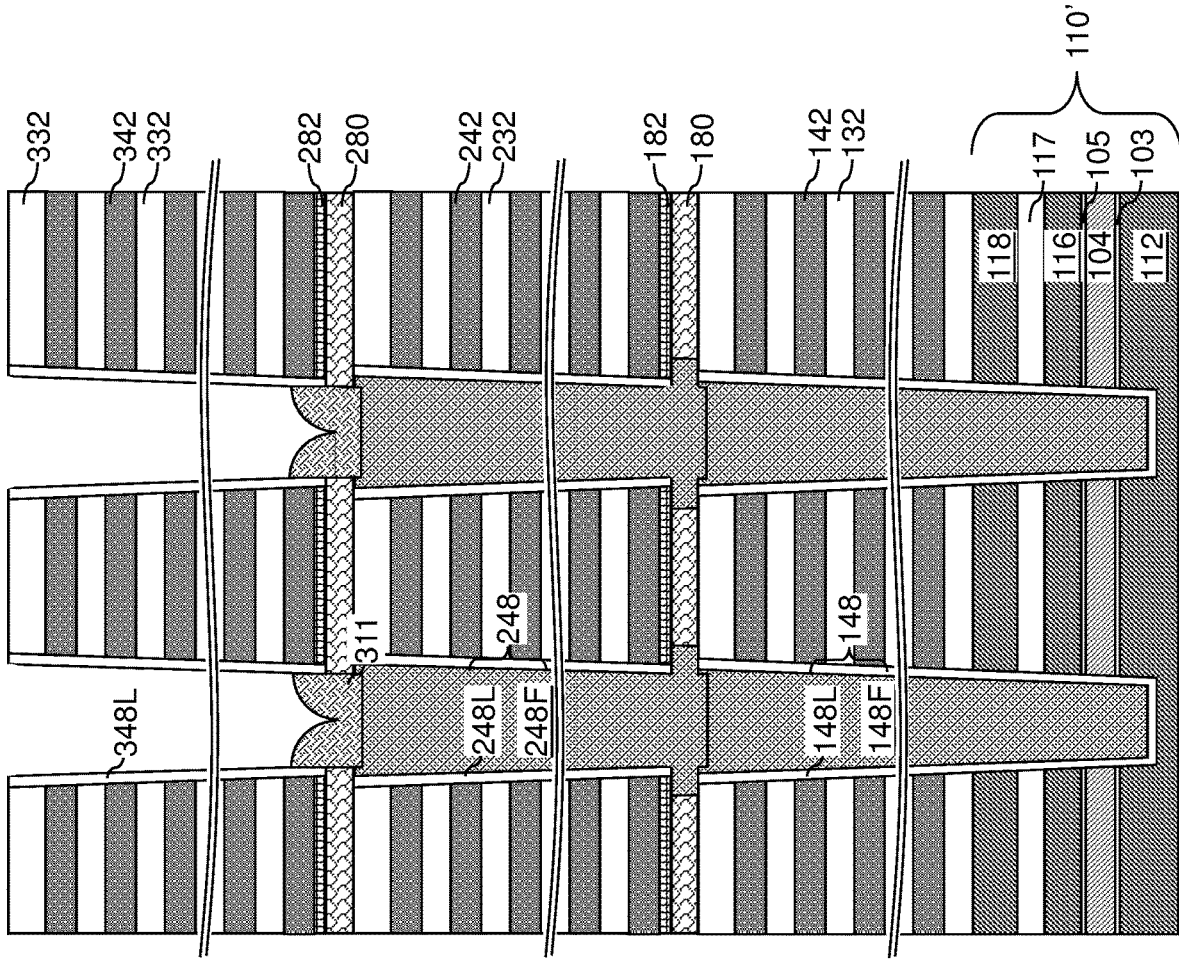

Referring to FIG. 28D, a third dielectric liner layer can be formed employing a conformal deposition process. The third dielectric liner layer includes a dielectric material such as silicon oxide, and can have a thickness in a range from 3 nm to 22 nm, such as from 3 nm to 8 nm, although lesser and greater thicknesses may also be employed. An anisotropic etch process can be performed to remove horizontally-extending portions of the third dielectric liner layer. Each remaining portion of the of the third dielectric liner layer that remains in a third-tier memory opening 349 or in a third-tier support opening 329 constitutes a third dielectric liner 348L. Each third dielectric liner 348L may have a tubular configuration. Top surfaces of the second semiconductor plugs 311 can be physically exposed after formation of the third dielectric liners 348L.

Figure 28E:
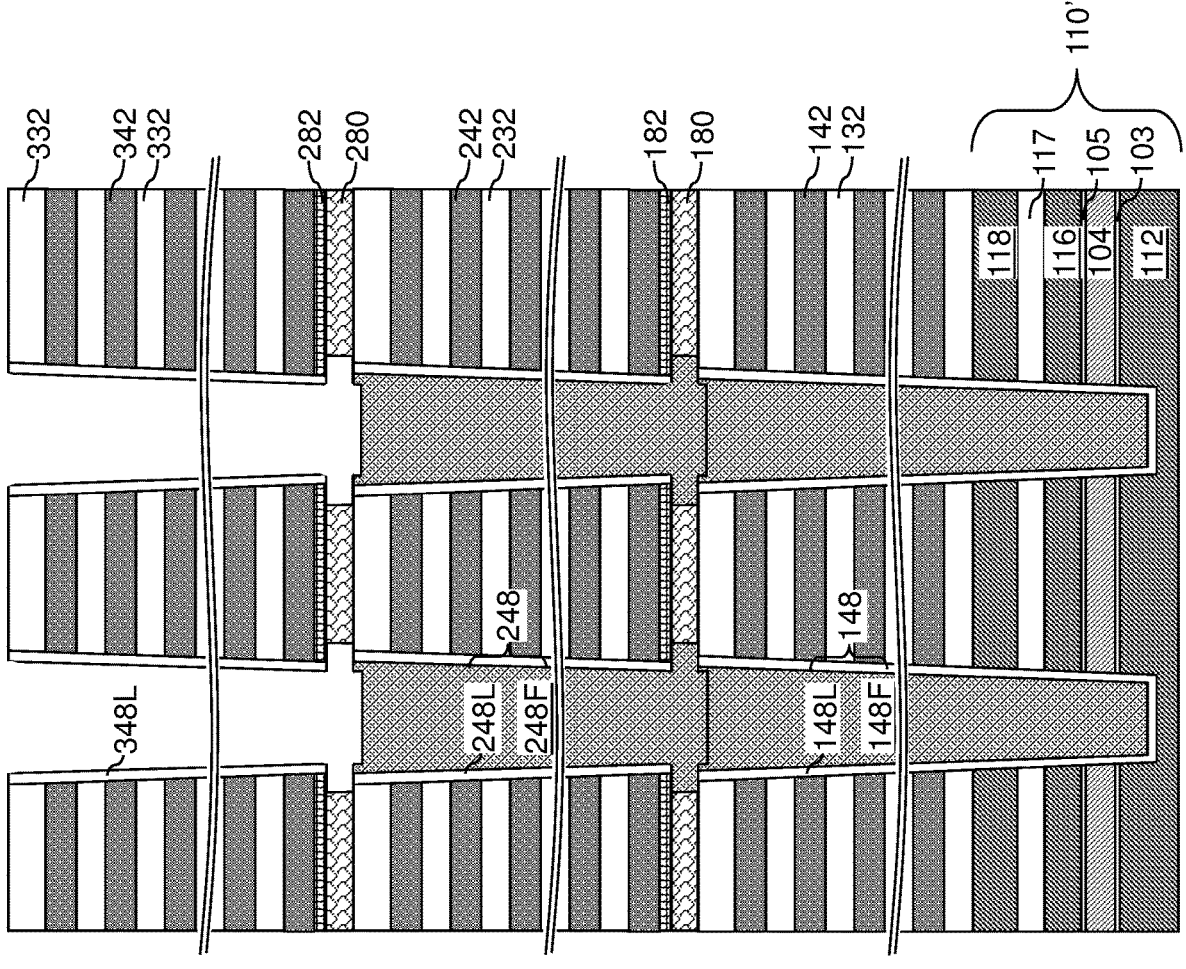

Referring to FIG. 28E, an etch process can be performed to remove the second semiconductor plugs 311 selective to the materials of third dielectric liners 348L and the second carbon-based fill material portions 248F. The etch process may comprise a wet etch process or a dry etch process. For example, a wet etch process employing hot trimethyl-2 hydroxyethyl ammonium hydroxide ("hot TMY") or tetramethyl ammonium hydroxide (TMAH) can be performed to remove amorphous silicon second semiconductor plugs 311. Alternatively or additionally, a dry etch process employing gas phase hydrochloric acid may be performed to remove the second semiconductor plugs 311.

In one embodiment, the etch process that removes the second semiconductor plugs 311 may collaterally recess each proximal portion of the second etch stop semiconductor material layer 280 around bottom portions of the third-tier memory openings 349 and the third-tier support openings 319 after removal of the second semiconductor plugs 311. The lateral recess distance of the recessed cylindrical surfaces of the second etch stop semiconductor material layer 280, as measured from a bottom periphery of an outer sidewall of a respective overlying third dielectric liner 348L, may be in a range from 5 nm to 200 nm, and/or from 20 nm to 50 nm, although lesser and greater lateral recess distances may also be employed.

Figure 28F:
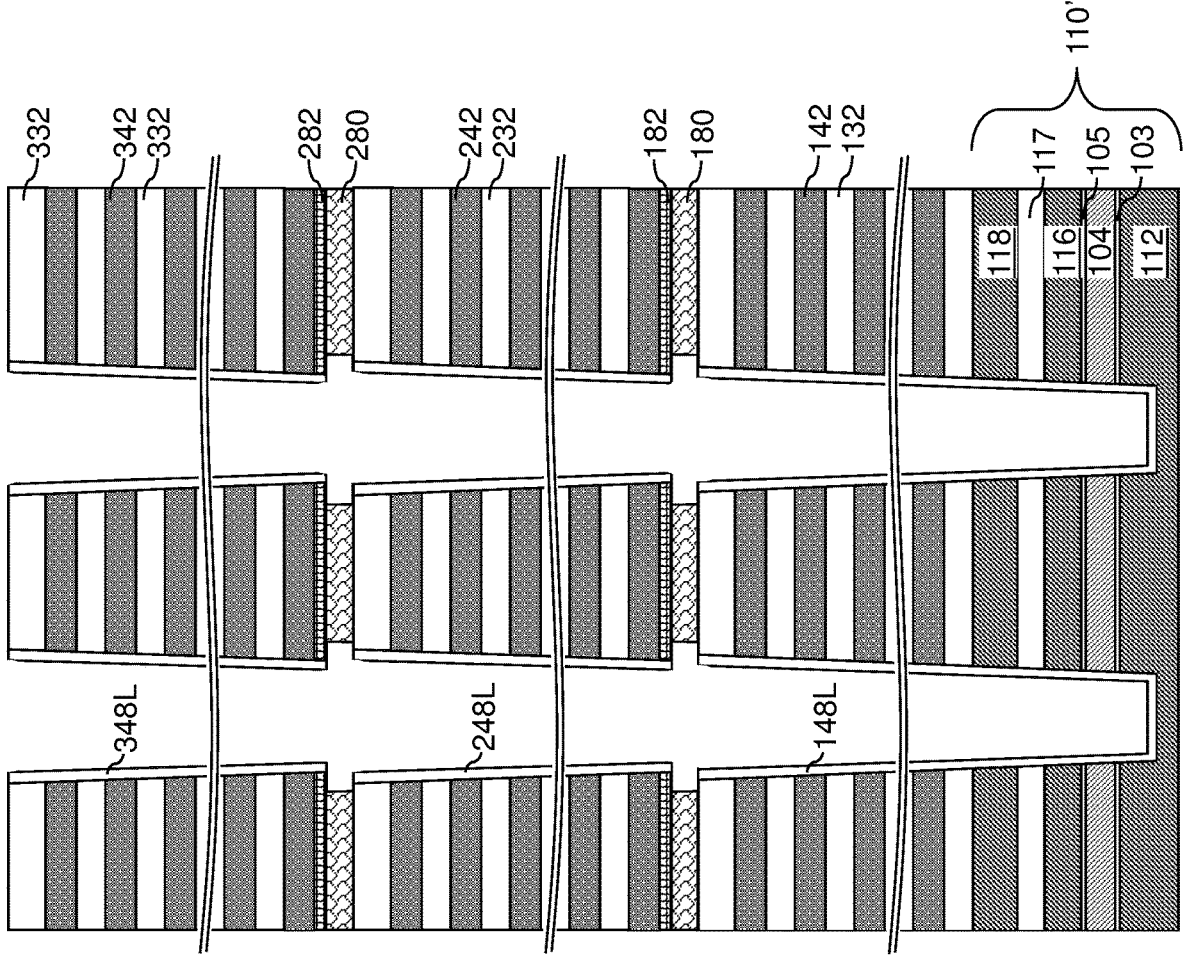

Referring to FIG. 28F, the second carbon-based fill material portions 248F and the first carbon-based fill material portions 148F can be removed, for example, by performing an ashing process. Generally, remaining portions of the sacrificial first-tier memory opening fill structures 148 can be removed after removing the second carbon-based fill material portion 248F.

Figure 28G:
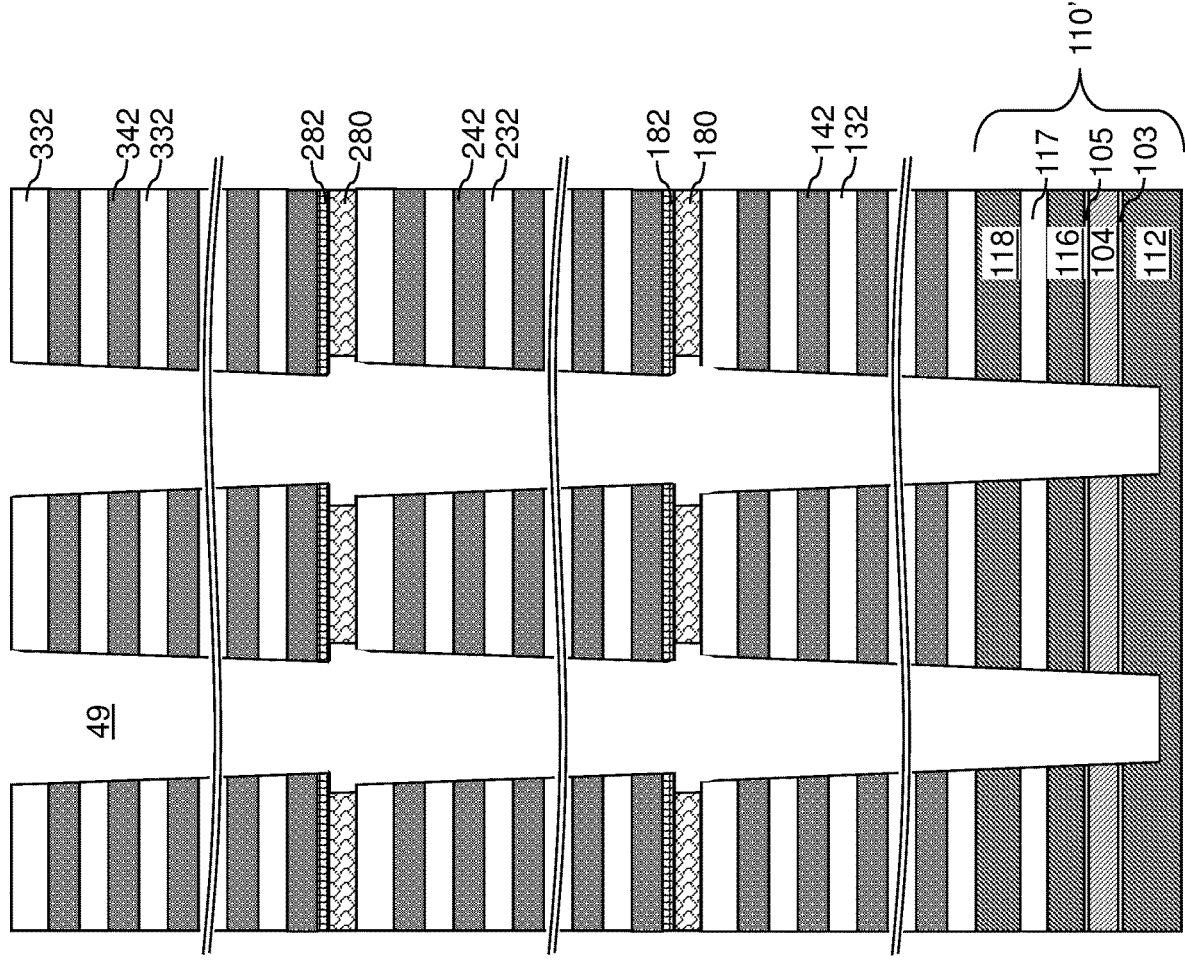

Referring to FIG. 28G, an isotropic etch process can be subsequently performed to remove the first dielectric liners 148L, the second dielectric liners 248L, and the third dielectric liners 348L. In one embodiment, the first dielectric liners 148L, the second dielectric liners 248L, and the third dielectric liners 348L comprise silicon oxide materials, and the isotropic etch process may comprise a wet etch process employing dilute hydrofluoric acid.

Inter-tier memory opening 49, which are also referred to as memory openings 49, can be formed by removing remaining portions of the sacrificial first and second-tier memory opening fill structures (148, 248) underneath the third-tier memory opening 349. Inter-tier support openings, which are also referred to as support openings, can be formed by removing portions of the sacrificial first and second-tier support opening fill structures underneath the third-tier support openings.

Figure 28H:
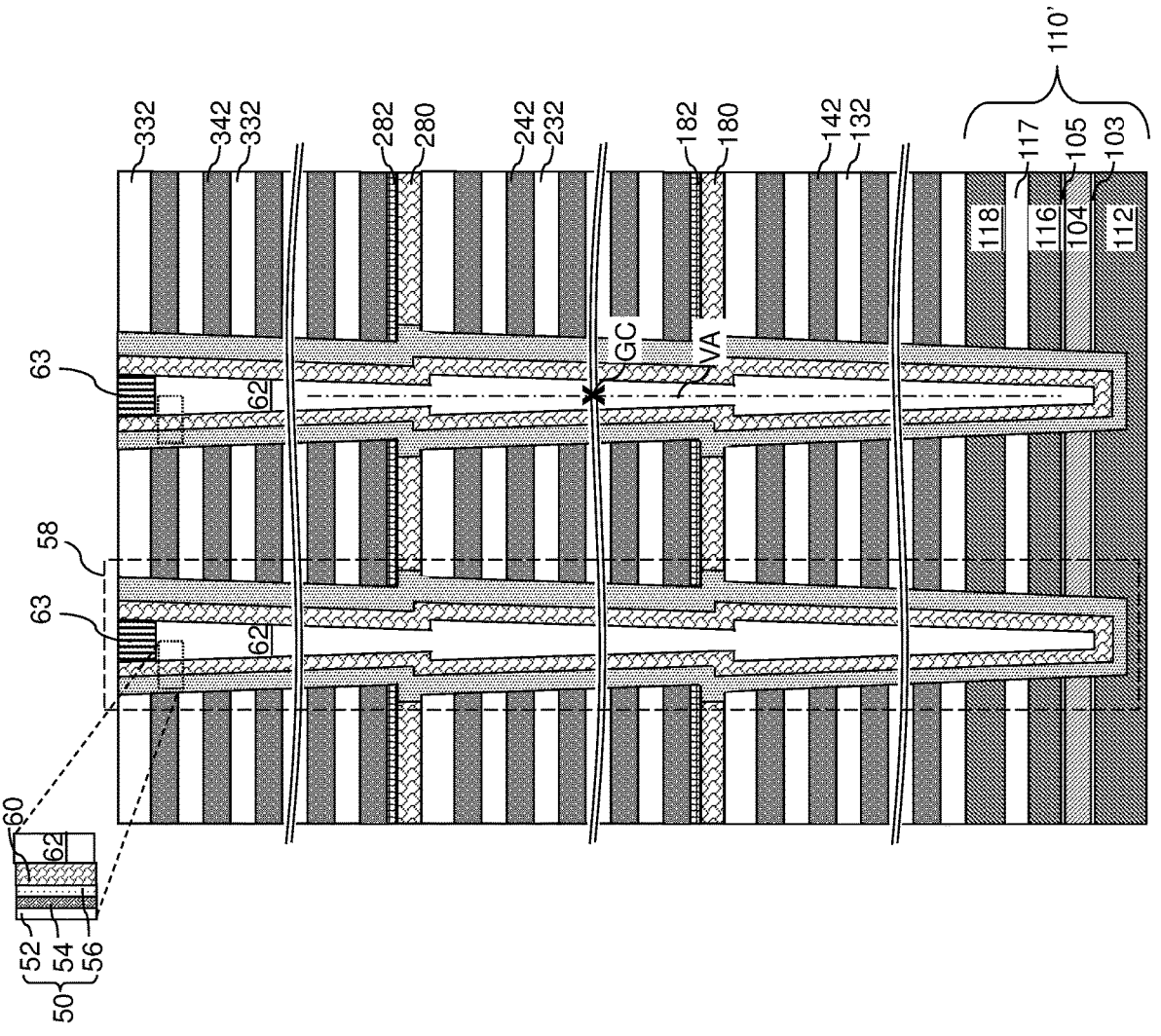

Referring to FIG. 28H, the processing steps described with reference to FIGS. 15F and 15G can be performed to form a memory opening fill structure 59 in each inter-tier memory opening 49, and to form a support pillar structure 20 in each inter-tier support opening 19. Each memory opening fill structure 58 comprises a vertical semiconductor channel 60 and a vertical stack of memory elements.

Figure 28I:
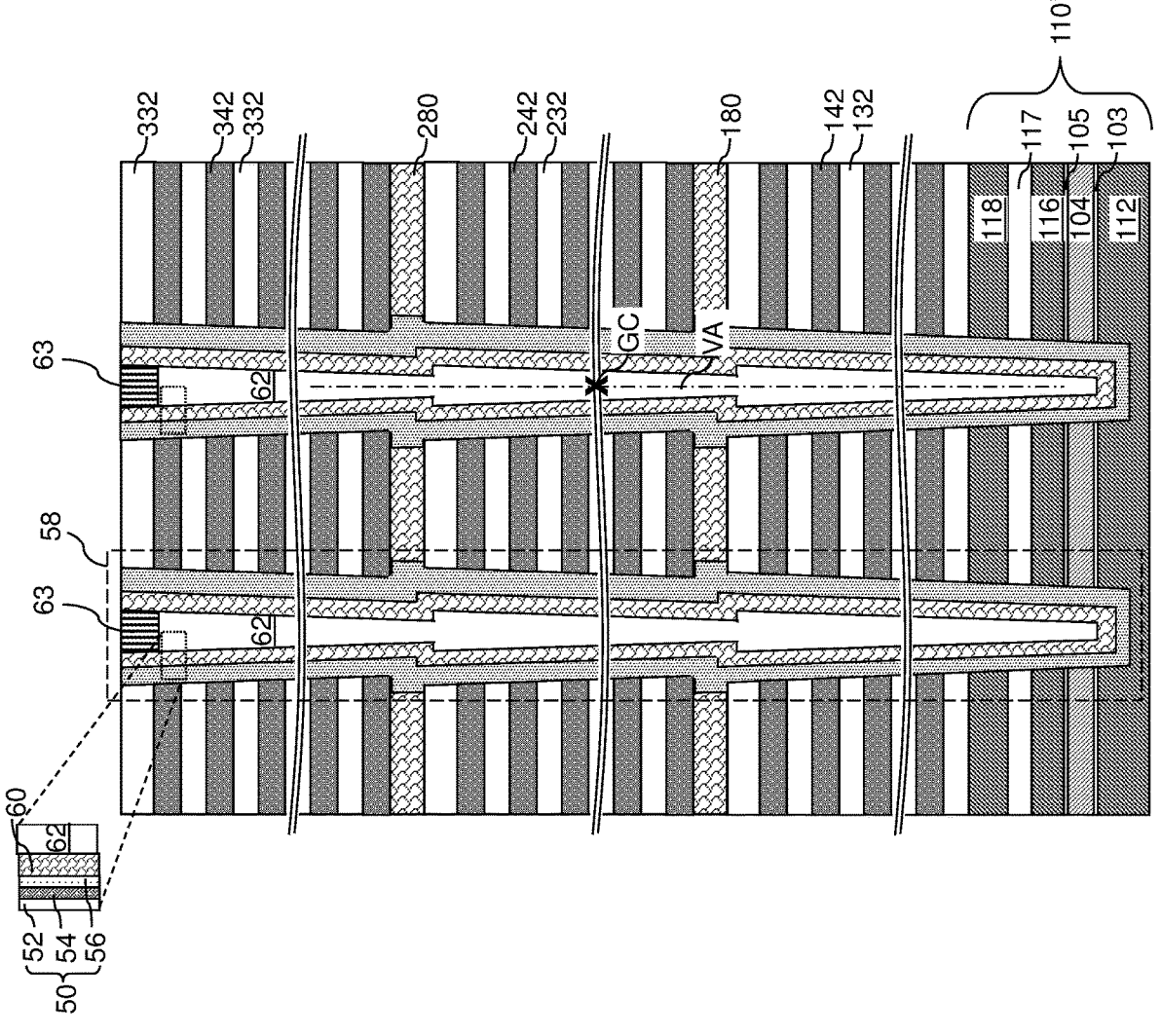
FIG. 28I is a vertical cross-sectional view of first-tier memory openings, second-tier memory openings, and third-tier memory openings in the second configuration of the second exemplary structure after formation of inter-tier memory openings and memory opening fill structures according to the second embodiment of the present disclosure.

FIG. 28I is a vertical cross-sectional view the second configuration of the second exemplary structure after formation of inter-tier memory openings 49 and memory opening fill structures 58 according to the second embodiment of the present disclosure. The second configuration of the second exemplary structure can be derived from the first configuration of the second exemplary structure by omitting formation of the etch stop conductive material layers (182, 282), and by omitting steps during formation of the second-tier openings (249, 219) and the third-tier openings (349, 319) for etching unmasked portions of the etch stop conductive material layers (182, 282).

Referring to FIGS. 29A and 29B, and FIGS. 30A and 30B, the first and second configurations of the second exemplary structure, respectively, are illustrated after performing additional processing steps described with reference to FIGS. 18A and 18B, 19A-19H, 20A and 20B, and 21A and 21B. Generally, each of the etch stop semiconductor material layers (180, 280) can be in direct contact with a respective surface segment of an outer sidewall of a memory film 50.

Figure 29A:
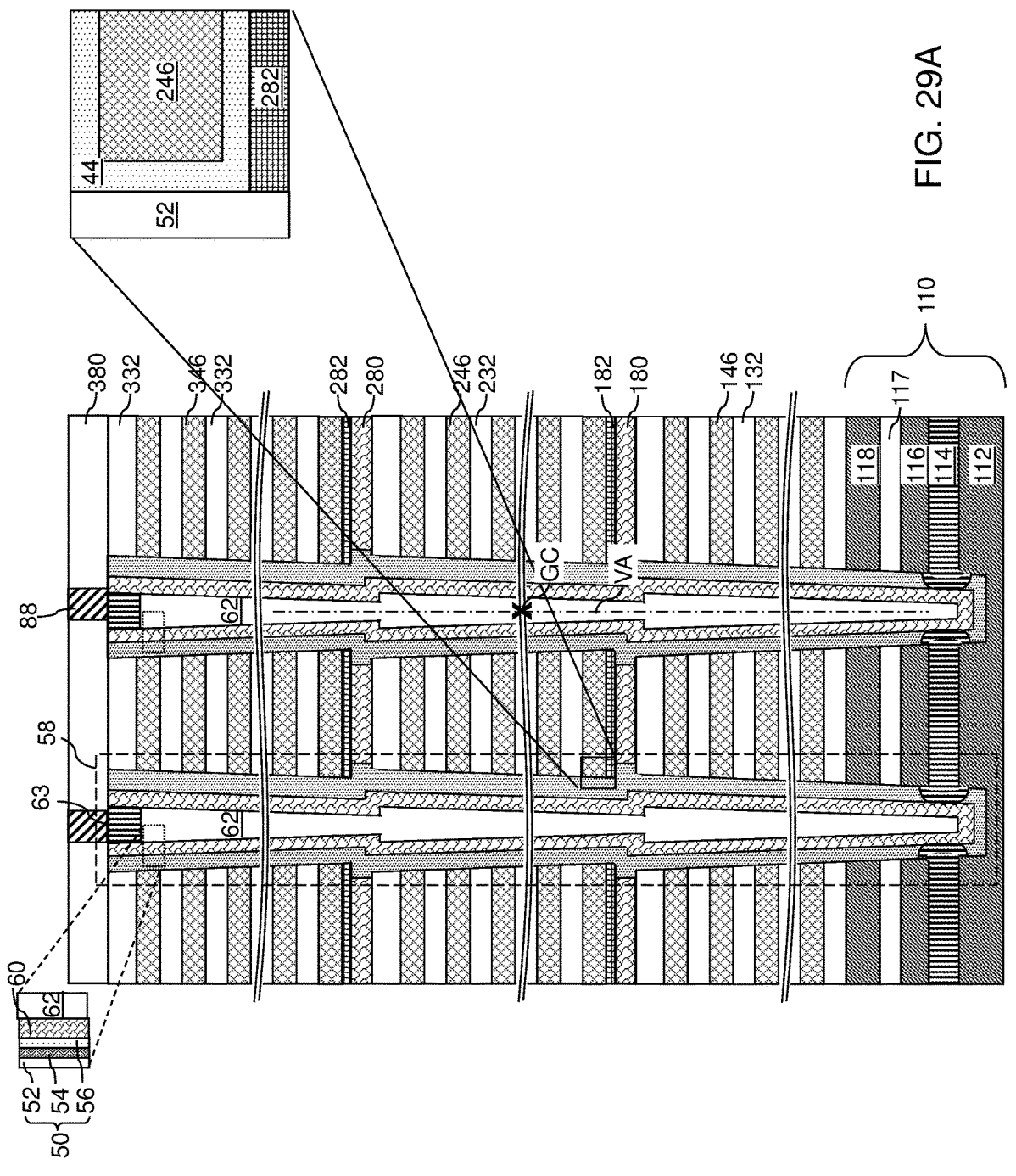
FIGS. 29A and 29B are vertical cross-sectional views of memory opening fill structures in the first configuration of the second exemplary structure after replacement of the sacrificial material layers with electrically conductive layers according to the second embodiment of the present disclosure.
Figure 30A:
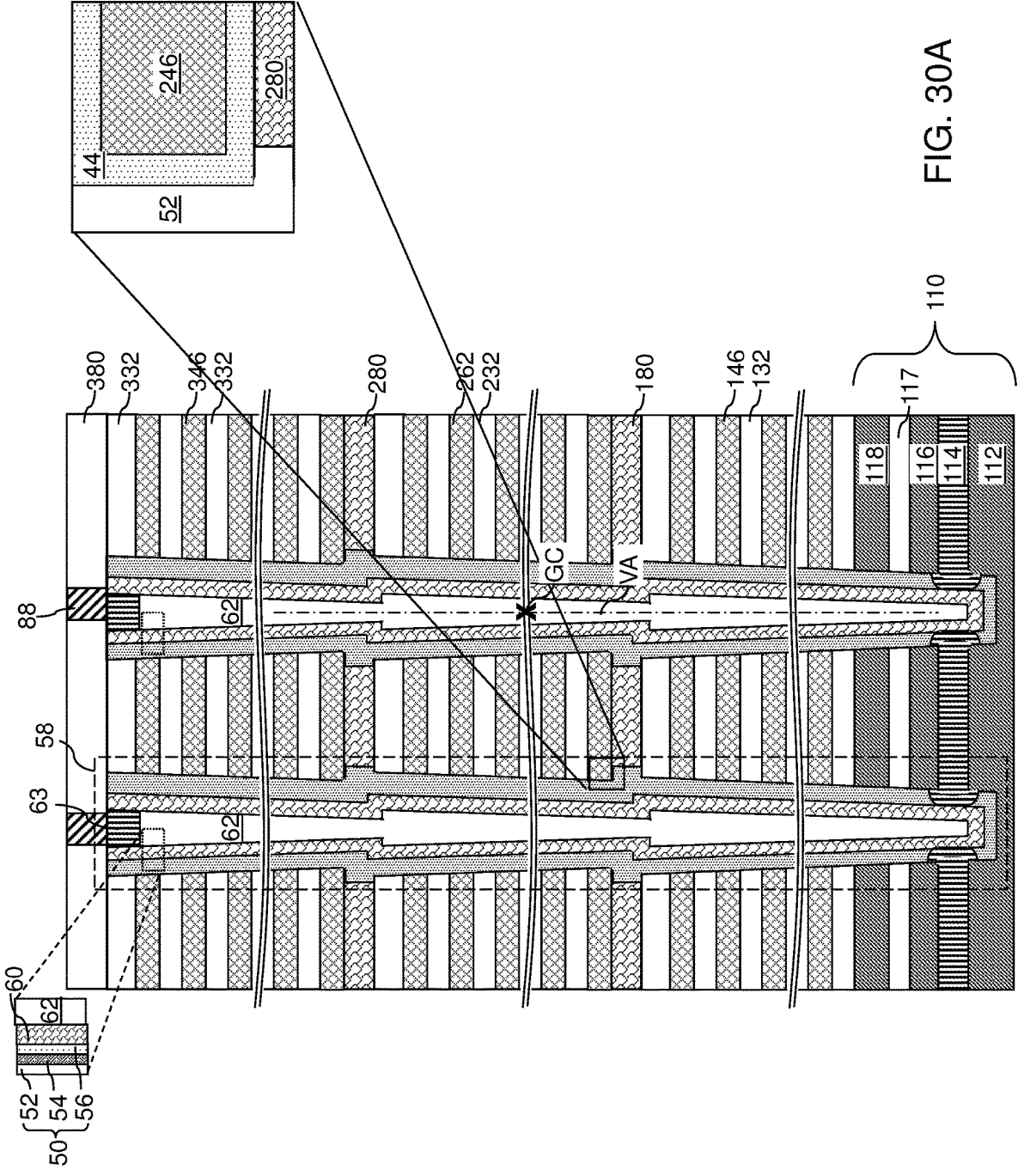
FIGS. 30A and 30B are vertical cross-sectional views of memory opening fill structures in the second configuration of the second exemplary structure after replacement of the sacrificial material layers with electrically conductive layers according to the second embodiment of the present disclosure.

In configurations illustrated in FIGS. 29A and 30A, a backside blocking dielectric layer 44 may be formed prior to formation of electrically conductive layers (146, 246, 346) in the backside recesses (143, 243, 343). In this case, the etch stop semiconductor material layers (180, 280) can be electrically isolated from each of the electrically conductive layers (146, 246, 346). For example, for each memory opening fill structure 58, a bottommost second electrically conductive layer 246 of the second electrically conductive layers 246 can be electrically isolated from the first etch stop semiconductor material layer 180 by a backside blocking dielectric layer 44 that contacts a sidewall of the memory opening fill structure 58. Likewise, a bottommost third electrically conductive layer 346 of the third electrically conductive layers 346 can be electrically isolated from the second etch stop semiconductor material layer 280 by another backside blocking dielectric layer 44 that contacts the sidewall of the memory opening fill structure 58.

Figure 29B:
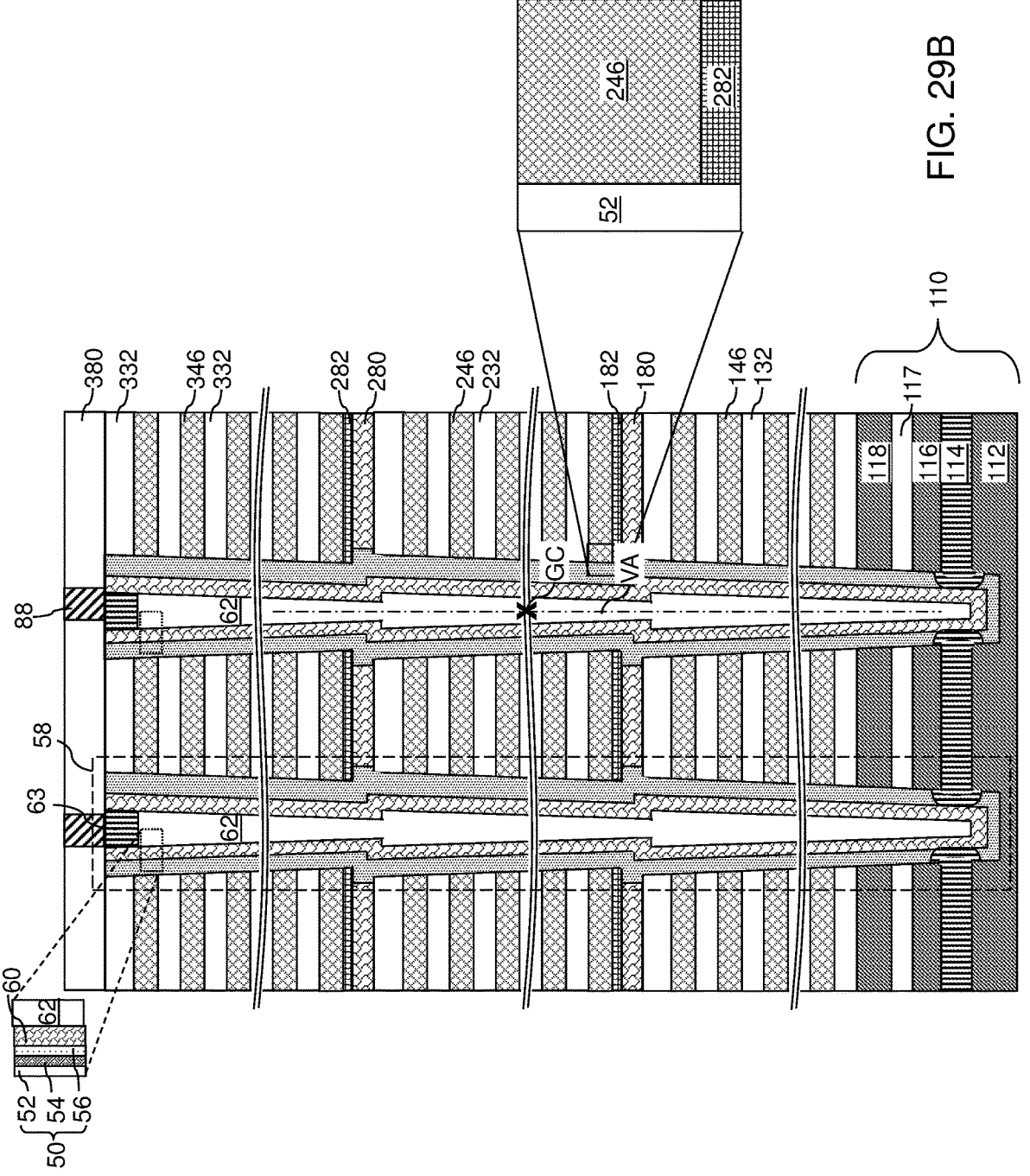

In the configuration illustrated FIG. 29B, a backside blocking dielectric layer is not employed. If the etch stop conductive material layers (182, 282) are present as illustrated in FIG. 29B, then the etch stop conductive material layers (182, 282) may contact a bottom surface of a respective one of the electrically conductive layers (246, 346). For example, a top surface of the first etch stop conductive material layer 182 can be in direct contact with a bottom surface of the bottommost second electrically conductive layer 246, and a top surface of the second etch stop conductive material layer 282 can be in direct contact with a bottom surface of the bottommost third electrically conductive layer 346. Further, the first etch stop conductive material layer 182 can be electrically connected to the bottommost second electrically conductive layer 246, and the second etch stop conductive material layer 282 can be electrically connected to the bottommost third electrically conductive layer 346.

Figure 30B:
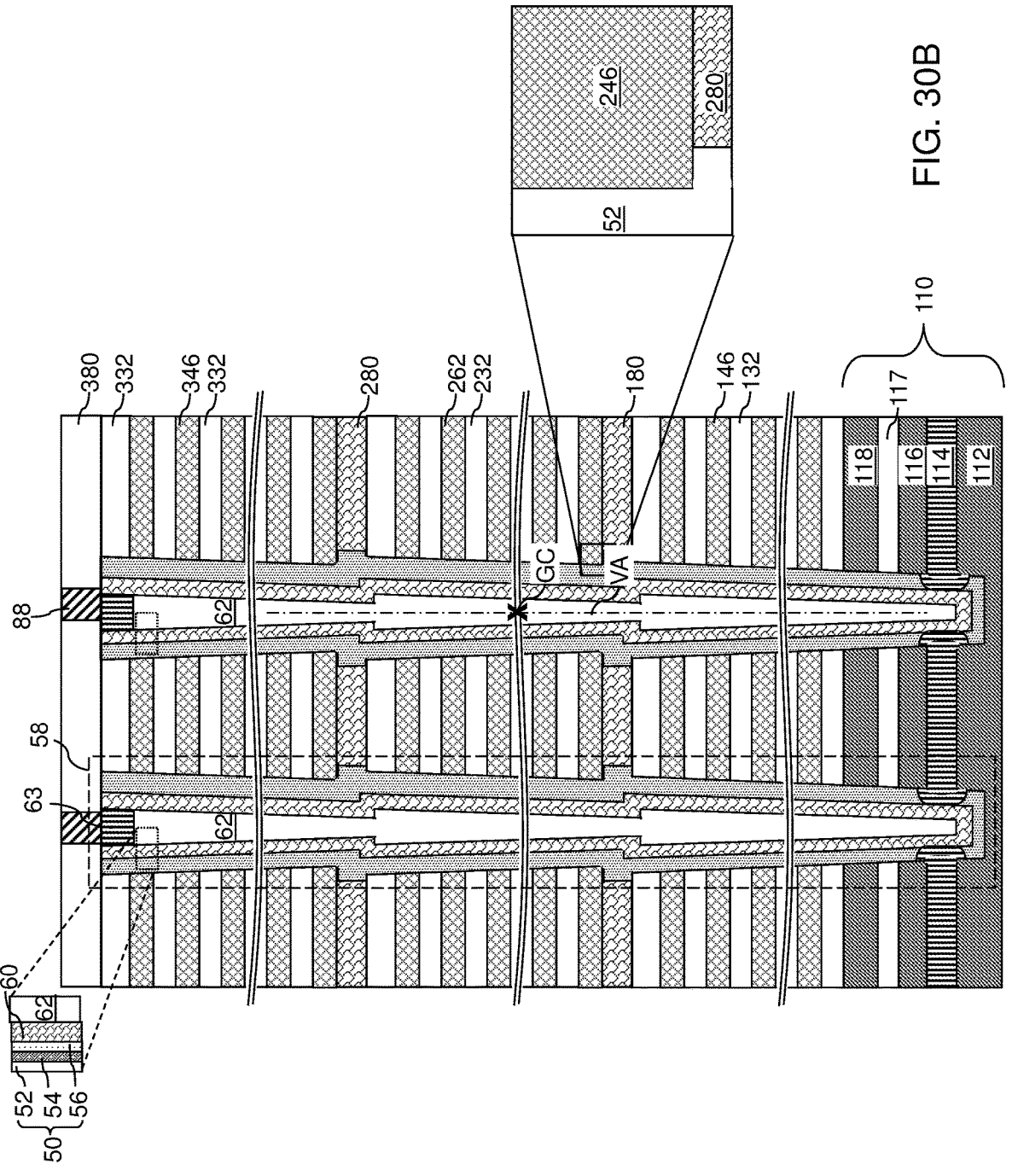

In the configuration illustrated in FIG. 30B, the etch stop conductive layer and the backside blocking dielectric layers are not employed. In this case, the etch stop semiconductor material layers (180, 280) may contact a bottom surface of a respective one of the electrically conductive layers (246, 346). For example, a top surface of the first etch stop semiconductor material layer 180 can be in direct contact with a bottom surface of the bottommost second electrically conductive layer 246, and a top surface of the second etch stop semiconductor material layer 280 can be in direct contact with a bottom surface of the bottommost third electrically conductive layer 346. Further, the first etch stop semiconductor material layer 180 can be electrically connected to the bottommost second electrically conductive layer 246, and the second etch stop semiconductor material layer 280 can be electrically connected to the bottommost third electrically conductive layer 346.

Referring collectively FIGS. 1A-4B and 22A-30B and according to the second embodiment, a memory device is provided, which comprises: a first-tier alternating stack (132, 146) of first insulating layers 132 and first electrically conductive layers 146; an etch stop semiconductor material layer 180 located over the first-tier alternating stack (132, 146); a second-tier alternating stack (232, 246) of second insulating layers 232 and second electrically conductive layers 246 overlying the etch stop semiconductor material layer 180; an inter-tier memory opening 49 vertically extending through the second-tier alternating stack (232, 246), the etch stop semiconductor material layer 180, and the first-tier alternating stack (132, 146); and a memory opening fill structure 58 located in the inter-tier memory opening 49 and comprising a vertical semiconductor channel 60 and a vertical stack of memory elements.

In one embodiment, the memory opening fill structure 58 comprises a memory film 50 that continuously extends vertically at least from a bottommost layer within the first-tier alternating stack (132, 146) to a topmost layer within the second-tier alternating stack (232, 246); and the vertical stack of memory elements comprises portions of the memory film 50 located at levels of the first electrically conductive layers 146 and the second electrically conductive layers 246. In one embodiment, the etch stop semiconductor material layer 180 is in direct contact with a surface segment of an outer sidewall of the memory film 50.

In one embodiment, the etch stop semiconductor material layer 180 is electrically connected to a bottommost second electrically conductive layer 246 of the electrically conductive layers. In one embodiment, a top surface of the etch stop semiconductor material layer 180 is in direct contact with a bottom surface of the bottommost second electrically conductive layer 246. In one embodiment, the memory device comprising an etch stop conductive material layer 182 in direct contact with a top surface of the etch stop semiconductor material layer 180 and with a bottom surface of the bottommost second electrically conductive layer 246.

In one embodiment, the etch stop semiconductor material layer 180 is electrically isolated from each of the second electrically conductive layers 246.

In one embodiment, a bottommost second electrically conductive layer 246 of the second electrically conductive layers 246 is electrically isolated from the etch stop semiconductor material layer 180 by a backside blocking dielectric layer 44 that contacts a sidewall of the memory opening fill structure 58. In one embodiment, the etch stop semiconductor material layer 180 is in contact with a bottom surface of the backside blocking dielectric layer 44. In one embodiment, the memory device comprises an etch stop conductive material layer 182 in direct contact with a top surface of the etch stop semiconductor material layer 180 and with a bottom surface of the backside blocking dielectric layer 44.

In one embodiment, the second electrically conductive layers 246 consist essentially of at least one conductive material. In one embodiment, an interface between the memory opening fill structure 58 and the etch stop semiconductor material layer 180 is laterally offset farther away from a vertical axis VA passing through a geometrical center GC of the memory opening fill structure 58 than an interface between the memory opening fill structure 58 and a bottommost second insulating layer 232 of the second insulating layers 232 is laterally offset from the vertical axis VA.

While embodiments are described employing three tier structures, embodiments are expressly contemplated herein in which only two tier structures or four or more tier structures are employed to form a three-dimensional memory device.

The various embodiments of the present disclosure can be employed to provide reliable etch stop structures that can be employed as etch barriers during isotropic etch processes that can be employed to widen topmost memory openings and topmost support openings. Thus, each tier-level openings can be laterally expanded only once, and repeated widening of lower-level openings can be avoided, and the lateral dimensions and vertical profiles of memory openings can be controlled for optimal performance of memory stack structures.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a memory device, comprising:

forming a first-tier alternating stack of first insulating layers and first spacer material layers over a substrate, wherein the first spacer material layers are formed as, or are subsequently replaced with, first electrically conductive layers;

forming a first-tier memory opening through the first-tier alternating stack;

forming a sacrificial first-tier memory opening fill structure comprising a stack of a first carbon-based fill material portion and a first conductive material portion in the first-tier memory opening;

forming a second-tier alternating stack of second insulating layers and second spacer material layers over the first-tier alternating stack, wherein the second spacer material layers are formed as, or are subsequently replaced with, second electrically conductive layers;

forming a second-tier memory opening through the second-tier alternating stack by performing an anisotropic etch process having an etch chemistry that etches materials of the second insulating layers and the second spacer material layers selective to a material of the first conductive material portion;

removing the first conductive material portion selective to the first carbon-based fill material portion;

forming an inter-tier memory opening by removing remaining portions of the sacrificial first-tier memory opening fill structure underneath the second-tier memory opening;

forming a memory opening fill structure in the inter-tier memory opening, wherein the memory opening fill structure comprises a vertical stack of memory elements and a vertical semiconductor channel; and performing an isotropic etch process that laterally recesses the second spacer material layers around the second-tier memory opening after performing the anisotropic etch process and prior to removing the first conductive material portion.

2. A method of forming a memory device, comprising:

forming a first-tier alternating stack of first insulating layers and first spacer material layers over a substrate, wherein the first spacer material layers are formed as, or are subsequently replaced with, first electrically conductive layers;

forming a first-tier memory opening through the first-tier alternating stack;

forming a sacrificial first-tier memory opening fill structure comprising a stack of a first carbon-based fill material portion and a first conductive material portion in the first-tier memory opening;

forming a second-tier alternating stack of second insulating layers and second spacer material layers over the first-tier alternating stack, wherein the second spacer material layers are formed as, or are subsequently replaced with, second electrically conductive layers;

forming a second-tier memory opening through the second-tier alternating stack by performing an anisotropic etch process having an etch chemistry that etches materials of the second insulating layers and the second spacer material layers selective to a material of the first conductive material portion;

removing the first conductive material portion selective to the first carbon-based fill material portion;

forming an inter-tier memory opening by removing remaining portions of the sacrificial first-tier memory opening fill structure underneath the second-tier memory opening;

forming a memory opening fill structure in the inter-tier memory opening, wherein the memory opening fill structure comprises a vertical stack of memory elements and a vertical semiconductor channel;

forming a patterned etch mask layer over the second-tier alternating stack, wherein the second-tier memory opening is formed underneath an opening in the patterned etch mask layer; and removing the patterned etch mask layer prior to removing the first conductive material portion.

3. The method of claim 2, wherein:

the patterned etch mask layer comprises a carbon-based material containing carbon atoms at an atomic percentage of at least 50%; and the patterned etch mask layer is removed by performing an ashing process that volatilizes the carbon-based material.

4. A method of forming a memory device, comprising:

forming a first-tier alternating stack of first insulating layers and first spacer material layers over a substrate, wherein the first spacer material layers are formed as, or are subsequently replaced with, first electrically conductive layers;

forming a first-tier memory opening through the first-tier alternating stack;

forming a sacrificial first-tier memory opening fill structure comprising a stack of a first carbon-based fill material portion and a first conductive material portion in the first-tier memory opening;

forming a second-tier alternating stack of second insulating layers and second spacer material layers over the first-tier alternating stack, wherein the second spacer material layers are formed as, or are subsequently replaced with, second electrically conductive layers;

forming a second-tier memory opening through the second-tier alternating stack by performing an anisotropic etch process having an etch chemistry that etches materials of the second insulating layers and the second spacer material layers selective to a material of the first conductive material portion;

removing the first conductive material portion selective to the first carbon-based fill material portion;

forming an inter-tier memory opening by removing remaining portions of the sacrificial first-tier memory opening fill structure underneath the second-tier memory opening;

forming a memory opening fill structure in the inter-tier memory opening, wherein the memory opening fill structure comprises a vertical stack of memory elements and a vertical semiconductor channel;

thinning the first conductive material portion by performing a recess etch process that etches the first conductive material selective to a material of the first-tier insulating layers; and forming a carbon-based capping material portion on a top surface of the thinned first conductive material portion by depositing and recessing a carbon-based capping material that comprises carbon at an atomic percentage greater than 50%.

5. The method of claim 4, wherein the carbon-based capping material portion is etched through by the anisotropic etch process.

6. A method of forming a memory device, comprising:

forming a first-tier alternating stack of first insulating layers and first spacer material layers over a substrate, wherein the first spacer material layers are formed as, or are subsequently replaced with, first electrically conductive layers;

forming a first-tier memory opening through the first-tier alternating stack;

forming a sacrificial first-tier memory opening fill structure comprising a stack of a first carbon-based fill material portion and a first conductive material portion in the first-tier memory opening;

forming a second-tier alternating stack of second insulating layers and second spacer material layers over the first-tier alternating stack, wherein the second spacer material layers are formed as, or are subsequently replaced with, second electrically conductive layers;

forming a second-tier memory opening through the second-tier alternating stack by performing an anisotropic etch process having an etch chemistry that etches materials of the second insulating layers and the second spacer material layers selective to a material of the first conductive material portion;

removing the first conductive material portion selective to the first carbon-based fill material portion;

forming an inter-tier memory opening by removing remaining portions of the sacrificial first-tier memory opening fill structure underneath the second-tier memory opening;

forming a memory opening fill structure in the inter-tier memory opening, wherein the memory opening fill structure comprises a vertical stack of memory elements and a vertical semiconductor channel;

forming a sacrificial second-tier memory opening fill structure comprising a stack of a second carbon-based fill material portion and a second conductive material portion in an upper portion of the first-tier memory opening and in the second-tier memory opening after removing the first conductive material portion selective to the first carbon-based fill material portion;

forming a third-tier alternating stack of third insulating layers and third spacer material layers over the second-tier alternating stack; and forming a third-tier memory opening through the third-tier alternating stack by performing an additional anisotropic etch process having an etch chemistry that etches materials of the third insulating layers and the third spacer material layers selective to a material of the second conductive material portion.

7. The method of claim 6, further comprising:

performing an additional isotropic etch process that laterally recesses the third spacer material layers around the third-tier memory opening after performing the additional anisotropic etch process;

removing the second conductive material portion selective to the second carbon-based fill material portion after performing the additional isotropic etch process; and removing the second carbon-based fill material portion, wherein the remaining portions of the sacrificial first-tier memory opening fill structure are removed after removing the second carbon-based fill material portion.

8. The method of claim 6, wherein:

all of the third insulating layers other than a bottommost third insulating layer comprises a first silicon oxide material;

the bottommost third insulating layer comprises a second silicon oxide material having a higher etch rate in dilute hydrofluoric acid than the first silicon oxide material;

all of the third spacer material layers other than a bottommost third spacer material layer comprises a first silicon nitride material; and the bottommost third spacer material layer comprises a second silicon nitride material having a higher etch rate in phosphoric acid than the first silicon nitride material.

9. A method of forming a memory device, comprising:

forming a first-tier alternating stack of first insulating layers and first spacer material layers over a substrate, wherein the first spacer material layers are formed as, or are subsequently replaced with, first electrically conductive layers;

forming a first-tier memory opening through the first-tier alternating stack;

forming a sacrificial first-tier memory opening fill structure comprising a stack of a first carbon-based fill material portion and a first conductive material portion in the first-tier memory opening;

forming a second-tier alternating stack of second insulating layers and second spacer material layers over the first-tier alternating stack, wherein the second spacer material layers are formed as, or are subsequently replaced with, second electrically conductive layers;

forming a second-tier memory opening through the second-tier alternating stack by performing an anisotropic etch process having an etch chemistry that etches materials of the second insulating layers and the second spacer material layers selective to a material of the first conductive material portion;

removing the first conductive material portion selective to the first carbon-based fill material portion;

forming an inter-tier memory opening by removing remaining portions of the sacrificial first-tier memory opening fill structure underneath the second-tier memory opening;

forming a memory opening fill structure in the inter-tier memory opening, wherein the memory opening fill structure comprises a vertical stack of memory elements and a vertical semiconductor channel;

forming a layer stack including a lower source-level semiconductor layer, a source-level sacrificial layer, and an upper source-level semiconductor layer, wherein the first-tier alternating stack is formed over the layer stack, and the first-tier memory opening vertically extends through the upper source-level semiconductor layer and into the source-level sacrificial layer;

forming a source cavity by removing the source-level sacrificial layer; and forming a source contact layer in the source cavity and on a sidewall of the vertical semiconductor channel.

\* \* \* \* \*